(12) United States Patent
Jing et al.

(10) Patent No.: US 12,132,849 B2
(45) Date of Patent: Oct. 29, 2024

(54) TERMINAL DEVICE, AND DISPLAY SCREEN AND APPLICATION THEREOF

(71) Applicant: NINGBO SUNNY OPOTECH CO., LTD., Zhejiang (CN)

(72) Inventors: Liao Jing, Zhejiang (CN); Xudong Wu, Zhejiang (CN); Siyuan Liu, Zhejiang (CN); Zhenyu Chen, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 455 days.

(21) Appl. No.: 17/599,411

(22) PCT Filed: Mar. 12, 2020

(86) PCT No.: PCT/CN2020/078945
§ 371 (c)(1),
(2) Date: Sep. 28, 2021

(87) PCT Pub. No.: WO2020/192434
PCT Pub. Date: Oct. 1, 2020

(65) Prior Publication Data
US 2022/0217226 A1    Jul. 7, 2022

(30) Foreign Application Priority Data

Mar. 28, 2019 (CN) .......................... 201910243074.0
Mar. 28, 2019 (CN) .......................... 201910243075.5
(Continued)

(51) Int. Cl.
*H04M 1/02* (2006.01)
*G09G 3/3233* (2016.01)

(52) U.S. Cl.
CPC ........ *H04M 1/0264* (2013.01); *G09G 3/3233* (2013.01); *H04M 1/0266* (2013.01); *G09G 2300/0426* (2013.01); *G09G 2354/00* (2013.01)

(58) Field of Classification Search
CPC .............. H04M 1/0264; H04M 1/0266; G09G 3/3233; G09G 2300/0426; G09G 2354/00
See application file for complete search history.

(56) References Cited

U.S. PATENT DOCUMENTS

| | | |
|---|---|---|
| 2011/0304759 A1 | 12/2011 | Noda et al. |
| 2019/0020830 A1 | 1/2019 | Zhou et al. |
| 2019/0123115 A1 | 4/2019 | Sun et al. |

FOREIGN PATENT DOCUMENTS

| | | |
|---|---|---|
| CN | 106506742 | 3/2017 |
| CN | 106603766 | 4/2017 |

(Continued)

OTHER PUBLICATIONS

English Machine Tranwslation of WO 2014141893 (Year: 2024).*

(Continued)

*Primary Examiner* — Donald L Raleigh
(74) *Attorney, Agent, or Firm* — Wenderoth, Lind & Ponack, L.L.P.

(57) ABSTRACT

The present invention provides a terminal device, and a display screen thereof and an application thereof. The terminal device includes a terminal device body, a display screen, and a camera module. The display screen is provided with a light through hole. The camera module is located below the display screen, and has a front end. The front end of the camera module is fixedly attached to the display screen and the camera module is aligned with the light (Continued)

through hole of the display screen, so that light outside the display screen is received by the camera module via the light through hole.

20 Claims, 66 Drawing Sheets

(30) Foreign Application Priority Data

| Mar. 28, 2019 | (CN) | 201910243146.1 |
|---|---|---|
| Mar. 28, 2019 | (CN) | 201910243729.4 |
| Mar. 28, 2019 | (CN) | 201910243776.9 |
| Mar. 28, 2019 | (CN) | 201920412052.8 |
| Mar. 28, 2019 | (CN) | 201920412623.8 |
| Mar. 28, 2019 | (CN) | 201920412656.2 |

(56) References Cited

FOREIGN PATENT DOCUMENTS

| CN | 106935144 | 7/2017 | | |
|---|---|---|---|---|
| CN | 107229148 | 10/2017 | | |
| CN | 107241465 | 10/2017 | | |
| CN | 107451542 | 12/2017 | | |
| CN | 107589615 | 1/2018 | | |
| CN | 206932243 | 1/2018 | | |
| CN | 107658332 | 2/2018 | | |
| CN | 108010441 | 5/2018 | | |
| CN | 207530869 | 6/2018 | | |
| CN | 207652494 | 7/2018 | | |
| CN | 108519657 | 9/2018 | | |
| CN | 108628043 | 10/2018 | | |
| CN | 108681131 | 10/2018 | | |
| CN | 108885376 | 11/2018 | | |
| CN | 109273494 | 1/2019 | | |
| CN | 109283736 | 1/2019 | | |
| CN | 208623755 | 3/2019 | | |
| CN | 209881831 | 12/2019 | | |
| CN | 209881832 | 12/2019 | | |
| EP | 2 448 243 | 5/2012 | | |
| EP | 3 226 101 | 10/2017 | | |
| EP | 3 346 363 | 7/2018 | | |
| EP | 3 355 556 | 8/2018 | | |
| EP | 3 429 183 | 1/2019 | | |
| EP | 3 609 165 | 2/2020 | | |
| WO | WO-2014141893 A1 | * | 9/2014 | G02F 1/1333 |
| WO | 2018/196149 | 11/2018 | | |

OTHER PUBLICATIONS

International Search Report issued Jun. 11, 2020, in International (PCT) Patent Application No. PCT/CN2020/078945, with English translation.

Extended European Search Report issued Apr. 19, 2022, in corresponding European Patent Application No. 20777811.9.

* cited by examiner

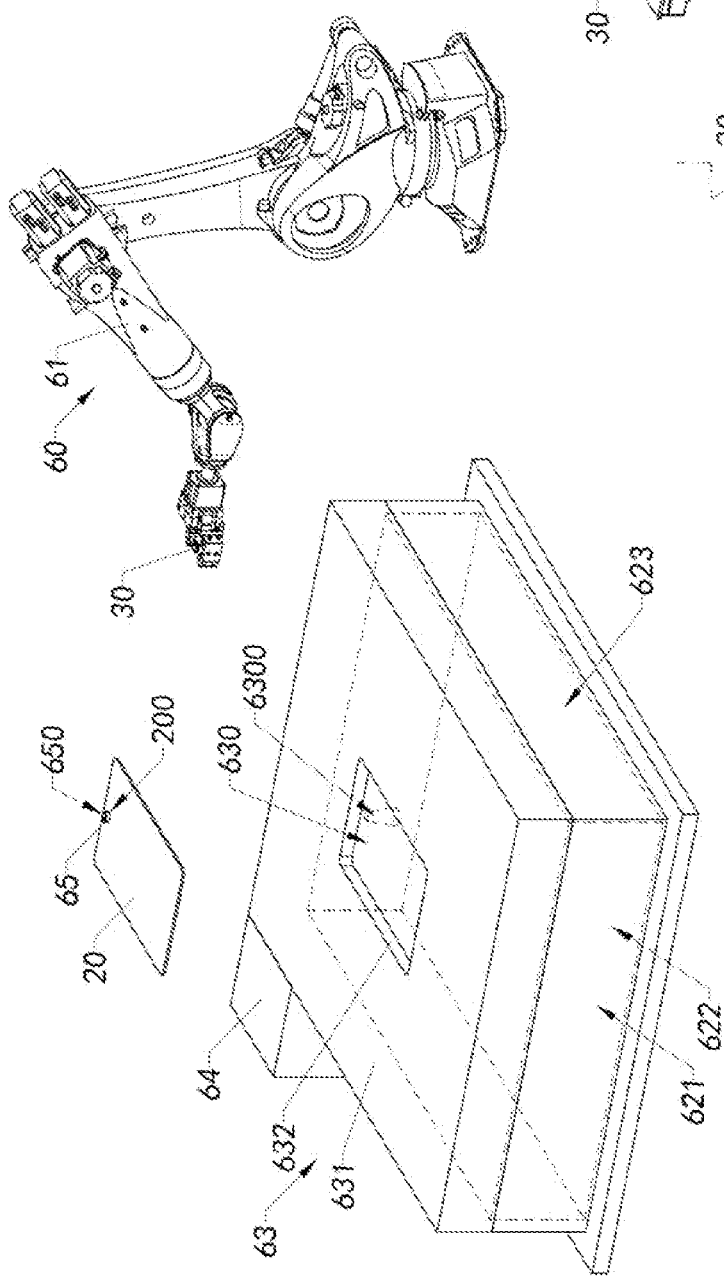
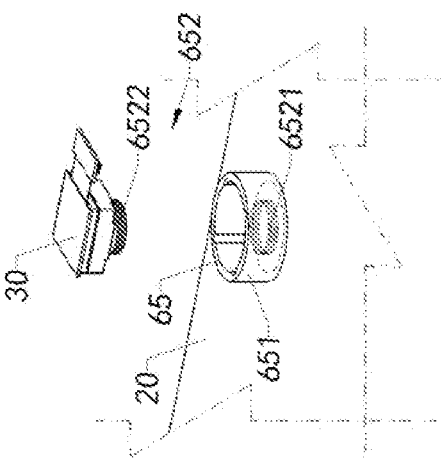
Figure 48A
Figure 48B

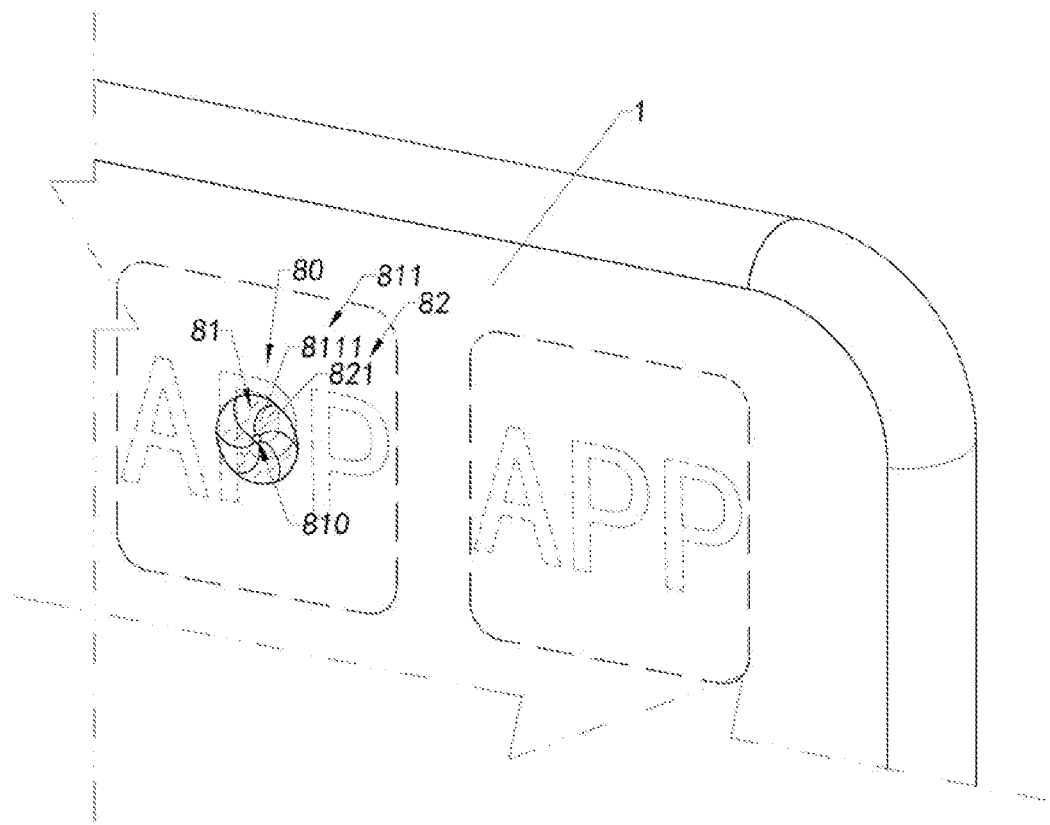
Figure 62A
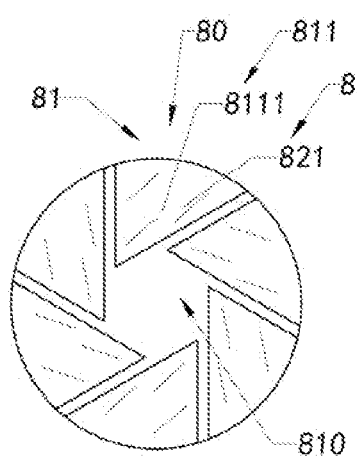 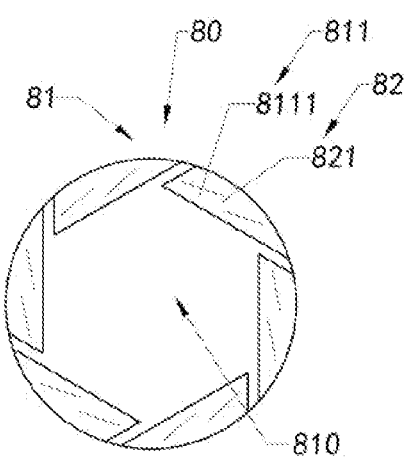
Figure 62B        Figure 62C

TERMINAL DEVICE, AND DISPLAY SCREEN AND APPLICATION THEREOF

FIELD OF THE INVENTION

The present invention relates to the field of electronic devices, and in particular, to a terminal device having a full screen, and a display screen thereof and application thereof.

BACKGROUND OF THE INVENTION

Current electronic devices usually have a camera function. To this end, conventional mobile phone terminals generally have a front camera module and a rear camera module. The front camera module is provided on the same side of a display screen for meeting the requirements of users for taking a selfie, etc. A front camera module occupies a large screen space, which is contrary to a current trend of pursuing a full screen.

The currently adopted measure is to design a camera module as a telescopic camera module so as to hide and use a camera function. When a camera function of an electronic device needs to be used, at least a part of the camera module is controlled to extend out of a housing of the electronic device. When the camera function is finished to be used, at least a part of the camera module is controlled to retract into the housing of the electronic device. However, the camera module is a relatively precise component, the service life of the camera module in a high-frequency back-and-forth motion needs to be tested, and the camera module is likely to be damaged due to the blocking of an external force in a moving process.

Therefore, how to ensure a front camera function of the electronic device and give consideration to the pursuit of a full screen is still an urgent problem to be solved.

SUMMARY OF THE INVENTION

An object of the present invention is to provide a terminal device, and a display screen thereof and application thereof. A camera module of the terminal device can collect sufficient light and a screen-to-body ratio of the terminal device can be improved.

Another object of the present invention is to provide a terminal device, and a display screen thereof and application thereof. A camera module of the terminal device is configured as an under-screen camera module and can receive sufficient light via a light through hole of the display screen.

Another object of the present invention is to provide a terminal device, and a display screen thereof and application thereof. A camera module of the terminal device is configured as an under-screen camera module and can receive sufficient light via a light through hole at an edge of the display screen.

Another object of the present invention is to provide a terminal device, and a display screen thereof and application thereof. Light passing through a light through hole can be guided to a camera module along a preset path to be received by the camera module.

Another object of the present invention is to provide a terminal device, and a display screen thereof and application thereof. A camera module and the display screen can be assembled together to facilitate holding relative positions of the camera module and the display screen.

Another object of the present invention is to provide a terminal device, and a display screen thereof and application thereof. A camera module of the terminal device can be designed in a small size to facilitate reduction of an overall height of the display screen and the camera module located below the display screen.

According to an aspect of the present invention, the present invention provides an assembly system, which includes: a clamping apparatus for clamping at least one camera module, a test unit for testing an imaging effect of the camera module receiving light via a through hole of a display screen, and a support platform for supporting the display screen with the through hole.

According to an embodiment of the present invention, the clamping apparatus clamps the camera module and the camera module is held above the display screen.

According to an embodiment of the present invention, the test unit includes a light source, a target plate, and a sensing device, the light source and the target plate are located below the display screen, and the sensing device detects the imaging effect of the camera module.

According to an embodiment of the present invention, the support platform has a mounting space and a test hole, the test hole penetrates through the mounting space, the through hole of the display screen is aligned with the test hole when the display screen is accommodated in the mounting space, and light emitted from the light source sequentially passes through the test hole and the through hole and is then received by the camera module.

According to an embodiment of the present invention, the test hole is conical in shape and has a smaller aperture at a position closer to the camera module.

According to an embodiment of the present invention, the support platform includes a platform body, a fixing assembly, and a mounting space in which the display screen is accommodated, the mounting space is formed in the fixing assembly, and the fixing assembly is provided to the platform body.

According to an embodiment of the present invention, the fixing assembly is integrally formed on the platform body.

According to an embodiment of the present invention, the fixing assembly is detachably mounted to the platform body.

According to an embodiment of the present invention, the assembly system further includes a limiting mechanism provided to the display screen, wherein relative positions of the camera module and the display screen are limited by the limiting mechanism when the camera module is mounted to the display screen.

According to an embodiment of the present invention, the assembly system further includes a limiting mechanism provided to the camera module, wherein relative positions of the camera module and the display screen are limited by the limiting mechanism when the camera module is mounted to the display screen.

According to an embodiment of the present invention, the assembly system further includes a limiting mechanism provided to a base which is aligned with the display screen, and the camera module is aligned with the display screen by the limiting mechanism.

According to an embodiment of the present invention, the limiting mechanism is adhesively fixed to the display screen.

According to an embodiment of the present invention, the limiting mechanism includes a sleeve having a free end and a connecting end, and a connecting portion extending outward from the connecting end of the sleeve in a radial direction of the sleeve, and the connecting portion is attached to a back side of the display screen when the sleeve is mounted to the display screen.

According to an embodiment of the present invention, the limiting mechanism includes a sleeve having a free end and a connecting end, and at least one connecting pin extending outward from the connecting end of the sleeve in an axial direction of the sleeve, and the connecting pin extends into the display screen when the sleeve is mounted to the display screen.

According to an embodiment of the present invention, the display screen has at least one embedded channel, and the connecting pin of the limiting mechanism is embedded in the embedded channel, the display screen includes a cover plate layer, a touch layer, a polarization layer, an encapsulation layer, a pixel layer, and a drive circuit layer, which are overlapped with each other in a height direction, the drive circuit layer is formed on a bottom side of the pixel layer and electrically connected to the pixel layer to drive the pixel layer to operate, the encapsulation layer is formed on a top side of the pixel layer and configured to encapsulate the pixel layer, wherein the through hole penetrates through the touch layer, the polarization layer, the encapsulation layer, the pixel layer, and the drive circuit layer in the height direction, the drive circuit layer includes a substrate base and a plurality of TFT structures provided to the substrate base, and the embedded channel is located between the adjacent TFT structures.

According to an embodiment of the present invention, the display screen has a mounting channel communicated with the through hole, and at least a part of the limiting mechanism is accommodated in the mounting channel.

According to an embodiment of the present invention, an inner diameter of the mounting channel is larger than the through hole.

According to another aspect of the present invention, the present application provides a terminal device, which includes: a terminal device body, a display screen, a camera module, and a limiting mechanism, wherein the display screen is mounted to the terminal device body and has a through hole penetrating from top to bottom, the camera module is held below the display screen and aligned with the through hole, the limiting mechanism is connected to the camera module and the display screen respectively, and the camera module is fixed to the display screen by the limiting mechanism.

According to an embodiment of the present invention, the limiting mechanism is adhesively fixed to the display screen.

According to an embodiment of the present invention, the limiting mechanism includes a sleeve having a free end and a connecting end, and a connecting portion extending outward from the connecting end of the sleeve in a radial direction of the sleeve, and the connecting portion is attached to a back side of the display screen when the sleeve is mounted to the display screen.

According to an embodiment of the present invention, the limiting mechanism includes a sleeve having a free end and a connecting end, and at least one connecting pin extending outward from the connecting end of the sleeve in an axial direction of the sleeve, and the connecting pin extends into the display screen when the sleeve is mounted to the display screen.

According to an embodiment of the present invention, the display screen has at least one embedded channel, the connecting pin of the limiting mechanism is embedded in the embedded channel, the display screen includes a cover plate layer, a touch layer, a polarization layer, an encapsulation layer, a pixel layer, and a drive circuit layer, which are overlapped with each other in a height direction, the drive circuit layer is formed on a bottom side of the pixel layer and electrically connected to the pixel layer to drive the pixel layer to operate, the encapsulation layer is formed on a top side of the pixel layer and configured to encapsulate the pixel layer, wherein the through hole penetrates through the touch layer, the polarization layer, the encapsulation layer, the pixel layer, and the drive circuit layer in the height direction, the drive circuit layer includes a substrate base and a plurality of TFT structures provided to the substrate base, and the embedded channel is located between the adjacent TFT structures.

According to an embodiment of the present invention, the display screen has a mounting channel communicated with the through hole, and at least a part of the limiting mechanism is accommodated in the mounting channel.

According to another aspect of the present invention, the present invention provides an assembly method of a camera module, which includes the following steps:

mounting a camera module on a limiting mechanism, wherein the camera module and the limiting mechanism are located below a through hole of a display screen;

adjusting a position of the camera module to achieve a desired effect based on an imaging effect of the camera module; and fixing the camera module and the display screen to the adjusted position.

According to an embodiment of the present invention, in the above method, the limiting mechanism is provided to the display screen.

According to an embodiment of the present invention, in the above method, the limiting mechanism is provided to a base, and the camera module is located between the base and the display screen.

According to an embodiment of the present invention, in the above method, relative positions of the camera module and the display screen are adjusted by adjusting relative positions of the camera module and the limiting mechanism.

According to an aspect of the present invention, the present invention provides a terminal device, which includes: a terminal device body, a display screen, a camera module, and at least one light through hole, wherein the display screen is mounted to the terminal device body, the camera module is held below the display screen and aligned with the through hole, the light through hole penetrates through at least a part of the display screen in a height direction, light outside the display screen is conducted to the camera module below the display screen via the light through hole, and the light through hole is designed as a virtual diaphragm of the camera module.

According to an embodiment of the present invention, the terminal device further includes a housing, wherein one of the light through holes penetrates from a side surface of the display screen to a bottom surface of the display screen in a gap between the housing and the display screen.

According to an embodiment of the present invention, the camera module includes a photosensitive unit, an optical mechanism held in a photosensitive path of the photosensitive unit and receiving light passing through the light through hole, and a diaphragm mounted to the optical mechanism.

According to an embodiment of the present invention, the camera module includes a photosensitive unit aligned with the light through hole, and an optical unit held in the light through hole.

According to an embodiment of the present invention, the optical unit includes an optical lens which includes a lens barrel and a plurality of lenses, the lens barrel includes a lens barrel wall and an extension wall, the lenses are mounted to the lens barrel wall, and the extension wall extends vertically upward for a preset distance from an end of the lens barrel wall close to the display screen.

According to an embodiment of the present invention, the extension wall is configured to extend vertically upward and then inward from the lens barrel wall.

According to an embodiment of the present invention, the extension wall is configured to extend upward from the lens barrel wall, and has a smaller inner diameter as being closer to the lens barrel wall.

According to an embodiment of the present invention, the extension wall has consistent inner diameters at each position.

According to an embodiment of the present invention, the extension wall has a smaller outer diameter as being closer to the lens barrel wall; or, the extension wall has a larger outer diameter as being closer to the lens barrel wall.

According to an embodiment of the present invention, the display screen includes a cover plate layer, a touch layer, a polarization layer, an encapsulation layer, a pixel layer, and a drive circuit layer, which are overlapped with each other in a height direction, the drive circuit layer is formed on a bottom side of the pixel layer and electrically connected to the pixel layer to drive the pixel layer to operate, the encapsulation layer is formed on a top side of the pixel layer for encapsulating the pixel layer, the polarization layer is configured to polarize passing light, and wherein the light through hole penetrates through the touch layer, the polarization layer, the encapsulation layer, the pixel layer, and the drive circuit layer other than the cover plate layer of the display screen in the height direction.

According to an embodiment of the present invention, the drive circuit layer includes a substrate base and a plurality of TFT structures provided to the substrate base, and the light through hole is located between the adjacent TFT structures.

According to an embodiment of the present invention, the pixel layer includes a plurality of pixels, and the light through hole is located between the adjacent pixels.

According to an embodiment of the present invention, the drive circuit layer includes a substrate base and a plurality of TFT structures provided to the substrate base, and the light through hole is located between the adjacent TFT structures.

According to an embodiment of the present invention, the terminal device is provided with a protective material, which is located in the light through hole and coated on the pixel layer and/or the drive circuit layer.

According to an embodiment of the present invention, the pixel layer includes an anode layer, a light emitting layer, a cathode layer, and a protective layer, the anode layer is located above the drive circuit layer, the light emitting layer is located between the anode layer and the cathode layer, and the cathode layer is located above the light emitting layer and below the protective layer.

According to an embodiment of the present invention, the terminal device is provided with a protective material, which is located in the light through hole, and is extended downward from the protective layer to the cathode layer or extended downward from the protective layer to the light emitting layer or extended downward from the protective layer to the anode layer.

According to an embodiment of the present invention, the terminal device includes a back plate layer, which is located below the drive circuit layer and configured to emit light, wherein the pixel layer includes a filter layer and a liquid crystal located between the filter layer and the drive circuit layer, the pixel layer is provided with a sealing material located between the filter layer and the drive circuit layer, and the liquid crystal is blocked by the sealing material so as not to leak to the light through hole.

According to an embodiment of the present invention, the terminal device is provided with a protective material, which is located in the light through hole and coated on the pixel layer and/or the drive circuit layer.

According to an embodiment of the present invention, the terminal device further includes a light guide conduit, wherein the light guide conduit is accommodated in the light through hole.

According to an embodiment of the present invention, the light guide conduit is made of a transparent material.

According to an embodiment of the present invention, the light guide conduit is coated with an opaque material.

According to an embodiment of the present invention, the terminal device further includes a limiting mechanism, wherein one end of the limiting mechanism is connected to the camera module, the other end of the limiting mechanism is connected to the display screen, and the camera module is fixed to the display screen by the limiting mechanism.

According to an aspect of the present invention, the present invention provides a display unit for matching with a camera module. The display unit includes: a display screen, a light supplementing unit, and a light through hole, wherein the light through hole penetrates through at least a part of the display screen in a height direction, the light supplementing unit is capable of radiating light to the outside of the display screen and forms a light hole when the camera module is in a working state, and light from the outside of the display screen is received by the camera module after being constrained by the light through hole and the light hole.

According to an embodiment of the present invention, the light supplementing unit is provided to the display screen.

According to an embodiment of the present invention, the light supplementing unit is provided inside the display screen.

According to an embodiment of the present invention, the display screen includes a cover plate layer, a touch layer, a polarization layer, an encapsulation layer, a pixel layer, and a drive circuit layer, the cover plate layer is located on a top side, the drive circuit layer is formed on a bottom side of the pixel layer and electrically connected to the pixel layer to drive the pixel layer to operate, the encapsulation layer is formed on a top side of the pixel layer, and the light supplementing unit is located at the drive circuit layer.

According to an embodiment of the present invention, the display screen includes a cover plate layer, a touch layer, a polarization layer, an encapsulation layer, a pixel layer, a drive circuit layer, and a back plate layer, the cover plate layer is located on a top side, the back plate layer is located on a bottom side, the drive circuit layer is formed on a bottom side of the pixel layer and electrically connected to the pixel layer to drive the pixel layer to operate, the encapsulation layer is formed on a top side of the pixel layer, and the light supplementing unit is located at the back plate layer.

According to an embodiment of the present invention, the light supplementing unit is held between the display screen and the camera module.

According to an embodiment of the present invention, the light supplementing unit is detachably mounted to the display screen.

According to an embodiment of the present invention, the light supplementing unit includes a diaphragm structure and a light emitting structure, the diaphragm structure includes a diaphragm moving portion and a diaphragm driving portion, the diaphragm moving portion is drivingly connected to the diaphragm driving portion in a manner of forming a light hole of a variable size, and the light emitting structure is located at the diaphragm moving portion.

According to an embodiment of the present invention, the light emitting structure is located on an upper surface of the diaphragm moving portion.

According to an embodiment of the present invention, a lower surface of the diaphragm moving portion is configured to be light-shielding when the light emitting structure is located on the upper surface of the diaphragm moving portion.

According to an embodiment of the present invention, the light supplementing unit further includes a reflecting structure, which is located below the light emitting structure to reflect light of the light emitting structure toward the outside of the display screen.

According to an embodiment of the present invention, the reflecting structure is stretchable to be deformably provided to the diaphragm structure, and a reflectivity of the reflecting structure changes when the reflecting structure is deformed as the diaphragm moving portion moves.

According to an embodiment of the present invention, the light emitting structure includes a light emitting element, the diaphragm moving portion has a hole, a size of the hole changes to form the light hole of a variable size during the movement of the diaphragm moving portion driven by the diaphragm driving portion, and the light emitting element is provided to the diaphragm moving portion.

According to an embodiment of the present invention, the light emitting structure includes a plurality of pixels, the diaphragm moving portion includes a plurality of blades drivingly connected to the diaphragm driving portion, and at least one of the pixels is provided to the at least one blade.

According to an embodiment of the present invention, a plurality of pixels are provided to one of the blades.

According to an embodiment of the present invention, the light emitting structure is located inside the diaphragm moving portion.

According to an embodiment of the present invention, the light supplementing unit includes a diaphragm moving portion and a diaphragm driving portion, the diaphragm moving portion is drivingly connected to the diaphragm driving portion in a manner of forming a light hole of a variable size, and the diaphragm moving portion is configured to emit light.

According to another aspect of the present invention, the present invention provides a terminal device, which includes:

a terminal device body;
the above display unit; and
a camera module, located below the display unit and having a front end, wherein the front end of the camera module is mounted to the display screen of the display unit and the camera module is aligned with the light through hole of the display screen, so that light outside the display screen is received by the camera module via the light through hole.

According to another aspect of the present invention, the present invention provides an operating method of a display unit, which includes the following steps:

operating, when a display screen with a light through hole works, a light supplementing unit to emit light so as to supplement a light intensity of a position of the light through hole.

According to an embodiment of the present invention, the operating method further includes the following steps:

operating, when a camera module which is located below the display screen and aligned with the light through hole works, a diaphragm structure of a light supplementing unit above the camera module to form a light hole, light reaching the camera module after being constrained by means of the light through hole and the light supplementing unit.

According to an aspect of the present invention, the present invention provides a terminal device, which includes: a terminal device body, a display screen, a camera module, a housing, and a light guide channel, wherein at least a part of the light guide channel is located between the display screen and the housing, at least a part of the light guide channel penetrates through the display screen, the display screen is mounted to the terminal device body, the camera module is located below the display screen and mounted to the display screen, the light guide channel is aligned with the camera module, and light is capable of imaging after reaching the camera module via the light guide channel.

According to an embodiment of the present invention, the light guide channel extends from a side surface of the display screen to a bottom surface of the display screen, and the camera module is attached to the bottom surface of the display screen.

According to an embodiment of the present invention, the display screen includes, from top to bottom, a cover plate layer, a touch layer, a polarization layer, an encapsulation layer, a pixel layer, a drive circuit layer, and a back plate layer, the drive circuit layer is formed on a bottom side of the pixel layer and electrically connected to the pixel layer to drive the pixel layer to operate, the encapsulation layer is formed on a top side of the pixel layer for encapsulating the pixel layer, the polarization layer is configured to polarize light, the drive circuit layer is supported on the back plate layer, and the light guide channel penetrates through one or more of the touch layer, the polarization layer, the encapsulation layer, the pixel layer, the drive circuit layer, and the back plate layer.

According to an embodiment of the present invention, the terminal device includes an optical unit, wherein the optical unit is held in the light guide channel and allows light to be transmitted therethrough.

According to an embodiment of the present invention, the display screen has a light through hole penetrating from top to bottom, and the light through hole is aligned with the camera module.

According to an embodiment of the present invention, the light guide channel and the light through hole at least partially coincide, and an image obtained by light reaching the camera module via the light guide channel and an image obtained by light reaching the same camera module via the light through hole are consistent.

According to an embodiment of the present invention, the terminal device further includes a light guide assembly, wherein the light guide assembly forms the light guide conduit and penetrates through the display screen.

According to an embodiment of the present invention, the light guide assembly is made of a light transmitting material.

According to an embodiment of the present invention, the light guide assembly is a light guide conduit coated with an opaque material.

According to an embodiment of the present invention, the terminal device includes an optical unit, wherein the optical unit is located at the light guide assembly and held in the light guide channel, and allows light to be transmitted therethrough.

According to an embodiment of the present invention, the display screen has a light through hole penetrating from top to bottom, and the light through hole is aligned with the camera module.

According to an embodiment of the present invention, the light guide channel and the light through hole at least partially coincide, and an image obtained by light reaching the camera module via the light guide channel and an image obtained by light reaching the same camera module via the light through hole are consistent.

According to an embodiment of the present invention, one of the light guide assemblies is accommodated in the light through hole.

According to another aspect of the present invention, the present invention provides a manufacturing method of a display screen, which includes the following steps:

forming a light guide channel extending from a side surface of a display screen to a bottom surface of the display screen.

According to an embodiment of the present invention, the above method further includes the following steps:

correspondingly forming holes at a preset position of each layer of the display screen; and mounting the layers of the display screen so that the corresponding holes form the light guide channel.

According to an embodiment of the present invention, the above method further includes the following steps:

forming a hole penetrating through a drive circuit layer in the drive circuit layer;

providing a cover plate layer, a touch layer, a polarization layer, an encapsulation layer, and a pixel layer above the drive circuit layer respectively to obtain the display screen; and perforating the display screen in alignment with the hole of the drive circuit layer to obtain the light guide channel.

According to an embodiment of the present invention, the above method further includes the following steps:

forming the pixel layer on the drive circuit layer with a hole;

forming a hole penetrating through the pixel layer and the drive circuit layer in the pixel layer and the drive circuit layer; and providing a cover plate layer, a touch layer, a polarization layer, and an encapsulation layer above the pixel layer respectively.

According to another aspect of the present invention, the present invention provides a manufacturing method of a display screen, which includes the following steps:

providing a cover plate layer, a touch layer, a polarization layer, an encapsulation layer, and a back plate layer on both sides of a liquid crystal layer respectively to obtain a display screen; and perforating the display screen in alignment with a sealing region of the liquid crystal layer on a side surface or a bottom surface of the display screen to obtain a light guide channel penetrating through the side surface to the bottom surface of the display screen.

According to an embodiment of the present invention, in the above method, the method for manufacturing the liquid crystal layer further includes the following steps:

providing a sealing material between a filter layer and a drive circuit layer to form the sealing region; and filling a liquid crystal outside the sealing region.

According to an embodiment of the present invention, a hole is pre-formed in the liquid crystal layer.

BRIEF DESCRIPTION OF THE DRAWINGS

FIG. 48A is a schematic diagram of an assembly system according to a preferred embodiment of the present invention.

FIG. 48B is a schematic diagram of an assembly process according to a preferred embodiment of the present invention.

FIG. 62A is a partial schematic diagram of a display unit according to a preferred embodiment of the present invention.

FIG. 62B is a partial schematic diagram of a display unit according to a preferred embodiment of the present invention.

FIG. 62C is a partial schematic diagram of a display unit according to a preferred embodiment of the present invention.

DETAILED DESCRIPTION OF THE INVENTION

Figure 1A:
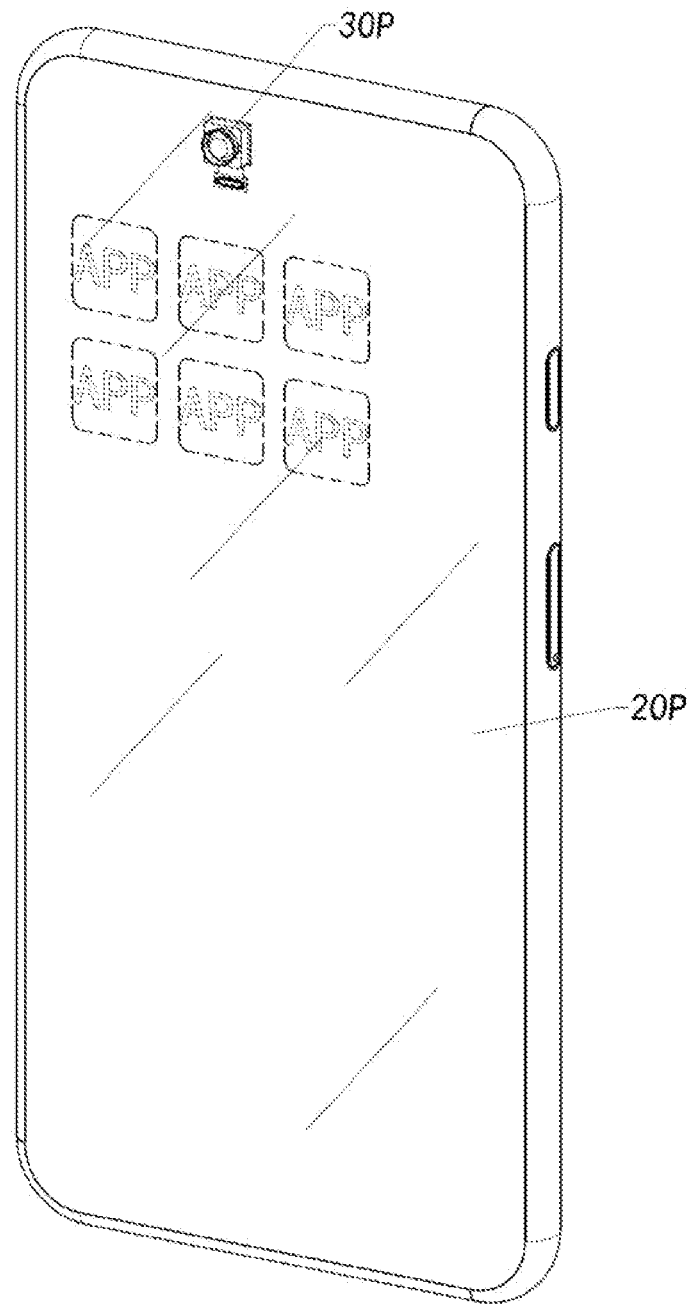
FIG. 1 is a schematic diagram of a terminal device according to the prior art.

The following description is used to disclose the present invention to enable those skilled in the art to implement the present invention. The preferred embodiments in the following description are by way of example only, and other obvious variations will occur to those skilled in the art. The basic principles of the present invention as defined in the following description may be applied to other embodiments, modifications, improvements, equivalents, and other technical solutions without departing from the spirit and scope of the present invention.

It should be understood by those skilled in the art that in the disclosure of the present invention, the orientation or positional relationship indicated by terms "longitudinal", "transverse", "upper", "lower", "front", "back", "left", "right", "vertical", "horizontal", "top", "bottom", "inside", "outside", etc. is based on the orientation or positional relationship shown in the drawings, which is merely for the convenience of describing the present invention and for the simplification of the description, and not to indicate or imply that the device or element referred to must have a specific orientation, or be constructed and operated in a specific orientation. Therefore, the above terms shall not be construed as a limitation of the present invention.

It will be understood that the term "a/an" is construed as "at least one" or "one or more", that is, in one embodiment, the number of an element may be one, and in another embodiment, the number of elements may be plural, and the term "a/an" cannot be construed as limiting the quantity.

Although ordinals such as "first" and "second" will be used to describe various assemblies, those components are not limited herein. The term is used only to distinguish one component from another. For example, a first component may be referred to as a second component, and likewise, a second component may be referred to as a first component without departing from the teachings of the inventive concept. As used herein, the term "and/or" includes any and all combinations of one or more of the associated listed items.

The term used herein is for the purpose of describing various embodiments only and is not intended to be limiting. As used herein, singular forms are also intended to include plural forms as well, unless the context clearly dictates otherwise. It will be further understood that when used in this specification, the terms "including" and/or "having" specify the presence of the features, numbers, steps, operations, components, elements, or combinations thereof, but do not preclude the presence or addition of one or more other features, numbers, steps, operations, components, elements, or combinations thereof.

The terms used herein, including technical and scientific terms, have the same meaning as commonly understood by those skilled in the art, so long as the terms are not defined differently. It will be understood that the terms defined in commonly used dictionaries have meanings consistent with the meanings of the terms in the prior art.

The present invention will now be described in further detail with reference to the accompanying drawings and detailed description.

SUMMARY OF THE APPLICATION

In recent years, a technical solution of an under-screen camera module is proposed. The camera module is held below a display screen, mounted to a motherboard of an electronic device such as a mobile phone. And, limited to a manufacturing process, a large light transmitting region is reserved on the display screen, so that the camera module can normally find a view through the light transmitting region. The size of the light transmitting region is much larger than that of a light receiving region of the camera module, and once a field angle θ of the camera module is set larger, the light transmitting region needs to be set larger so as to meet the view-finding requirements of the camera module in the process of moving back and forth. The light receiving region of the camera module refers to a region where a lens portion of the camera module is used for light entering.

Figure 1B:
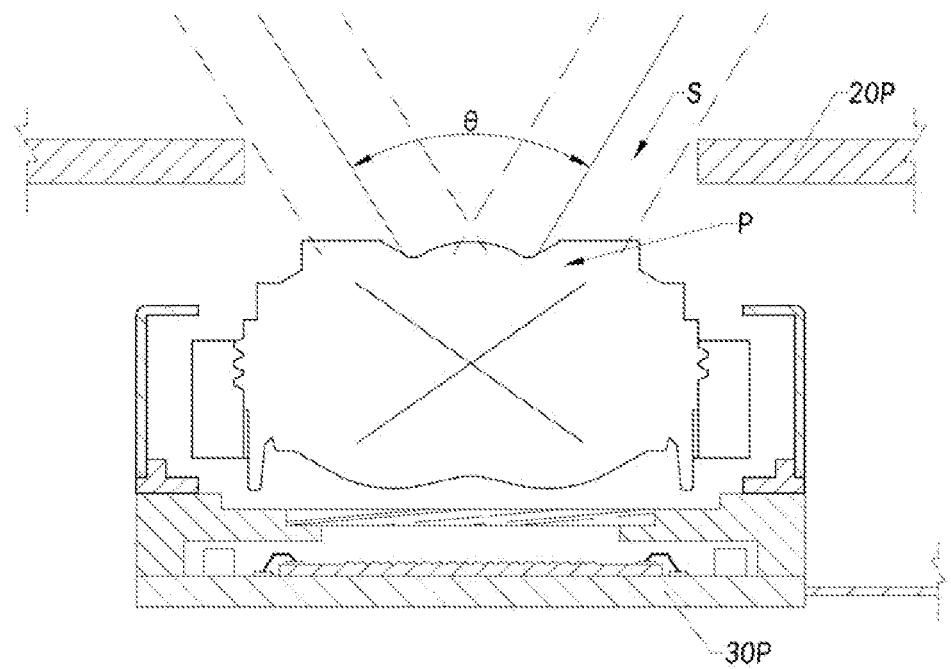
Figure 2:
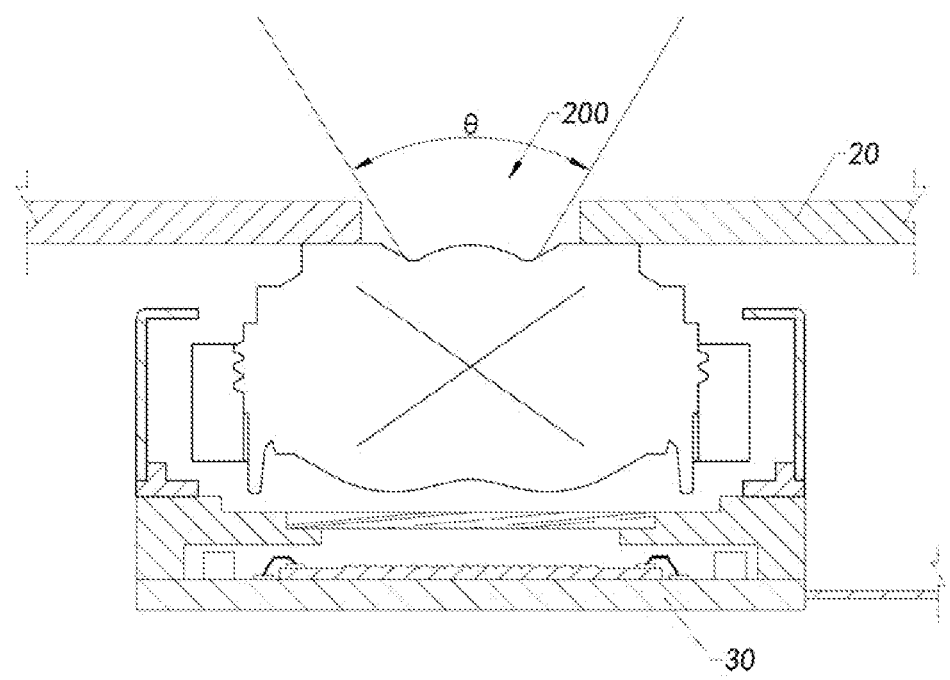
FIG. 2 is a schematic diagram of a display screen and a camera module according to the prior art.

Referring to FIGS. 1A and 1B, schematic diagrams of a conventional under-screen camera module 30P are shown. As shown in FIG. 1, a display screen 20P has a light transmitting region S. The light transmitting region S is much larger than a light receiving region P of the camera module 30P due to limitation to an early manufacturing process, and the light transmitting region S needs to be made larger when the camera module 30P needs to move back and forth relative to the display screen 20P.

Viewed from above the display screen 20P, the light transmitting region S will occupy a larger region of the display screen 20P. Further, since the light transmitting region S cannot be used for displaying in order to ensure light entering of the module in the prior art, it is not advantageous for improving a screen-to-body ratio of the entire display screen 20P.

The present invention provides a display screen 20P. The display screen 20P can satisfy imaging light required by the camera module 30P below the display screen 20P and improve the screen-to-body ratio of the display screen 20P as much as possible.

Referring to FIGS. 2-5B, schematic diagrams of the display screen 20 and a manufacturing method thereof according to some embodiments of the present invention are shown.

The display screen 20 has a light through hole 200. The light through hole 200 serves as the light transmitting region. The camera module 30 is located below the display screen 20. The camera module 30 images by receiving light passing through the light through hole 200.

It is worth mentioning that the camera module 30 can be fixed to the display screen 20, so that no space needs to be reserved between the camera module 30 and the display screen 20, an overall height can be reduced, and since the camera module 30 is closely attached to the display screen 20, the requirement of the camera module 30 on the area of the light transmitting region S can also be reduced. The camera module 30 can also, certainly, be moved relative to the display screen 20, but the light transmitting region of the display screen 20 can be made smaller.

The light transmitting region, i.e., the light transmitting hole 200, can be designed smaller, and higher requirements are imposed on a manufacturing process of the display screen 20.

In the present example, the display screen 20 is implemented as an organic light-emitting diode (OLED) display screen 20. The display screen 20 includes a cover plate layer 21, a touch layer 22, a polarization layer 23, an encapsulation layer 24, a pixel layer 25, a drive circuit layer 26, and a back plate layer 27, which are arranged from top to bottom. The cover plate layer 27 is located on a top side. The back plate layer is located on a bottom side. The drive circuit layer 26 is formed on a bottom side of the pixel layer 25 and electrically connected to the pixel layer 25 to drive the pixel layer 25 to operate. The encapsulation layer 24 is formed on a top side of the pixel layer 25 for encapsulating the pixel layer 25. The pixel layer 25 includes pixels arranged in an array, and gaps are formed between the pixels, so that light sequentially transmitted through the cover plate layer 21, the touch layer 22, the polarization layer 23, and the encapsulation layer 24 can pass through the pixel layer 25 via the gaps.

In particular, the display screen 20 also has the light through hole 200. The light through hole 200 penetrates through the touch layer 22, the polarization layer 23, the encapsulation layer 24, the pixel layer 25, and the drive circuit layer 26. It is worth noting that the light through hole 200 may penetrate through the cover plate layer 21 or may not penetrate through the cover plate layer 21. The cover plate layer 21 is generally made of a material having a good light transmittance, such as glass, so that the cover plate layer 21 can allow light to pass therethrough efficiently without perforating.

Further, the cover plate layer 21 is located above the display screen 20. If the cover plate layer 21 is a complete structure, the cover plate layer 21 located above each layer of the display screen 20 may protect other layers from contaminants such as moisture or dust entering the other layers of the display screen 20. In the present example, preferably, the light through hole 200 does not penetrate through the cover plate layer 21.

The camera module 30 can be mounted below the display screen 20, and receives sufficient amount of light above the display screen 20 via the light through hole 200.

Further, the camera module 30 is fixedly mounted to the display screen 20, and the size of the light through hole 200 of the display screen 20 can be designed to be small.

Figure 3A:
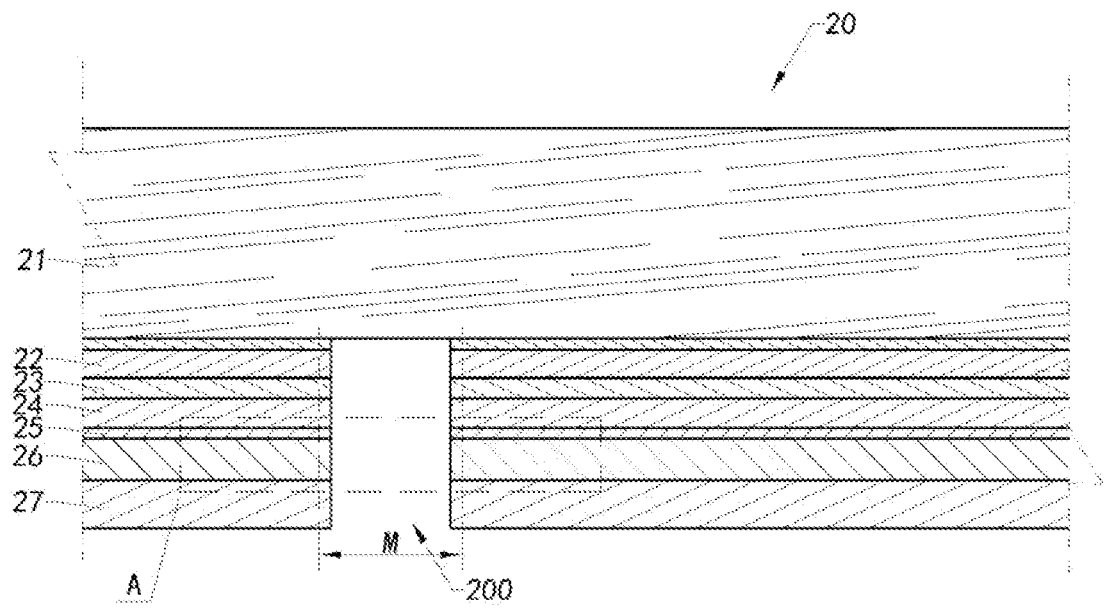
FIG. 3 is a schematic diagram of a display screen according to a preferred embodiment of the present invention.
Figure 3B:
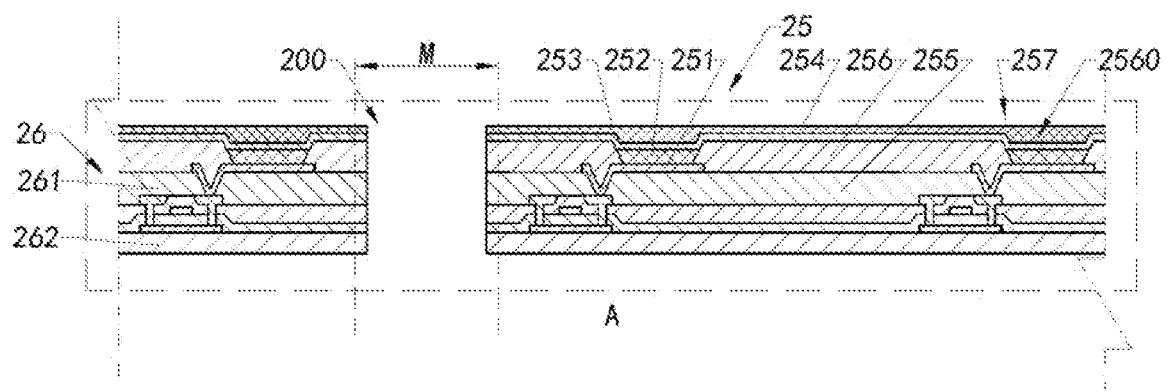

As shown in FIGS. 3A and 3B, in the present embodiment, the display screen 20 is implemented as an OLED display screen 20. Those skilled in the art would know that the OLED display screen 20 has the advantages of self-luminescence, wide viewing angle, high contrast, low power consumption, high reaction speed, full coloring, etc.

The cover plate layer 21 is usually implemented as a glass layer, which is located on the topmost layer of the display screen 20 for protecting the layers below the cover plate layer 21. It will be understood that the glass layer is made of a glass material, which is a material having a high light transmittance.

The touch layer 22 is located below the cover plate layer 21, and the cover plate layer 21 and the touch layer 22 are usually connected by an adhesive. Those skilled in the art would know that the touch layer 22 is an indispensable configuration for realizing the display screen 20 having a touch function.

The polarization layer 23 is located below the touch layer 22. The polarization layer 23 is usually implemented as circularly polarized light, etc.

The encapsulation layer 24 is located below the polarization layer 23. The encapsulation layer 24 serves to encapsulate the pixel layer 25 located below the encapsulation layer 24 so that the pixel layer 25 is in a sealed environment to prevent organic material in the pixel layer 25 from being polluted by the outside or volatilized. Specifically, the encapsulation layer 24 has two types. When the display screen 20 is a rigid screen, the encapsulation layer 24 is made of a rigid light-transmittable material such as glass or plastic. When the display screen 20 is a flexible screen, the encapsulation layer 24 is made of a flexible light-transmittable material such as a polyimide (PI) film.

The pixel layer 25 is wrapped by the encapsulation layer 24 and located below the encapsulation layer 24. For the OLED display screen 20, a pixel unit in the pixel layer 25 is implemented as an OLED, i.e. organic light-emitting diode.

The drive circuit layer 26 is located below the pixel layer 25. The drive circuit layer 26 can be electrically connected to the pixel layer 25 to drive the pixel layer 25 to operate.

The back plate layer 27 is located below the drive circuit layer 26. The back plate layer 27 can enhance the structural strength of the entire display screen 20. The back plate layer 27 is usually made of a plastic material.

For the OLED display screen 20, it is necessary to avoid the pixel layer 25 and the drive circuit layer 26 in a perforating process. The drive circuit layer 26 is provided with a circuit structure, the pixel layer 25 includes a plurality of pixels, and once the light through hole 200 destroys the circuit structure of the drive circuit layer 26 or a pixel structure of the pixel layer 25, it is likely to affect the working performance of the OLED display screen 20.

There are mainly three ways to perforate the OLED display screen 20. The first way is to uniformly perforate the layers of the OLED display screen 20 after the layers of the OLED display screen 20 are assembled. The second way is to perforate the layers of the OLED display screen 20 layer by layer. The third way is to perforate some layers of the OLED display screen 20 such as the pixel layer 25 and/or the drive circuit layer 26 in advance, and then perform uniformly perforating after the other layers are mounted to form the OLED display screen 20.

It is worth noting that the perforating herein refers not only to forming actual small holes, but may also refer to the display screen 20 forming regions having a function similar to holes. For example, the display screen 20 may be first perforated and then filled with a transparent material at the perforated position so that the region can have a hole-like light through function.

It is worth mentioning that when the display screen 20 with the light through hole 200 is obtained in the first way, a perforated region may be reserved during the manufacturing of the drive circuit layer 26 and the pixel layer 25, and the circuit structure of the drive circuit layer 26 and the pixels of the pixel layer 25 are not within the perforated region, thereby reducing the influence of the light through hole 200 on the working performance of the OLED display screen 20 after subsequent perforating.

The pixel layer 25 is formed on the drive circuit layer 26 by evaporation. The pixel layer 25 includes an anode layer 251, a light emitting layer 252, a cathode layer 253, and a protective layer 254. The anode layer 251 is located above the drive circuit layer 26. The light emitting layer 252 is located between the anode layer 251 and the cathode layer 253. The cathode layer 253 is located above the light emitting layer 252 and below the protective layer 254.

The light through hole 200 penetrates through the pixel layer 25. Specifically, the light through hole 200 penetrates through the layers of the pixel layer 25 and the display screen 20 in a direction perpendicular to each layer of the pixel layer 25, other than the cover plate layer 21 of the display screen 20.

The pixel layer 25 may also include other film layers, such as a planarization layer and a passivation layer, without limitation herein. While the light through hole 200 may be provided in a display region of the display screen 20 in the present example, since the diameter of the light through hole 200 involved in the present invention is less than or equal to 3.99 mm, preferably less than or equal to 2 mm, and the light through hole 200 does not affect the normal display of the display screen 20, the camera module 30 is mounted at a preset position below the display screen 20 corresponding to the light through hole 200.

It is worth mentioning that the preset position should be determined according to the diameter of the light through hole 200 and optical path parameters of the camera module 30. That is, the camera module 30 is provided to the preset position to receive light via the light through hole 200 on the display screen 20 and perform normal imaging. Since the light through hole 200 is of a smaller size compared with a conventional light through hole, the display region is enlarged, thereby facilitating the manufacture of a full screen.

It is worth noting that the light through hole 200 may be triangular, rectangular, or circular. In the present example, the light through hole 200 is preferably circular.

Figure 4A:
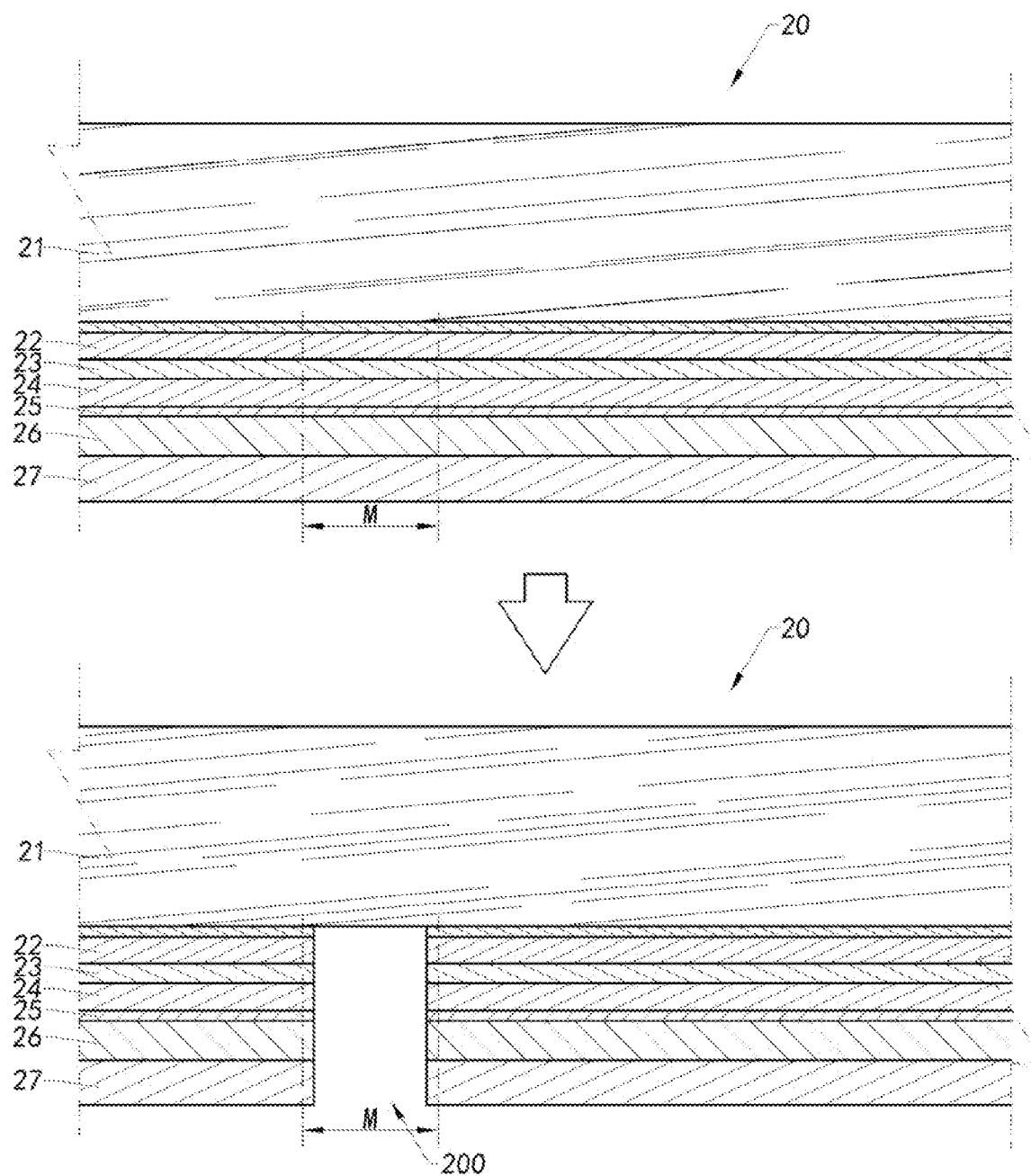
FIG. 4A is a schematic diagram of manufacture of a display screen according to a preferred embodiment of the present invention.

Referring to FIG. 4A, a specific implementation of a single perforating process for the OLED display screen 20 to perforate the entire OLED display screen 20 is illustrated.

After the pixel layer 25 is formed by the drive circuit layer 26, at least a part of the protective layer 254 of the pixel layer 25 may be removed by etching, direct perforating, etc. to form a groove which may be filled with at least a part of a marker substance available for prompting the perforated region. The marker substance may be a transparent material, and the position of the marker substance may be determined based on the difference in light transmittance between the marker substance and a surrounding material.

Other layers of the OLED display screen 20 are mounted to the drive circuit layer 26 or the pixel layer 25 to obtain the complete OLED display screen 20. The perforated region may be determined above the OLED display screen 20 based on the marker substance, and the OLED display screen 20 may be then perforated. In the perforating process, the light through hole 200 may have a larger range than the size of an area occupied by the marker substance, so that the marker substance may be completely removed after the perforating is completed.

It will be understood that the manner of positioning the perforated region by using the marker substance is by way of example only. It will be understood by those skilled in the art that the manner of perforating the OLED display screen 20 and bypassing the circuit structure of the drive circuit layer 26 and/or the pixel structure of the pixel layer 25 is not limited to the above example.

Figure 4B:
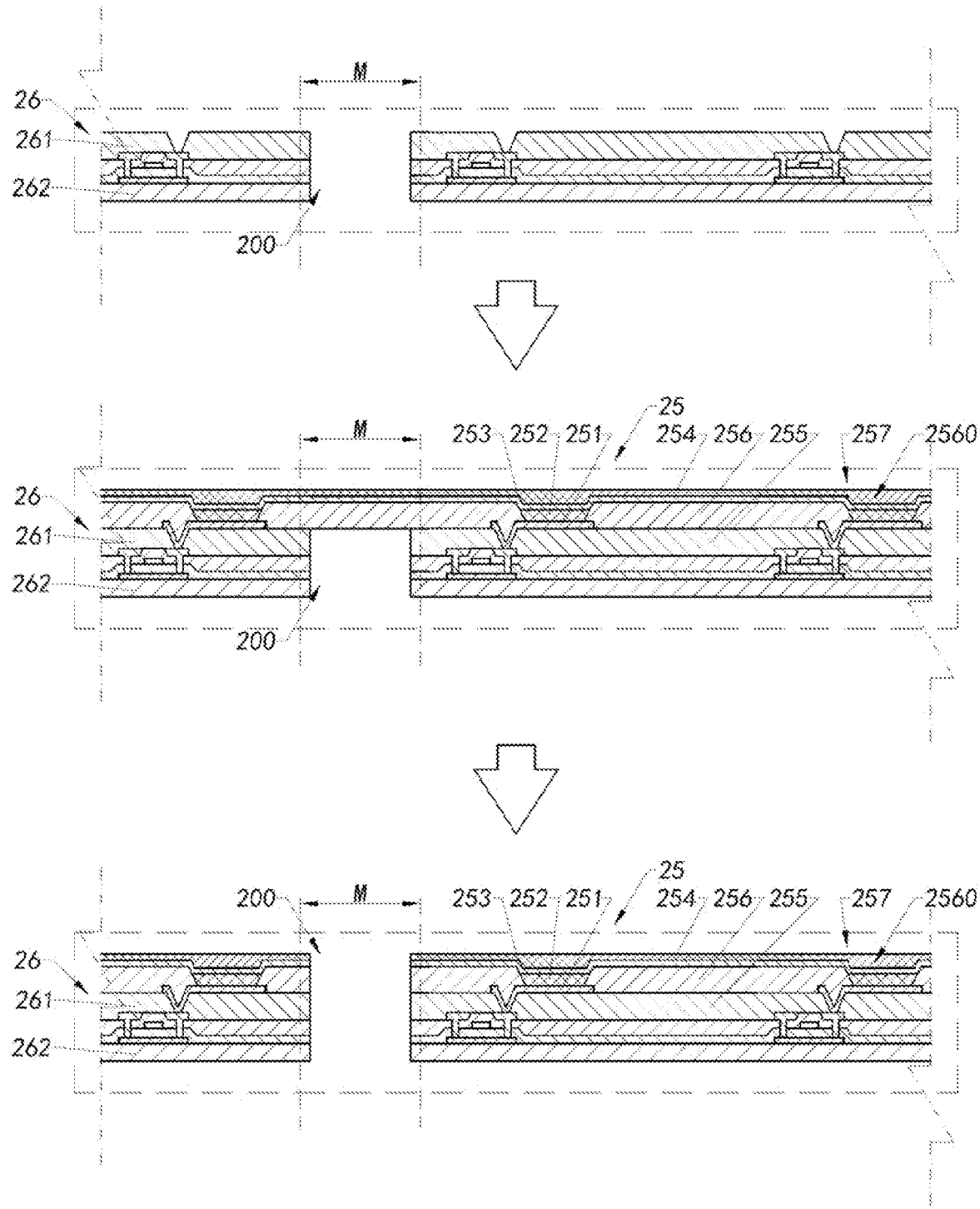
FIG. 4B is a schematic diagram of manufacture of a display screen according to a preferred embodiment of the present invention.

Referring to FIG. 4B, a specific implementation mode of multiple single perforating processes for the OLED display screen 20 to perforate the entire OLED display screen 20 is illustrated.

In the present example, the drive circuit layer 26 and the pixel layer 25 are perforated, and other layers of the OLED display screen 20 are then perforated to obtain the display screen 20 with the light through hole 200.

A region encircled by a dotted frame is the position of the light through hole 200. The light through hole 200 penetrates through the display screen 20 in a direction perpendicular to the pixel layer 25 and the drive circuit layer 26. Those skilled in the art would know that the structure of the pixel layer 25 in the figures is merely illustrative, that various functional layers may be provided as required, and that specific positions through which the light through hole 200 penetrate may be provided as required and are not limited to the positions shown in the figures.

Further, the drive circuit layer 26 includes a plurality of TFT structures 261 and a substrate base 262. The TFT structures 261 are sequentially provided to the substrate base 262 to form a TFT array. The substrate base 262 is located below the TFT structures 261. The TFT structures 261 are located below the pixel layer 25.

The light through hole 200 penetrates from the pixel layer 25 to the substrate base 262 of the drive circuit layer 26.

The pixel layer 25 further includes a planarization layer 255 and a pixel definition layer 256. The planarization layer 255 is located between the TFT structure 261 and the anode layer 251. The pixel definition layer 256 is located between the anode layer 251 and the light emitting layer 252. The pixel definition layer 256 has at least one pixel trench 2560. At least a part of the light emitting layer 252 and at least a part of the anode layer 251 are recessed formed in the pixel trench 2560 so that the pixel definition layer 256 can be used to define a pixel 257.

In the present example, the light through hole 200 is formed between two of the TFT structures 261 so that circuit influence on the drive circuit layer 26 is reduced, and at least a part of the protective layer 254 covers around the light through hole 200 so that the anode layer 251, the light emitting layer 252, and the cathode layer 253 near the light through hole 200 are not exposed, thereby reducing external influence on the anode layer 251, the light emitting layer 252, and the cathode layer 253 such as air and moisture, or dust.

The light through hole 200 may be formed by first pre-designing a small hole in the process of manufacturing the drive circuit layer 26. The small hole may be positioned as far away from the TFT structure 261 as possible to avoid damaging the structure of the drive circuit layer 26. The small hole may be formed in the drive circuit layer 26 by direct laser drilling or etching, etc.

After the small hole is formed in the drive circuit layer 26, the pixel layer 25 is formed on the drive circuit layer 26. At this moment, the small hole in the drive circuit layer 26 is covered. Then, the drive circuit layer 26 and the pixel layer 25 may be perforated in alignment with the position of the small hole of the drive circuit layer 26 so that the drive circuit layer 26 and the pixel layer 25 are penetrated through.

The encapsulation layer 24 is mounted to the drive circuit layer 26 and the pixel layer 25, and the encapsulation layer 24 may be perforated in alignment with the drive circuit layer 26 and the pixel layer 25. The polarization layer 23, the touch layer 22, the cover plate layer 21, and the back plate layer 27 are continuously mounted to the drive circuit layer 26 and the pixel layer 25, and the polarization layer 23, the touch layer 22, and the back plate layer 27 are perforated layer by layer to obtain the display screen 20 with the light through hole 200.

According to other embodiments of the present invention, the small hole in the drive circuit layer 26 is covered by the pixel layer 25 at this moment, the encapsulation layer 24, the polarization layer 23, the touch layer 22, the cover plate layer 21, and the back plate layer 27 are continuously mounted, and the display screen 20 is perforated in a thickness direction in alignment with the small hole after the complete display screen 20 is obtained, thereby obtaining the light through hole 200 penetrating through the display screen 20. It will be understood that the layers of the display screen 20 may first be mounted to obtain a complete display screen 20, and the layers other than the cover plate layer 21 may be then uniformly perforated. It is also possible to mount the layers of the display screen 20 other than the cover plate layer 21, then perforate, and finally mount the cover plate layer 21 to obtain the complete display screen 20.

According to other embodiments of the present invention, it will be certainly understood that the light through hole 200 may be formed by first pre-designing a small hole in the process of manufacturing the drive circuit layer 26. The small hole may be positioned as far away from the TFT structure 261 as possible to avoid damaging the structure of the drive circuit layer 26. Then the pixel layer 25 is formed on the basis of the drive circuit layer 26. The pixel layer 25 may be perforated in alignment with the drive circuit layer 26, and the encapsulation layer 24, the polarization layer 23, the touch layer 22, the cover plate layer 21, and the back plate layer 27 are then mounted, and the display screen 20 is perforated in a thickness direction in alignment with the small hole after the complete display screen 20 is obtained, thereby obtaining the light through hole 200 penetrating through the layers of the display screen 20 other than the cover plate layer 21. It will be understood that the layers of the display screen 20 may first be mounted to obtain a complete display screen 20, and the layers other than the cover plate layer 21 may be then uniformly perforated. It is also possible to mount the layers of the display screen 20 other than the cover plate layer 21, then perforate, and finally mount the cover plate layer 21 to obtain the complete display screen 20.

Figure 5A:
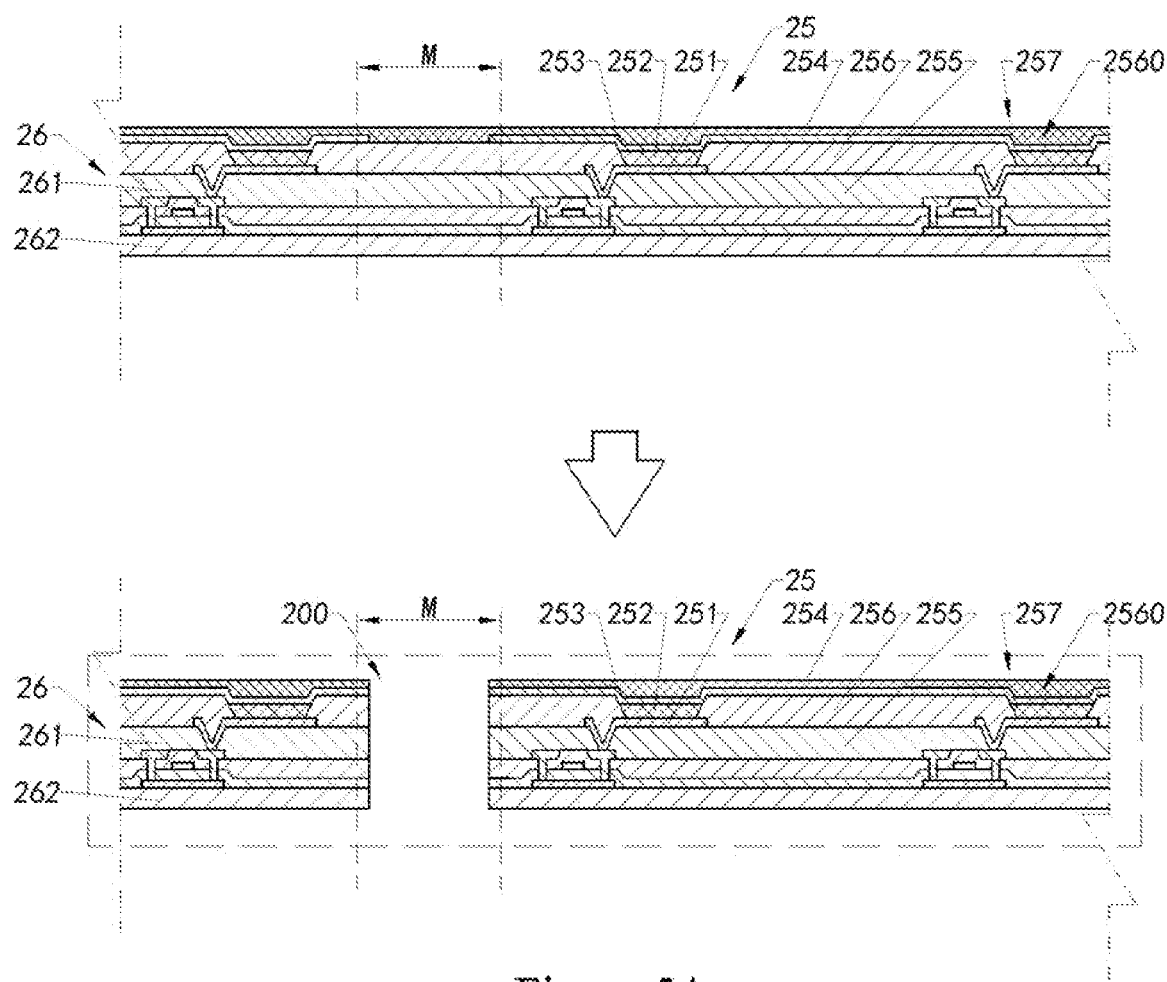
FIG. 5A is a schematic diagram of manufacture of a display screen according to a preferred embodiment of the present invention.
Figure 5B:
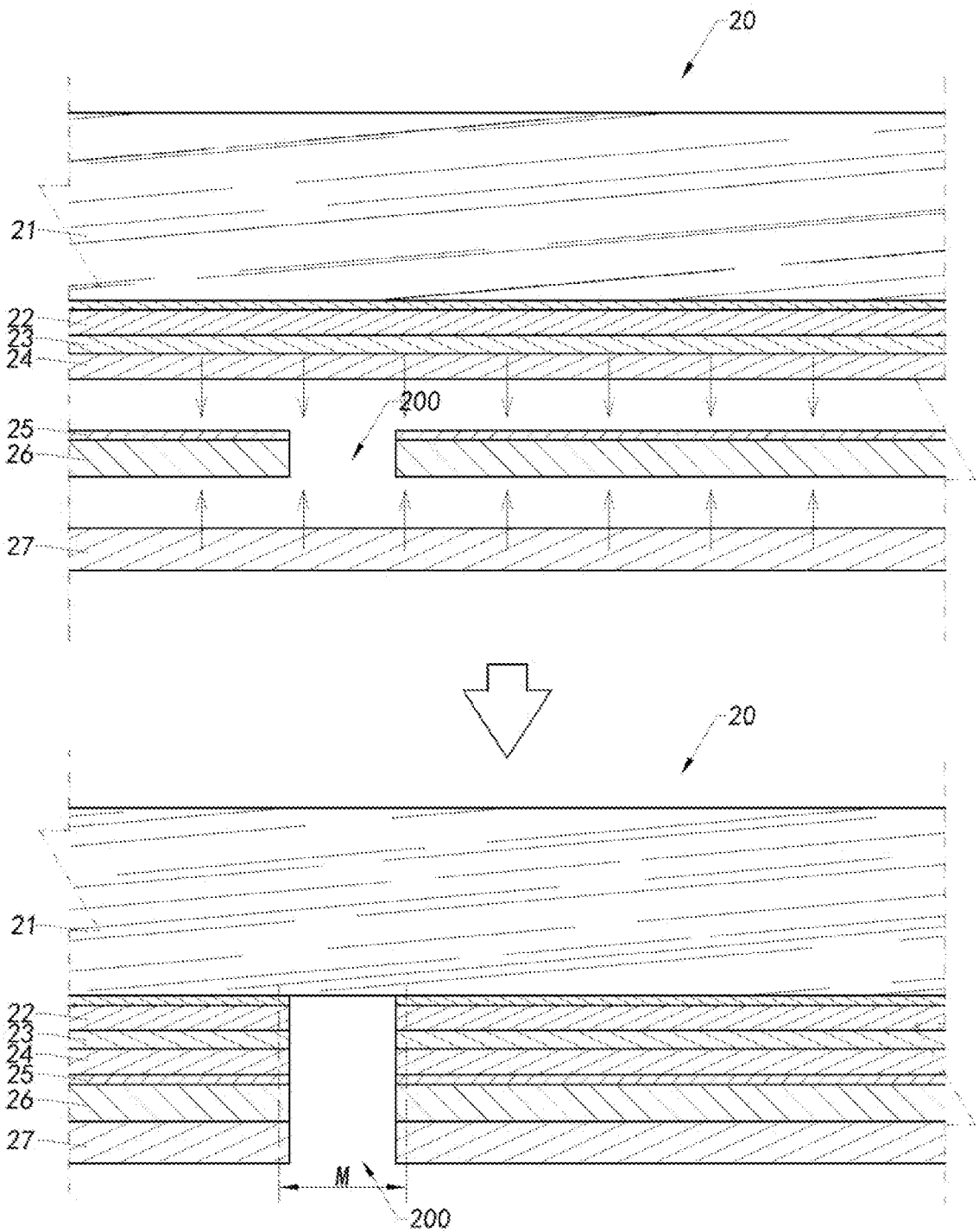
FIG. 5B is a schematic diagram of manufacture of a display screen according to a preferred embodiment of the present invention.

Referring to FIGS. 5A and 5B, a specific implementation mode of multiple single perforating processes for the OLED display screen 20 to perforate the entire OLED display screen 20 is illustrated.

In the present example, the drive circuit layer 26 and the pixel layer 25 are obtained first, and the drive circuit layer 26 and the pixel layer 25 are then simultaneously perforated.

Specifically, the anode layer 251, the light emitting layer 252, and the cathode layer 253 of the pixel layer 25 are formed on the drive circuit layer 26, and at least a part of the cathode layer 253 is then removed by means of etching to form a perforated region on the cathode layer 253.

At least a part of the pixel layer 25 is exposed from the perforated region. Specifically, at least a part of the pixel definition layer 256 of the pixel layer 25 is exposed from the perforated region. Preferably, a projection of the perforated region in a vertical direction of the pixel layer 25 and the drive circuit layer 26 is located between the adjacent TFT structures 261 to minimize the circuit influence on the display screen 20.

After forming the perforated region, the protective layer 254 is continuously formed over the cathode layer 253 and at least a part of the pixel definition layer 256. A protective material of the protective layer 254 fills the perforated region, and a region around the perforated region is also filled with the protective material of the protective layer 254.

At least a part of the light through hole 200 is then formed in the perforated region by means of drilling or cutting. At least a part of the pixel layer 25 and the drive circuit layer 26 are cut away in a height direction of the drive circuit layer 26 in the perforated region, for example, by using a laser cutting process, so that light above the pixel layer 25 passes through the pixel layer 25 and the drive circuit layer 26 to reach below the drive circuit layer 26. A specific perforating method may include: etching the layers corresponding to the perforated region by means of a centrally-opened mask, and covering the other parts.

In the present example, at least a part of the cathode layer 253 needs to be removed before forming the protective layer 254. In other embodiments of the present invention, at least a part of the cathode layer 253 and at least a part of the light emitting layer 252 need to be removed before forming the protective layer 254. Specifically, it may be removed by means of dry etching. For example, a dry etching process may be completed by a plasma enhanced chemical vapor deposition etching device or by an inductively coupled plasma etching device. Etching gases may be oxygen-containing gases which can react with organic matters in the light emitting layer 252 or the cathode layer 253, such as oxygen, nitrous oxide, or carbon dioxide. Or, etching gases are an oxygen-containing gas and an inert gas nitrogen, which are used simultaneously.

It is worth noting that the sizes of the perforated region and the light through hole 200 may be different. When the perforated region is larger than the light through hole 200 and the light through hole 200 is located within the perforated region, the cathode layer 253 located around the light through hole 200 can be protected from being exposed by the protective layer 254. When the sizes of the perforated region and the light through hole 200 are consistent or the light through hole 200 is larger than the perforated region, the cathode layer 253 around the light through hole 200 may exposed.

After the pixel layer 25 is formed on the drive circuit layer 26, the light through hole 200 can penetrate through the drive circuit layer 26 and the pixel layer 25.

Further, the encapsulation layer 24, the polarization layer 23, the touch layer 22, and the cover plate layer 21 can be mounted to the pixel layer 25 and the drive circuit layer 26 in a certain order. After the encapsulation layer 24, the polarization layer 23, the touch layer 22, and the cover plate layer 21 are fixedly mounted to the pixel layer 25 and the drive circuit layer 26 respectively, the light through hole 200 penetrates through the layers of the entire display screen 20 other than the cover plate layer 21 by drilling or cutting.

When the display screen 20 includes the back plate layer 27, the back plate layer 27 is mounted to the drive circuit layer 26, and the light through hole 200 penetrates through the back plate layer 27 in the height direction of the display screen 20.

It will be, certainly, understood that the encapsulation layer 24, the polarization layer 23, the touch layer 22, and the back plate layer 27 may be perforated after being fixedly mounted to the drive circuit layer 26 and the pixel layer 25, respectively. In other words, when the encapsulation layer 24 is mounted to the pixel layer 25, the encapsulation layer 24 may be perforated in alignment with the pixel layer 25. After the polarization layer 23 is mounted to the encapsulation layer 24, the polarization layer 23 may be perforated. After the touch layer 22 is mounted to the polarization layer 23, the touch layer 22 may be perforated. After the back plate layer 27 is mounted to the drive circuit layer 26, the back plate layer 27 may be perforated.

The perforating timing of the display screen 20 other than the drive circuit layer 26 and the pixel layer 25 is not limited to the above illustration. For example, the encapsulation layer 24, the polarization layer 23, and the touch layer 22 are located on the same side of the pixel layer 25 and may be simultaneously perforated. The back plate layer 27 is located on the other side of the pixel layer 25 and may be perforated separately or together with the encapsulation layer 24, the polarization layer 23, and the touch layer 22.

It is worth mentioning that other layers of the display screen 20 may be drilled or cut layer by layer before or after the drive circuit layer 26 forms the pixel layer 25, and the small holes in the layers are then aligned by adjusting relative positions of the layers and can thus penetrate through each other.

Further, the inner diameters of the portions of the light through hole 200 corresponding to the layers of the display screen 20 may be different. For example, the inner diameter of the portion of the light through hole 200 corresponding to the touch layer 22 located above may be larger than the inner diameter of the portion of the light through hole 200 corresponding to the back plate layer 27 located below. Each of the small holes corresponding to the layers of the display screen 20 may be made independently, so that the inner diameters of the finally-formed light through holes 200 corresponding to the layers may be different.

Further, for each layer of the display screen 20, taking the drive circuit layer 26 as an example, the small holes of the drive circuit layer 26 may be cylindrical. That is, the small holes have the same inner diameter at different height positions of the drive circuit layer 26. The small holes of the drive circuit layer 26 may also be conical. That is, the small holes have different inner diameters at different height positions of the drive circuit layer 26. For example, the inner diameters of the small holes are gradually reduced from top to bottom.

It will be understood by those skilled in the art that the shape of the small holes is not limited to the above example.

Referring to FIGS. 6A, 6B, 5A, and 5B, another specific implementation of the display screen 20 according to the present invention is illustrated. In the present example, a protective material 2812 is provided near the position of the light through hole 200 of the display screen 20. In particular, the protective material is provided near the position of the light through hole 200 corresponding to the pixel layer 25 and the drive circuit layer 26. The protective material 2812 may be of the same material as the protective layer 254 of the pixel layer 25 or of a different material than the protective layer 254 of the pixel layer 25.

The protective material 2812 is located near the position of the light through hole 200 to protect an internal structure of the exposed layers of the display screen 20, in particular for the pixel layer 25 and the drive circuit layer 26. The internal structures of the pixel layer 25 and the drive circuit layer 26 are exposed in the light through hole 200. The pixel layer 25 and the drive circuit layer 26 may be damaged when dust, moisture, or air enters into the light through hole 200. The protective material 2812 can cover the exposed portions of the pixel layer 25 and the drive circuit layer 26 at the positions of the light through hole 200, thereby protecting the pixel layer 25 and the drive circuit layer 26 so that the pixel layer 25 and the drive circuit layer 26 can be in a relatively stable working environment.

After obtaining the display screen 20 with the light through hole 200, the protective material 2812 may be poured into the light through hole 200 of the display screen 20, and the protective material 2812 may be then perforated to form a new light through hole 200. The protective material 2812 can cover each layer of the display screen 20. A filling height of the protective material 2812 in the light through hole 200 may be, certainly, controlled according to the requirements of users, thereby selecting a covering position of the protective material 2812. The protective material 2812 may not completely fill the light through hole 200. For example, the position of the back plate layer 27 corresponding to the light through hole 200 may not be protected by the protective material.

It is worth noting that the cover plate layer 21 is not perforated in the present example. The cover plate layer 21 is generally made of glass and has a good light transmitting property per se, so that the cover plate layer 21 may not be perforated, and the cover plate layer 21 may be located above to protect other layers of the display screen 20.

In this way, the original light through hole 200 may be made larger in advance, and the light through hole 200 is then controlled by cutting or drilling the protective material 2812 at a later stage so that the light through hole 200 is of a desired size. It is worth noting that the protective material 2812 around the light through hole 200 may be of the same material as the protective layer 254 or may be of different materials from the protective layer.

Figure 6A:
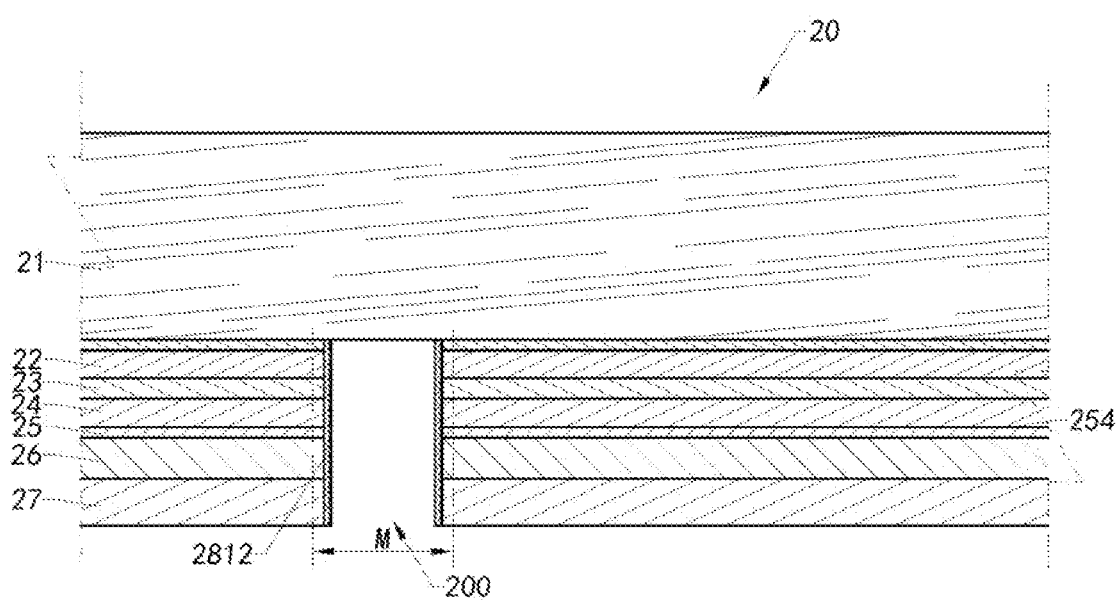
FIG. 6A is a schematic diagram of a display screen according to a preferred embodiment of the present invention.
Figure 6B:
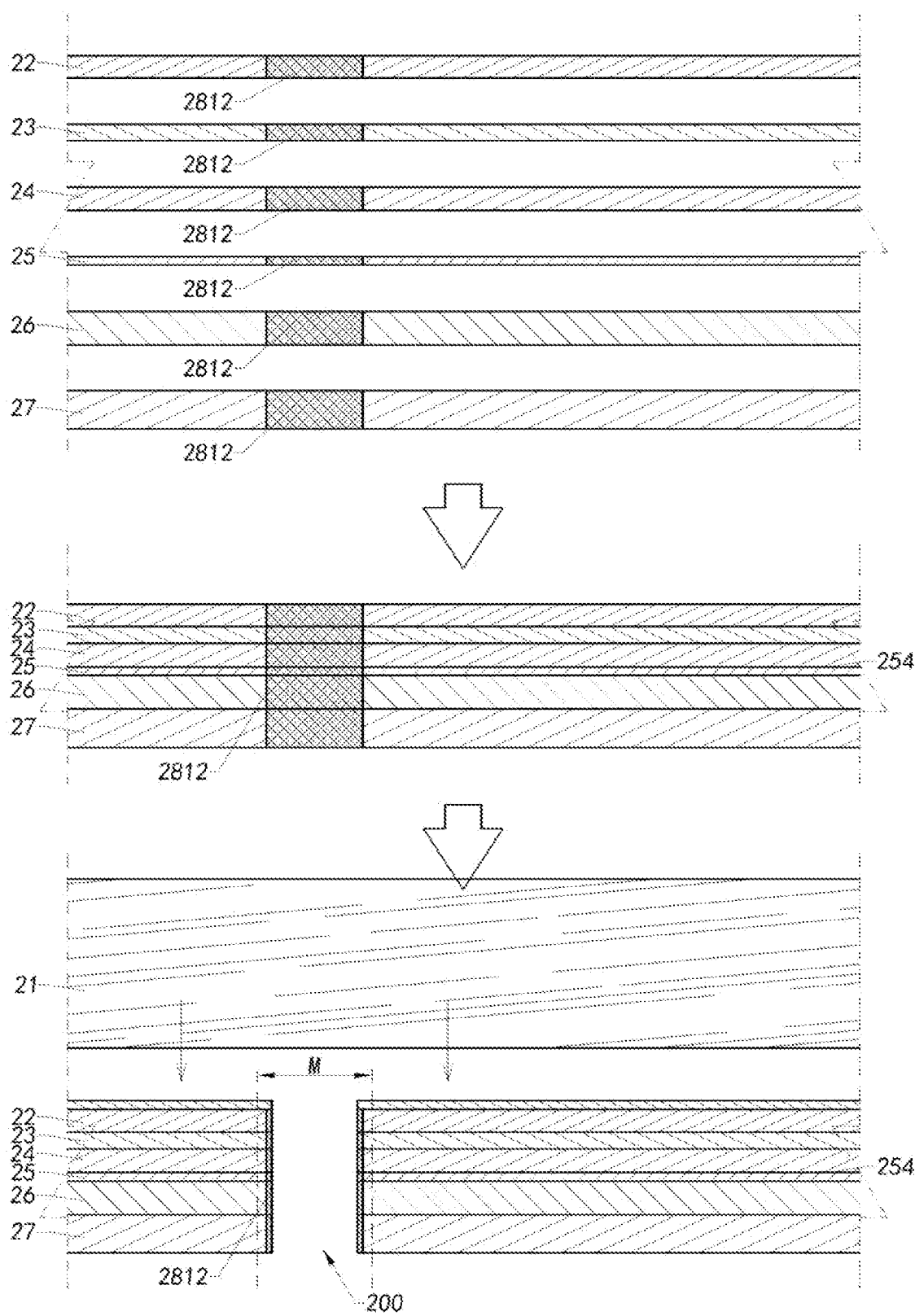
FIG. 6B is a schematic diagram of the above display screen according to the above preferred embodiment of the present invention.

Referring to FIG. 6B, a specific manufacturing method of the display screen 20 is illustrated.

In the present example, the layers constituting the display screen 20 are first perforated and then filled with the protective material 2812. The protective material 2812 is a transparent material. That is, the original position of the light through hole 200 corresponding to the display screen 20 is filled with the transparent material.

Specifically, the touch layer 22, the polarization layer 23, the encapsulation layer 24, the pixel layer 25, the drive circuit layer 26, and the back plate layer 27 may be perforated respectively, and the protective material 2812 may be then filled at the perforating position.

The touch layer 22, the polarization layer 23, the encapsulation layer 24, the pixel layer 25, the drive circuit layer 26, and the back plate layer 27 are then mounted together in alignment to form the display screen 20. At this moment, the display screen 20 may be used as a display screen with a "hole". Transparent materials corresponding to the touch layer 22, the polarization layer 23, the encapsulation layer 24, the pixel layer 25, the drive circuit layer 26, and the back plate layer 27 may function as holes.

Further, the touch layer 22, the polarization layer 23, the encapsulation layer 24, the pixel layer 25, the drive circuit layer 26, and the back plate layer 27 are perforated simultaneously, and a portion of the protective material 2812 may be left around the light through hole 200. The cover plate layer 21 is then mounted to obtain the display screen 20 shown in FIG. 6A.

Figure 7:
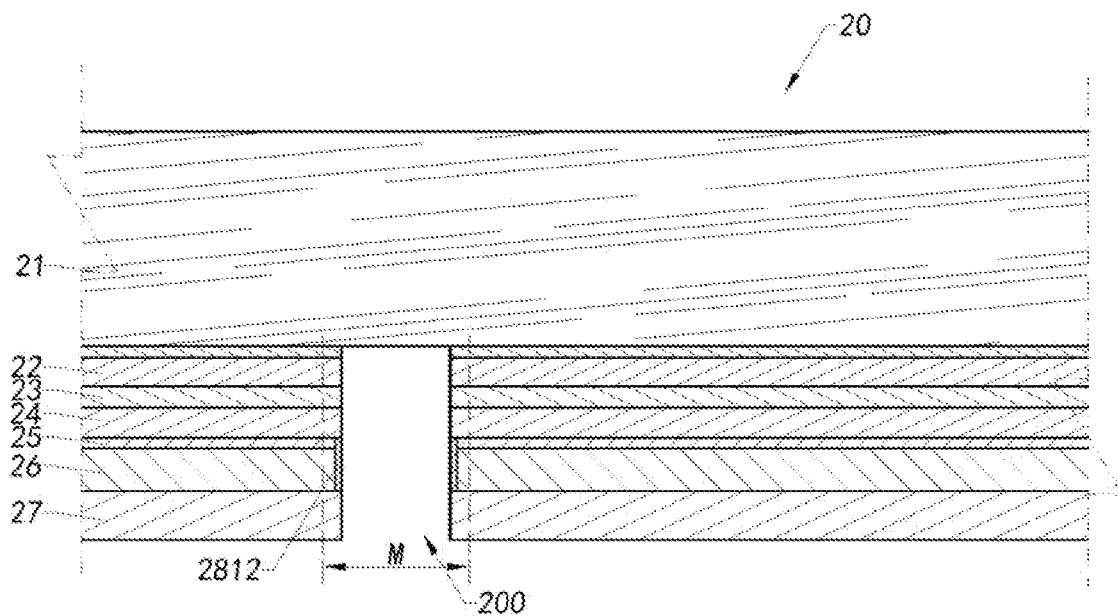
FIG. 7 is a schematic diagram of a display screen according to a preferred embodiment of the present invention.
Figure 8:
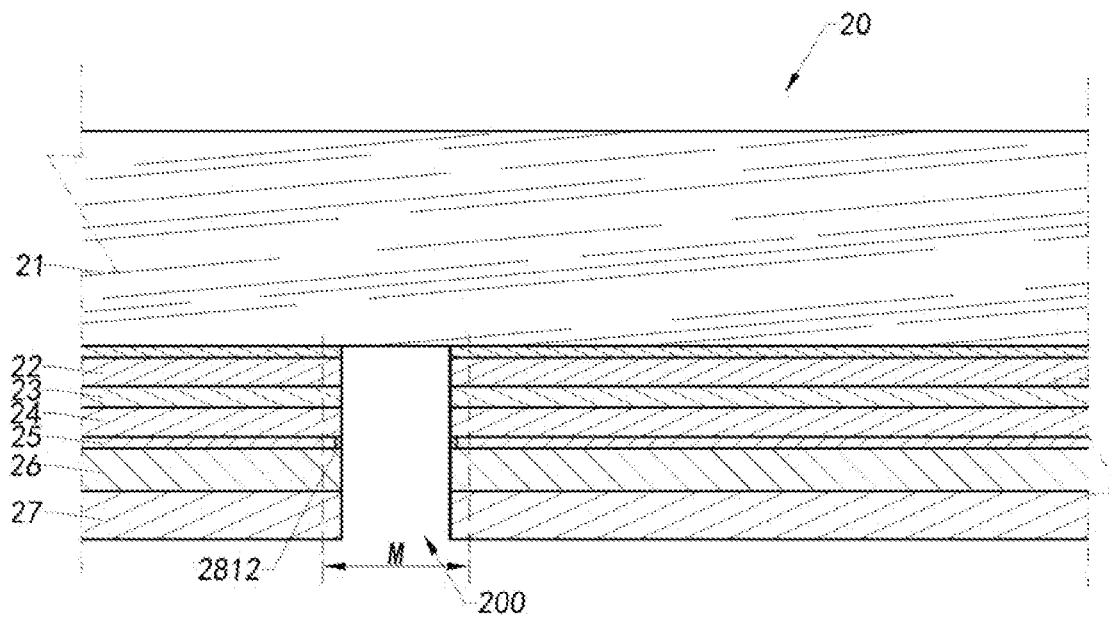
FIG. 8 is a schematic diagram of a display screen according to a preferred embodiment of the present invention.

Referring to FIG. 7, another specific implementation mode of the display screen 20 according to the present invention is illustrated.

In the present example, at least a part of the protective material 2812 is formed around the light through hole 200 of the display screen 20. The protective material 2812 can protect critical layers around the light through hole 200, such as the cathode layer 253, the pixel definition layer 256, or the TFT structure 261.

The protective material 2812 around the light through hole 200 may be positioned as required. For example, after obtaining the display screen 20 with the light through hole 200, the diameter of the light through hole 200 may be slightly larger than a desired design value, the light through hole 200 is filled with the protective material 2812 until the entire light through hole 200 is filled, and the position of the light through hole 200 is cut to obtain the light through hole 200 of a desired size as required.

In the present example, the drive circuit layer 26 and the pixel layer 25 in the display screen 20 may selectively be protected separately.

Specifically, the drive circuit layer 26 is obtained first. The drive circuit layer 26 may be obtained by the steps of film forming on a base, photoresist coating, exposing, developing, etching, peeling, etc. After the drive circuit layer 26 is prepared, a small hole penetrating in the height direction may be prepared in the drive circuit layer 26 by means of etching or drilling. Preferably, the small hole is formed between the adjacent TFT structures 261 of the drive circuit layer 26.

The pixel layer 25 is then formed on the drive circuit layer 26, during which the small hole is filled. A material corresponding to the position of the small hole in the pixel layer 25 and the drive circuit layer 26 may be removed to obtain the light through hole 200.

The protective material 2812 is then filled in the light through hole 200 corresponding to the pixel layer 25 and the drive circuit layer 26, and the protective material 2812 in the light through hole 200 is then perforated to regain a hole slightly smaller than the original light through hole 200.

At this moment, portions of the pixel layer 25 and the drive circuit layer 26 exposed in the light through hole 200 may be coated with the protective material 2812 so as to be protected by the protective material 2812.

The other layers of the display screen 20 are then mounted to the drive circuit layer 26 and the pixel layer 25. Each layer may selectively be drilled or cut after mounting so that the light through hole 200 penetrates through the display screen 20, or drilled or cut in alignment with the small hole after each layer is mounted so that the light through hole 200 penetrates through each layer of the display screen 20.

Referring to FIGS. 8 and 2-5B, another specific implementation mode of the display screen 20 according to the present invention is illustrated.

In the present example, at least a part of the protective material 2812 is filled around the light through hole 200 of the display screen 20 corresponding to the pixel layer 25.

A manufacturing method of the display screen 20 may include the following steps. The TFT structure 261, the anode layer 251, the light emitting layer 252, and the cathode layer 253 are sequentially formed on the substrate base 262. Further, the planarization layer 255 is formed after the TFT structure 261 is formed on the substrate base 262 and before the anode layer 251. At least a part of the planarization layer 255 in a thickness direction is removed by using one patterning process, and one of the light through holes 200 is formed. The light through hole 200 is formed through the drive circuit layer 26 and the planarization layer 255, and the anode layer 251, the pixel definition layer 256, and the cathode layer 253 are then formed on the planarization layer 255.

At least parts of the light emitting layer 252 and the cathode layer 253 corresponding to the perforated region in the thickness direction are removed by using an etching process. Specifically, at least parts of the pixel definition layer 256, the light emitting layer 252, and the cathode layer 253 corresponding to the perforated region may be removed by using an etching process so that at least a part of the planarization layer 255 is exposed.

The pixel layer 25 is then encapsulated with the protective material 2812, at least a part of the planarization layer 255 is covered with the protective material 2812, and the light through hole 200 is formed in the perforated region by means of cutting or drilling, so that the planarization layer 255 and the pixel definition layer 256 at an edge of the light through hole 200 may be covered with the protective material 2812.

In this way, the pixel layer 25 and the drive circuit layer 26 corresponding to the edge of the light through hole 200 may be selectively covered with the protective material 2812 as required. The protective material 2812 not only serves to protect the pixel layer 25, but also controls the size of the light through hole 200 by controlling a radial thickness of the protective material 2812.

In the present example, the light through hole 200 may be positioned in advance, and are preferably provided between the adjacent TFT structures 261 or between adjacent pixels to avoid influence on the performance of the entire display screen 20 while the light through hole 200 is provided.

Further, after the pixel layer 25 and the drive circuit layer 26 with the light through hole 200 are manufactured, the encapsulation layer 24, the polarization layer 23, the touch layer 22, and the cover plate layer 21 or the back plate layer 27 may be continuously mounted to the pixel layer 25 and the drive circuit layer 26 as required. The encapsulation layer 24, the polarization layer 23, the touch layer 22, and the cover plate layer 27 may be perforated in advance, may be perforated after being mounted to the pixel layer 25 and the drive circuit layer 26, or may be perforated uniformly after the entire display screen 20 is mounted.

It is worth noting that the cover plate layer 21 is not perforated, and the layers of the display screen 20 other than the cover plate layer 21 may be uniformly perforated from one side of the back plate layer 27 of the display screen 20 after the layers of the display screen 20 are mounted together.

Further, the cover plate layer 21 may be partially perforated. Specifically, at least a part of the cover plate layer 21 in the thickness direction may be perforated. For example, at least a part of the cover plate layer 21 in the thickness direction may be removed when the display screen 20 is perforated from the back plate layer 27 to the cover plate layer 21 on one side of the back plate layer 27 of the display screen 20. However, when viewed inward from one side of the cover plate layer 21 of the display screen 20, the cover plate layer 21 still completely covers the touch layer 22. The cover plate layer 21 may still protect the other layers of the display screen 20.

Figure 9:
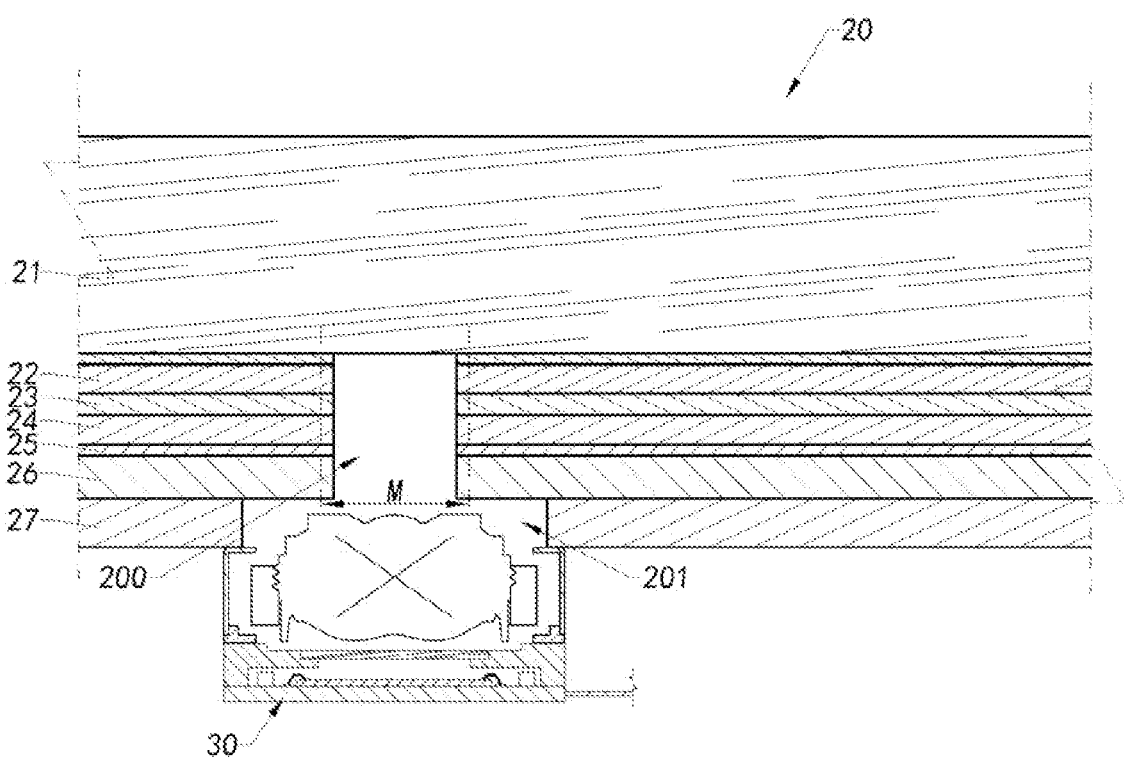
FIG. 9 is a schematic diagram of a display screen according to a preferred embodiment of the present invention.

Referring to FIG. 9, a specific implementation mode of the display screen 20 with the camera module 30 according to the present invention is illustrated.

The camera module 30 is fixedly mounted to the display screen 20, and the camera module 30 is aligned with the light through hole 200.

Specifically, the display screen 20 has a mounting channel 201, and at least a part of the camera module 30 can be accommodated in the mounting channel 201. The display screen 20 with the back plate layer 27 is described as an example. The mounting channel 201 is formed in the back plate layer 27.

The mounting channel 201 is located at a position corresponding to the light through hole 200, the mounting channel 201 is communicated with the light through hole 200, and the mounting channel 201 and the light through hole 200 are located in the height direction of the display screen 20. Preferably, an inner diameter of the mounting channel 201 is larger than that of other positions of the light through hole 200. At this moment, a cross-sectional size of the light through hole 200 of the display screen 20 is non-constant.

When the camera module 30 is mounted to the display screen 20 and partially accommodated in the mounting channel 201, the overall height of the camera module 30 and the display screen 20 can be reduced, thereby facilitating reduction of a height size of a mobile terminal.

The mounting channel 201 is slightly larger than the camera module 30, and a part of the mounting channel 201 not filled by the camera module 30 may be filled with a colloid so that the camera module 30 can be more firmly fixed to the display screen 20.

For example, a side surface of the camera module 30 may be adhered to the back plate layer 27 by a glue so that the camera module 30 is fixedly held in the mounting channel 201. A top surface of the camera module 30 may also be fixed to a back surface of the drive circuit layer 26 by means of an adhesive substance such as a glue, so as to facilitate the camera module 30 to be stably held in the mounting channel 201.

At least a part of the camera module 30 extends into the light through hole 200 of the display screen 20. When the camera module 30 extends into the light through hole 200, the size of the light through hole 200 corresponding to each layer of the display screen 20 may control the depth of the camera module 30 entering the light through hole 200.

In the present example, at least a part of the camera module 30 is accommodated in a part of the light through hole 200 corresponding to the back plate layer 27. A part of the light through hole 200 corresponding to each layer above the back plate layer 27 such as the drive circuit layer 26 and the pixel layer 25 may be smaller than the part of the light through hole 200 corresponding to the back plate layer 27, so that when viewed from a front side of the display screen 20, the light through hole 200 occupies a small area of the display screen 20. The front side of the display screen 20 is referred to herein as a side facing a user during normal use.

In other embodiments of the present invention, a front end portion of the camera module 30 may extend to the drive circuit layer 26, or even a part of the light through hole 200 corresponding to a part of the pixel layer 25. By controlling the size of the light through hole 200 corresponding to each layer, the depth of the camera module 30 extending into the display screen 20 may be controlled, so that an overall size of the camera module 30 and the display screen 20, in particular height sizes of the camera module 30 and the display screen 20, is controlled by designing the size of the light through hole 200 corresponding to each layer of the display screen 20.

Figure 10:
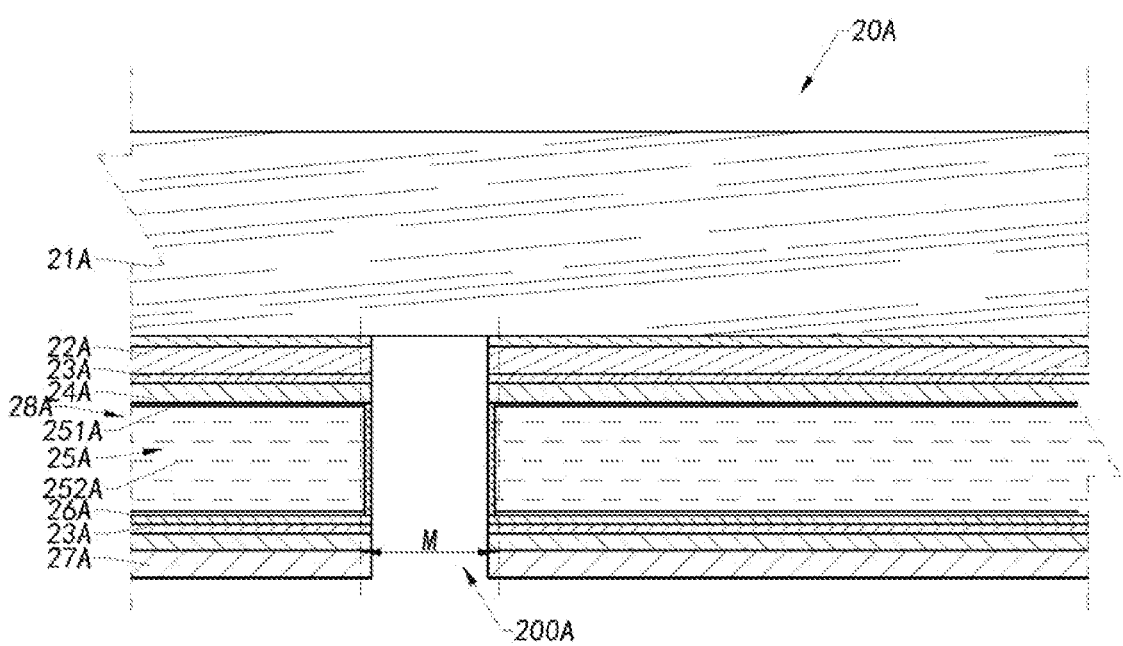
FIG. 10 is a schematic diagram of a display screen according to a preferred embodiment of the present invention.

Referring to FIG. 10, a display screen 20A with a light through hole 200A according to a preferred embodiment of the present invention is illustrated.

In the present example, the display screen 20A is implemented as a liquid crystal display (LCD) screen 20A. The display screen 20 includes a cover plate layer 21A, a touch layer 22A, a polarization layer 23A, an encapsulation layer 24A, a pixel layer 25A, a drive circuit layer 26A, and a back plate layer 27A. The drive circuit layer 26A is formed on a bottom side of the pixel layer 25A and electrically connected to the pixel layer 25A to drive the pixel layer 25A to operate. The encapsulation layer 24A is formed on a top side of the pixel layer 25A for encapsulating the pixel layer 25A. The pixel layer 25A includes pixels arranged in an array, and gaps are formed between the pixels, so that light sequentially transmitted through the cover plate layer 21A, the touch layer 22A, the polarization layer 23A, and the encapsulation layer 24A can pass through the pixel layer 25A via the gaps.

For the LCD screen 20A, liquid crystals of the pixel layer 25A are arranged orderly when energized.

In particular, the display screen 20A also has the light through hole 200A. The light through hole 200A penetrates through the touch layer 22A, the polarization layer 23A, the encapsulation layer 24A, the pixel layer 25A, and the drive circuit layer 26A.

The polarization layer 23A may be respectively located on both sides of the pixel layer 25A and implemented as a first polarizer and a second polarizer.

The pixel layer 25A includes a filter layer 251A (CF) and a liquid crystal 252A. The liquid crystal 252A is between the filter layer 251A and the drive circuit layer 26A. Taking a TFT-LCD as an example, the drive circuit layer 26A may include a plurality of TFT structures and a substrate base. The TFT structures are formed on the substrate base by the steps of thin film forming, yellow lighting, etching, stripping, etc.

The light through holes 200A are formed in the layers of the display screen 20A other than the cover plate layer 21A, and penetrate through the layers of the display screen 20A other than the cover plate layer 21A in a height direction of the display screen 20A.

Light above the display screen 20A or outside the display screen 20A may pass through the light through hole 200A to be received by the camera module 30 located below the display screen 20A or inside the display screen 20A.

A sealing material is provided around the light through hole 200A, so that the liquid crystal 252A cannot flow into the light through hole 200A, so as to avoid influence on the working performance of the camera module 30 or the display performance of the display screen 20A.

Further, the LCD screen 20A includes a liquid crystal layer 28A. The liquid crystal layer 28A includes the liquid crystal 252A, the filter layer 251A, and the drive circuit layer 26A.

There are mainly three manufacturing methods of the LCD screen 20A with the light through hole 200A. The first method is to uniformly perforate the layers of the LCD screen 20A after the layers of the LCD screen 20A are assembled together. The second method is to separately perforate the liquid crystal layer 28A of the LCD screen 20A, mount other layers of the LCD screen 20A on the liquid crystal layer 28A, and then uniformly perforate other layers of the LCD screen 20A. The third method is to separately perforate the liquid crystal layer 28A of the LCD screen 20A, mount other layers of the LCD screen 20A on the liquid crystal layer 28A layer by layer, and then perforate the layers of the LCD screen 20A layer by layer.

Those skilled in the art would know that the above is by way of example only and that the manufacturing methods of the LCD screen 20A with the light through hole 200A are not limited to the above examples.

Figure 11:
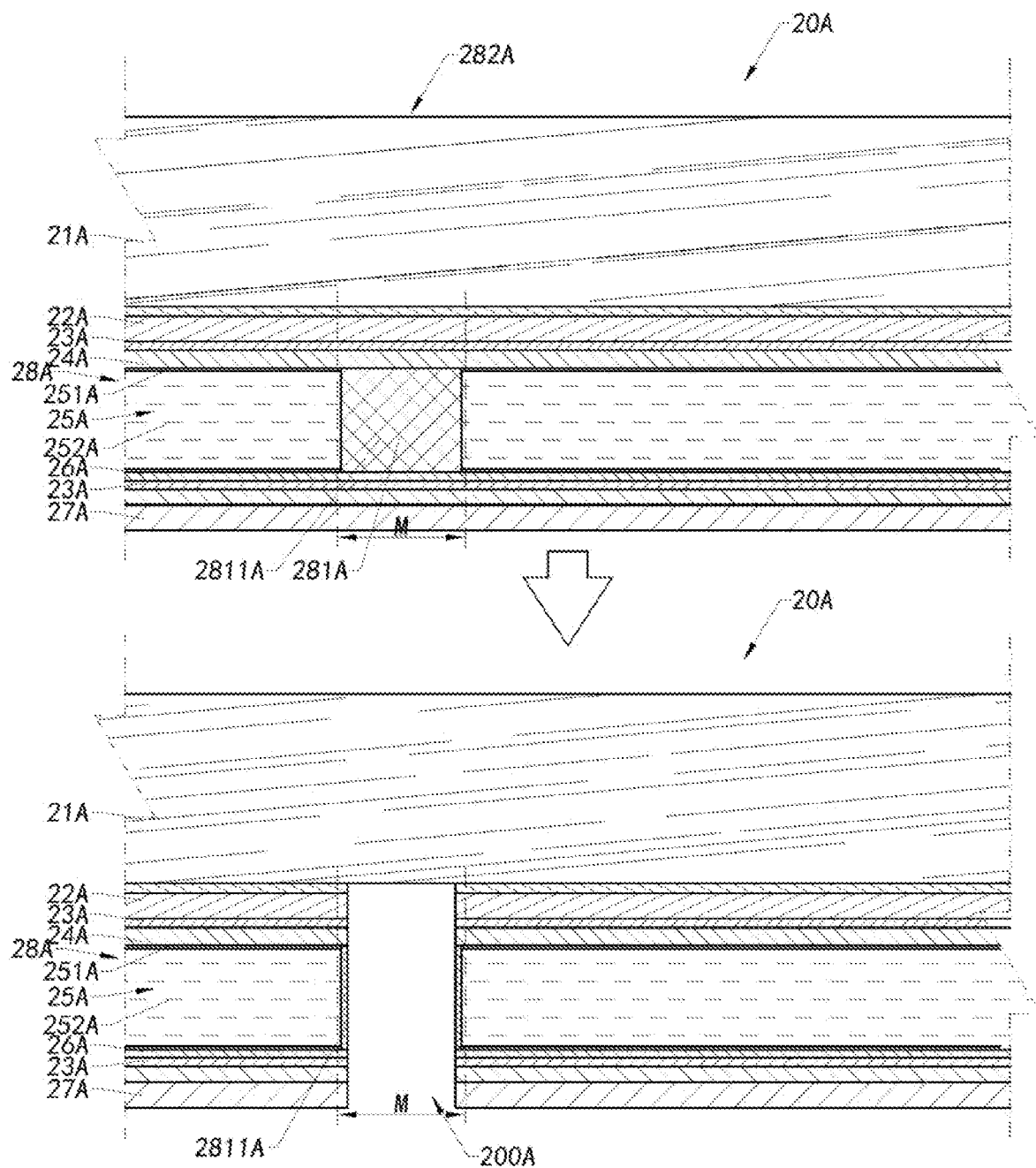
FIG. 11 is a schematic diagram of manufacture of a display screen according to a preferred embodiment of the present invention.

Referring to FIG. 11, a specific manufacturing method of the LCD screen 20A with the light through hole 200A according to the present invention is illustrated.

In the present example, the LCD screen 20A with the light through hole 200A may be obtained by single perforating.

Specifically, in the process of manufacturing the liquid crystal layer 28A, a sealing region 281A is formed between the drive circuit layer 26A and the filter layer 251A of the liquid crystal layer 28A. The sealing region 281A may be surrounded by a sealing material 2811A. The liquid crystal 252A of the liquid crystal layer 28A is mainly provided outside the sealing region 281A.

The layers of the LCD screen 20A are then assembled into a complete LCD screen 20A. The LCD screen 20A is perforated based on the sealing region 281A.

The LCD screen 20A has a perforated region 282A. The perforated region 282A overlaps the sealing region 281A and is not larger than the sealing region 281A. After the LCD screen 20A is perforated, at least a part of the sealing region 281A is removed, and the liquid crystal 252A located between the sealing regions 281A is blocked by the sealing material 2811A and thus cannot pass over the sealing material 2811A, so that the liquid crystal 252A cannot overflow to the position of the light through hole 200A.

In this way, the LCD screen 20A may obtain the light through hole 200A by a single perforating operation.

More specifically, the sealing material 2811A may be provided to a preset position of the drive circuit layer 26A of the liquid crystal layer 28A to form the sealing region 281A, and the sealing region 281A may be circular, triangular, or rectangular. The liquid crystal 252A is then filled at a position outside the sealing region 281A of the drive circuit layer 26A.

After the liquid crystal 252A is filled, the filter layer 251A may be mounted to the drive circuit layer 26A. The liquid crystal 252A is located between the drive circuit layer 26A and the filter layer 251A and is limited to a fixed region.

After the liquid crystal layer 28A is perforated, the perforated region 282A is smaller than the sealing region 281A, and at least a part of the sealing material 2811A can be held between the drive circuit layer 26A and the filter layer 251A, so that the liquid crystal 252A does not overflow at the position of the sealing material 2811A. The liquid crystal 252A can still be limited within the original fixed region.

In this way, the liquid crystal layer 28A can be perforated while keeping the liquid crystal 252A of the liquid crystal layer 28A from overflowing.

It is worth noting that after the display screen 20A is mounted, if the perforating can be performed outside the display screen 20A in alignment with the sealing region 281A, the perforating may be performed directly. For example, the sealing region 281A may be observed outside the display screen 20A.

If the sealing material 2811A is an opaque material and the position of the sealing region 281A cannot be determined outside the display screen 20A, a mark may be provided in the sealing region 281A so that the position of the sealing region 281A may be determined outside the display screen 20A.

It is worth noting that the sealing material 2811A may be positioned so as to avoid a corresponding circuit portion of the drive circuit layer 26A in the height direction to reduce the circuit influence on the drive circuit layer 26A.

Figure 12:
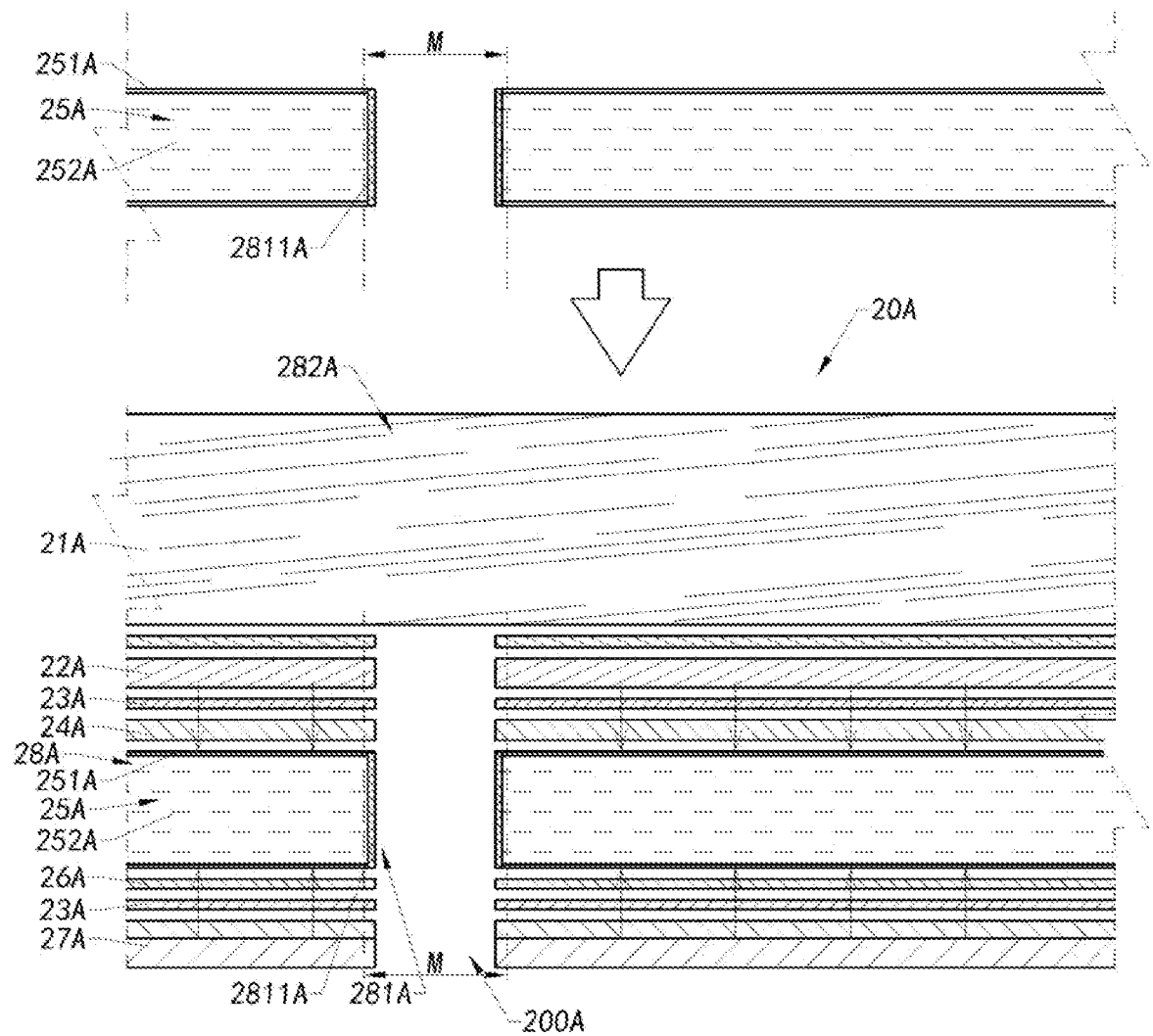
FIG. 12 is a schematic diagram of manufacture of a display screen according to a preferred embodiment of the present invention.

Referring to FIG. 12, a specific manufacturing method of the LCD screen 20A with the light through hole 200A according to the present invention is illustrated.

In the present example, the liquid crystal layer 28A is first perforated, and the other layers of the display screen 20A are then perforated.

Specifically, the sealing region 281A is provided to a preset region of the drive circuit layer 26A to prevent the liquid crystal 252A outside the sealing region 281A from flowing into the sealing region 281A during subsequent filling of the liquid crystal 252A. The drive circuit layer 26A may be perforated along a perforated region 282A after the sealing region 281A is provided. The perforated region 282A is located within the sealing region 281A. The drive circuit layer 26A and the filter layer 251A may be simultaneously perforated along the perforated region 282A after the filter layer 251A is mounted to the drive circuit layer 26A.

According to some embodiments of the present invention, the order of perforating the liquid crystal layer 28A may be: perforating the drive circuit layer 26A and then perforating the filter layer 251A.

For example, the drive circuit layer 26A within the sealing region 281A is first perforated based on the sealing region 281A, a preset region of the drive circuit layer 26A is filled with the liquid crystal 252A, the filter layer 251A is mounted to the drive circuit layer 26A, and the filter layer 251A is then perforated.

Further, after perforating the drive circuit layer 26A within the sealing region 281A, a region outside the sealing region 281A of the drive circuit layer 26A needs to be filled with the liquid crystal 252A so that the display screen 20A can operate normally in a subsequent step.

Further, according to other embodiments of the present invention, a perforated region 282A of the drive circuit layer 26A may be perforated, and a sealing material 2811A may be provided around the perforated region 282A to form the sealing region 281A. The liquid crystal 252A is filled outside the sealing region 281A and cannot flow into the sealing region 281A through the sealing material 2811A under the obstruction of the sealing material 2811A. That is, the liquid crystal 252A cannot flow to the position of the light through hole 200A after the perforating so as to help ensure a lighting effect of the light through hole 200A in a subsequent step.

The filter layer 251A is then mounted to the drive circuit layer 26A and perforated in alignment with the perforated region 282A of the drive circuit layer 26A. At this moment, the liquid crystal 252A between the filter layer 251A and the drive circuit layer 26A is still held outside the sealing region 281A and does not flow to the position of the light through hole 200A.

The other layers of the display screen 20A, such as the encapsulation layer 24A, the polarization layer 23A, the touch layer 22A, and the cover plate layer 21A, may be then mounted to the liquid crystal layer 28A in a certain order, respectively. The functional layers may be perforated layer by layer at the time of being mounted, or the layers may be simultaneously perforated after the other layers are mounted.

Preferably, in the present example, the cover plate layer 21A of the display screen 20A is not perforated. The manner of obtaining the display screen 20A with the light through hole 200A may be: first mounting each layer of the display screen 20A to obtain a complete display screen 20A, and then uniformly perforating the layers other than the cover plate layer 21A. Alternatively, the layers of the display screen 20A other than the cover plate layer 21A may be mounted and then perforated, and finally the cover plate layer 21A may be mounted to obtain the complete display screen 20A.

It is worth noting that it is also possible to perforate the cover plate layer 21A of the display screen 20A and then fill the cover plate layer 21A with a transparent material to prevent contaminants such as dust or moisture from entering the other layers of the display screen 20A through a part of the light through hole 200A corresponding to the cover plate layer 21A located at the outermost side.

It is worth noting that the perforated region 282A may be positioned in a variety of ways to facilitate subsequent accurate perforating before the layers are mounted to be uniformly perforated or before the layers are perforated layer by layer. The perforated region 282A may be positioned, for example, by mechanical identification, and the other layers are perforated at the same position based on the data.

It is worth noting that the sealing material 2811A for separating the light through hole 200A and the liquid crystal 252A may be provided to the drive circuit layer 26A, or the filter layer 251A, or both of the drive circuit layer 26A and the filter layer 251A.

According to other embodiments of the present invention, for example, the sealing material 2811A is provided to the filter layer 251A. After the drive circuit layer 26A is filled with the liquid crystal 252A, the filter layer 251A provided with the sealing material 2811A covers the drive circuit layer 26A. The liquid crystal 252A is separated within the sealing region 281A and outside the sealing region 281A by the sealing material 2811A. The sealing material 2811A provided to the filter layer 251A is closely attached to the drive circuit layer 26A, and the liquid crystal 252A located outside the sealing region 281A cannot pass into the sealing region 281A through the sealing material 2811A. The drive circuit layer 26A and the filter layer 251A are then perforated within the sealing region 281A to obtain the light through hole 200A penetrating through the drive circuit layer 26A and the filter layer 251A.

According to other embodiments of the present invention, the order of perforating the liquid crystal layer 28A may be: perforating the filter layer 251A and then perforating the drive circuit layer 26A.

For example, a perforated region 282A of the filter layer 251A may be perforated, and a sealing material 2811A may be then provided around the perforated region 282A to form the sealing region 281A. The liquid crystal 252A is filled outside the sealing region 281A and cannot flow into the sealing region 281A through the sealing material 2811A under the obstruction of the sealing material 2811A. That is, the liquid crystal 252A cannot flow to the position of the light through hole 200A after the perforating so as to help ensure a lighting effect of the light through hole 200A in a subsequent step.

After the filter layer 251A is perforated, the filter layer 251A is mounted to the drive circuit layer 26A while the sealing material 2811A provided to the filter layer 251A is closely attached to the drive circuit layer 26A, and the sealing material 2811A forms the sealing region 281A.

The drive circuit layer 26A is then perforated in alignment with the perforated region 282A of the filter layer 251A. After the drive circuit layer 26A is perforated, the liquid crystal 252A in the sealing region 281A can flow to the outside.

Further, the entire display screen 20A may be perforated after mounting other layers of the display screen 20A, for example, the encapsulation layer 24A, the polarization layer 23A, the touch layer 22A, and the back plate layer 27A, so that the light through hole 200A of the filter layer 251A penetrates through the layers of the display screen 20A other than the cover plate layer 21A.

In the process of mounting other layers of the display screen 20A, the layers which have been mounted in alignment are perforated. For example, after the polarization layer 23A and the touch layer 22A are mounted, the polarization layer 23A and the touch layer 22A are perforated so that the light through hole 200A of the filter layer 251A penetrates through the layers of the display screen 20A other than the cover plate layer 21A. The cover plate layer 21A is then mounted to obtain the complete display screen 20A.

According to other embodiments of the present invention, the order of perforating the liquid crystal layer 28A may be: perforating the filter layer 251A and the drive circuit layer 26A simultaneously.

For example, the sealing material 2811A is provided between the filter layer 251A and the drive circuit layer 26A. The sealing material 2811A may be provided to the filter layer 251A or the drive circuit layer 26A or both of the filter layer 251A and the drive circuit layer 26A.

The perforated region 282A is formed within the sealing region 281A. After the liquid crystal layer 28A is perforated, at least a part of the sealing material 2811A remains between the filter layer 251A and the drive circuit layer 26A to prevent the liquid crystal 252A between the filter layer 251A and the drive circuit layer 26A from flowing out.

The process of perforating the liquid crystal layer 28A may be: providing the sealing material 2811A on the drive circuit layer 26A and then filling the drive circuit layer 26A with a liquid crystal 252A material. The liquid crystal 252A material is located outside the sealing region 281A formed by the sealing material 2811A.

It will be understood that the sealing material 2811A may be transparent or have a high transmittance to facilitate the propagation of light at the position of the light through hole 200A corresponding to the liquid crystal layer 28A. The sealing material 2811A may be a light-shielding material to reduce the influence of stray light near the position of the light through hole 200A corresponding to the liquid crystal layer 28A on the light through effect of the light through hole 200A. That is, the type of the sealing material 2811A may be selectively set as required.

The filter layer 251A is then mounted to the drive circuit layer 26A. The sealing material 2811A, the drive circuit layer 26A, and the filter layer 251A form one sealing region 281A therebetween. For the sealing region 281A, the liquid crystal 252A outside the sealing region 281A cannot flow into the sealing region 281A.

After the filter layer 251A and the drive circuit layer 26A are mounted together to form the liquid crystal layer 28A, the liquid crystal layer 28A may be perforated, or after the entire display screen 20A is mounted, the entire display screen 20A is perforated in alignment with the sealing region 281A.

Further, it will be understood that after the liquid crystal layer 28A is perforated, the order of perforating the other layers of the display screen 20A may be selected as required. The encapsulation layer 24A may be mounted to the liquid crystal layer 28A, and the encapsulation layer 24A is then perforated in alignment with the liquid crystal layer 28A. The touch layer 22A is then mounted to the encapsulation layer 24A, and the touch layer 22A is then perforated in alignment with the liquid crystal layer 28A and the encapsulation layer 24A.

After the layers above the liquid crystal layer 28A are mounted, the layers above the liquid crystal layer 28A may be uniformly perforated. After the layers below the liquid crystal layer 28A are mounted, the layers below the liquid crystal layer 28A are then uniformly perforated.

The layers of the display screen 20A may also be pre-drilled and then mounted in alignment with the liquid crystal layer 28A.

Further, if the entire LCD screen 20A needs to be perforated, that is, when the entire LCD screen 20A is perforated in the case where the cover plate layer 21A is also perforated, the polarization layer 23A is made of an opaque material, and the cover plate layer 21A and the touch layer 22A may be made of a light transmitting material. The opaque material obstructs the view of the sealing region 281A of the liquid crystal layer 28A from the outside of the display screen 20A, thereby not facilitating perforating in alignment with the sealing region 281A. Therefore, the polarization layer 23A may be perforated. The cover plate layer 21A is then perforated so that the cover plate layer 21A can be perforated based on the portion of the light through hole 200A of the polarization layer 23A at the time of being perforated, and the portions of the light through hole 200A of the layers can be aligned with each other.

Figure 13:
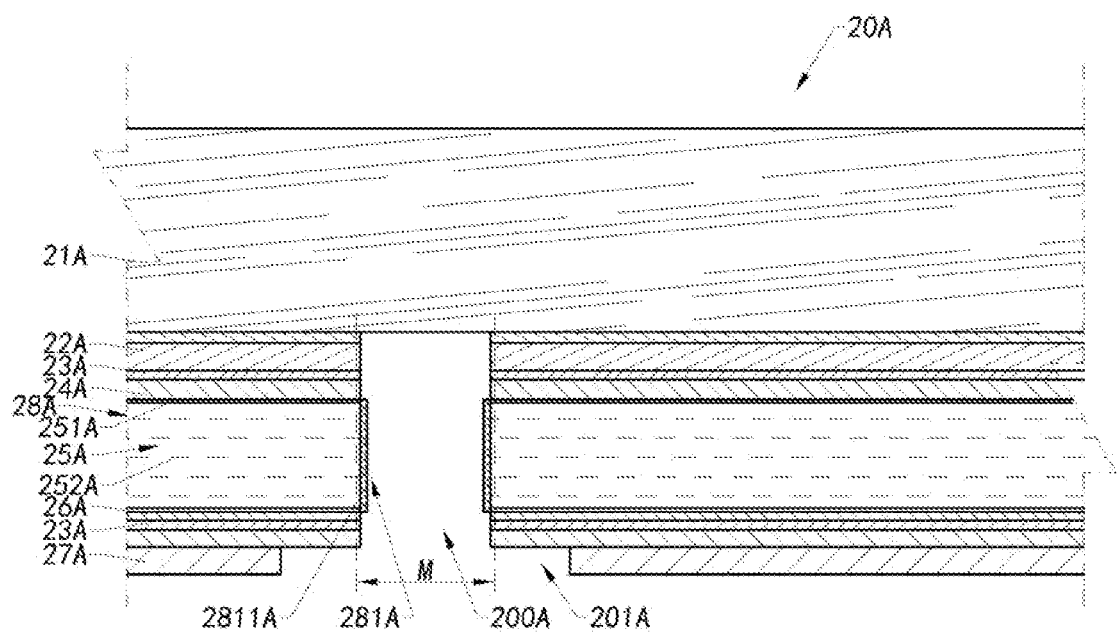
FIG. 13 is a schematic diagram of a display screen according to a preferred embodiment of the present invention.

Referring to FIG. 13, a specific implementation mode of the LCD screen 20A according to the present invention is illustrated. In the above embodiment, the inner diameters of the portions of the light through hole 200A corresponding to the layers of the LCD screen 20A are of the same size.

In the present embodiment, the inner diameters of the portions of the light through hole 200A corresponding to the layers of the LCD screen 20A are of different sizes.

After the liquid crystal layer 28A is formed, the encapsulation layer 24A, the polarization layer 23A, the touch layer 22A, and the cover plate layer 21A may be mounted above the liquid crystal layer 28A, and another polarization layer 23A and the back plate layer 27A may be mounted below the liquid crystal layer 28A. The back plate layer 27A of the LCD screen 20A is indispensable, and the back plate layer 27A can emit light when energized.

The liquid crystal layer 28A may be perforated in advance, and the encapsulation layer 24A, the polarization layer 23A, the touch layer 22A, and the cover plate layer 21A are then mounted. The encapsulation layer 24A, the polarization layer 23A, and the touch layer 22A may be perforated in advance or may be uniformly perforated after being mounted together. Another polarization layer 23A mounted below the liquid crystal layer 28A may be perforated in advance or perforated after being mounted to the liquid crystal layer 28A. The cover plate layer 21A may be mounted to the touch layer 22A after the other layers of the display screen 20A are perforated, or after the layers including the cover plate layer 21A are mounted together, the layers of the display screen 20A other than the cover plate layer 21A may be perforated.

The inner diameter of the portion of the light through hole 200A corresponding to the liquid crystal layer 28A may be different from the inner diameters of the other layers of the display screen 20A. For example, in the present example, the inner diameter of the portion of the light through hole 200A corresponding to the liquid crystal layer 28A is slightly smaller than that corresponding to the encapsulation layer 24A, the polarization layer 23A, and the touch layer 22A.

In other embodiments of the present invention, the touch layer 22A, the polarization layer 23A, the encapsulation layer 24A, and the liquid crystal layer 28A of the LCD screen 20A from top to bottom may obtain the light through hole 200A with a uniform inner diameter by a process of laser cutting, drilling, etc.

For the back plate layer 27A located below the liquid crystal layer 28A, the back plate layer 27A may be separately perforated, and the inner diameter of the portion of the light through hole 200A corresponding to the back plate layer 27A may be different from the inner diameters of the portions of the light through hole 200A corresponding to the liquid crystal layer 28A, the touch layer 22A, and the polarization layer 23A.

In the present example, the inner diameter of the portion of the light through hole 200A corresponding to the back plate layer 27A is larger than that of the portion of the light through hole 200A corresponding to the liquid crystal layer 28A. The portion of the light through hole 200A corresponding to the back plate layer 27A is communicated with the portion of the light through hole 200A corresponding to the liquid crystal layer 28A.

The display screen 20A has a mounting channel 201A. The mounting channel 201A is formed on the back plate layer 27A and is communicated with the light through hole 200A.

Optionally, the portion of the light through hole 200A corresponding to the back plate layer 27A is larger than the sealing region 281A. At least a part of the camera module 30 may be accommodated in the back plate layer 27A to facilitate reduction of the height sizes of the camera module 30 and the display screen 20A.

Further, with reference to FIG. 9, a mounting end of the camera module 30 includes a portion of lens and lens barrel. The portion of the light through hole 200A of the back plate layer 27A may be designed to be large enough to accommodate the portions of the lens and the lens barrel. For the portions of the light through hole 200A corresponding to the liquid crystal layer 28A and each layer above the liquid crystal layer 28A, the aperture size of the light through hole 200A may meet the light entering requirements of the camera module 30. In other words, when the camera module 30 extends into the LCD screen 20A, the camera module 30 is mounted in the LCD screen 20A, so that the mounting height of the camera module 30 and the LCD screen 20A is reduced. The light through hole 200A located above can still be designed to be small enough so that the light through hole 200A is not easily observed outside the display screen 20A, and the light through hole 200A may provide a sufficient mounting space for the camera module 30.

It will be understood that the camera module 30 can not only be accommodated in the portion of the light through hole 200A corresponding to the back plate layer 27A, and the camera module 30 can also penetrate further into the LCD screen 20A. For example, the camera module 30 may be further accommodated in the portion of the light through hole 200A corresponding to the drive circuit layer 26A.

Figure 14A:
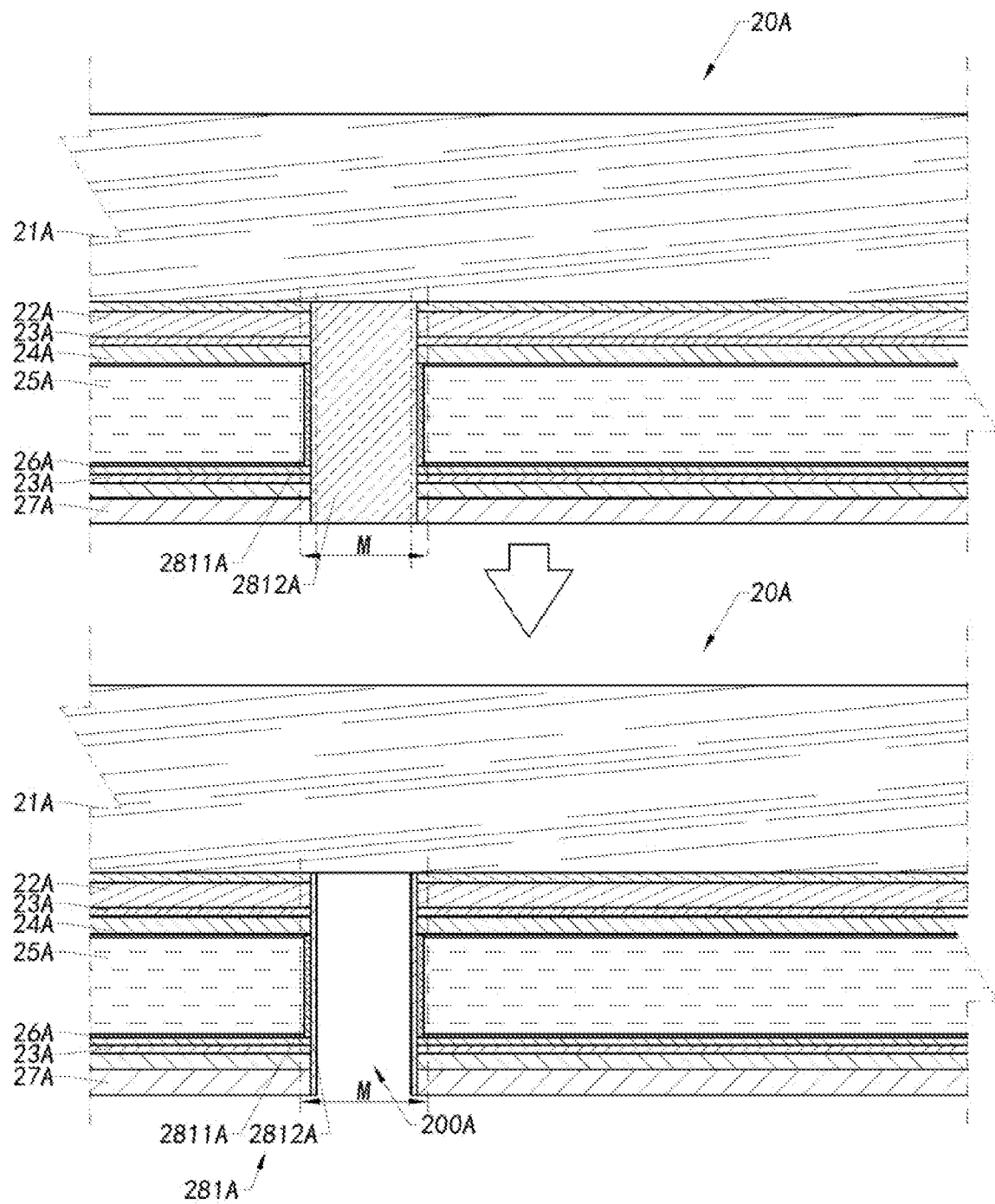
FIG. 14A is a schematic diagram of manufacture of a display screen according to a preferred embodiment of the present invention.

Referring to FIG. 14A, a specific implementation mode of the LCD screen 20A according to the present invention is illustrated.

In the present embodiment, the cover plate layer 21A of the display screen 20A is not perforated. The touch layer 22, the polarization layer 23, the encapsulation layer 24, the pixel layer 25, the drive circuit layer 26, and the back plate layer 27 may be perforated respectively, and the protective material 2812 may be then filled at the perforating position.

The light entering quality of the camera module 30 is influenced by the light through hole 200A. Specifically, the materials of the layers of the LCD screen 20A around the light through hole 200A may reflect and refract light entering the light through hole 200A, so that light entering the camera module 30 is influenced by the materials around the light through hole 200A.

Based on different materials of the layers and different positions of the light through holes 200A, it is difficult to achieve the same level of the materials around each of the light through holes 200A on the production line, that is, it is difficult to keep the light entering quality of the light through holes 200A consistent, debugging is required at a later stage.

In the present example, after obtaining the LCD screen 20A with the light through hole 200A, certain amount of protective material 2812A may be poured into the light through hole 200A. The protective material 2812A may protect the layers around the light through hole 200A, such as the drive circuit layer 26A, to reduce corrosion of the drive circuit layer 26A by water and oxygen.

After the protective material 2812A is filled in the light through hole 200A, at least a part of the protective material 2812A may be removed by means of drilling or laser cutting so that at least a part of the position around the light through hole 200A is filled with the protective material 2812A.

The protective material 2812A may be a light transmitting material, and light may be transmitted through the protective material 2812A. The protective material 2812A may be an opaque material, and stray light around the light through hole 200A may not be received by the camera module 30 through the protective material 2812A. The material of the protective material 2812A may be selected based on requirements to control the light entering quality of the light through hole 200A by controlling the protective material 2812A in the light through hole 200A.

It is worth mentioning that when there is a certain deviation in the portions of the light through hole 200A corresponding to the layers due to a machining process or a mounting process, the portions of the light through hole 200A corresponding to the layers may be compensated to a certain extent by the protective material 2812A.

Figure 14B:
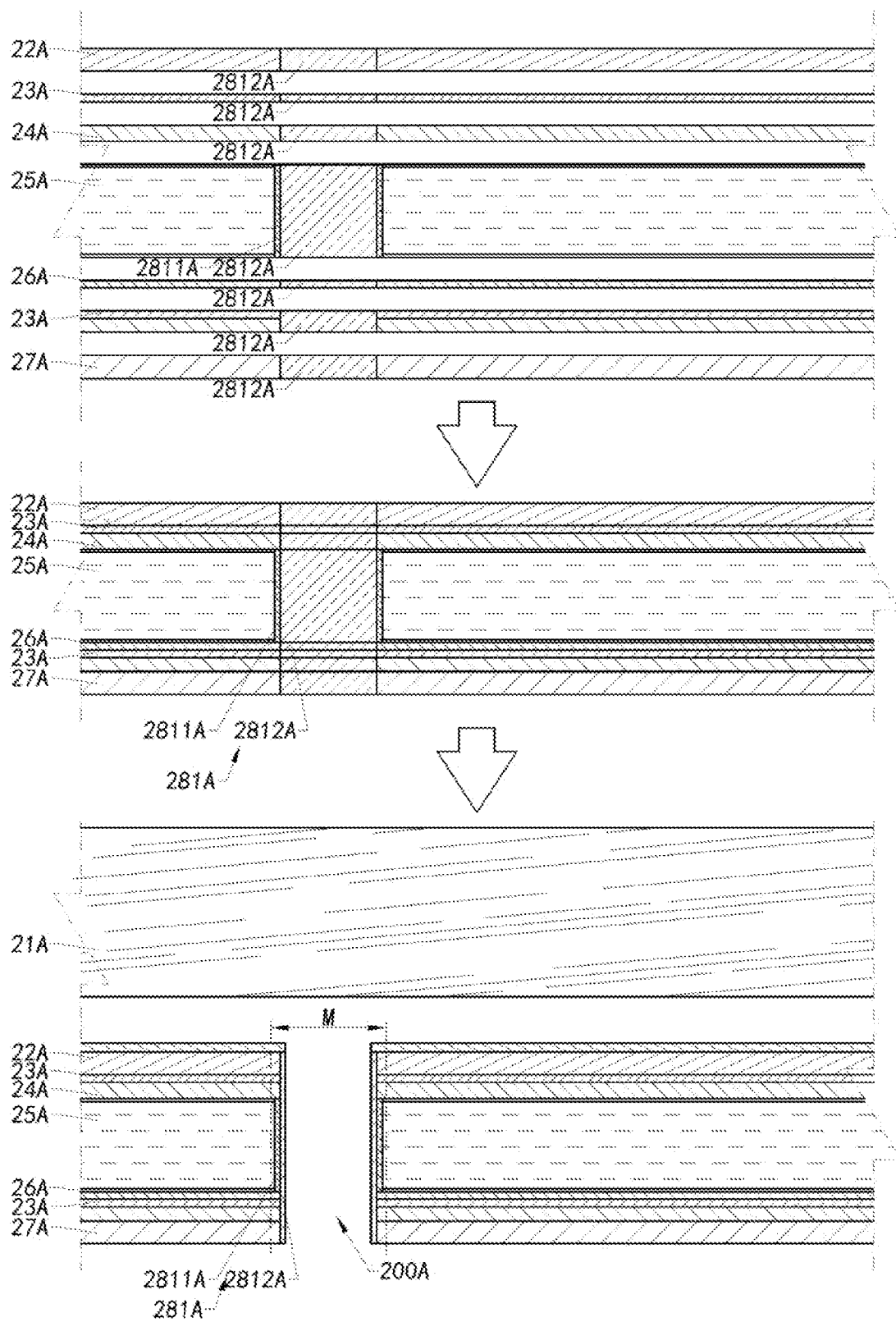
FIG. 14B is a schematic diagram of manufacture of a display screen according to a preferred embodiment of the present invention.

FIG. 14B is another implementation mode of the LCD screen 20A according to the present invention. The difference from the display screen 20A shown in FIG. 14A is that in the present implementation mode, the layers of the display screen 20A are separately perforated and then filled with the protective material 2812A.

Specifically, the touch layer 22A, the polarization layer 23A, the encapsulation layer 24A, the pixel layer 25A, the drive circuit layer 26A, and the back plate layer 27A may be perforated respectively, and the protective material 2812A may be then filled at the perforating position.

The touch layer 22A, the polarization layer 23A, the encapsulation layer 24A, the pixel layer 25A, the drive circuit layer 26A, and the back plate layer 27A are then mounted together in alignment to form the display screen 20A. At this moment, the display screen 20A may be used as a display screen with a "hole". Transparent materials corresponding to the touch layer 22A, the polarization layer 23A, the encapsulation layer 24A, the pixel layer 25A, the drive circuit layer 26A, and the back plate layer 27A may function as holes.

Further, the touch layer 22A, the polarization layer 23A, the encapsulation layer 24A, the pixel layer 25A, the drive circuit layer 26A, and the back plate layer 27A are perforated simultaneously, and a part of the protective material 2812A may be left around the light through hole 200A. The cover plate layer 21A is then mounted to obtain the display screen 20A.

Figure 15:
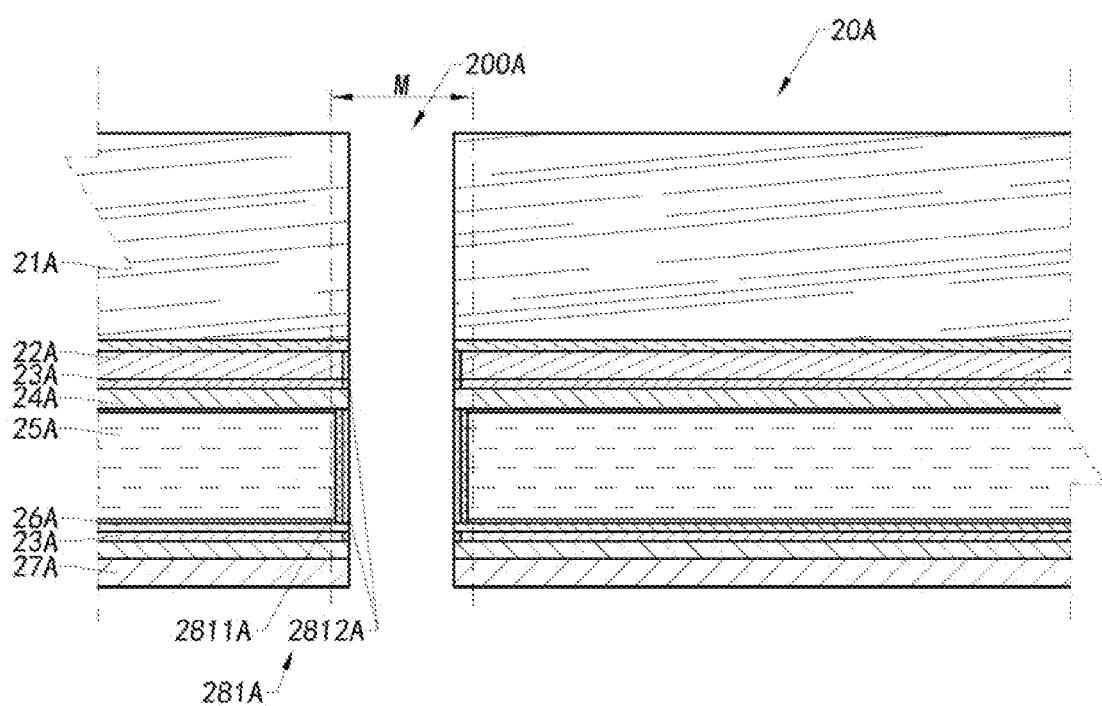
FIG. 15 is a schematic diagram of a display screen according to a preferred embodiment of the present invention.
Figure 16:
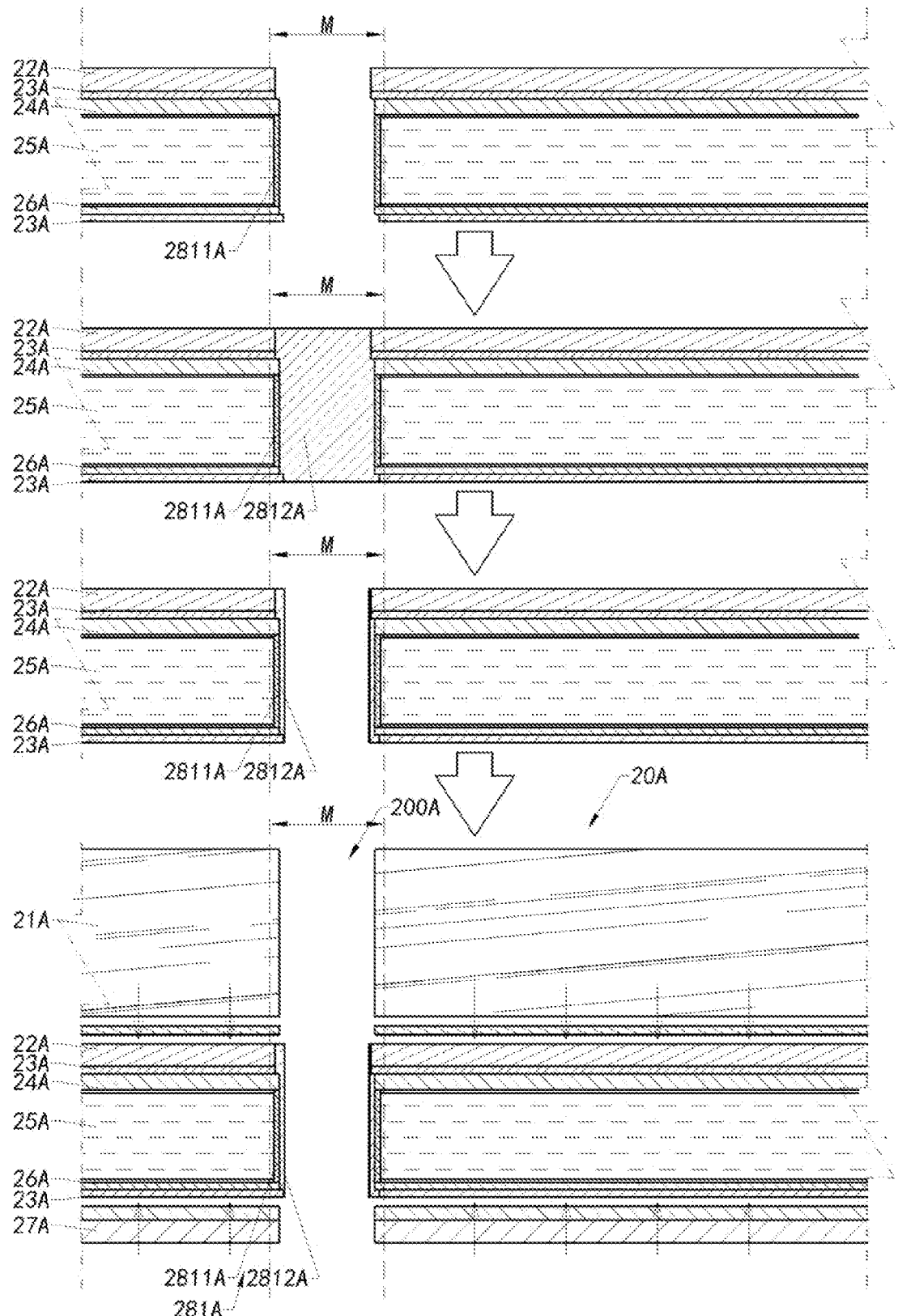
FIG. 16 is a schematic diagram of manufacture of a display screen according to a preferred embodiment of the present invention.

Referring to FIGS. 15 and 16, a specific implementation mode of the LCD screen 20A according to the present invention is illustrated.

The portion of the light through hole 200A corresponding to the liquid crystal layer 28A, the portion of the light through hole 200A corresponding to the polarization layer 23A, and the portion of the light through hole 200A corresponding to the cover plate layer 21A are not aligned, which may be caused by various factors such as factors that control the accuracy of a perforating position in the perforating process, or factors that control the accuracy of alignment in the mounting process, or factors that cause deviation when fixing in the mounting process.

The protective material 2812A is poured into the light through hole 200A, the protective material 2812A fills the light through hole 200A, and at least a part of the protective material 2812A is then removed according to a certain perforating region 282A to reform the light through hole 200A. At this moment, the inner diameter of the light through hole 200A can be kept uniform.

It will be certainly understood that in the present example, after the entire LCD screen 20A is mounted, the light through hole 200A is re-processed. In other embodiments of the present invention, the light through hole 200A may be adjusted after some functional layers of the LCD screen 20A are mounted together.

For example, when the liquid crystal layer 28A, the polarization layer 23A, and the touch layer 22A are assembled together, the portions of the light through hole 200A corresponding to the liquid crystal layer 28A, the polarization layer 23A, and the touch layer 22A have a certain deviation, the portions of the light through hole 200A corresponding to the liquid crystal layer 28A, the polarization layer 23A, and the touch layer 22A may be filled with the protective material 2812A, and the light through hole 200A is then formed secondarily. Another polarization layer 23A and a backlight plate are then mounted to the liquid crystal layer 28A.

The protective material 2812A may not cover the portions of the light through hole 200A corresponding to the polarization layer 23A and the back plate layer 27A, referring to FIG. 15.

In this way, the protective material 2812A may selectively cover the layers of the LCD screen 20A.

Figure 17:
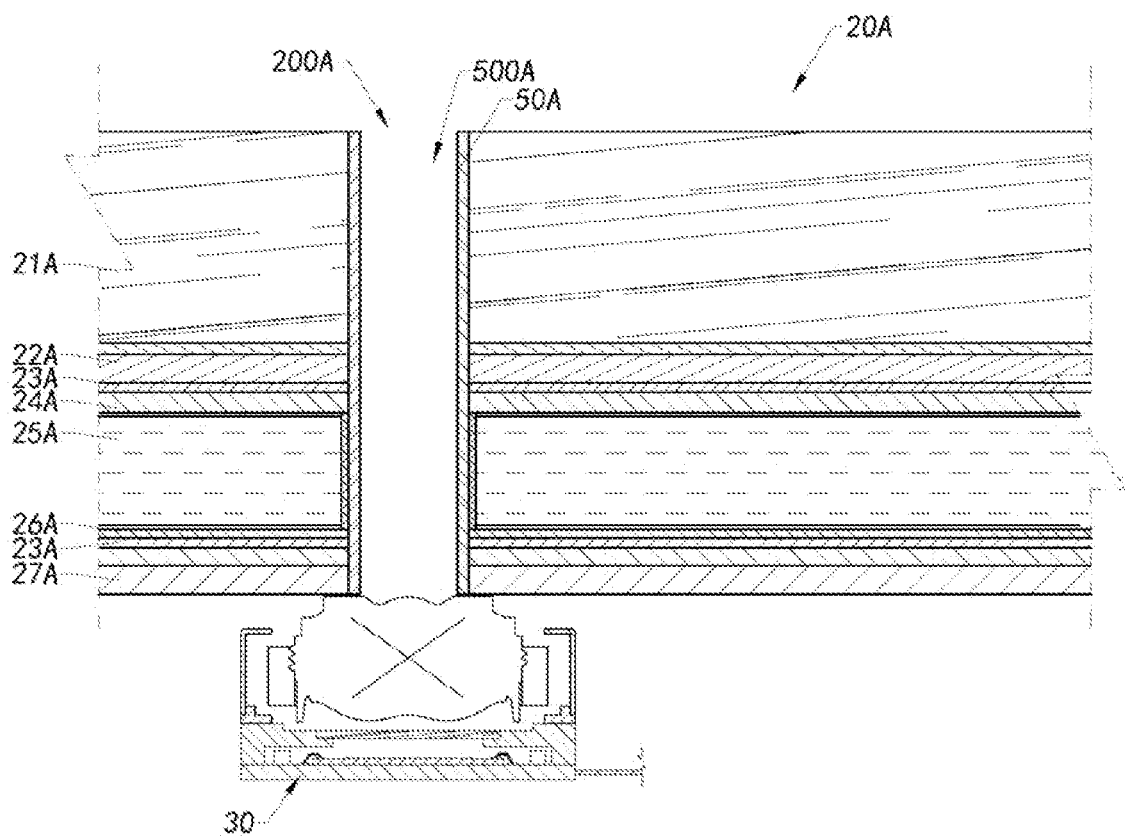
FIG. 17 is a schematic diagram of a display screen according to a preferred embodiment of the present invention.

Referring to FIG. 17, a specific implementation mode of the LCD screen 20A according to the present invention is illustrated.

The LCD screen 20A has a light through hole 200A, and a light guide assembly 50A is provided in the light through hole 200A. The light guide assembly 50A has a light guide channel 500A, and light can pass through the LCD screen 20A along the light guide channel 500A.

Specifically, the LCD screen 20A includes a cover plate layer 21A, a touch layer 22A, a polarization layer 23A, an encapsulation layer 24A, a pixel layer 25A, a drive circuit layer 26A, and a back plate layer 27A. The polarization layer 23A is located on opposite sides of the pixel layer 25A respectively.

The cover plate layer 21A is located on the top of the LCD screen 20A. The touch layer 22A can transmit a signal when being touched. The encapsulation layer 24A is used for encapsulation. The pixel layer 25A includes a filter layer 251A (CF) and a liquid crystal 252A. The liquid crystal 252A is located between the filter layer 251A and the drive circuit layer 26A. The drive circuit layer 26A includes a plurality of TFT structures and the substrate base. The TFT structures are formed on the substrate base by the steps of thin film forming, yellow lighting, etching, stripping, etc. The back plate layer 27A is configured to emit light.

The LCD screen 20A further includes a liquid crystal layer 28A. The liquid crystal layer 28A includes the liquid crystal 25A and the drive circuit layer 26A. The liquid crystal 252A is located between the filter layer 251A and the drive circuit layer 26A.

The light through hole 200A penetrates through the layers of the LCD screen 20A, and the light guide assembly 50A is accommodated in the light through hole 200A.

The light through hole 200A may be formed by perforating each layer of the LCD screen 20A, or formed by perforating the liquid crystal layer 28A of the LCD screen 20A, closing the liquid crystal layer 28A to prevent the liquid crystal 252A in the liquid crystal layer 28A from leaking to the outside, and then perforating the other layers of the LCD screen 20A.

In the former manner, specifically, the liquid crystal layer 28A is pre-processed during manufacturing to form a sealing region 281A. The sealing region 281A is unfilled with the liquid crystal 252A. The liquid crystal 252A is located outside the sealing region 281A. For example, a sealing material 2811A may be provided between the filter layer 251A and the drive circuit layer 26A to form the sealing region 281A.

In the latter manner, specifically, the liquid crystal layer 28A is pre-processed during manufacturing to form a sealing region 281A. The sealing region 281A is unfilled with the liquid crystal 252A. The liquid crystal 252A is located outside the sealing region 281A. For example, a sealing material 2811A may be provided between the filter layer 251A and the drive circuit layer 26A to form the sealing region 281A.

The liquid crystal layer 28A is then perforated based on the sealing region 281A. The other layers of the LCD screen 20A are then aligned with the liquid crystal layer 28A for perforating.

In the present example, the inner diameter of the light through hole 200A may be set slightly larger to accommodate the light guide assembly 50A. It is worth noting that when the portions of the light through hole 200A corresponding to the layers of the LCD screen 20A slightly deviate, the light guide assembly 50A can supplement, to some extent, the deviation between the layers caused by the LCD screen 20A during mounting.

Specifically, when the portions of the light through hole 200A corresponding to the layers of the LCD screen 20A slightly deviate, at least a part of light entering the light through hole 200A is lost when being transferred in the light through hole 200A. When the light guide assembly 50A is provided in the light through hole 200A, most of the light can propagate directly along the light guide channel 500A of the light guide assembly 50A, thereby reducing the loss of light in the LCD screen 20A due to a mounting deviation between the layers.

The light guide performance of the light guide assembly 50A may be set based on requirements. When the light guide efficiency requirement for the light guide assembly 50A is high, the light guide assembly 50A may be provided as a transparent material. When it is required to reduce the influence of external stray light on the light in the light guide channel 500A, an outer wall of the light guide assembly 50A may be coated with a light-shielding material.

Figure 18A:
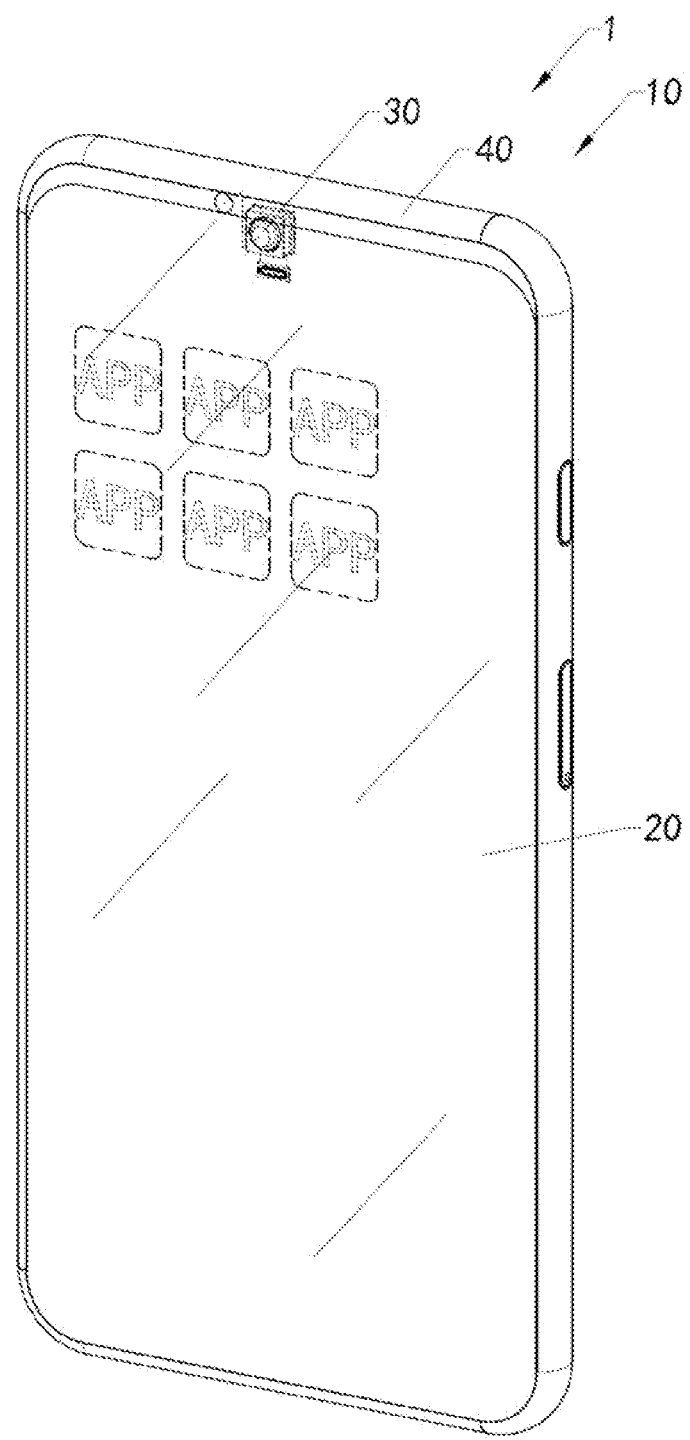
FIG. 18A is a schematic diagram of application of a display screen according to a preferred embodiment of the present invention.
Figure 18B:
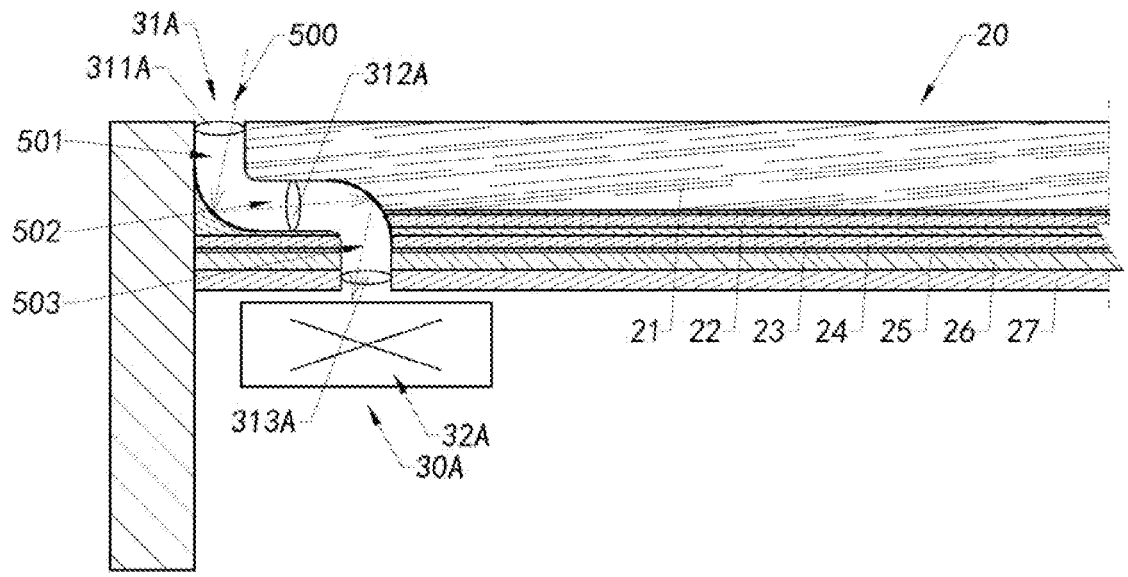
FIG. 18B is a schematic diagram of application of a display screen according to a preferred embodiment of the present invention.

Referring to FIGS. 18A and 18B, an implementation mode of the terminal device 1 based on the present invention is illustrated.

The terminal device 1 includes a terminal device body 10, a display screen 20, and a camera module 30. The display screen 20 and the camera module 30 are provided to the terminal device body 10 respectively. The display screen 20 is configured to display an image, and the camera module 30 is held below the display screen 20 to facilitate the design of the display screen 20 as a full screen.

The terminal device 1 further includes a housing 40 and has a light guide channel 500. The display screen 20 is mounted to the housing 40. The housing 40 is located at the periphery of the display screen 20 for supporting the display screen 20 and also protecting the display screen 20.

The light guide channel 500 is formed between the display screen 20 and the housing 40. The light guide channel 500 conducts the outside and the camera module 30, so that external light is conducted to the camera module 30 via the light guide channel 500.

In this way, the camera module 30 can be provided below the display screen 20 without occupying a display region of the display screen 20, so that the display screen 20 can achieve the effect of a full screen.

Specifically, the terminal device 1 has at least one light guide channel 500. At least a part of the light guide channel 500 is formed between the display screen 20 and the housing 40, and at least a part of the light guide channel 500 is formed in the display screen 20, so as to transfer light to the camera module 30 located below the display screen 20. Some light guide elements may be provided in the light guide channel 500 so that a propagation direction of light linearly propagating can be changed, and the light is conducted from the outside of the display screen 20 to the camera module 30 located inside the display screen 20 via the light guide channel 500. The light guide element may be a reflecting film or a reflecting mirror.

In other embodiments of the present invention, at least a part of the light guide channel 500 is located between the display screen 20 and the housing 40, and the remaining part may be located below the display screen 20. That is, the light guide channel 500 bypasses the side surface of the display screen 20 to reach below the display screen 20, and then guides light to the camera module 30.

In the present example, taking an OLED display screen 20 as an example, the light guide channel 500 may selectively be formed on the layers of the OLED display screen 20, such as the pixel layer 25, the drive circuit layer 26, or the back plate layer 27. Preferably, when the light guide channel 500 penetrates through the pixel layer 25, the light guide channel 500 is provided between the adjacent pixels to reduce the influence on an imaging effect. Preferably, when the light guide channel 500 penetrates through the drive circuit layer 26, the light guide channel 500 is provided to a non-circuit part of the drive circuit layer 26 to reduce the influence on the working performance of the drive circuit layer 26.

In the present example, the light guide channel 500 penetrates through the back plate layer 27, and light is then transferred to the camera module 30 located below the display screen 20 via the light guide channel 500.

The light guide channel 500 includes a first partial light guide channel 501, a second partial light guide channel 502, and a third partial light guide channel 503. The first partial light guide channel 501 is located between the display screen 20 and the housing 40. It is worth noting that when the display screen 20 is mounted to the housing 40, a gap naturally exists between the display screen 20 and the housing 40. The desired first partial light guide channel 501 may be obtained by designing an edge of the display screen 20 or an edge of the housing 40.

The second partial light guide channel 502 is located in the display screen 20, and the third partial light guide channel 503 is located in the display screen 20. The second partial light guide channel 502 is configured to transfer light from the outside into the display screen 20 via the first partial light guide channel 501. The third partial light guide channel 503 is configured to transfer light in the display screen 20 outward to the camera module 30.

The second partial light guide channel 502 may conduct light along a length-width direction of the display screen 20, and the third partial light guide channel 503 may conduct light along a height direction of the display screen 20.

Further, the first partial light guide channel 501 of the light guide channel 500 may serve to converge light so that more light enters the second partial light guide channel 502 after passing through the first partial light guide channel 501. The second partial light guide channel 502 may serve to transfer light.

In the present example, the camera module 30 is mounted to the display screen 20 and located below the display screen 20. The camera module 30 images based on the light of the light guide channel 500. The third partial light guide channel 503 may be configured to diffuse light so that the diffused light matches a light receiving region of the camera module 30.

The first partial light guide channel 501 may be provided with a micro-convex lens to converge light. The second partial light guide channel 502 may be provided with at least one reflecting mirror or other modulating devices so that light is transferred along the second partial light guide channel 502 to the third partial light guide channel 503. The third partial light guide channel 503 may be provided with a micro-concave lens to enable light to be diffused.

Further, the camera module 30 includes an optical unit 31A and a photosensitive unit 32A. The optical unit 31A collects light, and the photosensitive unit 32A receives the light collected by the optical unit 31A and converts an optical signal into an electrical signal based on photoelectric conversion for subsequent imaging. The optical unit 31A may include a converging member 311A, a modulating member 312A, and a diffusing member 313A. The converging member 311A can converge light. The modulating member 312A can modulate light, such as filtering, dispersing, or collimating. The diffusing member 313A can diffuse light.

The optical unit 31A may be provided to the light guide channel 500, such as the first partial light guide channel 501, the second partial light guide channel 502, and the third partial light guide channel 503. The photosensitive unit 32A is provided directly to the display screen 20 and located below the display screen 20. After the light is collected by the optical unit 31A, the photosensitive unit 32A converts an optical signal into an electrical signal.

Specifically, the converging member 311A may be provided to the first partial light guide channel 501 for converging light entering the light guide channel 500 from the outside so that an inner diameter of the second partial light guide channel 502 can be designed to be small while transferring more light. The modulating member 312A may be provided to the second partial light guide channel 500. The diffusing member 313A may be provided to the third partial light guide channel 503 to diffuse light to a photosensitive region corresponding to the photosensitive unit 32A of the camera module 30.

In this way, the portion of the light guide channel 500 in the display screen 20 may be set to a small size to reduce the influence of the light guide channel 500 on the imaging of the display screen 20. The manufacture and formation of the light guide channel 500 in the display screen 20 may be as previously described.

The optical unit 31A may include, but is not limited to, a concave lens, a convex lens, and other optical components.

Further, in other embodiments of the present invention, the concave lens located in the third partial light guide channel 503 may be provided to the display screen 20. For example, taking the encapsulation layer 24 as an example, the diffusing member 313A is provided to the encapsulation layer 24. External light is diffused after passing through the diffusing member 313A of the encapsulation layer 24, and then transferred to the photosensitive unit 32A of the camera module 30 via the third partial light guide channel 503, thereby being converted into an electrical signal.

The diffusing member 313A may be integrally formed on the encapsulation layer 24. The encapsulation layer 24 is usually made of glass. According to some embodiments of the present invention, the diffusing member 313A may be concavely integrally formed on a top surface of the encapsulation layer 24.

Figure 19:
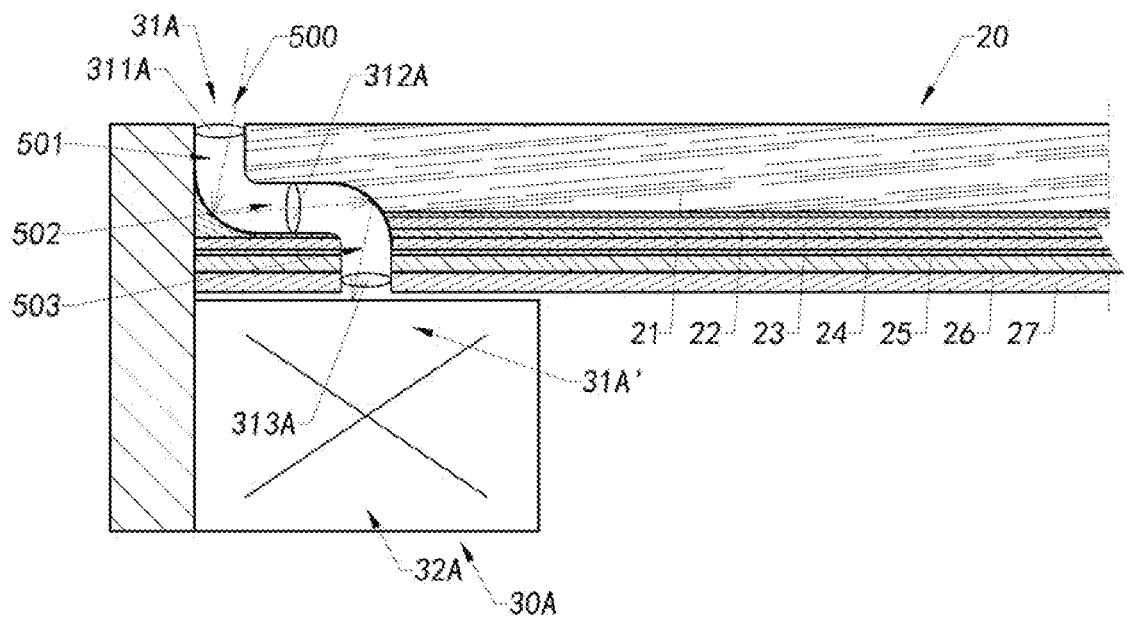
FIG. 19 is a schematic diagram of application of a display screen according to a preferred embodiment of the present invention.

Referring to FIGS. 19 and 18A, another specific implementation mode of the terminal device 1 according to the present invention is illustrated.

In the present example, the terminal device 1 includes a terminal device body 10, a display screen 20, and a camera module 30. The display screen 20 and the camera module 30 are provided to the terminal device body 10 respectively. The display screen 20 is configured to display an image, and the camera module 30 is held below the display screen 20 to facilitate the design of the display screen 20 as a full screen.

The terminal device 1 further includes a housing 40 and has a light guide channel 500. The display screen 20 is mounted to the housing 40. The housing 40 is located at the periphery of the display screen 20 for supporting the display screen 20 and also protecting the display screen 20.

At least a part of the light guide channel 500 is located between the display screen 20 and the housing 40, and extends to the display screen 20. External light passes through the gap between the display screen 20 and the housing 40, reaches the display screen 20, and is then received by the camera module 30 located below the display screen 20.

The terminal device 1 further includes an optical unit 31A. The optical unit 31A is provided to the light guide channel 500. The optical unit 31A may serve to converge, diffuse, or collimate light.

The camera module 30 includes an optical mechanism 31A' and a photosensitive unit 32A. The optical mechanism 31A' is held in a photosensitive path of the photosensitive unit 32A. The photosensitive unit 32A can convert an optical signal into an electrical signal based on photoelectric conversion. The optical mechanism 31A' may include an optical lens or other elements.

In the present example, the camera module 30 is a single complete camera module 30. With the optical unit 31A not provided in the light guide channel 500, the camera module 30 may still image based on light passing through the light guide channel 500.

Some light guide elements may be provided in the light guide channel 500 so that a propagation direction of light linearly propagating can be changed, and the light is conducted from the outside of the display screen 20 to the camera module 30 located inside the display screen 20 via the light guide channel 500. The light guide element may be a reflecting film or a reflecting mirror.

The light guide channel 500 may include a first partial light guide channel 501, a second partial light guide channel 502, and a third partial light guide channel 503. The first partial light guide channel 501 is located between the housing 40 and the display screen 20. The second partial light guide channel 502 guides light of the first partial light guide channel 501 into the display screen 20. The third partial light guide channel 503 guides light of the second partial light guide channel 502 out of the display screen 20 to be received by the camera module 30.

The optical unit 31A may be provided to the first partial light guide channel 501, the second partial light guide channel 502, and the third partial light guide channel 503.

It will be understood that the type and position of the optical unit 31A may be selected as required so that light can be adjusted to meet the light entering requirements of the camera module 30 under the action of the optical unit 31A when passing through the light guide channel 500 of the light guide assembly 50.

Figure 20:
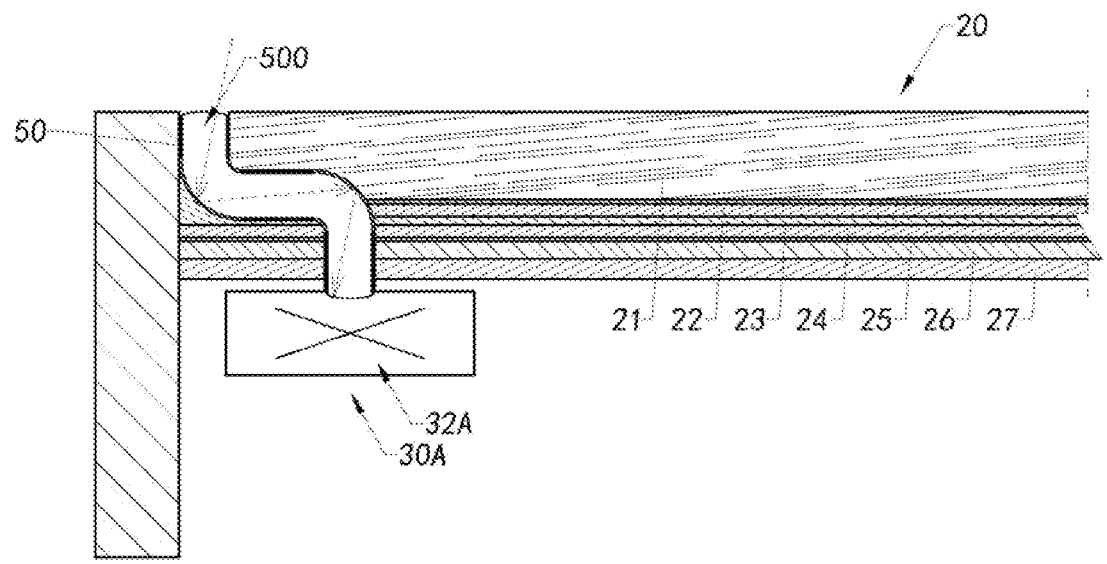
FIG. 20 is a schematic diagram of application of a display screen according to a preferred embodiment of the present invention.

Referring to FIGS. 20 and 18A, another preferred implementation mode of the terminal device 1 according to the present invention is illustrated.

In the present example, the terminal device 1 includes a terminal device body 10, a display screen 20, a camera module 30, a housing 40, and a light guide assembly 50. The display screen 20 is mounted to the terminal device body 10. The display screen 20 and the terminal device body 10 are mounted to the housing 40. The camera module 30 is mounted to the display screen 20 and held below the display screen 20. The light guide assembly 50 is configured to conduct external light to the camera module 30 below the display screen 20.

Specifically, the terminal device 1 has a light guide channel 500. At least a part of the light guide channel 500 is formed in the light guide assembly 50.

At least a part of the light guide channel 500 is located between the display screen 20 and the housing 40, and extends to the display screen 20. External light passes through the gap between the display screen 20 and the housing 40, reaches the display screen 20, and is then received by the camera module 30 located below the display screen 20.

The light guide assembly 50 includes a light guide conduit which has a certain shape and size. The light guide conduit may extend from the outside of the display screen 20 to the display screen 20 between the display screen 20 and the housing 40.

The entire light guide conduit may be light-transmitting or opaque. The light guide conduit may be made of a light-transmitting material. Then, in order to prevent stray light around the light guide conduit from entering the light guide channel 500, the light guide conduit may be coated with a light-shielding material so as to reduce the influence of stray light around.

Preferably, when the light guide assembly 50 needs to penetrate through the pixel layer 25, the light guide assembly 50 is provided between two adjacent pixels of the pixel layer 25.

For the same display screen 20, there may be a plurality of light guide assemblies 50, there may be a plurality of corresponding light guide channels 500, and at least a part of the plurality of light guide channels 500 coincide with each other.

The light guide assembly 50 may conduct the interior of the display screen 20 to a plurality of positions outside the display screen 20, e.g., in front of the display screen 20, to the left side of the display screen 20, or to the right side of the display screen 20. The light guide channel 500 of the light guide assembly 50 can conduct light passing through the gap between the display screen 20 and the housing 40 to the camera module 30.

When there are a plurality of light guide channels 500, the light entering amount of the camera module 30 may be increased.

Figure 21:
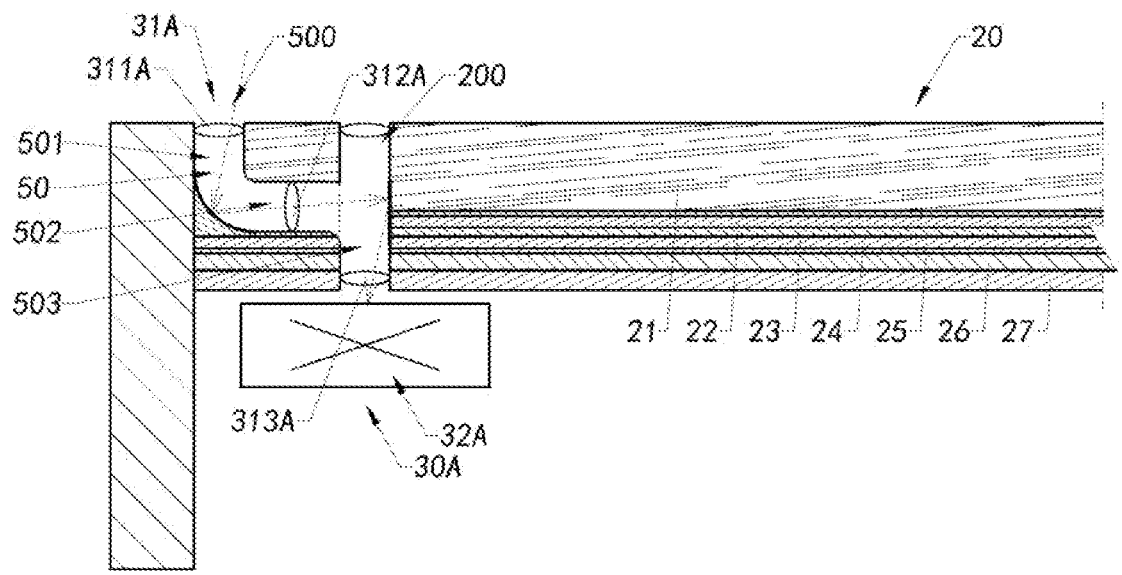
FIG. 21 is a schematic diagram of application of a display screen according to a preferred embodiment of the present invention.

Referring to FIGS. 21 and 18A, another implementation mode of the terminal device 1 according to the present invention is illustrated.

The terminal device 1 includes a terminal device body 10, a display screen 20, a camera module 30, a housing 40, and a light guide assembly 50. The display screen 20 is mounted to the terminal device body 10. The display screen 20 and the terminal device body 10 are mounted to the housing 40. The camera module 30 is mounted to the display screen 20 and held below the display screen 20. The light guide assembly 50 is configured to conduct external light to the camera module 30 below the display screen 20.

The terminal device 1 has at least one light guide channel 500 and a light through hole 200. The light through hole 200 penetrates through the display screen 20 of the terminal device 1 from top to bottom. The light guide channel 500 is formed on the light guide assembly 50. The light guide channel 500 extends downward from the gap between the display screen 20 and the housing 40 of the terminal device 1 to the display screen 20.

Both of the light guide channel 500 and the light through hole 200 may be configured to conduct light. The light through hole 200 penetrates through the display screen 20, and the camera module 30 aligned with the light through hole 200 of the display screen 20 can receive light from the outside of the display screen 20 via the light through hole 200. The camera module 30 aligned with the light guide channel 500 can receive light from the outside of the display screen 20 via the light guide channel 500.

It is worth noting that the light guide channel 500 and the light through hole 200 may be independent from each other, and the light guide channel 500 and the light through hole 200 may be aligned with different camera modules 30 respectively. In other words, the plurality of camera modules 30 may be mounted to the display screen 20 and located below the display screen 20.

In the present example, the light guide channel 500 and the light through hole 200 at least partially coincide with each other, so that light received by the light guide channel 500 and the light through hole 200 may enter the same camera module 30 and be received by the same photosensitive unit 32A, so as to image.

Specifically, at least a part of the light guide channel 500 is located between the display screen 20 and the housing 40, and at least a part of the light guide channel 500 is located in the display screen 20.

The light guide channel 500 may include a first partial light guide channel 501, a second partial light guide channel 502, and a third partial light guide channel 503. The first partial light guide channel 501 is located between the display screen 20 and the housing 40. The second partial light guide channel 502 and the third partial light guide channel 503 are located within the display screen 20 respectively.

The light guide channel 500 is communicated with the light through hole 200, and the third partial light guide channel 503 and the light through hole 200 coincide.

The first partial light guide channel 501 is located on one side of the display screen 20, the second partial light guide channel 502 extends inward from the side surface of the display screen 20, and the third partial light guide channel 503 extends from the interior of the display screen 20 to the back side of the display screen 20.

The terminal device 1 further includes an optical unit 31A. The optical unit 31A is provided to the light guide channel 500. The optical unit 31A may include a converging member 311A, a modulating member 312A, and a diffusing member 313A. The converging member 311A may be provided to the first partial light guide channel 501 for converging external light. The modulating member 312A may be provided to the second partial light guide channel 502 for modulating light from the first partial light guide channel 501. The diffusing member 313A may be provided to the third partial light guide channel 503 for diffusing and transferring light to the camera module 30.

It is worth noting that since the paths of light entering the camera module 30 for imaging through the light guide channel 500 and the light through hole 200 are different, light of different paths has an optical path difference when reaching the camera module 30. Beams simultaneously reaching a photosensitive chip of the camera module 30 have different phases and may eventually present different images. In order to avoid this problem, the optical path formed by the optical unit 31A in the display screen 20 is designed such that light reaching the camera module 30 may present consistent images.

In the present example, the camera module 30 includes an optical mechanism 31A' and a photosensitive unit 32A. The optical mechanism 31A' is aligned with the light through hole 200 and the light guide channel 500, and the optical mechanism 31A' is held in a photosensitive path of the photosensitive unit 32A. At least parts of the light through hole 200 and the light guide channel 500 are shared by each other.

In other embodiments of the present invention, the camera module 30 includes the optical unit 31A and a photosensitive unit 32A. The optical unit 31A is provided to the light guide channel 500 and the photosensitive unit 32A is mounted on a back side of the display screen 20.

In the case where the light guide channel 500 and the light through hole 200 coexist, since the camera module 30 receives light via the light guide channel 500, the light through hole 200 may be design to be smaller.

The light guide channel 500 may not be observed from the outside of the display screen 20. For example, when the second partial light guide channel 502 is located at the encapsulation layer 24 of the display screen 20, the light guide channel 500 may not be observed outside the display screen 20 due to the polarization layer located above the encapsulation layer 24. Therefore, the inner diameter of at least a part of the light guide channel 500 may be designed to be slightly larger than the inner diameter of the light through hole 200, so that a part of the optical element may be placed in the light guide channel 500.

When the light through hole 200 is designed to be small size, it is more difficult to observe the light through hole 200 from the outside of the display screen 20, so as to facilitate increase of a screen-to-body ratio of the display screen 20.

Further, for the light through hole 200, the inner diameter of the light through hole 200 may be set to be gradually increased from top to bottom. A part of the optical elements of the optical unit 31A may be provided to the light through hole 200, e.g., the diffusing member 313A.

For example, when a light through region provided by the light through hole 200 is smaller than a light receiving region of the photosensitive unit 32A of the camera module 30, one of the diffusing members 313A may be provided to the light through hole 200. The diffusing member 313A may diffuse light in the light through hole 200 so that the light through region provided by the light through hole 200 matches the light receiving region of the photosensitive unit 32A.

Figure 22:
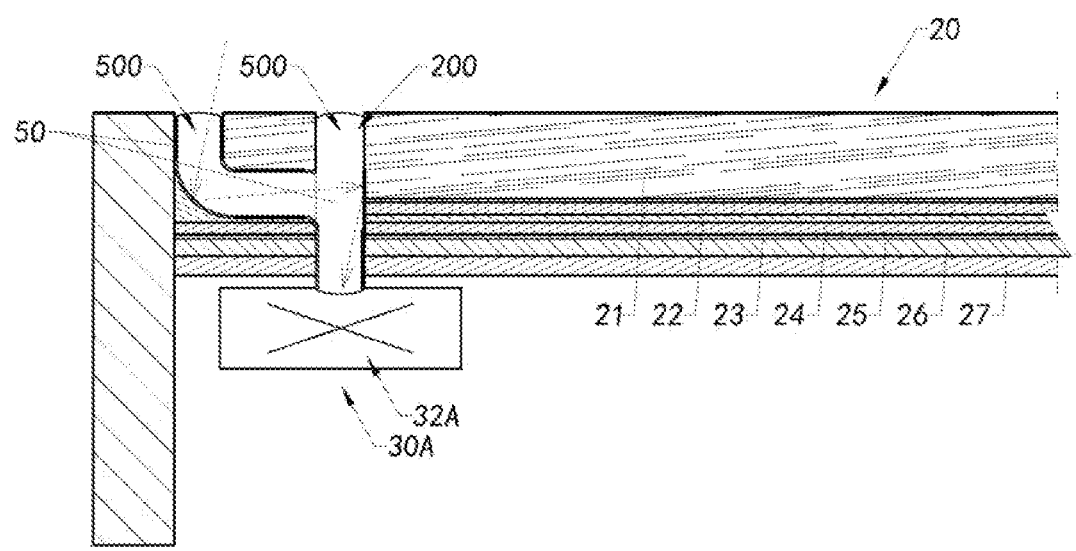
FIG. 22 is a schematic diagram of application of a display screen according to a preferred embodiment of the present invention.

Referring to FIGS. 22 and 18A, an implementation mode of a display screen assembly according to the present invention is illustrated.

In the present embodiment, the present invention provides a display screen assembly, which includes a display screen 20 and a light guide assembly 50. The display screen 20 has a light through hole 200 penetrating from top to bottom, and the light guide assembly 50 is partially accommodated in the light through hole 200.

The light guide assembly 50 provides a light guide channel 500. The desired light guide channel 500 may be obtained by designing the shape and structure of the light guide assembly 50.

The light guide assembly 50 includes two light guide conduits. One of the light guide conduits is accommodated in the light through hole 200, and the other light guide conduit extends from the gap between the display screen 20 and the housing 40 to the position of the light through hole 200. That is, one of the light guide conduits can guide light above the display screen 20 to pass through the display screen 20 from top to bottom and then to reach the camera module 30. The other light guide conduit can guide light between the display screen 20 and the housing 40 to reach the camera module 30. The way in which the light through hole 200 is made may be described with reference to the foregoing description.

The light guide conduit may be cylindrical, triangular prism-shaped, or quadrangular prism-shaped. The inner diameters corresponding to all positions of the light guide conduit may be different.

The light guide conduit may be made of a light-transmitting material, so that the light guide conduit is difficult to observe from the outside of the display screen 20. Meanwhile, in order to reduce the influence of stray light, e.g., the influence of light from the pixel layer 25 of the display screen 20, the light guide conduit may be coated with a light-shielding material.

Further, the light guide assembly 50 includes an optical unit 31A. The optical unit 31A is held in a light through path of the light through hole 200. The optical element may be a filtering member, a diffusing member 313A, or a modulating member 312A. The optical unit 31A may pre-process light to achieve desired light entering the camera module 30.

It is worth noting that since the paths of light entering the camera module 30 for imaging through the different light guide channels 500 are different, light of different paths has an optical path difference when reaching the camera module 30. Beams simultaneously reaching a photosensitive chip of the camera module 30 have different phases and may eventually present different images. In order to avoid this problem, the optical path formed by the optical unit 31A in the display screen 20 is designed such that light reaching the camera module 30 may present consistent images.

Figure 23:
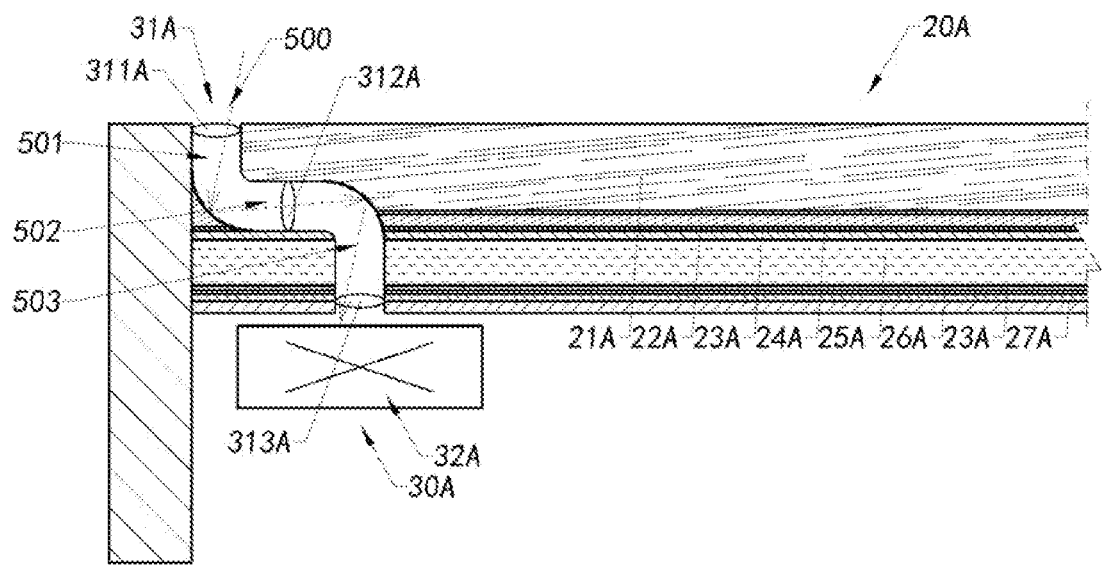
FIG. 23 is a schematic diagram of application of a display screen according to a preferred embodiment of the present invention.

Referring to FIGS. 23, 18A, and 10, another implementation mode of the display screen assembly according to the present invention is illustrated.

In the present example, a display screen 20 is implemented as an LCD screen 20A. The LCD screen 20A has a light guide channel 500. The light guide channel 500 can guide light outside the LCD screen 20A to the interior of the LCD screen 20A or to the inside of the LCD screen 20A.

Specifically, at least a part of the light guide channel 500 is located between the LCD screen 20A and a housing 40, and at least a part of the light guide channel 500 is located inside the LCD screen 20A.

The portion of the light guide channel 500 located between the LCD screen 20A and the housing 40 may guide external light from the outside of the LCD screen 20A to one side surface of the LCD screen 20A. The light is then guided into the interior of the LCD screen 20A by other portions of the light guide channel 500, and the light reaches the camera module 30 after passing through the interior of the LCD screen 20A. Thus, the camera module 30 located below the display screen 20A can receive light above the display screen 20A, so that the camera module 30 located below the display screen 20A can use the light to image, and further, the camera module 30 located below the display screen 20A can obtain sufficient light imaging via the light guide channel 500.

More specifically, the light guide channel 500 includes a first partial light guide channel 501, a second partial light guide channel 502, and a third partial light guide channel 503. The first partial light guide channel 501 is located between the LCD screen 20A and the housing 40. The second partial light guide channel 502 is located inside the LCD screen 20A and guides light from the first partial light guide channel 501 to the inside of the LCD screen 20A. The third partial light guide channel 503 is located inside the LCD screen 20A and guides light from the second partial light guide channel 502 to the outside of the LCD screen 20A.

The LCD screen 20A further includes at least one optical unit 31A. The optical unit 31A may be provided to the light guide channel 500 so that light can propagate in the light guide channel 500 according to the user's expectations. The optical unit 31A may include a converging member 311A, a modulating member 312A, and a diffusing member 313A. The converging member 311A can converge light. The modulating member 312A can modulate light, such as filtering, dispersing, or collimating. The diffusing member 313A can diffuse light.

The converging member 311A may be provided to the first partial light guide channel 501 of the light guide channel 500, e.g., at a light entrance of the light guide channel 500. The converging member 311A is located at the light entrance. The modulating member 312A may be provided to the second partial light guide channel 502 of the light guide channel 500 to modulate light passing through the second partial light guide channel 502. The diffusing member 313A may be provided to the third partial light guide channel 503 of the light guide channel 500, e.g., a light exit of the light guide channel 500. The diffusing member 313A located at the light exit may diffuse light, so that the light can be adapted to a photosensitive surface of the camera module 30. Thus, when the photosensitive surface of the camera module 30 is large, the light may be diffused by the diffusing member 313A to increase a photosensitive region of the entire photosensitive surface, thereby improving the working efficiency of the camera module 30.

The camera module 30 has a light entrance and includes a photosensitive unit 32A. The size of the light entrance corresponds to the photosensitive region of the photosensitive unit 32A so that the photosensitive region of the photosensitive unit 32A receives light as much as possible and the photosensitive region of the photosensitive unit 32A can be utilized as much as possible.

Further, the LCD screen 20A includes the cover plate layer 21A, the touch layer 22A, the polarization layer 23A, the encapsulation layer 24A, the pixel layer 25A, the drive circuit layer 26A, and the back plate layer 27A. The polarization layer 23A may be respectively located on both sides of the pixel layer 25A.

The LCD screen 20A has a side surface, a front surface, and a back surface. The front surface of the LCD screen 20A faces a user. The back surface of the LCD screen 20A faces away from the user. The side surface is connected to the front surface and the back surface, respectively. The light guide channel 500 extends from the gap between the LCD screen 20A and the housing 40 to the side surface of the LCD screen 20A, and then extends to the back surface of the LCD screen 20A. Light can pass through the LCD screen 20A from the side surface of the LCD screen 20A to the back surface of the LCD screen 20A via the light guide channel 500.

The LCD screen 20A is a multi-layer structure. The light guide channel 500 may penetrate through one or more of the cover plate layer 21A, the touch layer 22A, the polarization layer 23A, the encapsulation layer 24A, the pixel layer 25A, the drive circuit layer 26A, and the back plate layer 27A.

The light guide channel 500 may penetrate through the cover plate layer 21A and the back plate layer 27A, e.g., sequentially penetrate through the cover plate layer 21A, the touch layer 22A, a polarize sheet of the polarization layer 23A, the encapsulation layer 24A, the pixel layer 25A, the drive circuit layer 26A, another polarize sheet of the polarization layer 23A, and the back plate layer 27A from top to bottom. It will be understood by those skilled in the art that the configuration of the layers of the LCD screen 20A described herein is illustrative only and is not limiting of the present invention.

The light guide channel 500 may penetrate through the touch layer 22A and the back plate layer 27A. For example, the light guide channel 500 sequentially penetrates through the gap between the display screen 20A and the housing 40, the touch layer 22A, the polarization layer 23A, the encapsulation layer 24A, the pixel layer 25A, the drive circuit layer 26A, the polarization layer 23A, and the back plate layer 27A from top to bottom. It will be understood by those skilled in the art that the configuration of the layers of the LCD screen 20A at this moment is illustrative only and is not limiting of the present invention.

The light guide channel 500 may penetrate through the polarization layer 23A and the back plate layer 27A. For example, the light guide channel 500 sequentially penetrates through the gap between the display screen 20A and the housing 40, the polarization layer 23A, the encapsulation layer 24A, the pixel layer 25A, the drive circuit layer 26A, the polarization layer 23A, and the back plate layer 27A from top to bottom. It will be understood by those skilled in the art that the configuration of the layers of the LCD screen 20A at this moment is illustrative only and is not limiting of the present invention.

The light guide channel 500 may penetrate through the encapsulation layer 24A and the back plate layer 27A. For example, the light guide channel 500 sequentially penetrates through the gap between the display screen 20A and the housing 40, the encapsulation layer 24A, the pixel layer 25A, the drive circuit layer 26A, the polarization layer 23A, and the back plate layer 27A from top to bottom. It will be understood by those skilled in the art that the configuration of the layers of the LCD screen 20A at this moment is illustrative only and is not limiting of the present invention.

The light guide channel 500 may extend from the pixel layer 25A to the back plate layer 27A. For example, the light guide channel 500 sequentially penetrates through the gap between the display screen 20A and the housing 40, the pixel layer 25A, the drive circuit layer 26A, the polarization layer 23A, and the back plate layer 27A from top to bottom. It will be understood by those skilled in the art that the configuration of the layers of the LCD screen 20A at this moment is illustrative only and is not limiting of the present invention.

The light guide channel 500 may extend from the drive circuit layer 26A to the back plate layer 27A. For example, the light guide channel 500 sequentially penetrates through the gap between the display screen 20A and the housing 40, the drive circuit layer 26A, the polarization layer 23A, and the back plate layer 27A from top to bottom. It will be understood by those skilled in the art that the configuration of the layers of the LCD screen 20A at this moment is illustrative only and is not limiting of the present invention.

The light guide channel 500 may extend from the polarization layer 23A located below the pixel layer 25A to the back plate layer 27A. For example, the light guide channel 500 sequentially penetrates through the polarization layer 23A and the back plate layer 27A below the pixel layer 25A.

The light guide channel 500 may penetrate through the back plate layer 27A. For example, the light guide channel 500 extends from a gap between the back plate layer 27A and the polarization layer 23A or a connecting medium to the back plate layer 27A and penetrates through the back plate layer 27A.

The light guide channel 500 is illustrated as penetrating through the pixel layer 25A. The pixel layer 25A includes the filter layer 251A and the liquid crystal 252A. The LCD screen 20A includes a liquid crystal layer 28A. The liquid crystal layer 28A includes the liquid crystal 252A, the filter layer 251A, and the drive circuit layer 26A.

The liquid crystal 252A is held between the filter layer 251A and the drive circuit layer 26A. The light guide channel 500 penetrates through the liquid crystal layer 28A, and the liquid crystal 252A does not leak into the light guide channel 500.

The liquid crystal layer 28A with a hole may be first manufactured. The hole is at least a part of the light guide channel 500. Corresponding positions on the layers of the LCD screen 20A are then perforated to form at least a part of the light guide channel 500.

The hole of the liquid crystal layer 28A may be located in the height direction of the liquid crystal layer 28A. The hole may also be obliquely formed on the liquid crystal layer 28A along a certain oblique angle to adapt to the requirements of the arrangement of the light guide channel 500.

Specifically, a sealing material 2811A is provided on the drive circuit layer 26A or the filter layer 251A of the liquid crystal layer 28A, so that when the drive circuit layer 26A and the filter layer 251A are attached to each other, the sealing material 2811A forms a sealing region 281A, and the liquid crystal 252A cannot enter the sealing region 281A. In a subsequent step, the liquid crystal 252A of the liquid crystal layer 28A does not leak out as long as the liquid crystal layer 28A is perforated within the sealing region 281A.

The layers mounted above the liquid crystal layer 28A of the LCD screen 20A may be perforated respectively to form the light through hole 200 extending from the side surface of the LCD screen 20A to the back surface of the LCD screen 20A. In this way, the LCD screen 20A may be provided with the hole penetrating through the side surface of the LCD screen 20A and the back surface of the LCD screen 20A.

Further, a part of the light guide channel 500 is located between the display screen 20A and the housing 40. A part of the light guide channel 500 is provided inside the LCD screen 20A. It can be achieved that the light guide channel 500 is not visible from the front side of the LCD screen 20A, thereby achieving a full screen.

Further, after forming the part of the light guide channel 500 in the LCD screen 20A, the optical unit 31A may be mounted to the light guide channel 500.

It will be understood that the optical element may be mounted to the light guide channel 500 after the entire LCD screen 20A has been manufactured, or the optical unit 31A may be mounted to a preset position on each layer of the LCD screen 20A in the process of mounting the LCD screen 20A layer by layer or in the process of forming the portion of the light guide channel 500 corresponding to each layer of the LCD screen 20A, the functional layers are then assembled to form the complete LCD screen 20A, and at least a part of the optical unit 31A may be formed in the process of manufacturing the LCD screen 20A.

For example, firstly, a micro-lens layer is integrally formed on the encapsulation layer 24A, and the encapsulation layer 24A is then provided above the pixel layer 25A. The micro-lens layer corresponds to the light through hole 200 of the pixel layer 25A. The drive circuit layer 26A is provided on the bottom side of the pixel layer 25A. The drive circuit layer 26A is electrically connected to the pixel layer 25A for driving the pixel layer 25A to operate. The polarization layer 23A, the touch layer 22A, and the cover plate layer 21A are sequentially provided on the encapsulation layer 24A.

The through light guide channel 500 is formed among the cover plate layer 21A, the touch layer 22A, the polarization layer 23A, the encapsulation layer 24A, the pixel layer 25A, and the drive circuit layer 26A. The micro-lens layer is held in the light guide channel 500.

The optical unit 31A may be provided inside the LCD screen 20A or formed on each layer of the LCD screen 20A in other ways. It will be understood by those skilled in the art that the above manufacturing method of the optical unit 31A is by way of example only and is not limited to the above example.

Figure 24:
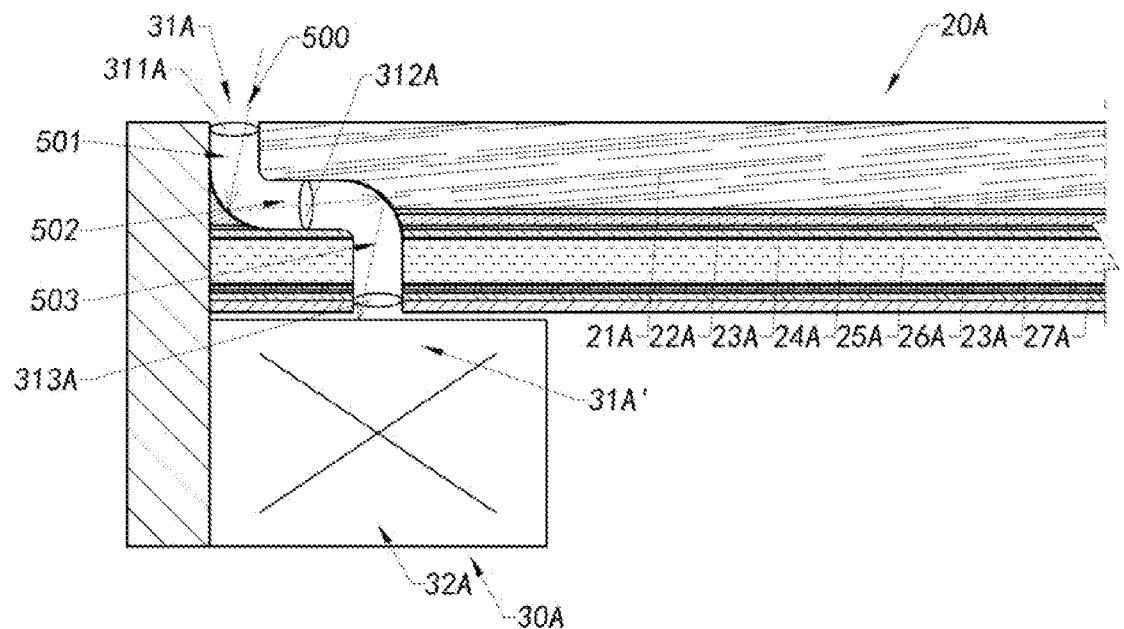
FIG. 24 is a schematic diagram of application of a display screen according to a preferred embodiment of the present invention.

Referring to FIG. 24, another implementation mode of the LCD screen 20A according to the present invention is illustrated.

In the present example, the camera module 30 includes the photosensitive unit 32A. The photosensitive unit 32A directly receives light from the light guide channel 500. The light may be received by the photosensitive unit 32A after being processed by the optical unit 31A located in the light guide channel 500.

In this way, the optical mechanism 31A' of the camera module 30 may be provided in the light guide channel 500, or the optical unit 31A located in the light guide channel 500 serves as the optical mechanism 31A' of the camera module 30 so as to reduce the height size of the camera module 30, thereby further facilitating reduction of the height sizes of the LCD screen 20A and the camera module 30.

Figure 25:
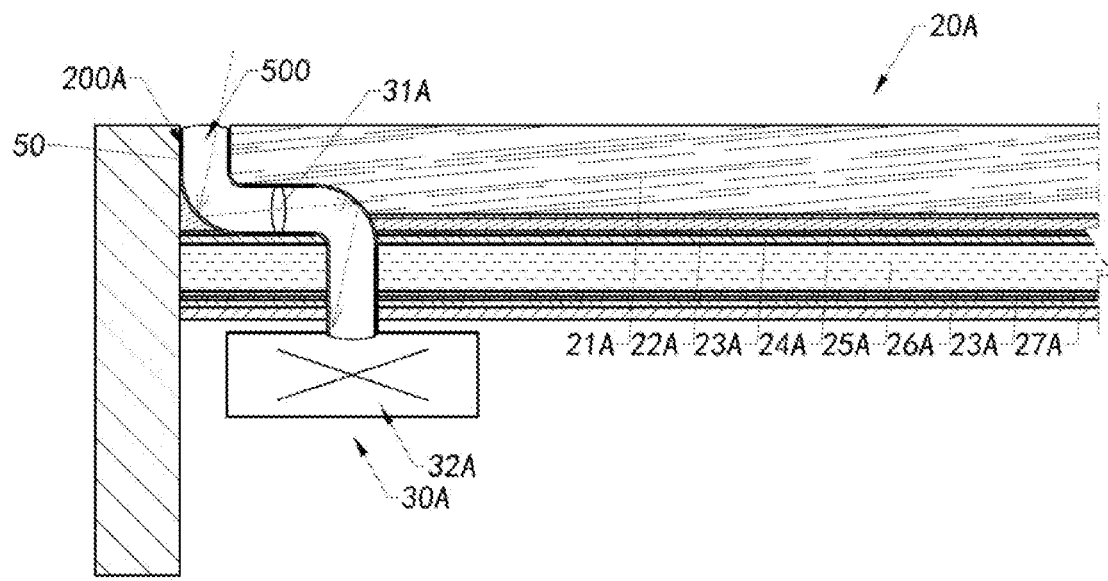
FIG. 25 is a schematic diagram of application of a display screen according to a preferred embodiment of the present invention.

Referring to FIG. 25, another implementation mode of the LCD screen 20A according to the present invention is illustrated.

In the present example, the LCD screen 20A has at least one light guide channel 500 and the LCD screen 20A further includes at least one light guide assembly 50. The light guide channel 500 is formed in the light guide assembly 50.

The LCD screen 20A provides another light through hole 200A. The light through hole 200A is used for mounting the light guide assembly 50.

The LCD screen 20A is a multi-layer structure. The light through hole 200A may penetrate through one or more of the cover plate layer 21A, the touch layer 22A, the polarization layer 23A, the encapsulation layer 24A, the pixel layer 25A, the drive circuit layer 26A, and the back plate layer 27A.

The light through hole 200 may pass through the cover plate layer 21A and the back plate layer 27A, e.g., sequentially pass through the cover plate layer 21A, the touch layer 22A, a polarize sheet of the polarization layer 23A, the encapsulation layer 24A, the pixel layer 25A, the drive circuit layer 26A, another polarize sheet of the polarization layer 23A, and the back plate layer 27A from top to bottom. It will be understood by those skilled in the art that the configuration of the layers of the LCD screen 20A described herein is illustrative only and is not limiting of the present invention.

The light through hole 200A may penetrate through the touch layer 22A and the back plate layer 27A. For example, the light through hole 200A sequentially penetrates through the touch layer 22A, a polarize sheet of the polarization layer 23A, the encapsulation layer 24A, the pixel layer 25A, the drive circuit layer 26A, another polarize sheet of the polarization layer 23A, and the back plate layer 27A from top to bottom. It will be understood by those skilled in the art that the configuration of the layers of the LCD screen 20A at this moment is illustrative only and is not limiting of the present invention.

The light through hole 200A may penetrate through the polarization layer 23A and the back plate layer 27A. For example, the light through hole 200A sequentially penetrates through a polarize sheet of the polarization layer 23A, the encapsulation layer 24A, the pixel layer 25A, the drive circuit layer 26A, another polarize sheet of the polarization layer 23A, and the back plate layer 27A from top to bottom. It will be understood by those skilled in the art that the configuration of the layers of the LCD screen 20A at this moment is illustrative only and is not limiting of the present invention.

The light through hole 200A may penetrate through the encapsulation layer 24A and the back plate layer 27A. For example, the light through hole 200A sequentially penetrates through the encapsulation layer 24A, the pixel layer 25A, the drive circuit layer 26A, the polarization layer 23A, and the back plate layer 27A from top to bottom. It will be understood by those skilled in the art that the configuration of the layers of the LCD screen 20A at this moment is illustrative only and is not limiting of the present invention.

The light through hole 200A may extend from the pixel layer 25A to the back plate layer 27A. For example, the light through hole 200A sequentially penetrates through the pixel layer 25A, the drive circuit layer 26A, the polarization layer 23A, and the back plate layer 27A from top to bottom. It will be understood by those skilled in the art that the configuration of the layers of the LCD screen 20A at this moment is illustrative only and is not limiting of the present invention.

The light through hole 200A may extend from the drive circuit layer 26A to the back plate layer 27A. For example, the light through hole 200A sequentially penetrates through the drive circuit layer 26A, the polarization layer 23A, and the back plate layer 27A from top to bottom. It will be understood by those skilled in the art that the configuration of the layers of the LCD screen 20A at this moment is illustrative only and is not limiting of the present invention.

The light through hole 200A may extend from the polarization layer 23A located below the pixel layer 25A to the back plate layer 27A. For example, the light through hole 200A sequentially penetrates through the polarization layer 23A and the back plate layer 27A below the pixel layer 25A.

The light through hole 200A may penetrate through the back plate layer 27A. For example, the light through hole 200A extends from a gap between the back plate layer 27A and the polarization layer 23A or a connecting medium to the back plate layer 27A and penetrates through the back plate layer 27A.

The light through hole 200A is illustrated as penetrating through the pixel layer 25A. The pixel layer 25A includes the liquid crystal 252A and the filter layer 251A. The LCD screen 20A includes a liquid crystal layer 28A. The liquid crystal layer 28A includes the liquid crystal 252A, the filter layer 251A, and the drive circuit layer 26A.

The liquid crystal 252A is held between the filter layer 251A and the drive circuit layer 26A. The light through hole 200 penetrates through the liquid crystal layer 28A and the liquid crystal 252A does not leak into the light through hole 200.

The liquid crystal layer 28A with the light through hole 200 may be first manufactured. Corresponding positions on the layers of the LCD screen 20A are then perforated to form at least a part of the light through hole 200.

The part of the light through hole 200 of the liquid crystal layer 28A may be located in the height direction of the liquid crystal layer 28A. The light through hole 200A may also be obliquely formed on the liquid crystal layer 28A along a certain oblique angle to adapt to the arrangement requirements of the light through hole 200A.

Specifically, a sealing material 2811 is provided on the drive circuit layer 26A or the filter layer 251A of the liquid crystal layer 28A, so that when the drive circuit layer 26A and the filter layer 251A are attached to each other, the sealing material 2811A forms a sealing region 281A, and the liquid crystal 252A cannot enter the sealing region 281A. In a subsequent step, the liquid crystal 252A of the liquid crystal layer 28A does not leak out as long as the liquid crystal layer 28A is perforated within the sealing region 281A.

The layers above the liquid crystal layer 28A of the LCD screen 20A may be perforated respectively to form the light through hole 200 facing the liquid crystal layer 28A of the LCD screen 20A from the side surface of the LCD screen 20A. In this way, the LCD screen 20A may be provided with the light through hole 200A penetrating through the side surface of the LCD screen 20A and the back surface of the LCD screen 20A.

A part of the light guide assembly 50 is mounted between the LCD screen 20A and the housing 40, and a part of the light guide assembly 50 is mounted in the light through hole 200A of the LCD screen 20A.

The light guide assembly 50 may include at least one light guide conduit. There may be a plurality of light guide conduits to adapt to the light through holes 200A of different shapes. The light through hole 200A may be straight or curved.

When there are a plurality of light guide conduits, the light guide conduits may be mounted to the light through hole 200A in a certain order one by one, or the light guide conduits may be mounted to the LCD screen 20A in a certain order one by one. For example, when the liquid crystal layer 28A is mounted to the polarization layer 23A, one light guide conduit may be mounted to the portion of the light through hole 200 corresponding to the liquid crystal layer 28A and the polarization layer 23A. Then, when the back plate layer 27A is mounted to the liquid crystal layer 28A, another light guide conduit is mounted to the portion of the light through hole 200A corresponding to the back plate layer 27A.

The shape and position of the entire light through hole 200A may be provided to the LCD screen 20A according to the user's requirements. The shape and position of the light guide assembly 50 may be designed according to the desired requirements of the light guide channel 500.

External light propagates along the light guide channel 500 to the camera module 30 located on one side of the back surface of the LCD screen 20A. In this process, light may be reflected, diffused, or collimated in the light guide channel 500 of the light guide assembly 50.

Further, the optical unit 31A may be provided in the light guide channel 500 of the light guide assembly 50. The optical unit 31A may be integrally formed with the light guide assembly 50, or the optical unit 31A may also be provided in the light guide channel 500 of the light guide assembly 50.

The light guide assembly 50 may be made of a transparent material, such as glass or resin. The light guide assembly 50 may also be non-transparent. For example, an outer wall of the light guide assembly 50 may be coated with an opaque material to reduce the influence of light outside the light guide assembly 50 on light in the light guide channel 500 of the light guide assembly 50.

Figure 26:
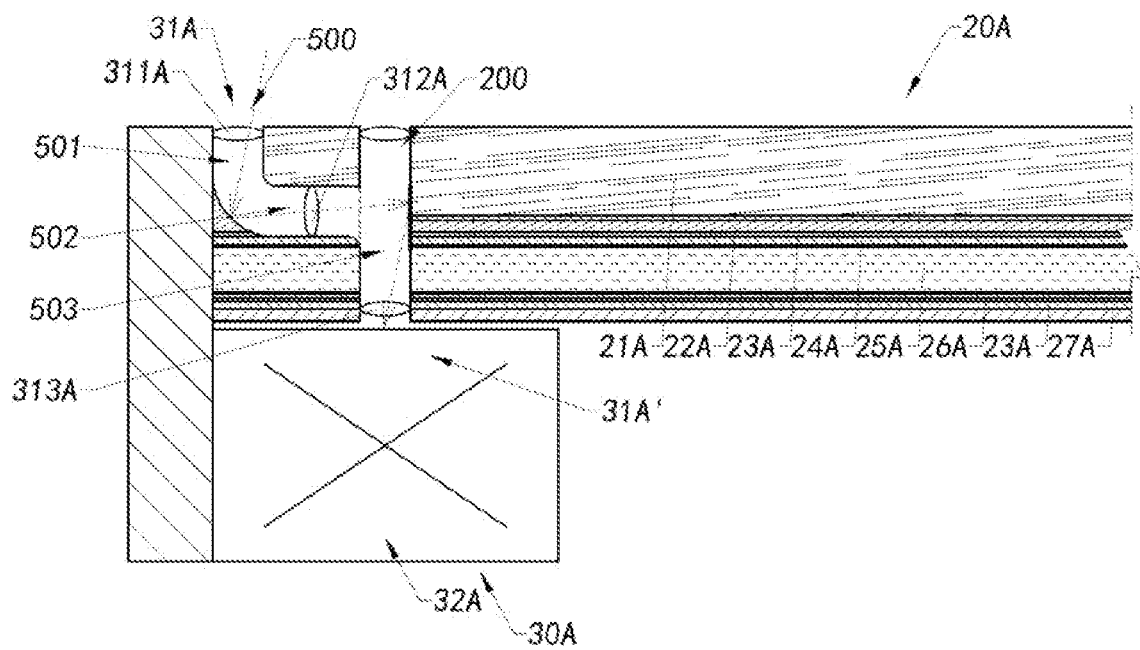
FIG. 26 is a schematic diagram of application of a display screen according to a preferred embodiment of the present invention.

Referring to FIGS. 26, 18A, and 10, another implementation mode of the LCD screen 20A according to the present invention is illustrated.

In the present example, the LCD screen 20A has a light through hole 200 and a light guide channel 500. The light through hole 200 penetrates through the display screen 20A of the terminal device 1 from top to bottom. The light guide channel 500 extends downward from the gap between the display screen 20A and the housing 40 of the terminal device 1 to the display screen 20A. It will be understood that there may be a plurality of light through holes 200, the light through holes 200 may penetrate through the display screen 20A from top to bottom, and the light through holes 200 may also penetrate through the interior of the display screen 20A from the side surface of the display screen 20A to the bottom surface of the display screen 20A.

Both of the light guide channel 500 and the light through hole 200 may be configured to conduct light. The light through hole 200 penetrates through the display screen 20A, and the camera module 30 aligned with the light through hole 200 of the display screen 20A can receive light from the outside of the display screen 20A via the light through hole 200. The camera module 30 aligned with the light guide channel 500 can receive light from the outside of the display screen 20A via the light through hole 200.

It is worth noting that the light guide channel 500 and the light through hole 200 may be independent from each other, and the light guide channel 500 and the light through hole 200 may be aligned with different camera modules 30 respectively. In other words, the plurality of camera modules 30 may be mounted to the display screen 20A and located below the display screen 20A.

In the present example, the light guide channel 500 and the light through hole 200 at least partially coincide with each other, so that light received by the light guide channel 500 and the light through hole 200 may enter the same camera module 30 and be received by the same photosensitive unit 32A, so as to image.

Specifically, at least a part of the light guide channel 500 is located between the display screen 20A and the housing 40, and at least a part of the light guide channel 500 is located in the display screen 20A.

The light guide channel 500 may include a first partial light guide channel 501, a second partial light guide channel 502, and a third partial light guide channel 503. The first partial light guide channel 501 is located between the display screen 20A and the housing 40. The second partial light guide channel 502 and the third partial light guide channel 503 are located within the display screen 20A respectively.

The light guide channel 500 is communicated with the light through hole 200, and the third partial light guide channel 503 and the light through hole 200 coincide.

The first partial light guide channel 501 is located on one side surface of the display screen 20A, the second partial light guide channel 502 extends inward from the side surface of the display screen 20A, and the third partial light guide channel 503 extends downward from the interior of the display screen 20A.

The terminal device 1 further includes an optical unit 31A. The optical unit 31A is provided to the light guide channel 500. The optical unit 31A may include a converging member 311A, a modulating member 312A, and a diffusing member 313A. The converging member 311A may be provided to the first partial light guide channel 501 for converging external light. The modulating member 312A may be provided to the second partial light guide channel 502 for modulating light from the first partial light guide channel 501. The diffusing member 313A may be provided to the third partial light guide channel 503 for diffusing and transferring light to the camera module 30.

It is worth noting that since the paths of light entering the camera module 30 for imaging through the light guide channel 500 and the light through hole 200 are different, light of different paths has an optical path difference when reaching the camera module 30. Beams simultaneously reaching a photosensitive chip of the camera module 30 have different phases and may eventually present different images. In order to avoid this problem, the optical path formed by the optical unit 31A in the display screen 20 is designed such that light reaching the camera module 30 may present consistent images.

In other embodiments of the present invention, the camera module 30 includes an optical mechanism 31A' and a photosensitive unit 32A. The optical mechanism 31A' is aligned with the light through hole 200 and the light guide channel 500, and the optical mechanism 31A' is held in a photosensitive path of the photosensitive unit 32A. At least parts of the light through hole 200 and the light guide channel 500 are shared by each other.

In the present example, the camera module 30 includes the optical unit 31A and a photosensitive unit 32A. The optical unit 31A is provided to the light guide channel 500 and the photosensitive unit 32A is mounted on a back side of the display screen 20A.

In the case where the light guide channel 500 and the light through hole 200 coexist, since the camera module 30 receives light via the light guide channel 500, the light through hole 200 may be designed to be smaller.

The light guide channel 500 may not be observed from the outside of the display screen 20A. For example, when the second partial light guide channel 502 is located at the encapsulation layer 24A of the display screen 20A, the light guide channel 500 may not be observed outside the display screen 20A due to the polarization layer located above the encapsulation layer 24A. Therefore, the inner diameter of at least a part of the light guide channel 500 may be designed to be slightly larger than the inner diameter of the light through hole 200, so that a part of the optical element may be placed in the light guide channel 500.

When the light through hole 200 is small-sized, it is more difficult to observe the light through hole 200 from the outside of the display screen 20A, so as to facilitate increase of a screen-to-body ratio of the display screen 20A.

Further, for the light through hole 200, the inner diameter of the light through hole 200 may be set to be gradually increased from top to bottom. A part of the optical element of the optical unit 31A may be provided to the light through hole 200, e.g., the diffusing member 313A.

For example, when a light through region provided by the light through hole 200 is smaller than a light receiving region of the photosensitive unit 32A of the camera module 30, one of the diffusing members 313A may be provided to the light through hole 200. The diffusing member 313A may diffuse light in the light through hole 200 so that the light through region provided by the light through hole 200 matches the light receiving region of the photosensitive unit 32A.

Figure 27:
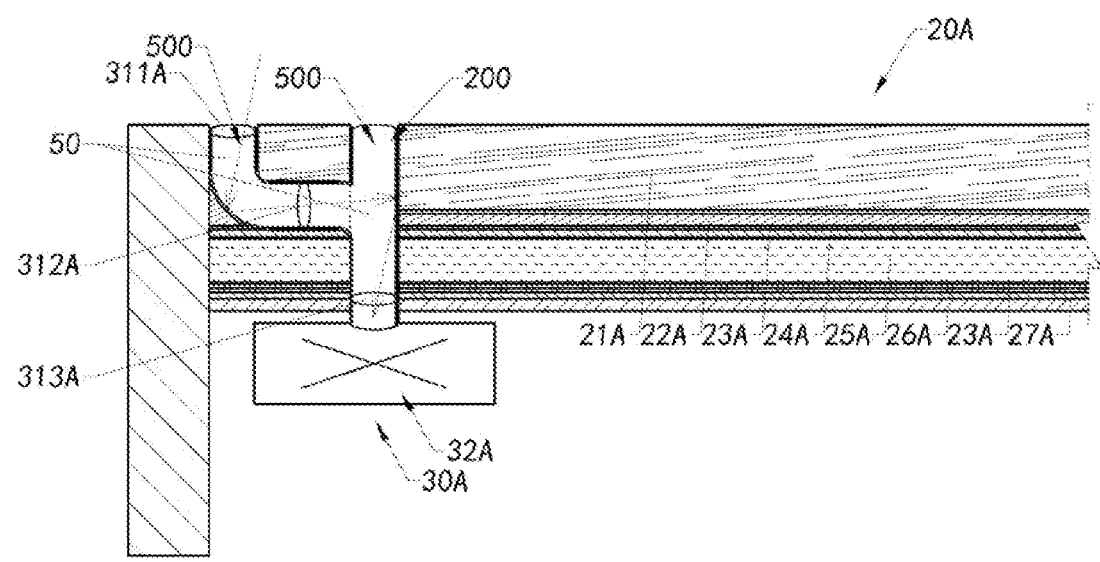
FIG. 27 is a schematic diagram of application of a display screen according to a preferred embodiment of the present invention.

Referring to FIGS. 27 and 18A, another implementation mode of the LCD screen 20A according to the present invention is illustrated.

In the present example, the LCD screen 20A has a light through hole 200. The light through hole 200 penetrates through the LCD screen 20A in the height direction. At least a part of the light guide assembly 50 is provided in the light through hole 200.

The light guide assembly 50 provides a light guide channel 500. The desired light guide channel 500 may be obtained by designing the shape and structure of the light guide assembly 50.

The light guide assembly 50 includes two light guide conduits. One of the light guide conduits is accommodated in the light through hole 200, and the other light guide conduit extends from the gap between the display screen 20A and the housing 40 to the position of the light through hole 200. That is, one of the light guide conduits can guide light above the display screen 20A to pass through the display screen 20A from top to bottom and then to reach the camera module 30. The other light guide conduit can guide light between the display screen 20A and the housing 40 to reach the camera module 30. The way in which the light through hole 200 is made may be described with reference to the foregoing description.

The light guide conduit may be cylindrical, triangular prism-shaped, or quadrangular prism-shaped. The inner diameters corresponding to all positions of the light guide conduit may be different.

The light guide conduit may be made of a light-transmitting material, so that the light guide conduit is difficult to observe from the outside of the display screen 20A. Meanwhile, in order to reduce the influence of stray light, e.g., the influence of light from the pixel layer 25A of the display screen 20A, the light guide conduit may be coated with a light-shielding material.

Further, the LCD screen 20A includes an optical unit 31A. The optical unit 31A is held in the light guide channel 500 of the light guide assembly 50. The optical unit 31A may be a filtering member, a diffusing member 313A, or a modulating member 312A. The optical unit 31A may pre-process light to achieve desired light entering the camera module 30.

It is worth noting that since the paths of light entering the camera module 30 for imaging through the different light guide channels 500 are different, light of different paths has an optical path difference when reaching the camera module 30. Beams simultaneously reaching a photosensitive chip of the camera module 30 have different phases and may eventually present different images. In order to avoid this problem, the optical path formed by the optical unit 31A in the display screen 20 is designed such that light reaching the camera module 30 may present consistent images.

In order to further reduce the overall height size of the terminal device 1, a camera module 30 having a low height size is adopted preferably in the present invention.

Figure 28:
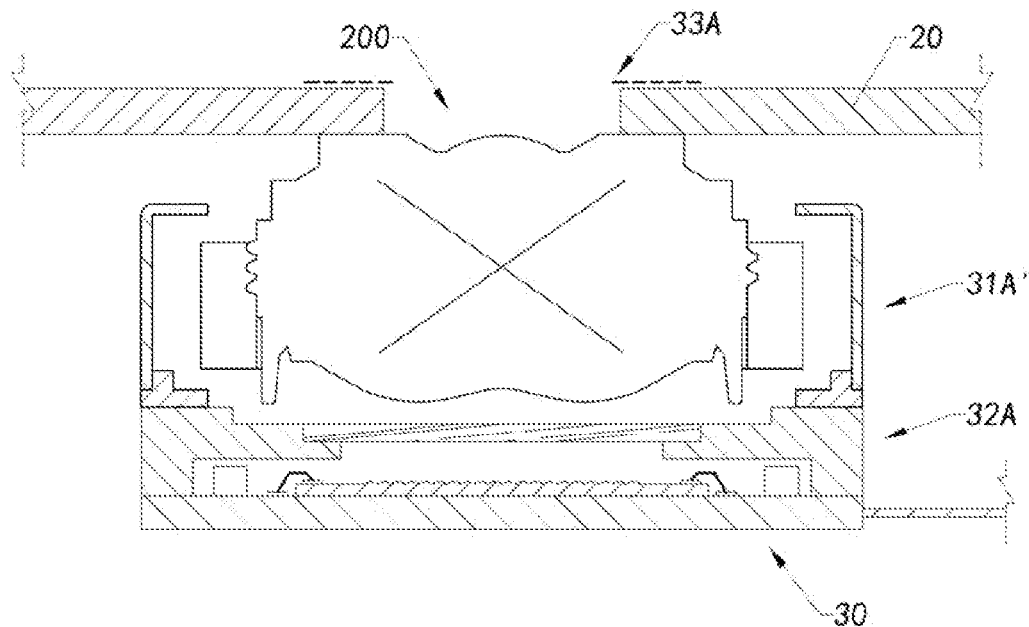
FIG. 28 is a schematic diagram of a display screen according to a preferred embodiment of the present invention.

FIG. 28 illustrates a specific example of the camera module 30 according to the present invention. The camera module 30 includes an optical mechanism 31A' and a photosensitive unit 32A. The camera module 30 may further include a diaphragm 33A. The diaphragm 33A is located at the position of the light through hole 200. The optical mechanism 31A' is held in a photosensitive path of the photosensitive unit 32A.

The diaphragm 33A may serve to constrain light passing through the optical mechanism 31A'. Specifically, it is possible to control the light entering amount of the optical mechanism 31A' by controlling the size of a light through aperture of the diaphragm 33A.

The diaphragm 33A may be circular, triangular, or rectangular. The diaphragm 33A is sized to limit light entering the optical mechanism 31A' by the diaphragm 33A.

In the present example, the display screen 20 is provided with the light through hole 200, and the camera module 30 is mounted below the display screen 20. The light through hole 200 allows light to penetrate through the display screen 20 and then to reach the camera module 30.

The light through hole 200 can function as the diaphragm 33A of the camera module 30, so that for the camera module 30, the camera module 30 does not need to be separately provided with the diaphragm 33A. The amount of light entering the camera module 30 may be controlled by the size control over the light through hole 200 of the display screen 20. The light through hole 200 acts as the diaphragm 33A.

In this way, the height size of the camera module 30 can be reduced, so that the height sizes of the display screen 20 and the camera module 30 can also be reduced, thereby facilitating thinning of the terminal device 1.

Furthermore, before the camera module 30 is mounted to the display screen 20, the optical path design of the camera module 30 is fixed, and parameters such as the light entering amount and the exposure time required by the camera module 30 may be determined. Based on these parameters, the size of the diaphragm 33A may be determined. Therefore, in the process of manufacturing and forming the light through hole 200 in the display screen 20, the light through hole 200 meeting the requirements may be obtained by manufacturing according to the requirements of the camera module 30. Reference may be made to the above manufacturing method of the light through hole 200, and the aperture size and position of the light through hole 200 may be designed as required.

Furthermore, the distance between the camera module 30 and the diaphragm 33A in the photosensitive path of the photosensitive unit 32A is determined based on the optical path design according to the optical requirements of the camera module 30. When the camera module 30 is assembled on the display screen 20, the distance between the camera module 30 and the diaphragm 33A may be adjusted as required by adjusting relative positions of the camera module 30 and the display screen 20 so as to meet the optical path requirements of the camera module 30.

Figure 29:
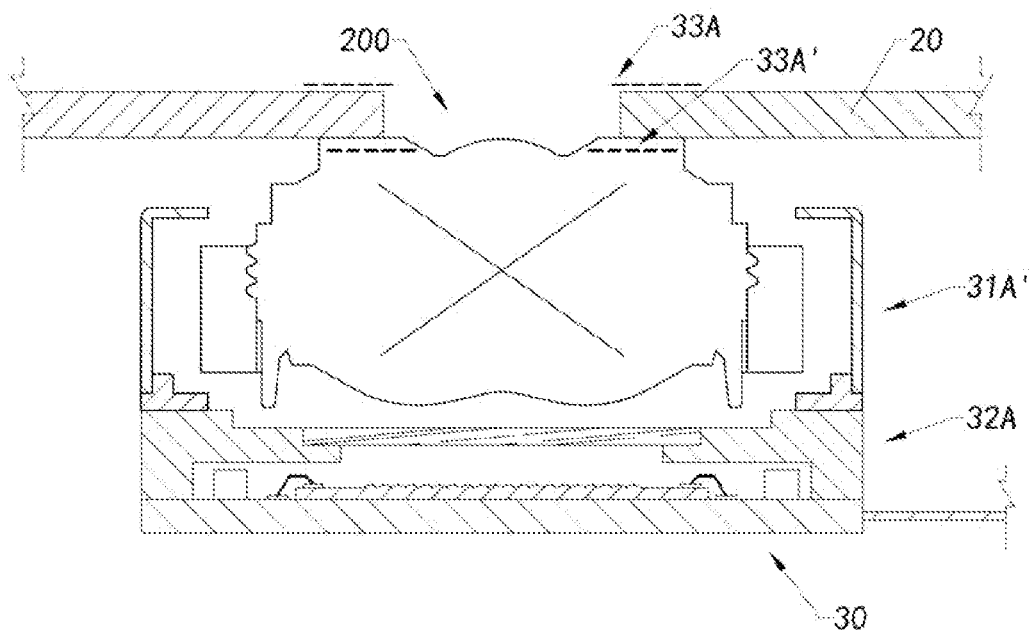
FIG. 29 is a schematic diagram of a display screen according to a preferred embodiment of the present invention.

FIG. 29 illustrates a specific embodiment mode of the camera module 30 according to the present invention.

The camera module 30 includes an optical mechanism 31A', a photosensitive unit 32A, and a diaphragm 33A'. The diaphragm 33A' is provided to the optical mechanism 31A'. The optical mechanism 31A' is held in a photosensitive path of the photosensitive unit 32A. The light through amount of the optical mechanism 31A' may be controlled by controlling the size of the diaphragm 33A'.

When the camera module 30 is mounted to the display screen 20, the light through hole 200 of the display screen 20 allows light to pass through the light through hole 200 from the outside of the display screen 20 and then to reach the camera module 30. The light through hole 200 can influence an imaging result of the camera module 30.

The light through hole 200 acts like a diaphragm, and by controlling the aperture of the light through hole 200, an imaging beam may be controlled. The light through hole 200 of the display screen 20 may serve to constrain the imaging beam of the camera module 30. The diaphragm 33A' of the camera module 30 also serves to constrain the imaging beam. The light through hole 200 of the display screen 20 and the diaphragm 33A' of the camera module 30 may operate in cooperation.

Before the camera module 30 is mounted to the display screen 20, the optical path design of the camera module 30 may be roughly determined so that the size of the light through hole 200 of the display screen 20 may be set based on the requirements of the camera module 30. After the camera module 30 is mounted to the display screen 20, the size of the light through hole 200 is fixed. The relative positions between the camera module 30 and the light through hole 200 may be fixed. The imaging beam may be further controlled by controlling the diaphragm 33A' of the camera module 30.

Further, the light through hole 200 of the display screen 20 may serve to constrain the imaging beam. The diaphragm 33A' of the camera module 30 may also serve to constrain the imaging beam, or may also be provided as a diaphragm capable of eliminating stray light. The stray light is removed from a beam after passing through the light through hole 200. In other words, the light through hole 200 of the display screen 20 and the diaphragm 33A' of the camera module 30 may cooperate with each other to limit the imaging beam. The light through hole 200 of the display screen 20 and the diaphragm 33A' of the camera module 30 may also serve different functions, and is specifically set according to the light path requirements of the camera module 30.

It is worth noting that the diaphragm 33A' of the camera module 30 may be a variable diaphragm, and the aperture of the diaphragm 33A' may be adjusted, so that the light through amount of the camera module 30 is controlled by adjusting the aperture thereof.

Figure 30:
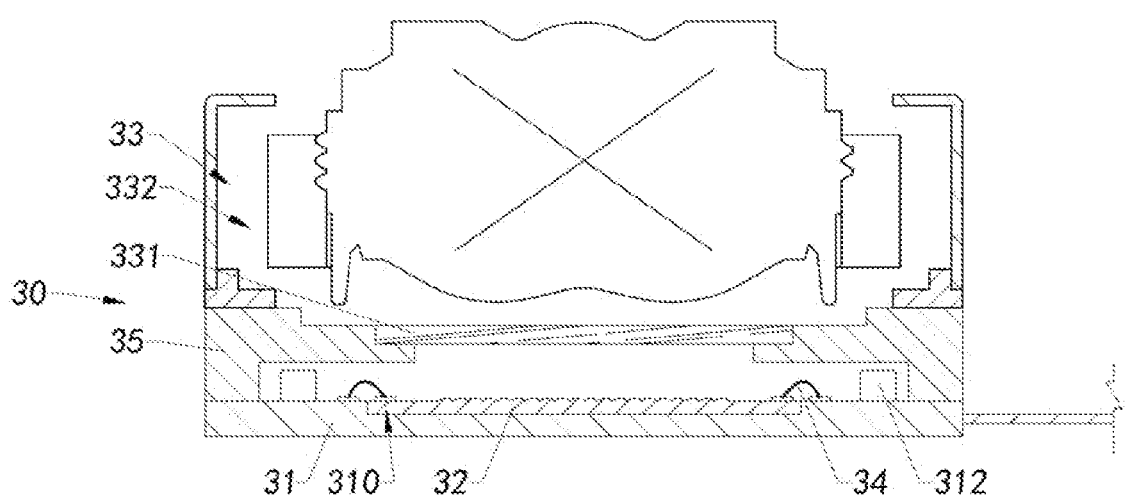
FIG. 30 illustrates a specific example of a camera module according to an embodiment of the present application.

FIG. 30 illustrates a specific example of the camera module 30 according to the present invention. As shown in FIG. 30, in this specific implementation mode, the camera module 30 includes a circuit board 31, a photosensitive chip 32, and a light transmitting assembly 33. The circuit board 31 has a groove 310. The photosensitive chip 32 is provided in the groove 310 and electrically connected to the circuit board 31. The light transmitting assembly 33 is located in a photosensitive path of the photosensitive chip 32. Thus, imaging light transmitted through the display screen 20 reaches the light transmitting assembly 33 and then reaches the photosensitive chip 32 to be sensed by the photosensitive chip 32 for performing an imaging reaction.

Those skilled in the art would know that in a conventional camera module based on a COB process, a circuit board has a flat surface, and a photosensitive chip is directly attached and electrically connected to the flat surface of the circuit board. Since each camera module has a preset optical back focus requirement, a mounting reference height of the photosensitive chip directly determines an overall height size of the camera module 30.

Accordingly, in this specific example, the circuit board 31 is provided with the groove 310 so as to reduce the mounting reference height of the photosensitive chip 32 by the groove 310, as compared with the conventional camera module based on the COB process. In other words, in the present invention, a top surface of the circuit board 31 is a non-flat surface. A region for mounting the photosensitive chip 32 in the circuit board 31 is recessed downward so that the mounting reference height of the photosensitive chip 32 is reduced. It will be understood that the mounting height of an optical lens 332 relative to the circuit board 31 can be reduced if the optical back focus requirements remain unchanged, so that the overall height size of the camera module 30 can be reduced.

Preferably, in this specific example, the size of the groove 310 corresponds to the size of the photosensitive chip 32 so that the groove 310 may be used to position and limit the photosensitive chip 32. Specifically, during mounting of the photosensitive chip 32 in the groove 310, the photosensitive chip 32 may be snugly inserted directly into the groove 310. There is no need to continuously calibrate and position the photosensitive chip at a mounting position of the circuit board in the conventional camera module based on the COB process. Further, after the photosensitive chip 32 is mounted in the groove 310 and electrically connected to the circuit board 31, the photosensitive chip 32 is "defined" in the groove 310 so as to prevent the photosensitive chip 32 from being detached or deviating from the groove 310.

Further, the camera module 30 further includes a group of leads 34. An electrical connection between the photosensitive chip 32 and the circuit board 31 is achieved by the leads 34 after the photosensitive chip 32 is attached in the groove 310 of the circuit board 31. Since the distance between an upper surface of the photosensitive chip 32 and an upper surface of the circuit board 31 is reduced, an arc height of a gold wire between pads connecting the photosensitive chip 32 and the circuit board 31 is also reduced, and the difficulty of wire bonding is reduced.

Specifically, each of the leads 34 extends in a curved manner between the photosensitive chip 32 and the circuit board 31 to connect the photosensitive chip 32 to the circuit board 31 by the leads 34, so that the circuit board 31 may supply power to the photosensitive chip 32 according to the leads 34, and the photosensitive chip 32 may transmit collected signals according to the leads 34.

It is worth mentioning that the type of the leads 34 in this specific example is not limited by the present application. For example, the leads 34 may be gold wires, silver wires, or copper wires. Also, the leads 34 may be mounted between the circuit board 31 and the photosensitive chip 32 by means of a "gold wire bonding" process for achieving an electrical connection therebetween.

Specifically, the "gold wire bonding" process is generally divided into two types: a "forward gold wire bonding" process and a "reverse gold wire bonding" process. The "forward gold wire bonding" process refers to: in the process of laying the lead 34, first forming one end of the lead 34 on a conductive end of the circuit board 31, then extending the lead 34 in a curved manner, and finally forming the other end of the lead 34 on a conductive end of the photosensitive chip 32. In this way, the lead 34 is formed between the photosensitive chip 32 and the circuit board 31. The "reverse gold wire bonding" process refers to: in the process of laying the lead 34, first forming one end of the lead 34 on the conductive end of the photosensitive chip 32, then extending the lead 34 in a curved manner, and finally forming the other end of the lead 34 on the conductive end of the circuit board 31. In this way, the lead 34 is formed between the photosensitive chip 32 and the circuit board 31. It is worth mentioning that an upward protrusion height of the lead 34 formed by the "reverse gold wire bonding" process is smaller than that of the lead 34 formed by the "forward gold wire bonding" process. Therefore, preferably, in this specific implementation, the lead 34 is formed by using the "reverse gold wire bonding" process.

Further, the camera module 30 further includes a base 35. The base 35 is provided to the circuit board 31 for supporting the light transmitting assembly 33. The light transmitting assembly 33 includes a color filter element 331 and an optical lens 332. The color filter element 331 and the optical lens 332 are sequentially provided in the photosensitive path of the photosensitive chip 32. It is worth noting that when the arc height of the lead 34 is reduced, an inner cavity height of the base 35 may also be appropriately reduced, and the height of the base 35 may also be further reduced. Further, the overall height of the camera module 30 may also be appropriately reduced.

Specifically, in this specific example, the base 35 may be implemented as a conventional plastic bracket, which is preformed and attached to the top surface of the circuit board 31; or, the base 35 may be implemented as a molded base, which may be integrally formed at a corresponding position of the circuit board 31 and/or the photosensitive chip 32 by means of molding on board (MOB) and molding on chip (MOC) processes. Those skilled in the art would know that the MOB process refers to: integrally forming the molded base on the circuit board 31 by a molding process. The formed molded base integrally embeds the circuit board 31, electronic components 312 located on the circuit board 31, and the leads 34. The MOC process refers to: integrally forming the molded base on the circuit board 31 by a molding process. The formed molded base embeds the circuit board 31 and electronic components 312 located on the circuit board 31 as well as at least a part of the leads 34, or embeds the leads 34 and at least a part of the photosensitive chip 32 (wherein at least one region of the photosensitive chip 32 is a non-photosensitive region of the photosensitive chip 32).

In this specific example, the color filter element 331 is provided between the optical lens 332 and the photosensitive element so that light entering the camera module 30 from the optical lens 332 is filtered by the color filter element 331 and can be received and subjected to photoelectric conversion by the photosensitive chip 32 to improve the imaging quality of the camera module 30. For example, the color filter element 331 may be configured to filter an infrared part of light entering the camera module 30 from the optical lens 332.

Those skilled in the art would know that the color filter element 331 can be implemented as a variety of types, including, but not limited to, infrared cutoff filters, full-transmission spectral filters, and other filters or combinations of a plurality of filters. Specifically, for example, the color filter element 331 is implemented as a combination of an infrared cutoff filter and a full-transmission spectral filter. That is, the infrared cutoff filter and the full-transmission spectrum filter can be switched to be selectively located in the photosensitive path of the photosensitive chip 32. Thus, when the camera module 30 is used in a light-sufficient environment such as daytime, the infrared cutoff filter may be switched to the photosensitive path of the photosensitive chip 32 to filter infrared rays in light reflected by an object entering the camera module 30 by the infrared cutoff filter, and when the camera module 30 is used in a dark environment such as night, the full-transmission spectral filter may be switched to the photosensitive path of the photosensitive chip 32 to allow partial light transmission of infrared rays in light reflected by an object entering the camera module 30.

It is worth mentioning that the color filter element 331 may also be provided at other positions in the photosensitive path of the photosensitive chip 32. For example, the color filter element 331 is provided at the bottom portion of the optical lens 332, the bottom side of the optical lens 332, etc. which is not limited by the present application.

In addition, it is also worth mentioning that in this specific example, the camera module 30 may be implemented as a fixed focus module or a dynamic focus module. When the camera module 30 is a dynamic focus module, the camera module 30 further includes a driver 36 connected to the circuit board 31. The driver 36 is configured to controllably drive the lens to move so as to realize auto-focus.

Figure 31:
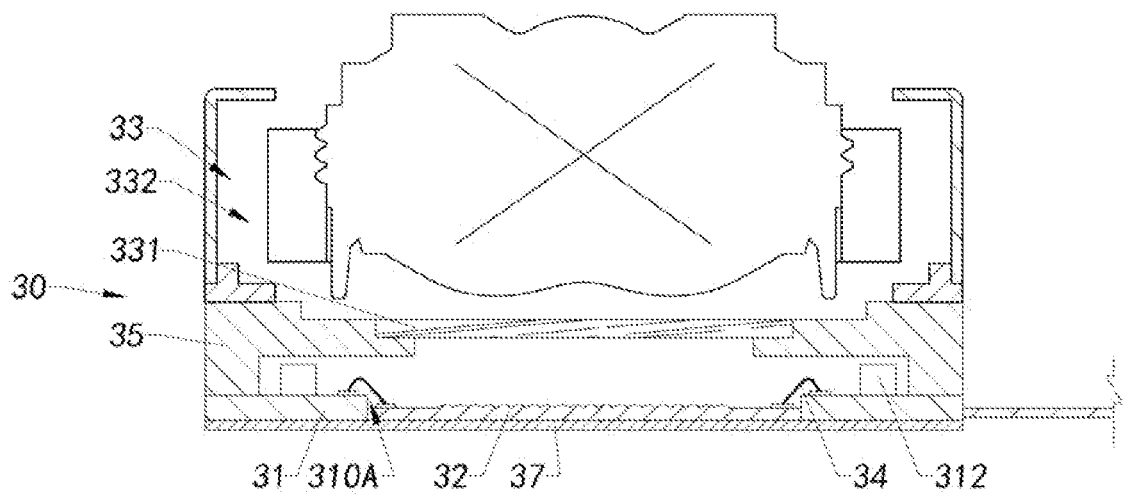
FIG. 31 illustrates another specific example of a camera module according to an embodiment of the present application.

FIG. 31 illustrates another specific example of the camera module 30 according to the present invention. The camera module 30 illustrated in FIG. 31 is a modified implementation mode of the camera module 30 illustrated in FIG. 30.

Specifically, as shown in FIG. 31, in this specific example, the camera module 30 includes a circuit board 31, a photosensitive chip 32, a light transmitting assembly 33, and a reinforcing plate 37. The circuit board 31 has an opening 310A penetratingly formed in the circuit board 31. The reinforcing plate 37 is attached to a bottom surface of the circuit board 31. The photosensitive chip 32 is provided at the opening 310A of the circuit board 31 and attached to the reinforcing plate 37. The photosensitive chip 32 may be conductively connected to the circuit board 31. The light transmitting assembly 33 is provided in a photosensitive path of the photosensitive chip 32. Thus, imaging light transmitted through the display screen 20 reaches the light transmitting assembly 33 and then reaches the photosensitive chip 32 to be sensed by the photosensitive chip 32 for performing an imaging reaction.

The reinforcing plate 37 may be implemented as a steel plate, which has a more flat surface than the circuit board 31. When the photosensitive chip 32 is attached thereto, the plate is more flat and has a better imaging effect. In addition, the thermal conductivity of metal is better, and the steel plate may be used for heat dissipation.

In other words, in this specific example, the circuit board 31 has the opening 310A that is penetratingly formed in the circuit board 31 to reduce the mounting reference height of the photosensitive chip 32 by the opening 310A, as compared with the camera module 30 illustrated in FIG. 30. In other words, in the present invention, a top surface of the circuit board 31 is a non-flat surface. A region for mounting the photosensitive chip 32 in the circuit board 31 is recessed downward and penetrates through the circuit board 31 so that the mounting reference height of the photosensitive chip 32 is further reduced. It will be understood that each camera module has a preset optical back focus requirement, so that the mounting height of an optical lens 332 relative to the circuit board 31 can be further reduced if the optical back focus requirements remain unchanged, and the overall height size of the camera module 30 can be further reduced.

As shown in FIG. 31, it should be particularly noted that in this specific example, a bottom surface of the photosensitive chip 32 is flush with the bottom surface of the circuit board 31. That is, the mounting reference height of the photosensitive chip 32 is the height of the bottom surface of the circuit board 31, so that the mounting position of the photosensitive chip 32 can be further reduced on the premise of ensuring a preset optical back focus, and the overall height size of the camera module 30 can be further reduced.

Preferably, in this specific example, the size of the opening 310A corresponds to the size of the photosensitive chip 32 so that the opening 310A may be used to position and limit the photosensitive chip 32. Specifically, during mounting of the photosensitive chip 32 in the opening 310A, the photosensitive chip 32 may be snugly inserted directly into the opening 310A and finally attached to the reinforcing plate 37. There is no need to continuously calibrate and position the photosensitive chip 32 at a mounting position of the circuit board 31 in the conventional camera module based on the COB process. Further, after the photosensitive chip 32 is mounted in the opening 310A and electrically connected to the circuit board 31, the photosensitive chip 32 is "defined" in the opening 310A so as to prevent the photosensitive chip 32 from being detached or deviating from the opening 310A.

Further, the camera module 30 further includes a group of leads 34. An electrical connection between the photosensitive chip 32 and the circuit board 31 is achieved by the leads 34 after the photosensitive chip 32 is mounted in the opening 310A of the circuit board 31. Specifically, each of the leads 34 extends in a curved manner between the photosensitive chip 32 and the circuit board 31 to connect the photosensitive chip 32 to the circuit board 31 by the leads 34, so that the circuit board 31 may supply power to the photosensitive chip 32 according to the leads 34, and the photosensitive chip 32 may transmit collected signals according to the leads 34.

It is worth mentioning that the type of the leads 34 in this specific example is not limited by the present application. For example, the leads 34 may be gold wires, silver wires, or copper wires. Also, the leads 34 may be mounted between the circuit board 31 and the photosensitive chip 32 by means of a "gold wire bonding" process for achieving an electrical connection therebetween.

Specifically, the "gold wire bonding" process is generally divided into two types: a "forward gold wire bonding" process and a "reverse gold wire bonding" process. The "forward gold wire bonding" process refers to: in the process of laying the lead 34, first forming one end of the lead 34 on a conductive end of the circuit board 31, then extending the lead 34 in a curved manner, and finally forming the other end of the lead 34 on a conductive end of the photosensitive chip 32. In this way, the lead 34 is formed between the photosensitive chip 32 and the circuit board 31. The "reverse gold wire bonding" process refers to: in the process of laying the lead 34, first forming one end of the lead 34 on the conductive end of the photosensitive chip 32, then extending the lead 34 in a curved manner, and finally forming the other end of the lead 34 on the conductive end of the circuit board 31. In this way, the lead 34 is formed between the photosensitive chip 32 and the circuit board 31. It is worth mentioning that an upward protrusion height of the lead 34 formed by the "reverse gold wire bonding" process is smaller than that of the lead 34 formed by the "forward gold wire bonding" process. Therefore, preferably, in this specific implementation, the lead 34 is formed by using the "reverse gold wire bonding" process.

Further, the camera module 30 further includes a base 35. The base 35 is provided to the circuit board 31 for supporting the light transmitting assembly 33. The light transmitting assembly 33 includes a color filter element 331 and an optical lens 332. The color filter element 331 and the optical lens 332 are sequentially provided in the photosensitive path of the photosensitive chip 32.

Specifically, in this specific example, the base 35 may be implemented as a conventional plastic bracket, which is preformed and attached to the top surface of the circuit board 31; or, the base 35 may be implemented as a molded base, which may be integrally formed at a corresponding position of the circuit board 31 and/or the photosensitive chip 32 by means of MOB and MOC processes. Those skilled in the art would know that the MOB process refers to: integrally forming the molded base on the circuit board 31 by a molding process. The formed molded base integrally embeds the circuit board 31, electronic components 312 located on the circuit board 31, and the leads 34. The MOC process refers to: integrally forming the molded base on the circuit board 31 by a molding process. The formed molded base embeds the circuit board 31 and electronic components 312 located on the circuit board 31 as well as at least a part of the leads 34, or embeds the leads 34 and at least a part of the photosensitive chip 32 (wherein at least one region of the photosensitive chip 32 is a non-photosensitive region of the photosensitive chip 32).

In this specific example, the color filter element 331 is provided between the optical lens 332 and the photosensitive element so that light entering the camera module 30 from the optical lens 332 is filtered by the color filter element 331 and can be received and subjected to photoelectric conversion by the photosensitive chip 32 to improve the imaging quality of the camera module 30. For example, the color filter element 331 may be configured to filter an infrared part of light entering the camera module 30 from the optical lens 332.

Those skilled in the art would know that the color filter element 331 can be implemented as a variety of types, including, but not limited to, infrared cutoff filters, full-transmission spectral filters, and other filters or combinations of a plurality of filters. Specifically, for example, the color filter element 331 is implemented as a combination of an infrared cutoff filter and a full-transmission spectral filter. That is, the infrared cutoff filter and the full-transmission spectrum filter can be switched to be selectively located in the photosensitive path of the photosensitive chip 32. Thus, when the camera module 30 is used in a light-sufficient environment such as daytime, the infrared cutoff filter may be switched to the photosensitive path of the photosensitive chip 32 to filter infrared rays in light reflected by an object entering the camera module 30 by the infrared cutoff filter, and when the camera module 30 is used in a dark environment such as night, the full-transmission spectral filter may be switched to the photosensitive path of the photosensitive chip 32 to allow partial light transmission of infrared rays in light reflected by an object entering the camera module 30.

It is worth mentioning that the color filter element 331 may also be provided at other positions in the photosensitive path of the photosensitive chip 32. For example, the color filter element 331 is provided at the bottom part of the optical lens 332, the bottom side of the optical lens 332, etc. which is not limited by the present application.

It is also worth mentioning that in this specific example, the camera module 30 may be implemented as a fixed focus camera module or a dynamic focus camera module. When the camera module 30 is a dynamic focus camera module, the camera module 30 further includes a driver 36 electrically connected to the circuit board 31. The driver 36 is configured to controllably drive the lens to move so as to realize auto-focus.

Figure 32:
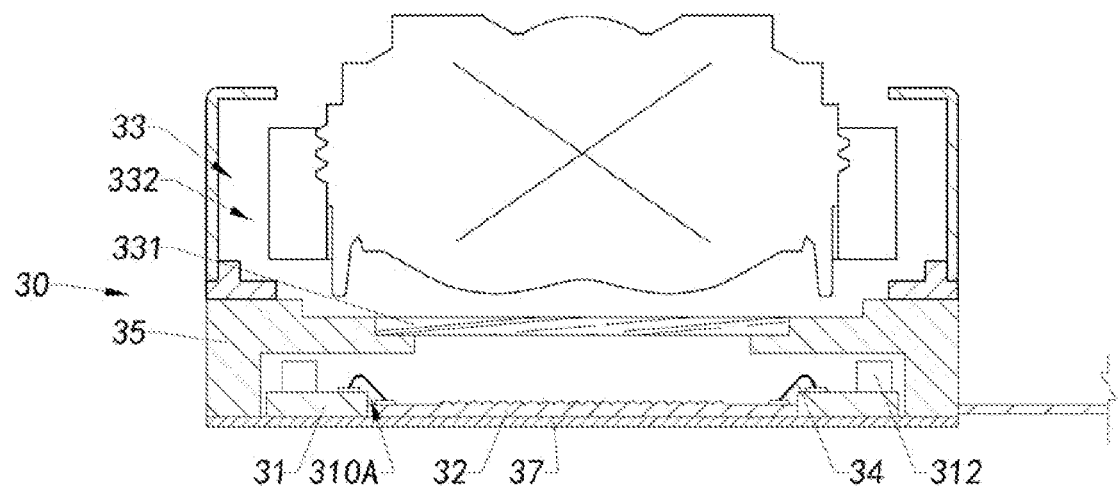
FIG. 32 illustrates yet another specific example of a camera module according to an embodiment of the present application.

FIG. 32 is yet another specific illustration of the camera module 30 according to the present invention. The camera module 30 illustrated in FIG. 32 is a modified implementation mode of the camera module 31 illustrated in FIG. 30.

Specifically, in this specific example, the base 35 is directly mounted to the reinforcing plate 37, as compared with the camera module 30 illustrated in FIG. 31. In other words, in this specific example, the mounting reference height of the base 35 is reduced, so that the mounting reference height of the optical lens 332 mounted to the base 35 is reduced, and the overall height size of the camera module 30 is reduced.

Accordingly, in this specific embodiment, the base 35 may be implemented as a conventional plastic bracket, which is preformed and attached to a top surface of the reinforcing plate 37; or, the base 35 may be implemented as a molded base, which may be integrally formed at a corresponding position of the reinforcing plate 37, the circuit board 31, and/or the photosensitive chip 32 by means of MOB and MOC processes. Those skilled in the art would know that the MOB process refers to: integrally forming the molded base on the circuit board 31 by a molding process. The formed molded base integrally embeds the reinforcing plate 37, the circuit board 31, electronic components 312 located on the circuit board 31, and the leads 34. The MOC process refers to: integrally forming the molded base on the circuit board 31 by a molding process. The formed molded base embeds the reinforcing plate 37, the circuit board 31, and electronic components 312 located on the circuit board 31 as well as at least a part of the leads 34, or embeds the leads 34 and at least a part of the photosensitive chip 32 (wherein at least one region of the photosensitive chip 32 is a non-photosensitive region of the photosensitive chip 32).

Figure 33:
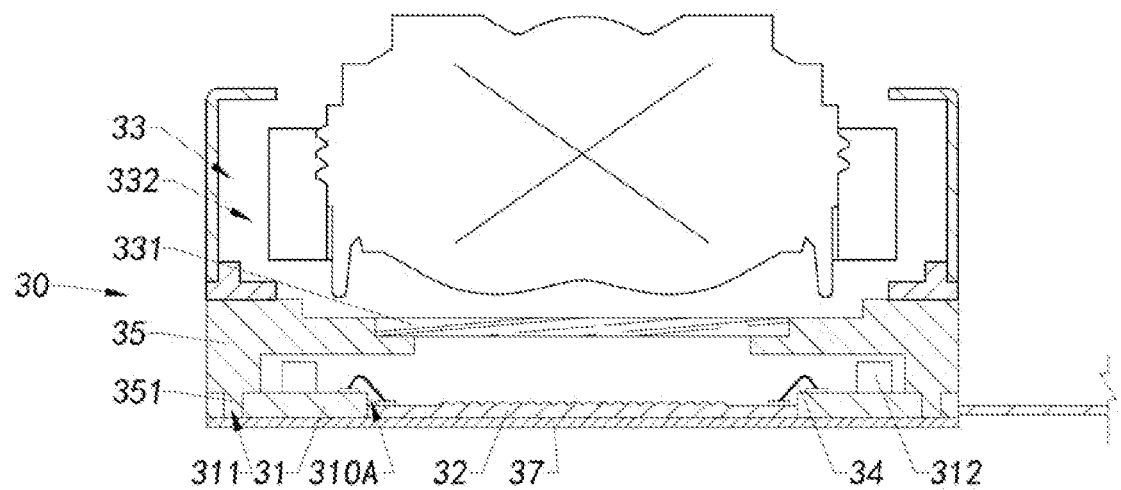
FIG. 33 illustrates yet another specific example of a camera module according to an embodiment of the present application.

FIG. 33 illustrates yet another specific example of the camera module 30 according to the present invention. The camera module 30 illustrated in FIG. 33 is another modified implementation mode of the camera module 31 illustrated in FIG. 30.

Specifically, in this specific example, the base 35 has at least two positioning columns 351 extending downward, as compared with the camera module 30 illustrated in FIG. 31. The circuit board 31 has at least two openings 311. The positioning columns 351 are provided to the reinforcing plate 37 by penetrating through the openings 311 in such a manner that the mounting reference height of the base 35 can be reduced and the overall height of the camera module 30 can be reduced.

Figure 34:
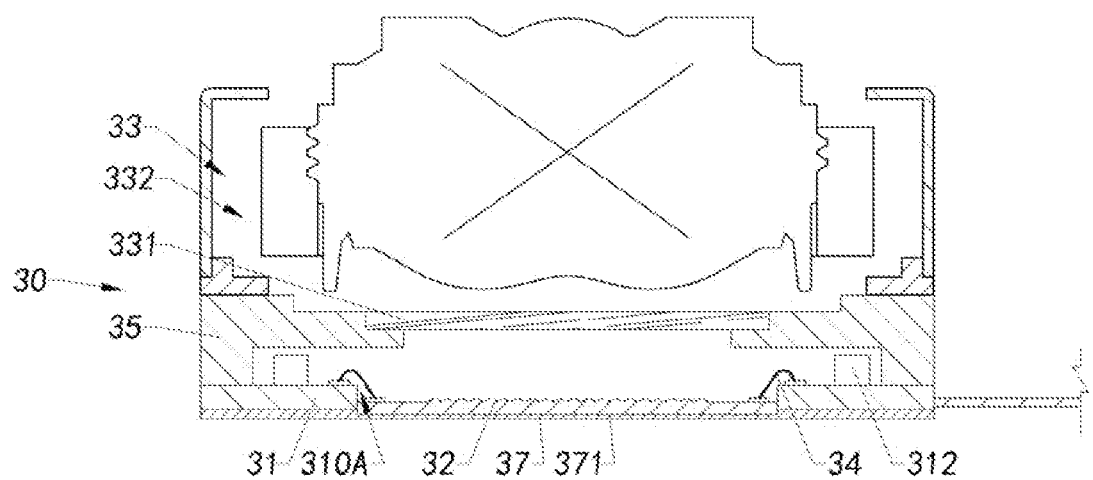
FIG. 34 illustrates yet another specific example of a camera module according to an embodiment of the present application.
Figure 35:
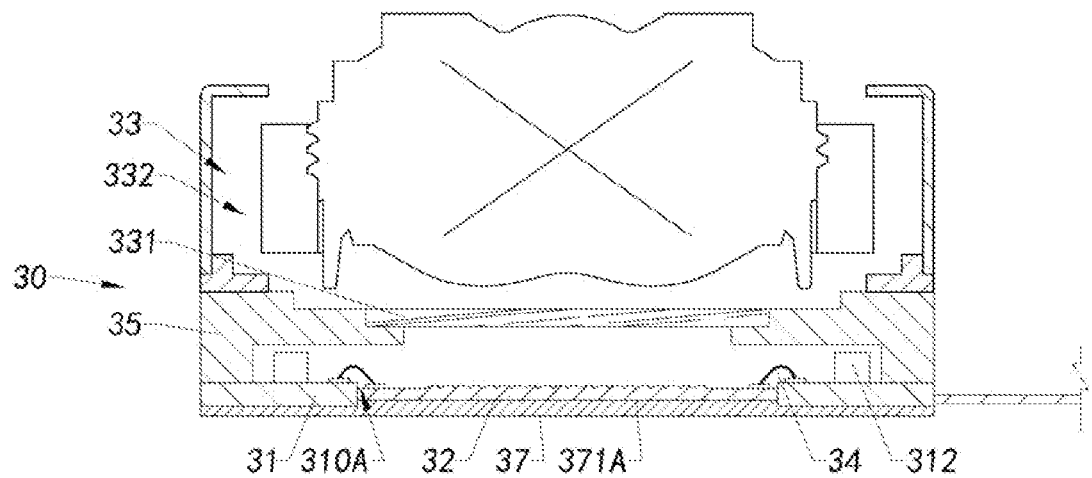
FIG. 35 illustrates yet another specific example of a camera module according to an embodiment of the present application.

FIGS. 34 and 35 illustrate yet another specific example of the camera module 30 according to the present invention. The camera module 30 illustrated in FIGS. 34 and 35 is yet another modified implementation mode of the camera module 31 illustrated in FIG. 30.

As shown in FIGS. 34 and 35, in this specific example, the reinforcing plate 37 has a boss 371A or a groove 371 at the opening 310A of the circuit board 31 to adjust the mounting reference height of the photosensitive chip 32 by the boss 371A or the groove 371. In other words, in this specific example, the bottom surface of the photosensitive chip 32 is not flush with the bottom surface of the circuit board 31.

Specifically, as shown in FIG. 34, when the reinforcing plate 37 has a groove 371 at the opening 310A of the circuit board 31, the mounting reference height of the photosensitive chip 32 is further reduced, so that the overall height size of the camera module 30 is further reduced when meeting the design requirements of a preset optical back focus. It should be noted that when the reinforcing plate 37 has a groove 371 at the opening 310A of the circuit board 31, the photosensitive chip 32 is attached to the reinforcing plate 37, at which time the bottom surface of the photosensitive chip 32 is lower than the bottom surface of the circuit board 31.

Specifically, as shown in FIG. 35, when the reinforcing plate 37 has a boss 371A at the opening 310A of the circuit board 31, the mounting reference height of the photosensitive chip 32 is reduced as compared with the conventional camera module based on the COB process, so that the overall height size of the camera module 30 is reduced when meeting the design requirements of a preset optical back focus. It should be noted that when the reinforcing plate 37 has a boss 371A at the opening 310A of the circuit board 31, the photosensitive chip 32 is attached to the reinforcing plate 37, at which time the bottom surface of the photosensitive chip 32 is higher than the bottom surface of the circuit board 31 but lower than the top surface of the circuit board 31.

Figure 36:
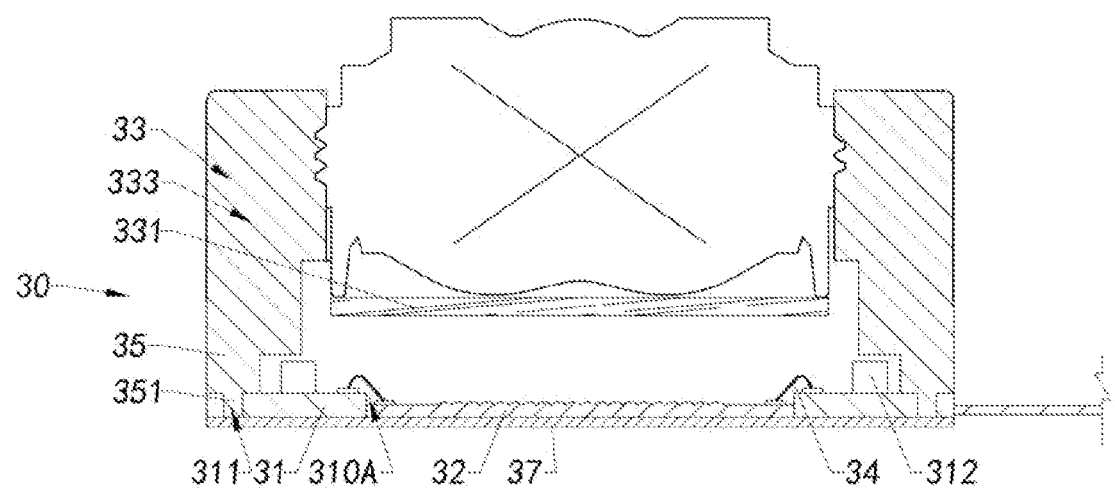
FIG. 36 illustrates yet another specific example of a camera module according to an embodiment of the present application.

FIG. 36 illustrates yet another specific example of the camera module 30 according to the present invention. The camera module 30 illustrated in FIG. 36 is a modified implementation mode of the camera module 33 illustrated in FIG. 30.

Specifically, as shown in FIG. 36, in this specific example, the camera module 30 includes a circuit board 31, a photosensitive chip 32, a base 35, an optical lens 332, a color filter element 331, and a reinforcing plate 37. The circuit board 31 has an opening 310A penetratingly formed in the circuit board 31. The reinforcing plate 37 is attached to a bottom surface of the circuit board 31. The photosensitive chip 32 is provided at the opening 310A of the circuit board 31 and attached to the reinforcing plate 37. The photosensitive chip 32 may be conductively connected to the circuit board 31. The color filter element 331 and the optical lens 332 are sequentially provided in a photosensitive path of the photosensitive chip 32. Thus, imaging light transmitted through the display screen 20 reaches the optical lens 332, and is filtered by the color filter element 331, and then reaches the photosensitive chip 32 to be sensed by the photosensitive chip 32 for performing an imaging reaction.

In particular, in this specific implementation mode, the optical lens 332 and the base 35 have an integrated structure. That is, the optical lens 332 and the base 35 have been integrated before participating in the assembly of the camera module 30. In other words, in this specific example, the optical lens 332 is an integrated lens 333 that is assembled with the base 35 to form an element unit. Further, in this specific example, the base 35 has at least two positioning columns extending downward. The circuit board 31 has at least two openings. The positioning columns are provided to the reinforcing plate 37 by penetrating through the openings in such a manner that the integrated lens 333 and the photosensitive chip 32 have the same mounting reference plane (i.e., the top surface of the reinforcing plate 37). Thus, the overall height size of the camera module 30 is reduced to meet the design requirements of a preset optical back focus.

It is worth mentioning that in this specific example of the application, the integrated lens 333 may further include the color filter unit 331. That is, in this specific implementation mode, the optical lens 332, the base 35, and the color filter unit 331 have an integrated structure. That is, the optical lens 332, the base 35, and the color filter unit 331 have been integrated before participating in the assembly of the camera module 30. Thus, it is possible to make the assembly of the camera module 30 more compact, so that the overall height size of the camera module 30 is reduced.

Figure 37:
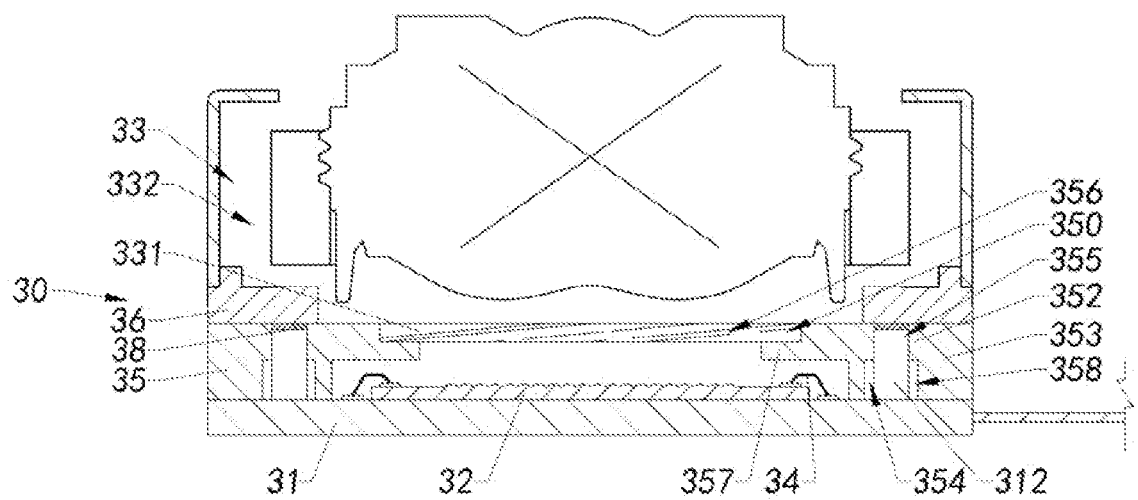
FIG. 37 illustrates yet another specific example of a camera module according to an embodiment of the present application.

FIG. 37 illustrates yet another specific example of the camera module 30 according to the present invention. As shown in FIG. 37, in this specific example, the camera module 30 includes an optical lens 332, a base 35, a color filter element 331, a photosensitive chip 32, and a circuit board 31. The photosensitive chip 32 is conductively provided to the circuit board 31. The base 35 is provided to the circuit board 31. The lens and the color filter element 331 are sequentially provided in a photosensitive path of the photosensitive chip 32. The base 35 is configured to support the color filter element 331. Thus, imaging light transmitted through the display screen 20 reaches the optical lens 332, and is filtered by the color filter element 331, and then reaches the photosensitive chip 32 to be sensed by the photosensitive chip 32 for performing an imaging reaction.

Further, the camera module 30 further includes a group of leads 34. An electrical connection between the photosensitive chip 32 and the circuit board 31 is achieved by the leads 34 after the photosensitive chip 32 is attached in the circuit board. Specifically, each of the leads 34 extends in a curved manner between the photosensitive chip 32 and the circuit board 31 to connect the photosensitive chip 32 to the circuit board 31 by the leads 34, so that the circuit board 31 may supply power to the photosensitive chip 32 according to the leads 34, and the photosensitive chip 32 may transmit collected signals according to the leads 34.

It is worth mentioning that the type of the leads 34 in this specific example is not limited by the present application. For example, the leads 34 may be gold wires, silver wires, or copper wires. Also, the leads 34 may be mounted between the circuit board 31 and the photosensitive chip 32 by means of a "gold wire bonding" process for achieving an electrical connection therebetween.

Specifically, the "gold wire bonding" process is generally divided into two types: a "forward gold wire bonding" process and a "reverse gold wire bonding" process. The "forward gold wire bonding" process refers to: in the process of laying the lead 34, first forming one end of the lead 34 on a conductive end of the circuit board 31, then extending the lead 34 in a curved manner, and finally forming the other end of the lead 34 on a conductive end of the photosensitive chip 32. In this way, the lead 34 is formed between the photosensitive chip 32 and the circuit board 31. The "reverse gold wire bonding" process refers to: in the process of laying the lead 34, first forming one end of the lead 34 on the conductive end of the photosensitive chip 32, then extending the lead 34 in a curved manner, and finally forming the other end of the lead 34 on the conductive end of the circuit board 31. In this way, the lead 34 is formed between the photosensitive chip 32 and the circuit board 31. It is worth mentioning that an upward protrusion height of the lead 34 formed by the "reverse gold wire bonding" process is smaller than that of the lead 34 formed by the "forward gold wire bonding" process. Therefore, preferably, in this specific implementation, the lead 34 is formed by using the "reverse gold wire bonding" process.

A group of electronic components 312 is further provided on the circuit board 31. Each of the electronic components 312 may be attached to an edge region of the circuit board 31 at intervals (as compared with an attachment position of the photosensitive chip 32) by a process such as a surface mount technology (SMT). The electronic components 312 include, but are not limited to, resistors, capacitors, inductors, etc. It is worth mentioning that the photosensitive chip 32 and each of the electronic components 312 may be located on the same side or opposite sides of the circuit board 31, respectively. For example, the photosensitive chip 32 and each of the electronic components 312 may be located on the same side of the circuit board 31, respectively, and each of the electronic components 312 may be attached to an edge region of the circuit board 31 at intervals.

In particular, as shown in FIG. 37, in this specific example, the base 35 is supported on the top surface of the circuit board 31, and the base 35 includes a body 352 and a side wall 353 extending downward along the body 352. The body 352 and the side wall 353 define an accommodation cavity 354. When the base 35 is provided to the circuit board 31, the side wall 353 is supported on the circuit board 31, the bottom surface of the base 35, the upper surface of the circuit board 31, and the side wall 353 together define the accommodation cavity 354. The electronic components 312 provided to the circuit board 31 are accommodated in the accommodation cavity 354. Preferably, the height size of the accommodation cavity 354 is less than 0.2 mm, such as 0.1 mm.

Further, as shown in FIG. 37, in this specific example, the base 35 also has at least one accommodation hole 355. The accommodation hole 355 penetrates through the base 35 to be communicated with the accommodation cavity 354 and an external environment. It will be understood that in this specific embodiment, the height of the accommodation cavity 354 is lower than that of a high-sized electronic component 312, such as a capacitor. Therefore, when the base 35 is provided to the circuit board 31, the height from the bottom surface of the body 352 of the base 35 to the top surface of the circuit board 31 is less than a high-sized electronic component 312 such as a capacitor. If the accommodation hole 355 is not provided, the electronic component 312 cannot be accommodated. That is, the accommodation hole 355 serves to avoid the high-sized electronic component 312 so that the electronic component 312 may be accommodated in the base 35 with the height of the base 35 reduced. In other words, by providing the accommodation hole 355 in the base 35, the overall design height of the base 35 can be reduced so that the overall height size of the camera module 30 is reduced.

By way of example and not limitation, for example, the height of the capacitor in the electronic component 312 is 0.38 mm, the height of the accommodation cavity 354 is 0.1 mm, and the thickness of the body 352 of the base 35 is set to 0.4 mm, that is, the height of the accommodation hole 355 is 0.4 mm. Thus, when the base 35 is provided to the circuit board 31, the capacitor in the electronic component 312 cannot be completely accommodated in the accommodation cavity 354. Accordingly, an upper end of the capacitor in the electronic component 312 extends into the accommodation hole 355 and is accommodated in the accommodation hole 355. It will be understood that in the present invention, the accommodation hole 355 should be configured to match the electronic component 312 of the circuit board 31. A horizontal size of the electronic component 312 determines the size of the accommodation hole 355. That is, the electronic component 312 should be ensured to be accommodated in the accommodation hole 355.

Further, as shown in FIG. 37, in this specific example, the base 35 further has a light through hole 356. The light through hole 356 is formed in the body 352 of the base 35 and corresponds to the photosensitive chip 32. The light through hole 356 is configured to place the color filter element 331. Accordingly, the body 352 of the base 35 also has a cantilever 357. The cantilever 357 extends integrally to the body 352 and defines the size of the light through hole 356. The color filter element 331 is placed on the cantilever 357 and filters light received by the module. It should be particularly noted that in this specific example, when the base 35 is provided to the circuit board 31, the color filter element 331 is placed on the cantilever 357 of the body 352. When the upper end of at least one of the electronic components 312 is accommodated in the accommodation hole 355, the top surface of a portion of the electronic component 312 is observed to be higher than the bottom surface of the color filter element 331.

It is worth mentioning that in this specific example, the color filter element 331 can be implemented as a variety of types, including, but not limited to, infrared cutoff filters, full-transmission spectral filters, and other filters or combinations of a plurality of filters. Specifically, for example, the color filter element 331 is implemented as a combination of an infrared cutoff filter and a full-transmission spectral filter. That is, the infrared cutoff filter and the full-transmission spectrum filter can be switched to be selectively located in the photosensitive path of the photosensitive chip 32. Thus, when the camera module 30 is used in a light-sufficient environment such as daytime, the infrared cutoff filter may be switched to the photosensitive path of the photosensitive chip 32 to filter infrared rays in light reflected by an object entering the camera module 30 by the infrared cutoff filter. And when the camera module 30 is used in a dark environment such as night, the full-transmission spectral filter may be switched to the photosensitive path of the photosensitive chip 32 to allow partial light transmission of infrared rays in light reflected by an object entering the camera module 30.

The color filter element 331 may also be, certainly, provided at other positions in the photosensitive path of the photosensitive chip 32. For example, the color filter element 331 is provided at the bottom part of the optical lens 332, the bottom side of the optical lens 332, etc. which is not limited by the present application.

In particular, as shown in FIG. 37, in this specific example, the base 35 may be implemented as a conventional plastic bracket, which is preformed and attached to the top surface of the circuit board 31; or, the base 35 may be implemented as a molded base, which may be integrally formed by a molding process and attached to the top surface of the circuit board 31. However, due to the limited molding process of the base 35, the accommodation hole 355 is provided as a light through hole. That is, the accommodation hole 355 is communicated with the accommodation cavity 354 and the external environment. It should be appreciated that when the camera module 30 is assembled, dirt easily enters through the accommodation hole 355 to cause stain to the photosensitive chip 32.

Therefore, as shown in FIG. 37, in this specific example, the camera module 30 further includes a protecting member 38. The protecting member 38 integrally extends downward from the body 352. When the base 35 is provided to the circuit board 31, the protecting member 38 surrounds the photosensitive chip 32, and the protecting member 38, the body 352 of the base 35, and the color filter element 331 provided to the body 352 form a sealed space to prevent dirt from entering the photosensitive chip 32.

Figure 38:
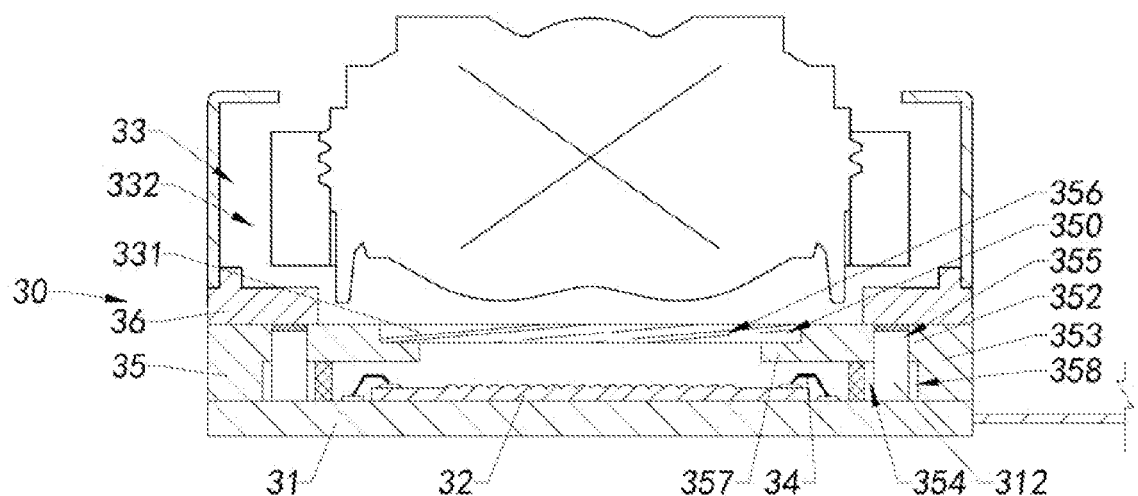
FIG. 38 illustrates yet another specific example of a camera module according to an embodiment of the present application.

In specific implementations, the protecting member 38 may be implemented as a part of the body 352 of the base 35, which integrally extends downward from the body 352. When the base 35 is provided to the circuit board 31, the protecting member 38 surrounds the photosensitive chip 32, and the protecting member 38, the body 352 of the base 35, and the color filter element 331 provided to the body 352 form a sealed space to prevent dirt from entering the photosensitive chip 32. Or, the protecting member 38 and the base 35 are provided separately. As shown in FIG. 38, for example, the protecting member 38 is attached to the base 35 by means of bonding or the like, thereby reducing the difficulty of forming the base 35.

Preferably, the upper end of the accommodation hole 355 may be sealed with a film or a glue, etc., thereby preventing, on one hand, the electronic component 312 from being damaged and further enhancing, on the other hand, the sealing effect to prevent dirt from entering the photosensitive chip 32.

It is worth mentioning that in this specific example, the camera module 30 may be implemented as a fixed focus module or a dynamic focus module. When the camera module 30 is a dynamic focus module, the camera module 30 further includes a driver 36 (the driver may be implemented as, for example but not limited to, a motor, etc.) electrically connected to the circuit board 31. The driver 36 is configured to controllably drive the lens to move so as to realize auto-focus, as shown in FIG. 39.

Figure 39:
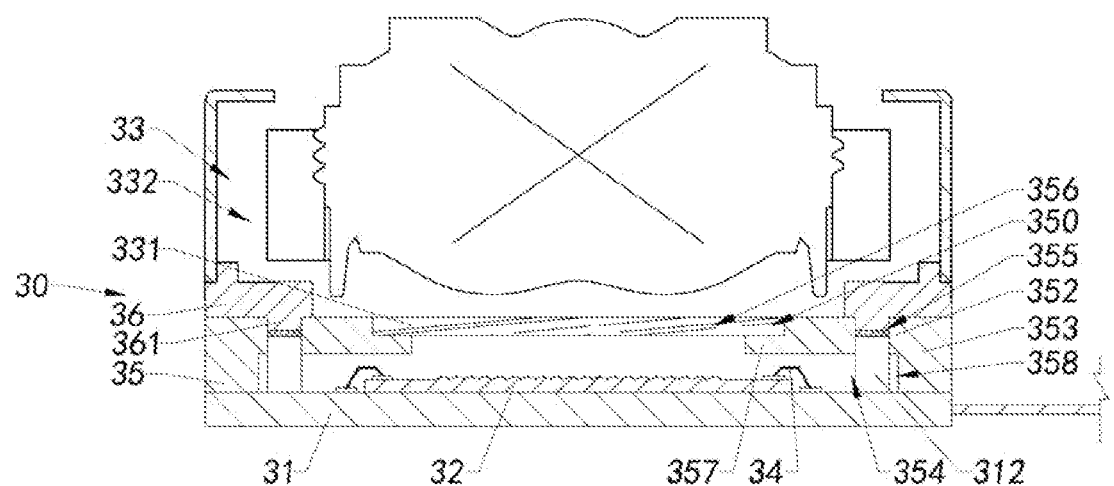
FIG. 39 illustrates yet another specific example of a camera module according to an embodiment of the present application.

In particular, as shown in FIG. 39, the driver 36 includes at least one positioning column 361 extending to a lower end of the driver 36, and, at least one of the positioning columns 361 is formed at the position of the driver 36 and corresponds to at least one of the accommodation holes 355, so that when the driver 36 is mounted to the base 35, the positioning columns are clamped into the accommodation holes 355 in a latching manner. Thus, the mounting accuracy of the driver can be improved by the cooperation of the positioning columns 361 and the accommodation holes 355, and the reliability of the driver 36 can be improved by the cooperation between the positioning columns and the accommodation holes 355.

Figure 40:
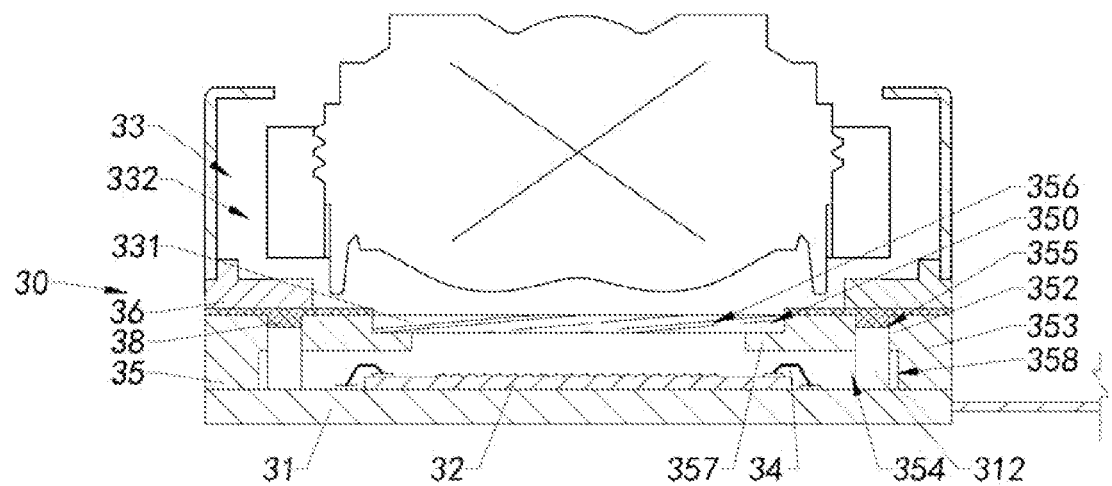
FIG. 40 illustrates yet another specific example of a camera module according to an embodiment of the present application.

FIG. 40 illustrates yet another specific example of the camera module 30 according to the present invention. The camera module 30 illustrated in FIG. 40 is a modified implementation mode of the camera module 37 illustrated in FIG. 30.

Specifically, as shown in FIG. 40, in this specific example, the protecting member 38 is implemented as a protective film which is attached to the upper end (the top surface of the body 352) of the accommodation hole 355. Thus, when the base 35 is provided to the circuit board 31, the protective film ensures that the accommodation hole 355 and the accommodation cavity 354 are an enclosed space, so that dirt can be prevented from entering the photosensitive chip 32, and the protective film may also protect the electronic component 312. For example, the protective film may be implemented as a film, or the protective film may be formed on the upper end of the accommodation hole 355 by a process such as glue pouring to seal the accommodation hole 355.

Figure 41:
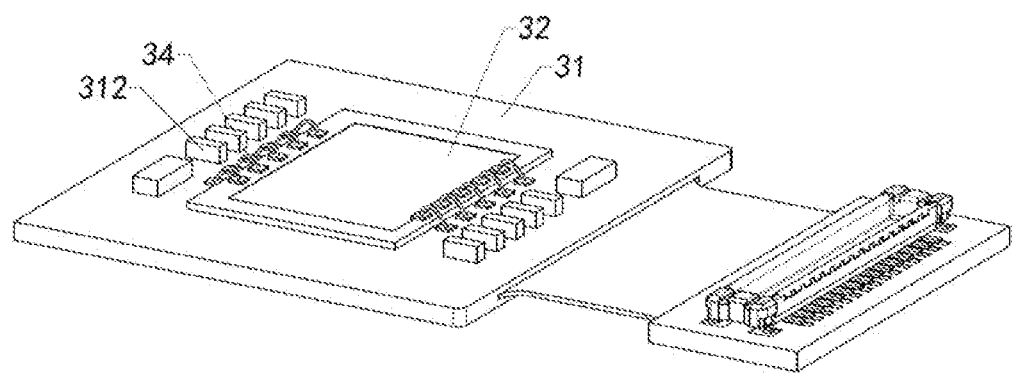
FIG. 41 illustrates yet another specific example of a camera module according to an embodiment of the present application.

FIG. 41 illustrates yet another specific example of the camera module 30 according to the present invention. The camera module 30 illustrated in FIG. 41 is a modified implementation mode of the camera module 37 illustrated in FIG. 30.

Specifically, as shown in FIG. 41, in this specific example, the electronic components 312 provided to the circuit board 31 are provided on both sides of the circuit board 31, that is, the photosensitive chip 32 is provided to the circuit board 31, and the electronic components 312 are located on both sides of the photosensitive chip 32. Those skilled in the art would know that most of the electronic components 312 located on a circuit board 31 in a conventional camera module are arranged around (or on four sides of) the circuit board 31.

Further, as shown in FIG. 41, in this specific example, the protecting member 38 is integrally formed on the body 352 and extends downward from the body 352. Preferably, the protecting member 38 extends downward from the body 352 in parallel relative to the side wall 353 to form a receiving cavity 358 between the side wall 353 and the protecting member 38, and, the accommodation hole 355 is formed between the side wall 353 and the protecting member 38 and is communicated with the receiving cavity 358.

Specifically, as shown in FIG. 41, in this specific example, the electronic component 312 is arranged at a position on the circuit board 31 such that when the base 35 is attached to the top surface of the circuit board 31, the electronic component 312 is received in the receiving cavity 358, and a portion of the electronic component 312 higher than the height of the receiving cavity 358 may be received in the accommodation hole 355.

It should be understood that in this specific example, the position of the side wall 353 and the protecting member 38 should be determined by the manner in which the electronic component 312 is arranged on the circuit board 31. For example, when the electronic components 312 are arranged in a matrix on both sides of the circuit board 31, the protecting member 38 extends downward from the body 352 in parallel relative to the side wall 353, and is formed between the electronic component 312 and the photosensitive chip 32 for isolating the photosensitive chip 32 and preventing dirt from entering the photosensitive chip 32 through the accommodation hole 355.

It is worth noting that in this specific example, the protecting member 38 only needs to be respectively formed between the photosensitive chip 32 and the electronic component 312 for isolating the photosensitive chip 32, that is, the protecting member 38 does not need to be provided around the photosensitive chip 32 and only needs to be formed on both sides of the photosensitive chip 32. In other words, in this specific example, the camera module 30 has an extremely narrow side which is formed on a side of the circuit board 31 where the electronic component 312 is not arranged. The mounting positions of the photosensitive chip 32 and the optical lenses 332 are close to an edge of the circuit board 31. In particular, the extremely narrow side may allow the camera module 30 to be provided at an edge of a smart phone.

Figure 42:
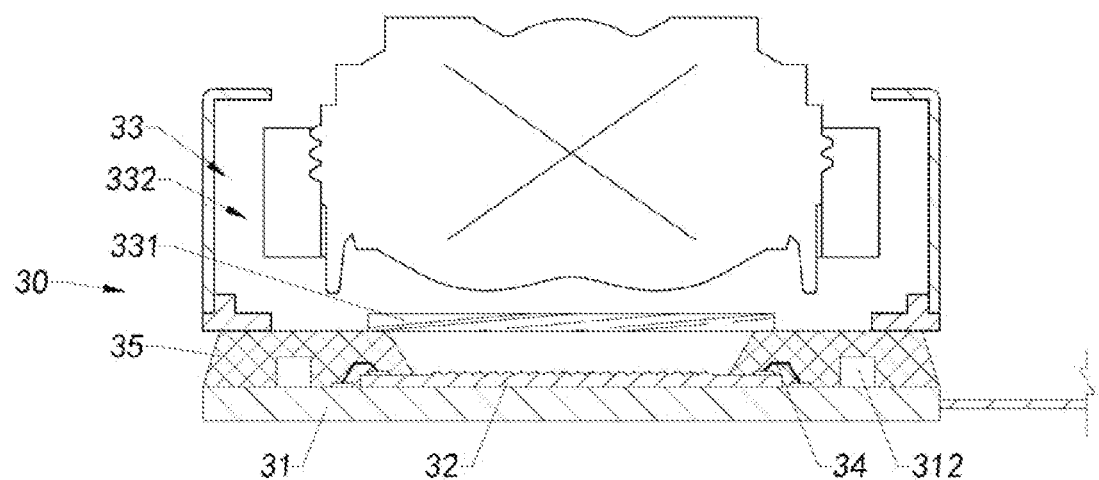
FIG. 42 illustrates yet another specific example of a camera module according to an embodiment of the present application.

FIG. 42 illustrates yet another specific example of the camera module 30 according to the present invention. As shown in FIG. 42, in this specific example, the camera module 30 includes an optical lens 332, a base 35, a color filter element 331, a photosensitive chip 32, and a circuit board 31. The photosensitive chip 32 is conductively provided to the circuit board 31. The base 35 is integrally formed on the circuit board 31 by means of a molding process. The optical lens 332 and the color filter element 331 are sequentially provided in a photosensitive path of the photosensitive chip 32. The base 35 is configured to support the color filter element 331. Thus, imaging light transmitted through the display screen 20 reaches the optical lens 332, and is filtered by the color filter element 331, and then reaches the photosensitive chip 32 to be sensed by the photosensitive chip 32 for performing an imaging reaction.

In particular, this specific example is an optimization solution of a conventional camera module based on a molding process. Those skilled in the art would know that in the conventional camera module based on the molding process, a photosensitive chip and an electronic component are usually attached to a circuit board, a molded base is formed on the circuit board by a molding process, a filter is attached to a lens base, and a lens is then attached to a filter assembly so that the lens is held in a photosensitive path of the chip, as shown in FIG. 42. However, the assembly mode of the prior art greatly limits the height of the camera module.

In detail, although the lateral size and height of the camera module can be reduced by replacing the conventional lens base with a molded base, a mold used in the molding process needs to avoid electronic components such as a capacitor and a resistor on the circuit board (especially the size of the capacitor is large, and the height of the smallest capacitor at present is also 0.38 mm), and a certain safety distance is also reserved between the mold and various electronic components. Therefore, the height of the molded base is also at least greater than 0.4 mm. On the other hand, a filter is usually formed into a filter assembly together with a support member, and the filter assembly is then attached to the molded base. Since the support member is usually made by an injection molding process, the thickness of the portion of the support member supporting the filter is required to be substantially greater than 0.15 mm, while the thickness of the filter is usually more than 0.21 mm. Therefore, the thickness of the filter assembly is at least greater than 0.36 mm.

That is, the distance between the lens and the circuit board 31 is equal to the sum (at least greater than 0.76 mm) of the height of the molded base and the thickness of the filter assembly. The distance between the lens and the circuit board 31 of the camera module in the prior art cannot be further reduced due to all the above-described factors, that is, the height of the camera module in the prior art cannot be further reduced, so that the market requirements for lightness, thinness, and miniaturization of the camera module cannot be met.

Figure 43:
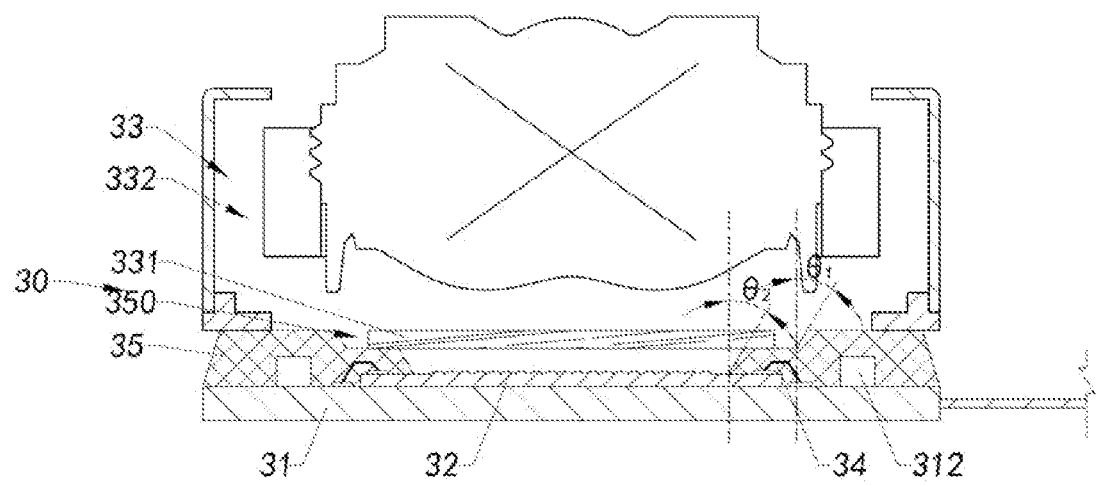
FIG. 43 is a schematic diagram of a conventional camera module based on a molding process.

Accordingly, as shown in FIG. 43, in this specific example, the molded base has a recessed step portion for mounting the color filter element 331 thereon. That is, in this specific example, the top surface of the molded base is a non-flat surface having a recessed step portion, as compared with a conventional camera module based on a molding process. Accordingly, by mounting the color filter element 331 on the recessed step portion of the molded base, it is possible to eliminate a color filter element support member and reduce the distance between the color filter element 331 and the circuit board 31, thereby achieving the effect of reducing the height of the module.

Specifically, as shown in FIG. 43, in this specific example, the molded base has a stepped peripheral groove 350. The color filter element 331 of the light transmitting assembly 33 is provided in the stepped peripheral groove 350 of the molded base. In this way, the distance between the optical lens 332 and the circuit board 31 is no longer limited by the thickness of the color filter element 331. That is, the distance between the optical lens 332 and the circuit board 31 can be reduced to be smaller than the sum of the thickness of the color filter element 331 and the height of the molded base, and the overall height size of the camera module 30 is reduced.

Figure 44:
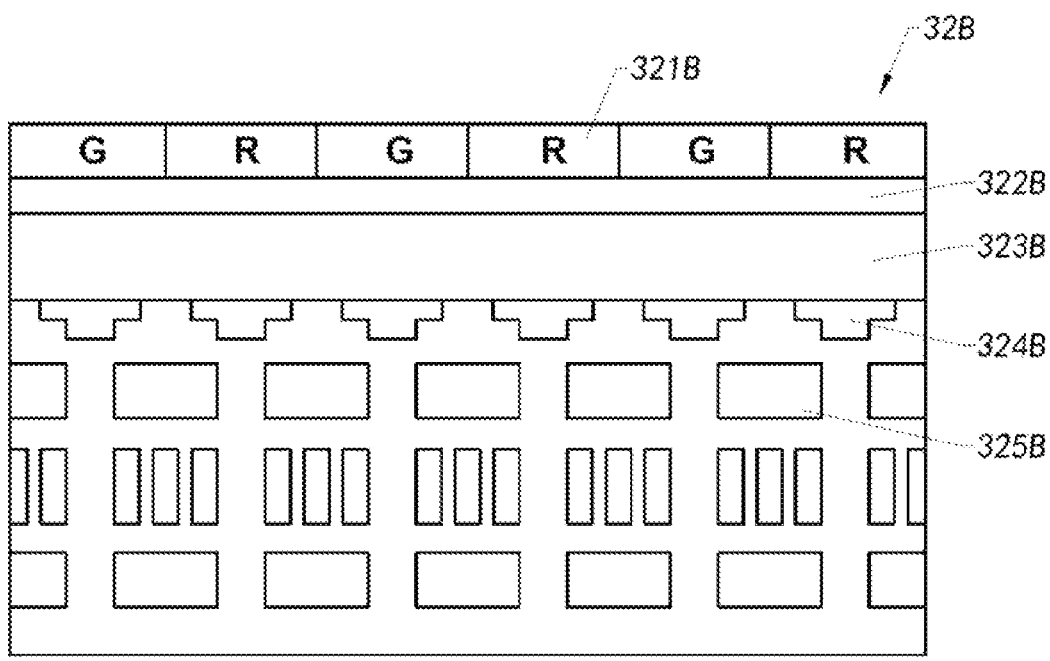
FIG. 44 is a specific schematic diagram of a photosensitive chip of the camera module.

FIG. 44 illustrates yet another specific implementation of the photosensitive chip 32B according to the present invention. As shown in FIG. 44, in this specific example, optimization is performed from the perspective of the structure of the photosensitive chip to reduce the overall height size of the camera module 30. In other words, in this specific implementation, the camera module 30 may be implemented as a camera module and modified implementation modes thereof as described in any of FIGS. 39-43.

Specifically, in this specific example, the camera module 30 adopts a quantum dot thin film photosensitive chip 32A instead of a conventional CMOS/CCD photosensitive chip. The quantum dot thin film photosensitive chip 32B has dual advantages of a planar size and a height size as compared with the conventional CMOS/CCD photosensitive chip.

First, the use of the quantum dot thin film photosensitive chip 32B enables the size of the photosensitive chip in a Z-axis direction to be reduced. As shown in FIG. 44, the quantum dot thin film photosensitive chip 32B respectively includes, from top to bottom, a color filter 321B, a top electrode 322B, a quantum dot thin film 323B, a bottom electrode 324B, and a pixel circuit 325B. The top electrode 322B, the quantum dot thin film 323B, and the bottom electrode 324B constitute a photosensitive layer of the quantum dot thin film photosensitive chip 32B. The quantum dot thin film 323B is electrically connected to two electrodes. The current and/or voltage between the two electrodes is related to the intensity of light received by the quantum dot thin film 323B. The pixel circuit 325B includes a charge storage and read circuit. In particular, the color filter may be implemented as a Bayer filter or a Mono filter, which is not limited by the present application.

In the working process, light passing through the color filter 321B irradiates the photosensitive layer. The photosensitive layer generates a charge between the top electrode and the bottom electrode at a given bias voltage such that the voltage accumulates in charge storage for an integration period. The pixel circuit 325B reads an electrical signal transmitted to the chip. The electrical signal reflects a signal of the light intensity absorbed by the photosensitive layer during the integration period. The electrical signal is the light intensity generated by the light passing through the color filter 321B. Therefore, the electric signal can correspond to the light passing through the color filter 321B. That is, if the color filter 321B is red, it means that only red light can be transmitted. The electrical signal generated by the corresponding photosensitive layer under the color filter 321B is then representative of the intensity of the red light in light at this position.

The quantum dot thin film photosensitive chip 32B has a relatively small thickness size as compared with the conventional CMOS or CCD chip.

Figure 45:
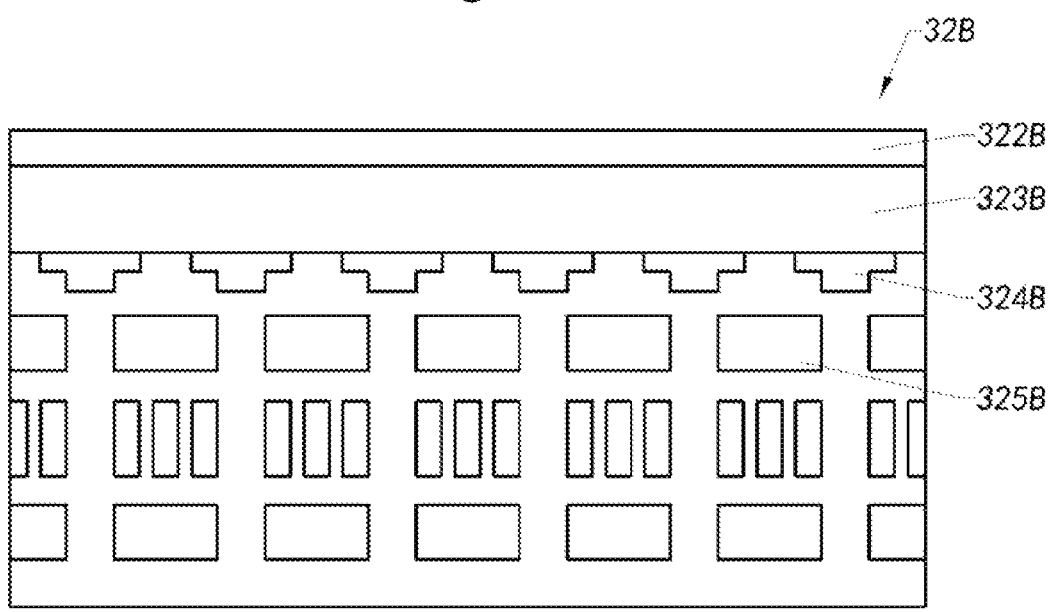
FIG. 45 is another specific schematic diagram of a photosensitive chip of the camera module.

FIG. 45 is yet another specific illustration of the photosensitive chip 32B of the camera module 30 according to the present invention. The photosensitive chip 32B illustrated in FIG. 45 is a modified implementation mode of the photosensitive chip illustrated in FIG. 44.

Specifically, as shown in FIG. 45, in this specific example, the quantum dot thin film 323B of the photosensitive layer is configured to respond to light of a selected color or group of colors. For example, color sensitivity can be achieved by combining a photoconductive material and a wavelength selective absorbing material (e.g. a material forming a color filter 321B array) to form a color sensitive pixel. Accordingly, the quantum dot thin film 323B may be configured to be sensitive to three colors of red (R), green (G), and blue (B), respectively, so that the color filter 321B in the photosensitive chip may be directly eliminated.

In the working process, when light passes through the color sensitive pixel, the color sensitive pixel will absorb the corresponding light, convert the light intensity of the light of this wavelength or waveband into an electrical signal, and transmit the electrical signal to the chip via the pixel circuit 325B for processing and imaging, while the remaining light continues to propagate forward, so that the photoelectric conversion of the pixel point is not influenced. Accordingly, the Z-direction size of the photosensitive chip can be reduced by adopting this technical solution, and meanwhile, the photosensitive chip may receive more light and may image clearer since there is no filtering of light by the color filter 321B.

Further, the use of the quantum dot thin film photosensitive chip 32B enables the size of the photosensitive chip in X/Y-axis directions to be reduced. Specifically, since the light transmittance of the quantum dot thin film 323B is high, after a material sensitive to a certain wavelength or waveband is configured, the quantum dot thin film 323B may only absorb the corresponding light, while other light may transmit the thin film and continue to propagate forward. Therefore, a plurality of quantum dot thin films 323B sensitive to a certain wavelength or waveband of light may be vertically arranged.

In other words, light intensity information of multiple wavelengths or wavebands may be acquired simultaneously at a pixel point position. For example, three quantum dot thin films 323B of a red color sensitive pixel, a green color sensitive pixel and a blue color-sensitive pixel are vertically arranged. When light passes through the red color sensitive pixel, red light is absorbed and converted into an electrical signal, and the remaining light continues to propagate forward. When light passes through the green color sensitive pixel, green light is absorbed and converted into an electrical signal, and the remaining light continues to propagate forward. After reaching the blue color sensitive pixel, blue light is also absorbed and converted into an electrical signal. Therefore, the light intensity information of multiple wavelengths or wavebands of light may be acquired simultaneously at a pixel-sized point.

It is worth mentioning that three colors RGB described in this specific example of the present application are not limiting, and each quantum dot thin film 323B may absorb and convert any desired light, only the quantum dot thin film 323B needs to be configured to be sensitive to the desired light.

Also, in this specific example, since the conventional color filter 321B is not used, it is possible to obtain not only a stronger light intensity but also a higher resolution of the photosensitive chip of the same specification. In other words, at the same resolution, the method adopted in the present solution may reduce the XY-direction size of the photosensitive chip, thereby further reducing the planar size of the camera module 30.

Also, the quantum dot thin film 323B in the quantum dot thin film chip referred to in the present application may be prepared by means of the following process.

In one form, a quantum dot material may be processed by molten pool casting to form the quantum dot thin film 323B. The molten pool casting may include: depositing a measured quantum dot material onto a substrate and allowing a solution to evaporate. A generated film may or may not crack.

In one form, a quantum dot material may be processed by electro-deposition to form the quantum dot thin film 323B.

In one form, a quantum dot material may be processed by vapor deposition to form the quantum dot thin film 323B.

In one form, a quantum dot material may be processed by gun spraying to form the quantum dot thin film 323B. The gun spraying may include processing from a gas. The gun spraying may include entrainment in a solvent.

In one form, a quantum dot material may be processed by growth from a solution to form the quantum dot thin film 323B. The growth of a film from a solution may include cross-linking. A cross-linking agent may be attached to at least a part of a substrate to cross-link quantum dots. When a substrate having an attached cross-linking agent is immersed in a solution of quantum dots, the quantum dots may become cross-linked and grow at a position on the substrate where the cross-linking agent is attached, and the process of growth may be similar to that of seed growth. Since growth occurs where the cross-linking agent has been attached, the formation of a patterned film on the substrate may be achieved by depositing the cross-linking agent along the patterned substrate.

In one form, a film may be formed by processing a quantum dot material by means of a drainage system. The drainage system may enable deposition of a single layer of the quantum dot thin film 323B of quantum dots, and the quantum dot thin film 323B may be deposited in a pattern.

In one form, a quantum dot material may be processed by vapor acceleration or evaporation to form the quantum dot thin film 323B.

In one form, a quantum dot material may be processed by screen-printing to form the quantum dot thin film 323B.

In one form, a quantum dot material may be processed by ink-jet printing to form the quantum dot thin film 323B.

In summary, the camera module 30 provided below the display screen can be implemented by using, but not limited to, the technical solutions listed above and modified implementation modes thereof, so that the size of the camera module 30 in the height direction thereof is reduced, so as to meet the requirements of thin smart phones.

Figure 46:
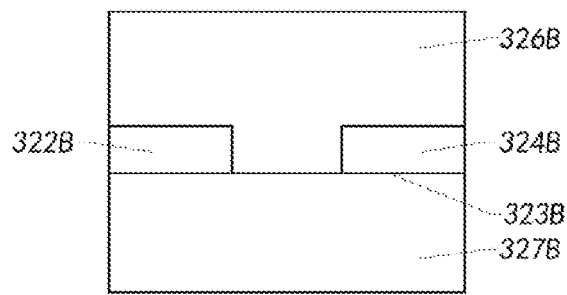
FIG. 46 is a specific schematic diagram of a photosensitive layer of a photosensitive chip of the camera module.

FIG. 46 is a specific illustration of the photosensitive layer of the above photosensitive chip 32B. The photosensitive layer includes the top electrode 322B, the quantum dot thin film 323B, and the bottom electrode 324B.

In the present example, the top electrode 322B and the bottom electrode 324B of the photosensitive layer are provided to be distributed horizontally, thereby reducing the influence on light propagation.

Specifically, the photosensitive layer further includes a nanocrystal film 326B and a substrate 327B. The nanocrystal film 326B is located above the top electrode 322B and the bottom electrode 324B. The nanocrystal film 326B is a transparent material. The substrate 327B is located at the lowermost end of the photosensitive layer.

The top electrode 322B and the bottom electrode 324B are located between the nanocrystal film 326B and the substrate 327B, and at least a part of the nanocrystal film 326B extends to the substrate 327B.

The entire photosensitive layer may be a laterally stacked structure. The top electrode 322B of the photosensitive layer is located between the nanocrystal film 326B and the substrate 327B. The bottom electrode 324B of the photosensitive layer is located between the nanocrystal film 326B and the substrate 327B. The bottom electrode 324B and the top electrode 322B are respectively supported on the substrate 327B. The top electrode 322B and the bottom electrode 324B do not overlap in the height direction. The top electrode 322B and the bottom electrode 324B are horizontally provided between the nanocrystal film 326B and the substrate 327B. The substrate 327B may be a glass substrate 327B, the top electrode 322B may be a metal contact, and the bottom electrode 324B may be a metal contact.

The quantum dot thin film 323B covers the top of the substrate 327B and the bottom electrode 324B is located on the top of the quantum dot thin film 323B.

Figure 47:
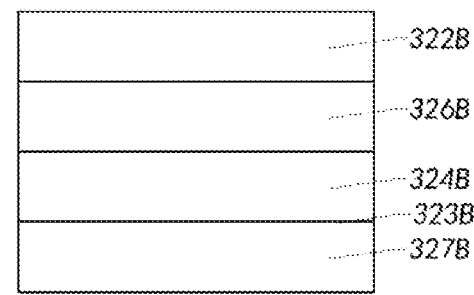
FIG. 47 is another specific schematic diagram of a photosensitive layer of a photosensitive chip of the camera module.
Figure 50:
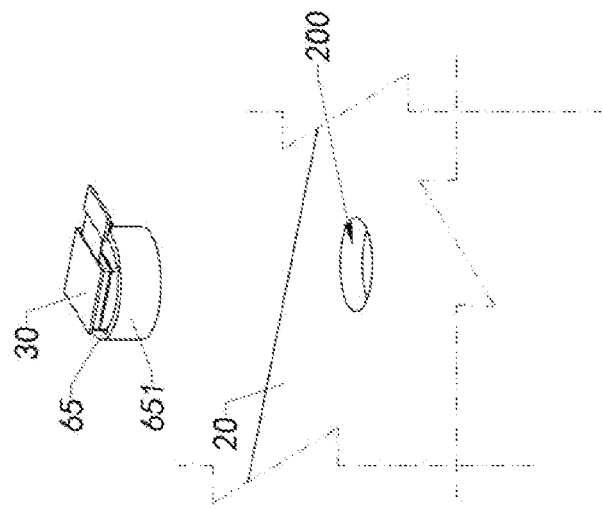
FIG. 50 is a schematic diagram of an assembly process according to a preferred embodiment of the present invention.
Figure 49:
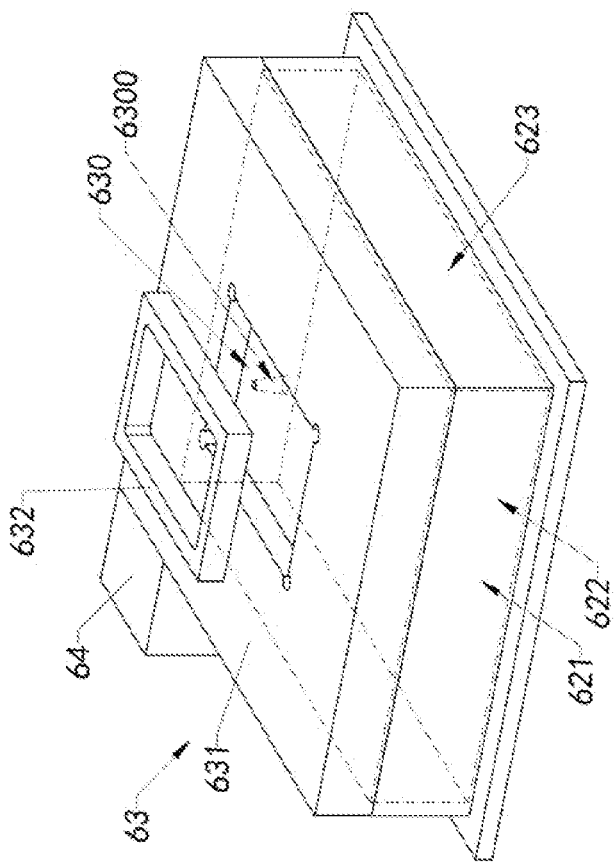
FIG. 49 is a schematic diagram of a support platform of the assembly system according to a preferred embodiment of the present invention.

FIG. 47 is a specific illustration of the photosensitive layer of the above photosensitive chip 32B. The photosensitive layer includes the top electrode 322B, the quantum dot thin film 323B, and the bottom electrode 324B.

The top electrode 322B and the bottom electrode 324B at least partially overlap in the height direction.

In the present example, the top electrode 322B is located on the top of the photosensitive layer, and the bottom electrode 324B is located below the top electrode 322B.

The photosensitive layer further includes a nanocrystal film 326B and a substrate 327B. The nanocrystal film 326B is located between the top electrode 322B and the bottom electrode 324B. The substrate 327B is located below the bottom electrode 324B.

The top electrode 322B is provided as a transparent material to reduce the influence of light passing through the top electrode 322B.

Further, the quantum dot thin film 323B is located between the substrate 327B and the bottom electrode 324B.

Referring to FIGS. 48A to 51C, an assembling method of the camera module 30 and the display screen 20 with the light through hole 200 according to the present invention is illustrated. It will be understood that the display screen 20 may also be provided with the light guide channel 500 and/or the light through hole 200. The light through hole 200 penetrating in the height direction is exemplified herein.

The present invention provides an assembly system 60. The assembly system 60 includes a clamping device 61, a test unit 62, and a support platform 63. The clamping device 61 is located above the support platform 63 for clamping the camera module 30. The display screen 20 is supported on the support platform 63.

The clamping device 61 can clamp the camera module 30 so as to drive the camera module 30 to move so as to change relative positions of the camera module 30 and the display screen 20 supported on the support platform 63. Thus, an imaging effect of the camera module 30 when the camera module 30 and the display screen 20 are at various positions is obtained by the test unit 62, and mounting positions of the camera module 30 and the display screen 20 are further determined. The assembly system 60 further includes a loading unit 64. After determining the relative positions of the camera module 30 and the display screen 20 based on the test unit 62, the loading unit 64 may load materials to the camera module 30 and/or the display screen 20 so that the camera module 30 and the display screen 20 can be fixed at a proper mounting position to be confirmed.

Further, the test unit 62 includes a light source 621, a target plate 622, and a sensing device 623. The light source 621 is provided near a light entering position of the camera module 30. The target plate 622 may be located in front of the light source 621. That is, the light source 621 is located between the target plate 622 and the camera module 30. The target plate 622 may also be located behind the light source 621. That is, the target plate 622 is located between the light source 621 and the camera module 30. The light source 621 may also be located on the target plate 622 to provide uniform light to the target plate 622.

The light source 621 emits light when in operation, and the sensing device 623 obtains a real-time working image about the target plate 622 from the camera module 30, and adjusts the position of the camera module 30 based on the working image to obtain a desired imaging effect of the camera module 30.

Specifically, the display screen 20 may be assembled by first adjusting the distance from the camera module 30 to the display screen 20 to an appropriate value, and then adjusting an optical axis of the camera module 30 to coincide with the center of the light through hole 200 of the display screen 20. The adjustment may be as follows.

When the camera module 30 is located at a position relative to the display screen 20, the sensing device 623 may sense the optimum position of the camera module and the display screen, particularly the coincidence of the optical axes, calculate a relative adjustment amount (an adjustment amount of the camera module 30 relative to the display screen 20) of the other one of the camera module and the display screen on the basis of one of the camera module and the display screen (e.g., the display screen 20), and then make corresponding adjustment according to the adjustment amount. After the adjustment, the optical axis conditions of the camera module and the display screen are calculated again. If a desired detection result is obtained, a module is assembled at the position, otherwise, the adjustment is continued until the positions of the camera module and the display screen reach an optimal state, that is, the imaging of the camera module 30 has an optimal state. Meanwhile, the assembly of the camera module 30 and the display screen 20 does not influence the mounting and working of other components. The position adjustment of the camera module 30 relative to the display screen 20 is also, certainly, within a range that allows the camera module 30 to be mounted.

Further, in the present example, the camera module 30 is located above the display screen 20, and the camera module 30 is located above the support platform 63. The light source 621 and the target plate 622 are located below the display screen 20. In other words, the display screen 20 is supported on the support platform 63 with a back side facing upward. The camera module 30 is mounted on the back side of the display screen 20 in a subsequent step.

The clamping device 61 and the loading unit 64 operate above the support platform 63, so that the relative positions of the camera module 30 and the display screen 20 may be observed in time above the support platform 63, thereby facilitating operation, especially in the case of manual operation. It will be, certainly, understood by those skilled in the art that the assembly process of the camera module 30 and the display screen 20 may be accomplished by a complete set of automated device.

In other embodiments of the present invention, the camera module 30 is located below the display screen 20, the light source 621 and the target plate 622 are located above the display screen 20, and the camera module 30 receives light from top to bottom for photoelectric conversion. At this moment, if it is necessary to observe the relative positions of the camera module 30 and the display screen 20, it is necessary to observe below the support platform 63.

Further, preferably, the display screen 20 is located at a horizontal position, and the camera module 30 may be located above the display screen 20 or below the display screen 20 depending on different orientations of the back side of the display screen 20.

It will be certainly understood that the display screen 20 may be located at an oblique position. For example, the support platform 63 is oblique. The position of the camera module 30 relative to the position of the display screen 20 may be adjusted by the clamping device 61. The display screen 20 may also be located at a vertical position. For example, the support platform 63 is located at a vertical position. The camera module 30 and the display screen 20 are adjusted relatively at the vertical position, respectively.

Further, the support platform 63 has a mounting space 630. The mounting space 630 is located on the support platform 63. The display screen 20 can be fixedly accommodated in the mounting space 630.

The support platform 63 has a test hole 6300. The mounting space 630 is communicated with the test hole 6300. When the display screen 20 is fixed in the mounting space 630, the test hole 6300 corresponds to the light through hole 200 of the display screen 20, so that light can enter the light through hole 200 of the display screen 20 via the test hole 6300, and then reach the camera module 30 via the light through hole 200.

The test hole 6300 penetrates through the support platform 63 so that light on one side of the support platform 63 can reach the other side of the support platform 63 via the test hole 6300.

The test hole 6300 may be configured in a certain shape according to the test requirements. For example, in the present example, the shape of the test hole 6300 is conical. As the test hole is closer to the display screen 20, an inner diameter of the test hole 6300 is smaller, and as the test hole is farther away from the display screen 20, the inner diameter of the test hole 6300 is larger.

The test hole 6300 may serve to converge light.

The support platform 63 includes a platform body 631 and a fixing assembly 632. The fixing assembly 632 is provided to the platform body 631, and the fixing assembly 632 is configured to fix the display screen 20.

In the present example, the fixing member 632 is integrally formed on the platform body 631. The mounting space 630 is formed on the platform body 631. The fixing member 632 is provided to the platform body 631 and accommodated in the mounting space 630.

The display screen 20 can be mounted to the fixing assembly 632, and the relative positions of the display screen 20 and the platform body 631 are fixed with the aid of the fixing assembly 632. Thus, only the position of the camera module 30 is required to realize the adjustment of the relative positions of the display screen 20 and the camera module 30, until a position of the camera module 30 with a better imaging effect relative to the display screen 20 is found.

In other embodiments of the present invention, the fixing assembly 632 is detachably mounted to the platform body 631. The fixing assembly 632 may be sized to adapt to the size of the display screen 20. For example, if the mounting space 630 provides an area of 7 inches, the fixing assembly 632 may provide an area of about 7 inches for mounting the display screen 20. If the display screen 20 of 5 inches needs to be assembled, the fixing assembly 632 may be replaced with a fixing assembly 632 capable of providing an area of about 5 inches to adapt to the size adjustment of the display screen 20.

Further, in other embodiments of the present invention, the clamping device 61 clamps the camera module 30 and the display screen 20, respectively, and then finds an appropriate assembly position by changing the relative positions of the camera module 30 and the display screen 20.

In other embodiments of the present invention, the support platform 63 supports the camera module 30, the clamping device 61 clamps the display screen 20, and the clamping device 61 then drives the display screen 20 to move so as to change the position of the display screen 20. Thus, while keeping the camera module 30 fixed, the relative positions of the camera module 30 and the display screen 20 are changed until a satisfactory imaging effect is obtained.

Further, in the present example, the assembly system 60 includes a limiting mechanism 65. The limiting mechanism 65 is provided to the display screen 20 and located near the position of the light through hole 200 of the display screen 20.

The limiting mechanism 65 is configured to limit the position of the camera module 30 so as to improve the alignment accuracy of the camera module 30 and the display screen 20.

Specifically, when the relative positions of the camera module 30 and the display screen 20 are changed to test an imaging effect, the limiting mechanism 65 may play a limiting role on the position change of the camera module 30, so that the position adjustment of the camera module 30 is controlled within a certain range, and the position adjustment amplitude of the camera module 30 at a single time is avoided to be too large, thereby facilitating improvement of the alignment accuracy of the camera module 30 and the display screen 20.

The limiting mechanism 65 is provided on the back side of the display screen 20 and aligned with the light through hole 200 of the display screen 20, so that when the camera module 30 is mounted to the limiting mechanism 65, the camera module 30 can be aligned with the light through hole 200 of the display screen 20.

The camera module 30 is then mounted to the limiting mechanism 65. The camera module 30 mounted to the limiting mechanism 65 is aligned with the light through hole 200 of the display screen 20 and the relative positions of the camera module 30 and the limiting mechanism 65 can be finely adjusted.

Then, an image formed by the camera module 30 is acquired by a test device, and the camera module 30 and the limiting mechanism 65 are adjusted based on the imaging effect of the camera module 30 so as to change the relative positions of the camera module 30 and the display screen 20. The adjustment space provided by the limiting mechanism 65 is limited, and the relative positions of the camera module 30 and the display screen 20 can only be adjusted within a small range, so that the position of the camera module 30 is not greatly shifted during this adjustment process, thereby facilitating improvement of the alignment accuracy of the camera module 30 and the display screen 20.

After determining the relative positions of the camera module 30 and the display screen 20 based on the imaging effect of the camera module 30, the relative positions of the camera module 30 and the limiting mechanism 65 are fixed, thereby fixing the relative positions of the camera module 30 and the display screen 20. The camera module 30 is assembled on the display screen 20, and the camera module 30 can obtain sufficient light through the light through hole 200 of the display screen 20 and obtain a desired imaging effect.

Further, in other embodiments of the present invention, the limiting mechanism 65 is provided to the camera module 30. Specifically, the limiting mechanism 65 and the camera module 30 are first mounted to each other, the limiting mechanism 65 is fixed to the display screen 20, and the camera module 30 located on the limiting mechanism 65 can correspond to the light through hole 200 of the display screen 20.

The limiting mechanism 65 provides a certain adjustment space for the camera module 30 mounted to the limiting mechanism 65.

After the limiting mechanism 65 is mounted to the display screen 20, the relative positions of the camera module 30 and the limiting mechanism 65 may be adjusted based on the imaging effect of the camera module 30, thereby confirming the relative positions of the camera module 30 and the display screen 20.

It is worth mentioning that when the limiting mechanism 65 is mounted to the display screen 20, the camera module 30 has been mounted to the limiting mechanism 65. Therefore, the relative positions of the limiting mechanism 65 and the display screen may be determined based on the imaging effect of the camera module 30, and the limiting mechanism 65 is then positioned on the display screen 20. The limiting mechanism 65 and the display screen 20 may be fixed by means of gluing or welding.

In other words, the limiting mechanism 65 may be mounted to the camera module 30 or the display screen 20 before the camera module 30 is mounted to the display screen 20. The relative positions of the camera module 30 and the limiting mechanism 65 may be then adjusted within an adjustable range of the limiting mechanism 65 based on the imaging effect of the camera module 30, thereby adjusting the relative positions of the camera module 30 and the display screen 20.

Further, the limiting mechanism 65 has a limiting channel 650. The lens assembly of the camera module 30 may be at least partially accommodated in the limiting channel 650.

When the limiting mechanism 65 is located on the display screen 20, the limiting channel 650 of the limiting mechanism 65 is aligned with the light through hole 200 of the display screen 20.

The limiting mechanism 65 and the camera module 30 cooperate with each other so that when the camera module 30 is mounted to the limiting mechanism 65, the limiting mechanism 65 may play a limiting role for the camera module 30. Meanwhile, the camera module 30 may make an adjustment within a certain range in the limiting channel 650 provided by the limiting mechanism 65 so as to change the relative positions of the camera module 30 and the display screen 20.

Specifically, the limiting mechanism 65 may include a sleeve 651 and a limiting assembly 652. The sleeve 651 surrounds the limiting channel 650. The limiting assembly 652 includes a first limiting member 6521 and a second limiting member 6522. The first limiting member 6521 is provided to an inner wall of the sleeve 651, and the second limiting member 6522 is provided to an outer wall of the lens assembly of the camera module 30.

When the camera module 30 is mounted to the limiting mechanism 65, the first limiting member 6521 and the second limiting member 6522 relatively cooperate to define the position of the camera module 30.

The first limiting member 6521 may be a directional groove, and the second limiting member 6522 may be a protrusion. When the camera module 30 is mounted to the limiting mechanism 65, the second limiting member 6522 extends into the first limiting member 6521.

The first limiting member 6521 may be a protrusion, and the second limiting member 6522 may be a groove. When the camera module 30 is mounted to the limiting mechanism 65, the first limiting member 6521 extends into the second limiting member 6522.

It is worth noting that when the camera module 30 is mounted to the limiting mechanism 65, the first limiting member 6521 and the second limiting member 6522 are not completely fixedly clamped with each other. A certain movable space is also left between the first limiting member 6521 and the second limiting member 6522, so that the position of the camera module 30 relative to the sleeve 651 may be further adjusted while being limited by the limiting assembly 652.

Further, the inner wall of the sleeve 651 may be provided in a threaded structure, and an outer wall of an upper portion of the camera module 30, i.e. an outer wall of a lens barrel of the lens assembly, may be at least partially provided in a threaded structure.

When the camera module 30 is mounted to the limiting mechanism 65, not only the relative positions of the camera module 30 and the limiting mechanism 65, in particular, the axis of the camera module 30 and the center of the light through hole 200 of the display screen 20 may be adjusted relatively, and the distance between the camera module 30 and the display screen 20 may also be adjusted.

It will be certainly understood that if the limiting mechanism 65 needs to be mounted to the display screen 20, the distance between the camera module 30 and the display screen 20 may be adjusted by controlling the distance between the limiting mechanism 65 and the display screen 20 during the mounting of the limiting mechanism 65 to the display screen 20.

Preferably, the center of the sleeve 651 of the limiting mechanism 65 is aligned with the center of the light through hole 200 of the display screen 20. Further, preferably, the center of the sleeve 651 of the limiting mechanism 65 is aligned with the center of the test hole 6300 of the test platform 63.

Figure 51A:
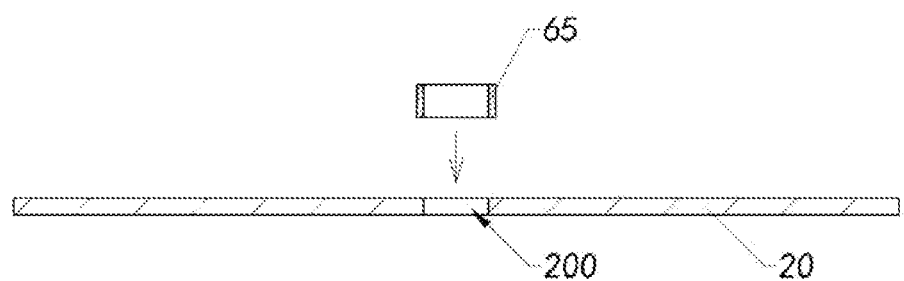
FIG. 51A is a schematic diagram of an assembly process according to a preferred embodiment of the present invention.
Figure 51A:
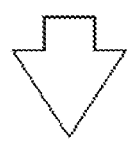
Figure 51A:
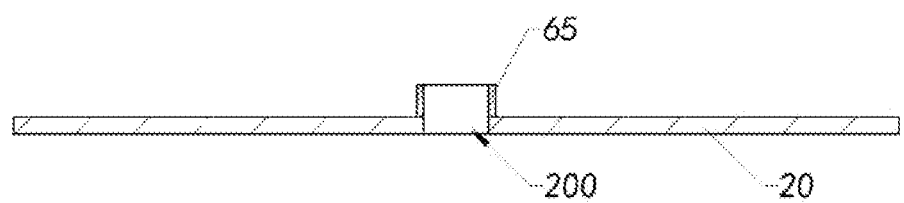
Figure 51B:
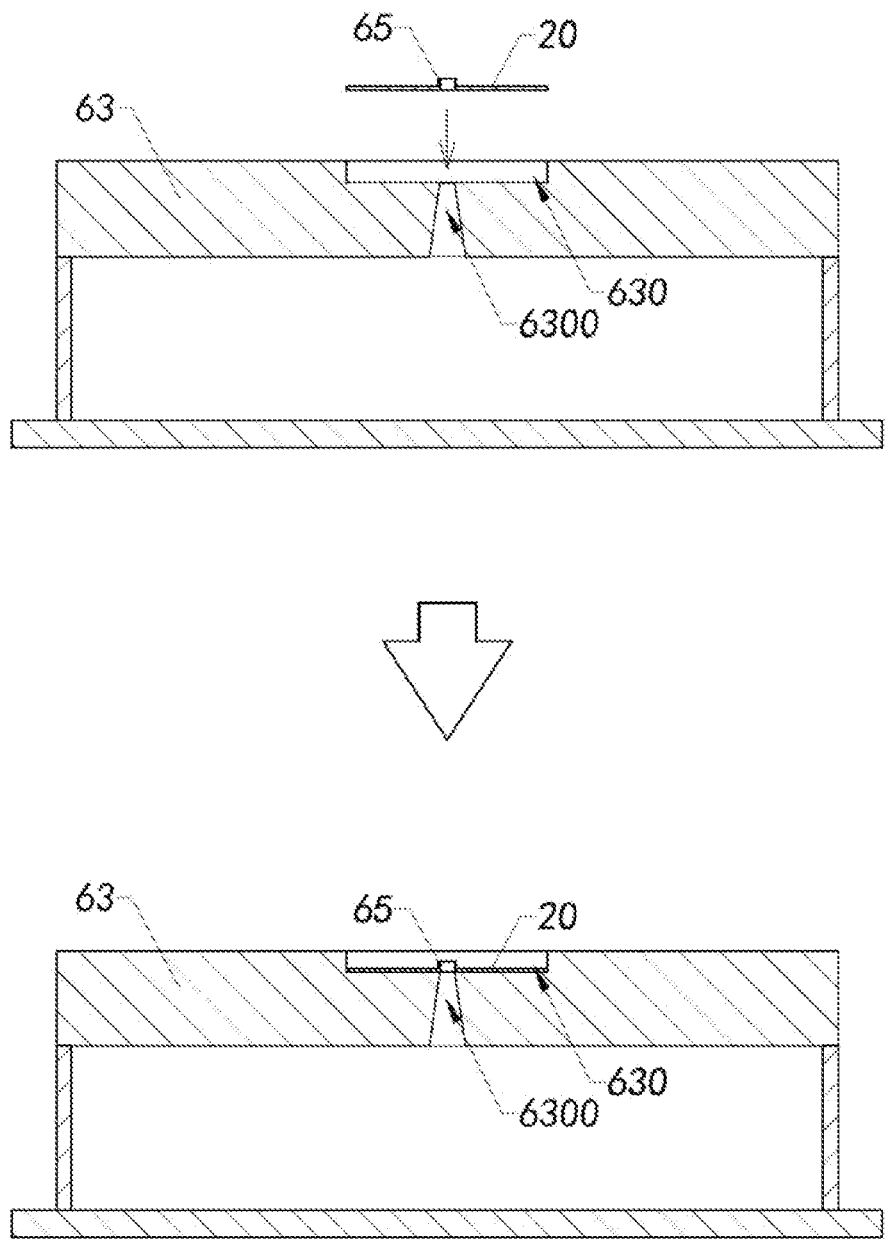
FIG. 51B is a schematic diagram of an assembly process according to a preferred embodiment of the present invention.
Figure 51C:
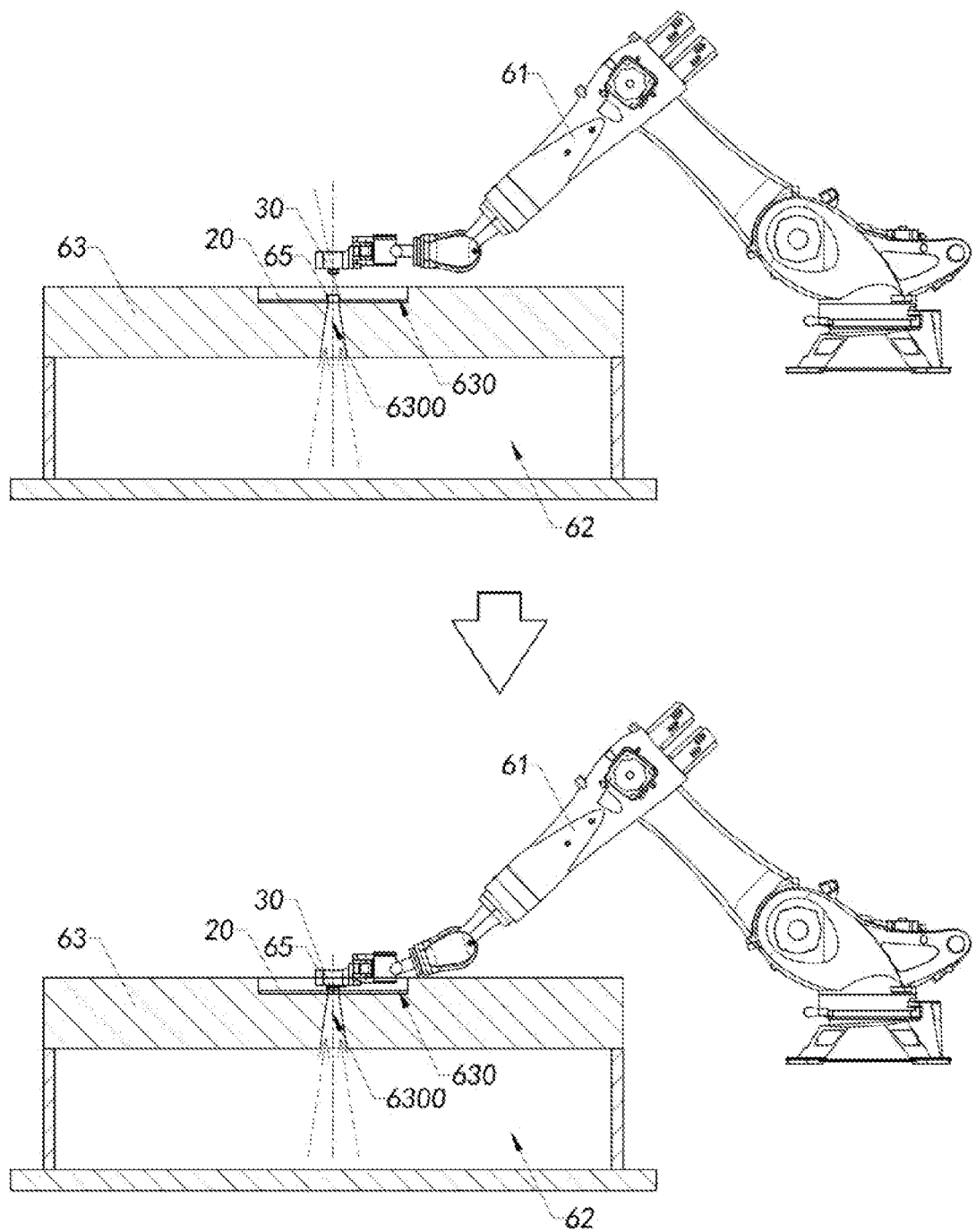
FIG. 51C is a schematic diagram of an assembly process according to a preferred embodiment of the present invention.

Referring to FIGS. 51A to 51C, a specific implementation of the limiting mechanism 65 according to the present invention is illustrated. In the present example, the limiting mechanism 65 needs to be mounted to the display screen 20. That is, the limiting mechanism 65 and the display screen 20 are originally independent of each other.

The assembly method of the camera module 30 includes the following steps. The limiting mechanism 65 is mounted to the display screen 20, the camera module 30 is mounted to the limiting mechanism 65, the position of the camera module 30 is adjusted relative to the limiting mechanism 65 so as to achieve the purpose of adjusting the position of the camera module 30 relative to the display screen 20, the relative positions of the camera module 30 and the display screen 20 are confirmed on the basis of the imaging effect of the camera module 30, and the camera module 30 and the display screen 20 are fixed at an adjusted position by fixing the camera module 30 to the limiting mechanism 65.

It is worth noting that the limiting mechanism 65 may be mounted to the display screen 20 by aligning the limiting mechanism 65 with the light through hole 200 of the display screen 20.

It will be understood that in the mounting process of the limiting mechanism 65 to the display screen 20, the limiting mechanism 65 may be fixed to the display screen 20 based on the degree of alignment of the limiting channel 650 of the limiting mechanism 65 with the light through hole 200 of the display screen 20. In this way, adjustment of the relative positions between the camera module 30 and the display screen 20 during subsequent adjustments only requires adjustment of the relative positions between the camera module 30 and the limiting mechanism 65.

The assembly method of the camera module 30 may also be implemented as the following steps. The camera module 30 is mounted to the limiting mechanism 65, the limiting mechanism 65 is mounted to the display screen 20, the position of the camera module 30 is adjusted relative to the limiting mechanism 65 so as to achieve the purpose of adjusting the position of the camera module 30 relative to the display screen 20, the relative positions of the camera module 30 and the display screen 20 are confirmed on the basis of the imaging effect of the camera module 30, and the camera module 30 and the display screen 20 are fixed at an adjusted position by fixing the camera module 30 to the limiting mechanism 65.

It will be understood that in the mounting process of the limiting mechanism 65 to the display screen 20, the limiting mechanism 65 may be mounted to the display screen 20 based on the imaging effect of the camera module 30.

The assembly method of the camera module 30 may also be implemented as the following steps. The relative positions of the camera module 30 and the display screen 20 are adjusted to a more satisfactory position. The limiting mechanism 65 is mounted to the display screen 20, and the relative positions of the camera module 30 and the limiting mechanism 65 are then adjusted within a range of the limiting mechanism 65 where the camera module 30 may be adjusted, thereby adjusting the relative positions of the camera module 30 and the display screen 20.

It will be understood that after the camera module 30 is mounted to the limiting mechanism 65, the limiting mechanism 65 may be fixed to the display screen 20, so that the camera module 30 can be adjusted within a relatively small range by the limiting mechanism 65 so as to improve the adjustment accuracy of the camera module 30 and the limiting mechanism 65. Or, after the camera module 30 is mounted to the limiting mechanism 65, the limiting mechanism 65 is temporarily not fixed to the display screen 20, the relative positions of the camera module 30 and the display screen 20 are continuously changed to obtain a relatively satisfactory imaging effect, and the limiting mechanism 65 is then fixed to the display screen 20.

Further, in the present example, the back side of the display screen 20 is implemented as a planar structure. That is, the back plate of the display screen 20 is a planar structure, and the limiting mechanism 65 is mounted to the back plate of the display screen 20. When the relative positions between the limiting mechanism 65 and the display screen 20 need to be adjusted, the limiting mechanism 65 is freely adjusted on the display screen 20 until the limiting channel 650 of the limiting mechanism 65 is aligned with the light through hole 200 of the display screen 20, or the camera module 30 mounted to the limiting mechanism 65 obtains a desired imaging effect.

It will be certainly understood that the relative positions of the camera module 30 and the display screen 20 may also be adjusted directly. When the relative positions between the camera module 30 and the display screen 20 are determined, the camera module 30 may be directly fixed to the display screen 20 by means of gluing or welding, etc., and the positions of the camera module and the display screen may be maintained at the adjusted position.

Furthermore, after the relative positions of the limiting mechanism 65 and the camera module 30 are confirmed based on the imaging effect of the camera module 30, the limiting mechanism 65 and the camera module 30 may be fixed by means of gluing, welding, etc.

For example, when the camera module 30 is mounted to the limiting mechanism 65 and the relative positions of the camera module 30 and the limiting mechanism 65 are adjusted, the limiting channel 650 of the limiting mechanism 65 has a gap for fine adjustment between the camera module 30 and the limiting mechanism 65.

When the relative positions between the camera module 30 and the limiting mechanism 65 are confirmed, the space of the limiting channel 650 of the limiting mechanism 65 not occupied by the camera module 30 may be filled with a colloid to fix the relative positions of the camera module 30 and the limiting mechanism 65.

For example, when the camera module 30 is mounted to the limiting mechanism 65 and the relative positions of the camera module 30 and the limiting mechanism 65 are adjusted, the limiting channel 650 of the limiting mechanism 65 has a gap for fine adjustment between the camera module 30 and the limiting mechanism 65.

When the relative positions between the camera module 30 and the limiting mechanism 65 are confirmed, an insert piece may be inserted between the camera module 30 and the sleeve 651 of the limiting mechanism 65 to fix the relative positions of the camera module 30 and the limiting mechanism 65. The insert piece limits the displacement of the camera module 30 relative to the limiting mechanism 65.

For example, when the camera module 30 is mounted to the limiting mechanism 65 and the relative positions of the camera module 30 and the limiting mechanism 65 are adjusted, the limiting channel 650 of the limiting mechanism 65 has a gap for fine adjustment between the camera module 30 and the limiting mechanism 65.

When the relative positions between the camera module 30 and the limiting mechanism 65 are confirmed, a welding pad may be provided on the outer side of the lens barrel of the camera module 30 or the inner wall of the sleeve 651 of the limiting mechanism 65, and the camera module 30 and the limiting mechanism 65 are then fixed by means of welding.

It will be understood that the colloid used for fixing the camera module 30 and the limiting mechanism 65 may be a thermoplastic fluid, and when the thermoplastic fluid fills the gap between the camera module 30 and the limiting mechanism 65, the thermoplastic fluid of the camera module 30 and the limiting mechanism 65 may be cured by means of heating.

Further, the sleeve 651 of the limiting mechanism 65 is provided with an opaque material to reduce the influence of external light on the camera module 30 located in the limiting channel 650 of the limiting mechanism 65. Especially when the display screen 20 is an LCD screen 20, the back plate layer 27 can actively emit light, and the opaque limiting mechanism 65 can reduce the influence of the light-emitting back plate layer 27 on the camera module 30.

Figure 52:
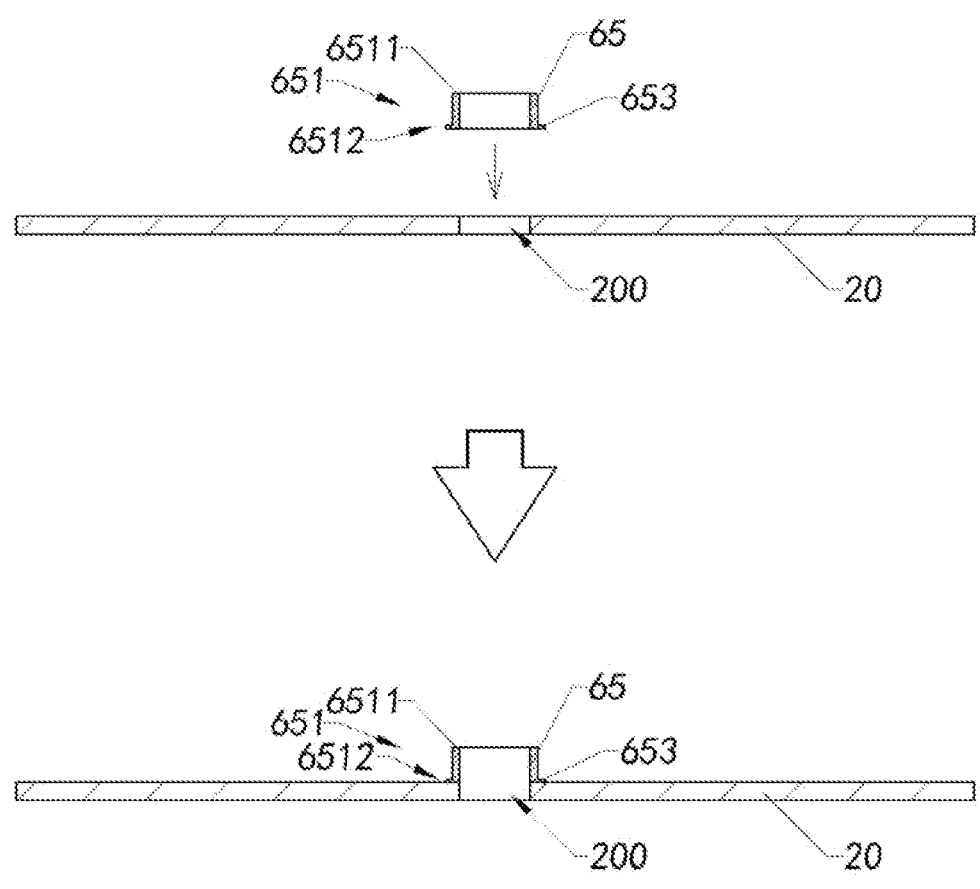
FIG. 52 is a schematic diagram of an assembly process according to a preferred embodiment of the present invention.

Referring to FIG. 52, a specific implementation mode of the limiting mechanism 65 according to the present invention is illustrated. In the present example, the limiting mechanism 65 further includes a connecting portion 653. The connecting portion 653 is configured to connect the sleeve 651 to the display screen 20.

Specifically, the sleeve 651 has a free end 6511 and a connecting end 6512. The free end 6511 and the connecting end 6512 are respectively located at both ends, and the connecting portion 653 is located at the connecting end 6512 of the sleeve 651.

The connecting portion 653 may be configured to extend outward from the connecting end 6512 of the sleeve 651. When the limiting mechanism 65 and the display screen 20 are mounted, the connecting portion 653 of the limiting mechanism 65 can be connected to the display screen 20. Meanwhile, the connecting portion 653 increases the area size of the limiting mechanism 65 connectable to the display screen 20, so as to facilitate the stable connection of the limiting mechanism 65 and the display screen 20. Thus, it is advantageous to stably mount the camera module 30 to the display screen 20 by the limiting mechanism 65.

Figure 53:
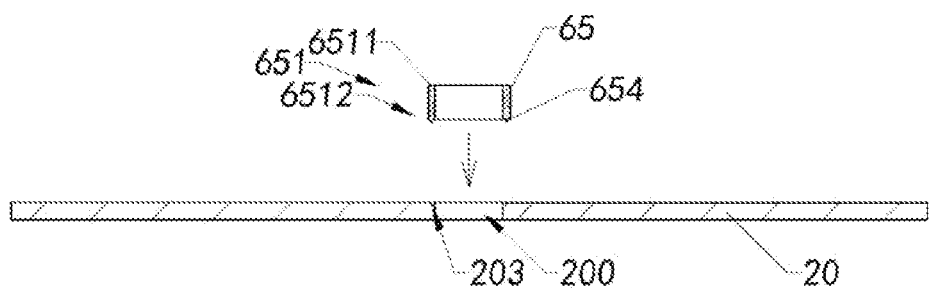
FIG. 53 is a schematic diagram of an assembly process according to a preferred embodiment of the present invention.
Figure 53:
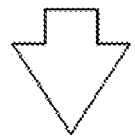
Figure 53:
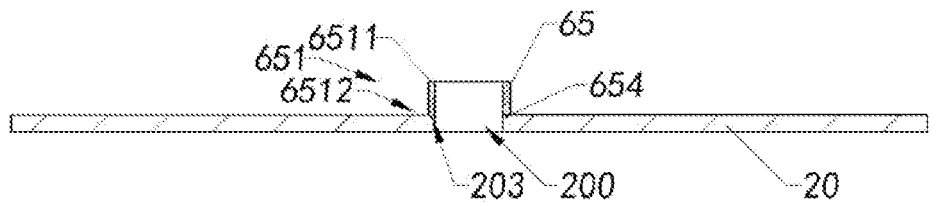

Referring to FIG. 53, a specific implementation mode of the limiting mechanism 65 according to the present invention is illustrated. In the present example, the relative positions of the limiting mechanism 65 and the display screen 20 are fixed in advance, and it is only necessary to adjust the relative positions of the camera module 30 and the limiting mechanism 65.

The limiting mechanism 65 is combined to the display screen 20 to facilitate enhancement of the combination strength of the limiting mechanism 65 to the display screen 20.

In the present example, the limiting mechanism 65 is embedded into the display screen 20.

For example, when the display screen 20 is an OLED display screen 20, the display screen 20 includes the cover plate layer 21, the touch layer 22, the polarization layer 23, the encapsulation layer 24, the pixel layer 25, the drive circuit layer 26, and the back plate layer 27, referring to the previous figures. The back side of the display screen 20 is a planar structure, that is, the back plate layer 27 is a planar structure, and the display screen 20 has the light through hole 200 penetrating through at least a part of the display screen. For example, the light through hole 200 penetrates through the layers other than the cover plate layer 21 in the height direction. The light through hole 200 may, certainly, penetrate through the layers of the display screen 20 completely in the height direction.

At least a part of the limiting mechanism 65 is embedded into the drive circuit layer 26 and the back plate layer 27.

The limiting mechanism 65 further includes at least one connecting pin 654. The connecting pin 654 extends from the connecting end 6512 of the sleeve 651 along the length direction of the sleeve 651. Preferably, there may be a plurality of connecting pins 654.

The display screen 20 has at least one embedded channel 203. The embedded channel 203 is located around the light through hole 200 of the display screen 20, and the embedded channel 203 is matched to the connecting pin 654 of the limiting mechanism 65.

The embedded channel 203 extends from the back plate layer 27 to the drive circuit layer 26. Preferably, the embedded channel 203 is provided to avoid the circuit structure of the drive circuit layer 26 to reduce the influence on the working efficiency of the display screen 20.

When the limiting mechanism 65 is mounted to the display screen 20, the connecting pin 654 of the limiting mechanism 65 extends into the embedded channel 203 of the display screen 20. The connecting pin 654 may be embedded into the embedded channel 203. The embedded channel 203 may also be slightly larger than the connecting pin 654. When the connecting pin 654 extends into the embedded channel 203, a gap remains in the embedded channel 203. At this moment, a colloid may be filled inward, so that the connecting pin 654 of the limiting mechanism 65 can be fixed to the embedded channel 203 of the display screen 20, thereby facilitating the limiting mechanism 65 to be stably mounted to the display screen 20.

Further, the embedded channel 203 may be formed on the back plate layer 27 and the drive circuit layer 26 of the display screen 20 by means of perforating. For example, a hole is drilled from the back plate layer 27 of the display screen 20 to the drive circuit layer 26.

It will be understood by those skilled in the art that the manner in which the embedded channel 203 is formed or the position of the embedded channel 203 is not limited to the above examples.

Furthermore, according to other embodiments of the present invention, the embedded channel 203 may be formed on the sleeve 651, and the connecting pin 654 may be formed on the display screen 20.

When the limiting mechanism 65 is mounted to the display screen 20, the connecting pin 654 located on the display screen 20 extends into the embedded channel 203 of the sleeve 651, thereby facilitating fixation between the limiting mechanism 65 and the display screen 20.

The connecting pin 654 may be formed on the display screen 20 by means of deposition, evaporation, etc. The connecting pin 654 may be integrally formed on the display screen 20.

Furthermore, according to other embodiments of the present invention, the embedded channels 203 may be formed on the sleeve 651 and the display screen 20, respectively, and the connecting pins 654 can be embedded into the sleeve 651 and the display screen 20, respectively. For example, one end of the connecting pin 654 extends into the embedded channel 203 of the display screen 20, and the other end of the connecting pin 654 then extends into the embedded channel 203 of the sleeve 651. The connecting pin 654 and the display screen 20 and the connecting pin 654 and the sleeve 651 are respectively fixed, thereby fixing the sleeve 651 to the display screen 20.

Figure 54:
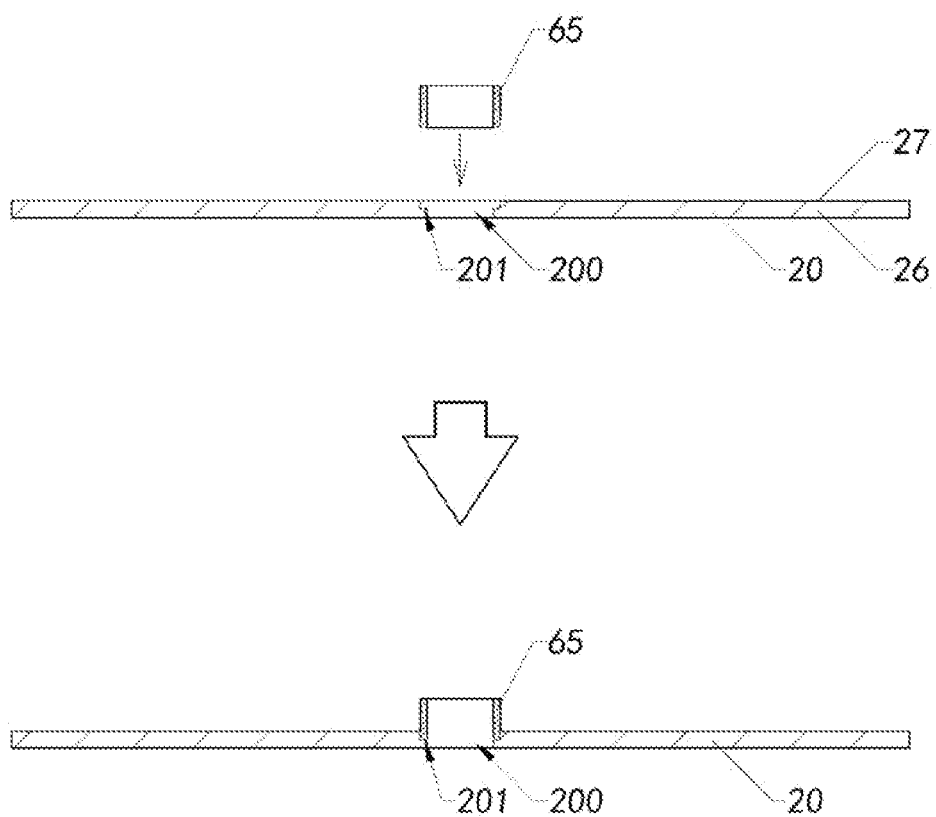
FIG. 54 is a schematic diagram of an assembly process according to a preferred embodiment of the present invention.

Referring to FIG. 54, another specific implementation mode of the limiting mechanism 65 according to the present invention is illustrated.

In the present example, the display screen 20 has a mounting channel 201. The light through hole 200 penetrates through the mounting channel 201. The light through hole 200 penetrates through the layers of the display screen 20 other than the cover plate layer 21 in the height direction, and the mounting channel 201 is exposed on the back side of the display screen 20.

The inner diameter of the mounting channel 201 is larger than that of the light through hole 200. At least a part of the limiting mechanism 65 can be accommodated in the mounting channel 201.

For example, the mounting channel 201 is formed on the back plate layer 27 of the display screen 20.

The mounting channel 201 penetrates through the back plate layer 27, and the inner diameter of the mounting channel 201 is larger than that of the light through hole 200. The mounting channel 201 penetrates through the light through hole 200 of the back plate layer 27 in the height direction. Light from the outside of the display screen 20 passes through the light through hole 200 and the mounting channel 201, and is then received by the camera module 30.

The mounting channel 201 has a certain size, and the limiting mechanism 65 has a certain size. The size of the mounting channel 201 is larger than that of the limiting mechanism 65 so that at least a part of the limiting mechanism 65 can be accommodated in the mounting channel 201.

In the present example, the limiting mechanism 65 needs to be mounted to the display screen 20. That is, the limiting mechanism 65 and the display screen 20 are originally independent of each other.

The assembly method of the camera module 30 includes the following steps. The limiting mechanism 65 is mounted to the mounting channel 201 of the display screen 20, the camera module 30 is mounted to the limiting mechanism 65, the position of the camera module 30 is adjusted relative to the limiting mechanism 65 so as to achieve the purpose of adjusting the position of the camera module 30 relative to the display screen 20, the relative positions of the camera module 30 and the display screen 20 are confirmed on the basis of the imaging effect of the camera module 30, and the camera module 30 and the display screen 20 are fixed at an adjusted position by fixing the camera module 30 to the limiting mechanism 65.

The limiting mechanism 65 may be limited to some extent by the size control over the mounting channel 201 of the display screen 20 to facilitate improvement of the positioning accuracy of the limiting mechanism 65 and the display screen 20.

It will be understood that in the mounting process of the limiting mechanism 65 to the mounting channel 201 of the display screen 20, the limiting mechanism 65 may be fixed to the display screen 20 based on the degree of alignment of the limiting channel 650 of the limiting mechanism 65 with the light through hole 200 of the display screen 20. In this way, adjustment of the relative positions between the camera module 30 and the display screen 20 during subsequent adjustments only requires adjustment of the relative positions between the camera module 30 and the limiting mechanism 65.

The assembly method of the camera module 30 may also be implemented as the following steps. The camera module 30 is mounted to the limiting mechanism 65, the limiting mechanism 65 is mounted to the mounting channel 201 of the display screen 20, the position of the camera module 30 is adjusted relative to the limiting mechanism 65 so as to achieve the purpose of adjusting the position of the camera module 30 relative to the display screen 20, the relative positions of the camera module 30 and the display screen 20 are confirmed on the basis of the imaging effect of the camera module 30, and the camera module 30 and the display screen 20 are fixed at an adjusted position by fixing the camera module 30 to the limiting mechanism 65.

The limiting mechanism 65 may be limited to some extent by the size control over the mounting channel 201 of the display screen 20 to facilitate improvement of the positioning accuracy of the limiting mechanism 65 and the display screen 20.

It will be understood that in the mounting process of the limiting mechanism 65 to the display screen 20, the limiting mechanism 65 may be mounted to the display screen 20 based on the imaging effect of the camera module 30.

The assembly method of the camera module 30 may also be implemented as the following steps. The relative positions of the camera module 30 and the display screen 20 are adjusted to a more satisfactory position. The camera module 30 is mounted to the limiting mechanism 65 so that the camera module 30 can be fixed to the position. The limiting mechanism 65 is mounted to the mounting channel 201 of the display screen 20, and the relative positions of the camera module 30 and the limiting mechanism 65 are then adjusted within a range of the limiting mechanism 65 where the camera module 30 may be adjusted, thereby adjusting the relative positions of the camera module 30 and the display screen 20 mechanism.

It will be understood that after the camera module 30 is mounted to the limiting mechanism 65, the limiting mechanism 65 may be fixed to the display screen 20, so that the camera module 30 can be adjusted within a relatively small range by the limiting mechanism 65 so as to improve the adjustment accuracy of the camera module 30 and the limiting mechanism 65. Or, after the camera module 30 is mounted to the limiting mechanism 65, the limiting mechanism 65 is temporarily not fixed to the display screen 20, the relative positions of the camera module 30 and the display screen 20 are continuously changed to obtain a relatively satisfactory imaging effect, and the limiting mechanism 65 is then fixed to the display screen 20.

Further, in the present example, the back side of the display screen 20 is implemented as a planar structure. That is, the drive circuit layer 26 of the display screen 20 is a planar structure, and the limiting mechanism 65 is mounted to the drive circuit layer 26 of the display screen 20. When the relative positions between the limiting mechanism 65 and the display screen 20 need to be adjusted, the position adjustment of the limiting mechanism 65 on the display screen 20 is limited by the mounting channel 201 of the display screen 20.

It will be certainly understood that the relative positions of the camera module 30 and the display screen 20 may also be adjusted directly. When the relative positions between the camera module 30 and the display screen 20 are determined, the camera module 30 may be directly fixed to the display screen 20 by means of gluing or welding, etc., and the positions of the camera module and the display screen may be maintained at the adjusted position.

Furthermore, after the relative positions of the limiting mechanism 65 and the camera module 30 are confirmed based on the imaging effect of the camera module 30, the limiting mechanism 65 and the camera module 30 may be fixed by means of gluing, welding, etc.

For example, when the camera module 30 is mounted to the limiting mechanism 65 and the relative positions of the camera module 30 and the limiting mechanism 65 are adjusted, the limiting channel 650 of the limiting mechanism 65 has a gap for fine adjustment between the camera module 30 and the limiting mechanism 65.

When the relative positions between the camera module 30 and the limiting mechanism 65 are confirmed, the space of the limiting channel 650 of the limiting mechanism 65 not occupied by the camera module 30 may be filled with a colloid to fix the relative positions of the camera module 30 and the limiting mechanism 65.

For example, when the camera module 30 is mounted to the limiting mechanism 65 and the relative positions of the camera module 30 and the limiting mechanism 65 are adjusted, the limiting channel 650 of the limiting mechanism 65 has a gap for fine adjustment between the camera module 30 and the limiting mechanism 65.

When the relative positions between the camera module 30 and the limiting mechanism 65 are confirmed, an insert piece may be inserted between the camera module 30 and the sleeve 651 of the limiting mechanism 65 to fix the relative positions of the camera module 30 and the limiting mechanism 65. The insert piece limits the displacement of the camera module 30 relative to the limiting mechanism 65.

For example, when the camera module 30 is mounted to the limiting mechanism 65 and the relative positions of the camera module 30 and the limiting mechanism 65 are adjusted, the limiting channel 650 of the limiting mechanism 65 has a gap for fine adjustment between the camera module 30 and the limiting mechanism 65.

When the relative positions between the camera module 30 and the limiting mechanism 65 are confirmed, a welding pad may be provided on the outer side of the lens barrel of the camera module 30 or the inner wall of the sleeve 651 of the limiting mechanism 65, and the camera module 30 and the limiting mechanism 65 are then fixed by means of welding.

It will be understood that the colloid used for fixing the camera module 30 and the limiting mechanism 65 may be a thermoplastic fluid, and when the thermoplastic fluid fills the gap between the camera module 30 and the limiting mechanism 65, the thermoplastic fluid of the camera module 30 and the limiting mechanism 65 may be cured by means of heating.

Further, the sleeve 651 of the limiting mechanism 65 is configured as an opaque material to reduce the influence of external light on the camera module 30 located in the limiting channel 650 of the limiting mechanism 65. Especially when the display screen 20 is an LCD screen 20, the back plate layer 27 can actively emit light, and the opaque limiting mechanism 65 can reduce the influence of the light-emitting back plate layer 27 on the camera module 30.

The limiting mechanism 65 may be fixed to the drive circuit layer 26 by means of gluing, welding, etc.

Figure 55:
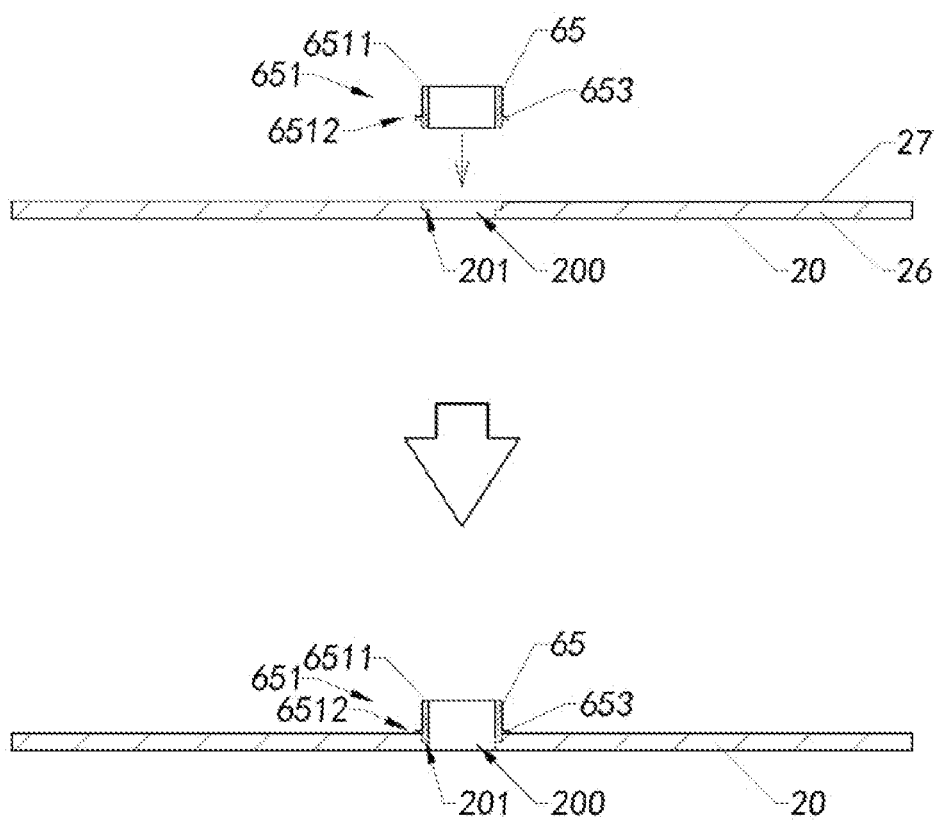
FIG. 55 is a schematic diagram of an assembly process according to a preferred embodiment of the present invention.

Referring to FIG. 55, a specific implementation mode of the limiting mechanism 65 according to the present invention is illustrated. In the present example, the limiting mechanism 65 further includes a connecting portion 653. The connecting portion 653 is configured to connect the sleeve 651 to the display screen 20.

Specifically, the sleeve 651 has a free end 6511 and a connecting end 6512. The free end 6511 and the connecting end 6512 are respectively located at both ends, and the connecting portion 653 is located at the connecting end 6512 of the sleeve 651.

The connecting portion 653 may be configured to extend outward from the connecting end 6512 of the sleeve 651. When the limiting mechanism 65 and the display screen 20 are mounted, the connecting portion 653 of the limiting mechanism 65 can be connected to the display screen 20. Meanwhile, the connecting portion 653 increases the area size of the limiting mechanism 65 connectable to the display screen 20, so as to facilitate the stable connection of the limiting mechanism 65 and the display screen 20. Thus, it is advantageous to stably mount the camera module 30 to the display screen 20 by the limiting mechanism 65.

More specifically, taking the mounting channel 201 formed on the back plate layer 27 as an example, the drive circuit layer 26 is at least exposed. The connecting portion 653 of the limiting mechanism 65 extends horizontally along the surface of the drive circuit layer 26, and the limiting mechanism 65 and the display screen 20 may be fixed by fixing the connecting portion 653 and the drive circuit layer 26 of the display screen 20.

The mounting channel 201 may be designed to be slightly larger to accommodate the connecting portion 653.

It is worth mentioning that in this way, the height sizes of the display screen 20 and the camera module 30 can be reduced to facilitate the reduction of the thickness size of the terminal device.

Figure 56:
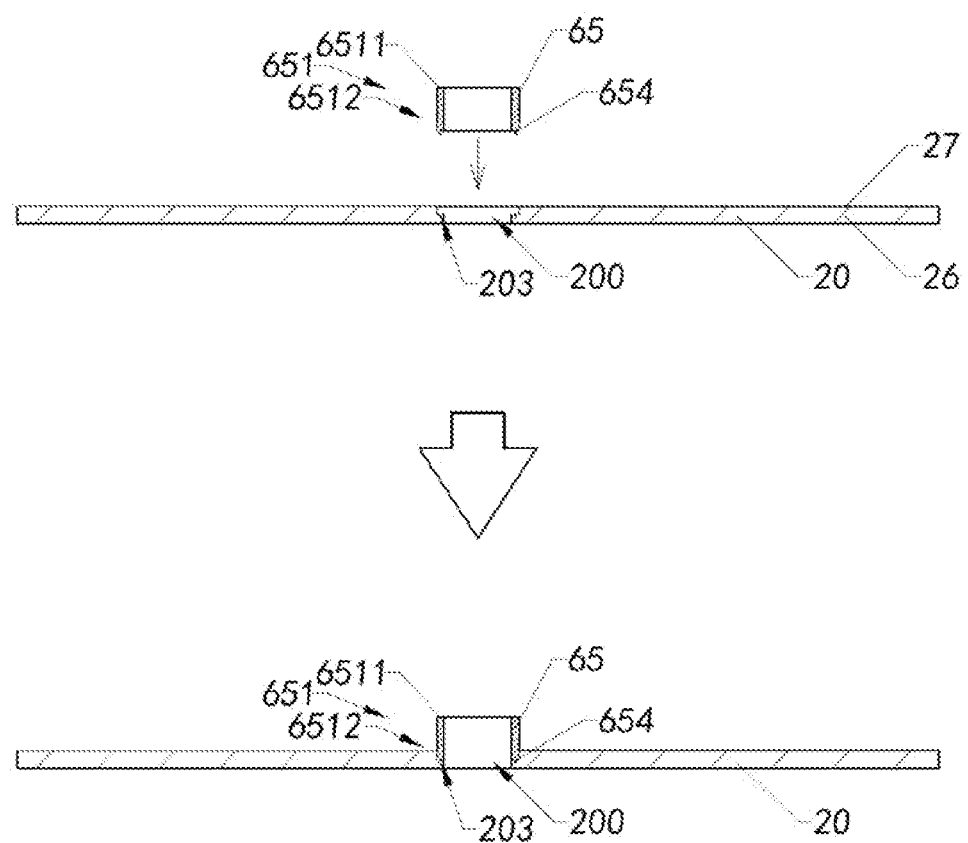
FIG. 56 is a schematic diagram of an assembly process according to a preferred embodiment of the present invention.

Referring to FIG. 56, a specific implementation mode of the limiting mechanism 65 according to the present invention is illustrated. In the present example, the relative positions of the limiting mechanism 65 and the display screen 20 are fixed in advance, and it is only necessary to adjust the relative positions of the camera module 30 and the limiting mechanism 65.

The limiting mechanism 65 is combined to the display screen 20 to facilitate enhancement of the combination strength of the limiting mechanism 65 to the display screen 20.

In the present example, the display screen 20 has a mounting channel 201. The light through hole 200 penetrates through the mounting channel 201. The light through hole 200 penetrates through the layers of the display screen 20 in the height direction, and the mounting channel 201 is exposed on the back side of the display screen 20.

The inner diameter of the mounting channel 201 is larger than that of the light through hole 200. At least a part of the limiting mechanism 65 can be accommodated in the mounting channel 201.

In the present example, the limiting mechanism 65 is embedded into the display screen 20.

For example, when the display screen 20 is an OLED display screen 20, the display screen 20 includes the cover plate layer 21, the touch layer 22, the polarization layer 23, the encapsulation layer 24, the pixel layer 25, the drive circuit layer 26, and the back plate layer 27. For example, the mounting channel 201 is formed on the back plate layer 27 and at least a part of the drive circuit layer 26 is exposed on the mounting channel 201.

At least a part of the limiting mechanism 65 penetrates through the mounting channel 201 and embedded into the drive circuit layer 26.

The limiting mechanism 65 further includes at least one connecting pin 654. The connecting pin 654 extends from the connecting end 6512 of the sleeve 651 along the length direction of the sleeve 651. Preferably, there may be a plurality of connecting pins 654.

The display screen 20 has at least one embedded channel 203. The embedded channel 203 is located around the light through hole 200 of the display screen 20, and the embedded channel 203 is matched to the connecting pin 654 of the limiting mechanism 65.

The embedded channel 203 extends to the drive circuit layer 26. Preferably, the embedded channel 203 is configured to avoid the circuit structure of the drive circuit layer 26 to reduce the influence on the working efficiency of the display screen 20.

It will be certainly understood by those skilled in the art that the embedded channel 203 may continue to extend upward from the drive circuit layer 26 to other layers of the display screen 20.

When the limiting mechanism 65 is mounted to the display screen 20, the connecting pin 654 of the limiting mechanism 65 extends into the embedded channel 203 of the display screen 20. The connecting pin 654 may be embedded into the embedded channel 203. The embedded channel 203 may also be slightly larger than the connecting pin 654. When the connecting pin 654 extends into the embedded channel 203, a gap remains in the embedded channel 203. At this moment, a colloid may be filled inward, so that the connecting pin 654 of the limiting mechanism 65 can be fixed to the embedded channel 203 of the display screen 20, thereby facilitating the limiting mechanism 65 to be stably mounted to the display screen 20.

Further, when the mounting channel 201 of the display screen 20 is slightly larger than the sleeve 651 of the limiting mechanism 65, the limiting mechanism 65 may be fixed to a portion of the display screen 20 corresponding to the mounting channel 201, e.g., the back plate layer 27, by means of filling the mounting channel 201 with a colloid or mounting an insertion piece or welding. In this way, the limiting mechanism 65 and the display screen 20 can be combined firmly to facilitate stable combination between the limiting mechanism 65 and the camera module 30.

Further, the embedded channel 203 may be formed on the drive circuit layer 26 of the display screen 20 by means of perforating. The drive circuit layer 26 of the display screen 20 is drilled, for example, in the mounting channel 201. The embedded channel 203 may also be formed by means of etching.

It will be understood by those skilled in the art that the manner in which the embedded channel 203 is formed or the position of the embedded channel 203 is not limited to the above examples.

Furthermore, according to other embodiments of the present invention, the embedded channel 203 may be formed on the sleeve 651, and the connecting pin 654 may be formed on the display screen 20.

When the limiting mechanism 65 is mounted to the display screen 20, the connecting pin 654 located on the display screen 20 extends into the embedded channel 203 of the sleeve 651, thereby facilitating fixation between the limiting mechanism 65 and the display screen 20.

The connecting pin 654 may be formed on the display screen 20 by means of deposition, evaporation, etc. The connecting pin 654 may be integrally formed on the display screen 20. The connecting pin 654 may be formed on a portion of the drive circuit layer 26 of the display screen 20 exposed to the mounting channel 201.

Furthermore, according to other embodiments of the present invention, the embedded channels 203 may be formed on the sleeve 651 and the display screen 20, respectively, and the connecting pins 654 can be embedded into the sleeve 651 and the display screen 20, respectively. For example, one end of the connecting pin 654 extends into the embedded channel 203 of the display screen 20, and the other end of the connecting pin 654 then extends into the embedded channel 203 of the sleeve 651. The connecting pin 654 and the display screen 20 and the connecting pin 654 and the sleeve 651 are respectively fixed, thereby fixing the sleeve 651 to the display screen 20.

Figure 57:
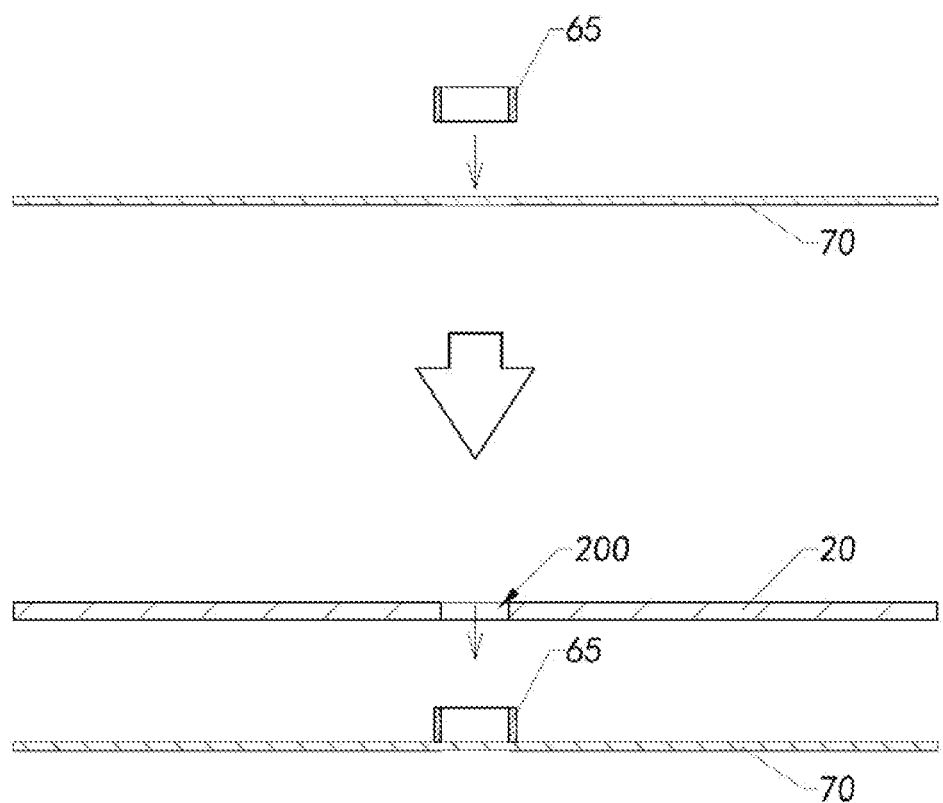
FIG. 57 is a schematic diagram of an assembly process according to a preferred embodiment of the present invention.

Referring to FIG. 57, another specific implementation mode of the limiting mechanism 65 according to the present invention is illustrated.

The mobile terminal includes a base plate 70. The base plate 70 is configured to mount the camera module 30. The camera module 30 is located between the base plate 70 and the display screen 20.

A position between the base plate 70 and the display screen 20 can be relatively fixed, for example, by a housing 40 of the mobile terminal. The base plate 70 may be mounted to the mobile terminal after the camera module 30 is mounted to the mobile terminal, the housing 40 is then mounted to the mobile terminal, and the mobile terminal may provide a sufficient operating space when the camera module 30 is mounted.

The limiting mechanism 65 is located on the base plate 70 so as to limit the relative displacement of the camera module 30 and the display screen 20 by limiting the relative displacement of the camera module 30 and the base plate 70.

In the present example, the limiting mechanism 65 needs to be mounted to the display screen 20. That is, the limiting mechanism 65 and the base plate 70 are originally independent of each other.

The assembly method of the camera module 30 includes the following steps. The limiting mechanism 65 is mounted to the base plate 70, the camera module 30 is mounted to the limiting mechanism 65, the position of the camera module 30 is adjusted relative to the limiting mechanism 65 so as to achieve the purpose of adjusting the position of the camera module 30 relative to the display screen 20, the relative positions of the camera module 30 and the display screen 20 are confirmed on the basis of the imaging effect of the camera module 30, and the camera module 30 and the display screen 20 are fixed at an adjusted position by fixing the camera module 30 to the limiting mechanism 65. It will be understood that in the mounting process of the limiting mechanism 65 to the base plate 70, the limiting mechanism 65 may be fixed to the display screen 20 based on the degree of alignment of the limiting channel 650 of the limiting mechanism 65 with the light through hole 200 of the base plate 70. That is, a mounting position of the limiting mechanism 65 on the base plate 70 is judged according to an alignment state of the limiting channel 650 of the limiting mechanism 65 with the light through hole 200 of the display screen 20. In this way, adjustment of the relative positions between the camera module 30 and the display screen 20 during subsequent adjustments only requires adjustment of the relative positions between the camera module 30 and the limiting mechanism 65.

The assembly method of the camera module 30 may also be implemented as the following steps. The camera module 30 is mounted to the limiting mechanism 65, the limiting mechanism 65 is mounted to the base plate 70, the position of the camera module 30 is adjusted relative to the limiting mechanism 65 so as to achieve the purpose of adjusting the position of the camera module 30 relative to the display screen 20, the relative positions of the camera module 30 and the display screen 20 are confirmed on the basis of the imaging effect of the camera module 30, and the camera module 30 and the display screen 20 are fixed at an adjusted position by fixing the camera module 30 to the limiting mechanism 65.

It will be understood that in the mounting process of the limiting mechanism 65 to the base plate 70, the limiting mechanism 65 may be mounted to the base plate 70 based on the imaging effect of the camera module 30.

The assembly method of the camera module 30 may also be implemented as the following steps. The relative positions of the camera module 30 and the display screen 20 are adjusted to a more satisfactory position. The camera module 30 is mounted to the limiting mechanism 65 so that the camera module 30 can be fixed to the position. The limiting mechanism 65 is mounted to the base plate 70, and the relative positions of the camera module 30 and the limiting mechanism 65 are then adjusted within a range of the limiting mechanism 65 where the camera module 30 may be adjusted, thereby adjusting the relative positions of the camera module 30 and the display screen 20.

It will be understood that after the camera module 30 is mounted to the limiting mechanism 65, the limiting mechanism 65 may be fixed to the base plate 70, so that the camera module 30 can be adjusted within a relatively small range by the limiting mechanism 65 so as to improve the adjustment accuracy of the camera module 30 and the limiting mechanism 65. Or, after the camera module 30 is mounted to the limiting mechanism 65, the limiting mechanism 65 is temporarily not fixed to the base plate 70, the relative positions of the camera module 30 and the display screen 20 are continuously changed to obtain a relatively satisfactory imaging effect, and the limiting mechanism 65 is then fixed to the base plate 70.

Further, in the present example, one side of the base plate 70 is implemented as a planar structure, and the limiting mechanism 65 is mounted to the side of the base plate 70. When the relative positions between the limiting mechanism 65 and the display screen 20 need to be adjusted, the limiting mechanism 65 is freely adjusted on the base plate 70 until the limiting channel 650 of the limiting mechanism 65 is aligned with the light through hole 200 of the display screen 20, or the camera module 30 mounted to the limiting mechanism 65 obtains a desired imaging effect.

It will be certainly understood that the relative positions of the camera module 30 and the display screen 20 may also be adjusted directly. When the relative positions between the camera module 30 and the display screen 20 are determined, the camera module 30 may be directly fixed to the display screen 20 by means of gluing or welding, etc., and the positions of the camera module and the display screen may be maintained at the adjusted position.

Furthermore, after the relative positions of the limiting mechanism 65 and the camera module 30 are confirmed based on the imaging effect of the camera module 30, the limiting mechanism 65 and the camera module 30 may be fixed by means of gluing, welding, etc.

For example, when the camera module 30 is mounted to the limiting mechanism 65 and the relative positions of the camera module 30 and the limiting mechanism 65 are adjusted, the limiting channel 650 of the limiting mechanism 65 has a gap for fine adjustment between the camera module 30 and the limiting mechanism 65.

When the relative positions between the camera module 30 and the limiting mechanism 65 are confirmed, the space of the limiting channel 650 of the limiting mechanism 65 not occupied by the camera module 30 may be filled with a colloid to fix the relative positions of the camera module 30 and the limiting mechanism 65.

For example, when the camera module 30 is mounted to the limiting mechanism 65 and the relative positions of the camera module 30 and the limiting mechanism 65 are adjusted, the limiting channel 650 of the limiting mechanism 65 has a gap for fine adjustment between the camera module 30 and the limiting mechanism 65.

When the relative positions between the camera module 30 and the limiting mechanism 65 are confirmed, an insert piece may be inserted between the camera module 30 and the sleeve 651 of the limiting mechanism 65 to fix the relative positions of the camera module 30 and the limiting mechanism 65. The insert piece limits the displacement of the camera module 30 relative to the limiting mechanism 65.

For example, when the camera module 30 is mounted to the limiting mechanism 65 and the relative positions of the camera module 30 and the limiting mechanism 65 are adjusted, the limiting channel 650 of the limiting mechanism 65 has a gap for fine adjustment between the camera module 30 and the limiting mechanism 65.

When the relative positions between the camera module 30 and the limiting mechanism 65 are confirmed, a welding pad may be provided on the outer side of the lens barrel of the camera module 30 or the inner wall of the sleeve 651 of the limiting mechanism 65, and the camera module 30 and the limiting mechanism 65 are then fixed by means of welding.

It will be understood that the colloid used for fixing the camera module 30 and the limiting mechanism 65 may be a thermoplastic fluid, and when the thermoplastic fluid fills the gap between the camera module 30 and the limiting mechanism 65, the thermoplastic fluid of the camera module 30 and the limiting mechanism 65 may be cured by means of heating.

Further, the sleeve 651 of the limiting mechanism 65 is configured as an opaque material to reduce the influence of external light on the camera module 30 located in the limiting channel 650 of the limiting mechanism 65. Especially when the display screen 20 is an LCD screen 20, the back plate layer can actively emit light, and the opaque limiting mechanism 65 can reduce the influence of the light-emitting back plate layer on the camera module 30.

It is worth noting that the camera module 30 has a high end and a low end. When the limiting mechanism 65 is located on the display screen 20, the high end of the camera module 30 is mounted to the limiting mechanism 65. The high end of the camera module 30 is a light entering position of the camera module 30, and the low end of the camera module 30 is a photosensitive position of the camera module 30. When the limiting mechanism 65 is located on the base plate 70, the bottom end of the camera module 30 is mounted to the limiting mechanism 65.

In the present embodiment, the lower end of the camera module 30 is mounted to the limiting mechanism 65. When the relative positions of the camera module 30 and the limiting mechanism 65 are determined, that is, when the relative positions of the camera module 30 and the display screen 20 are determined, the high end of the camera module 30 may be mounted to the display screen 20.

Figure 58:
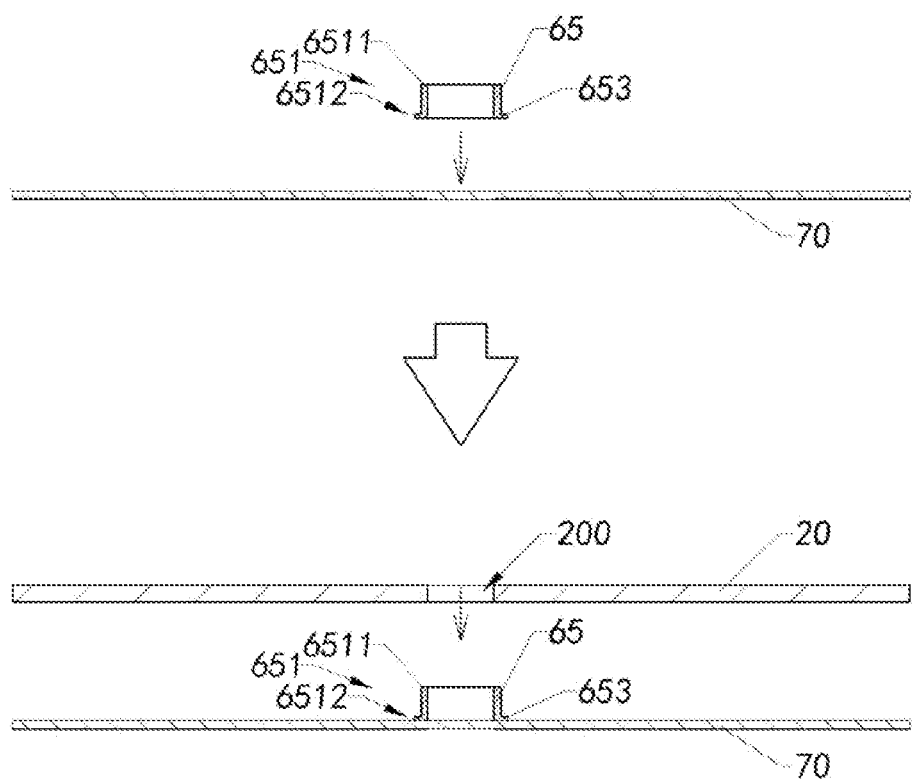
FIG. 58 is a schematic diagram of an assembly process according to a preferred embodiment of the present invention.

Referring to FIG. 58, a specific implementation mode of the limiting mechanism 65 according to the present invention is illustrated. In the present example, the limiting mechanism 65 further includes a connecting portion 653. The connecting portion 653 is configured to connect the sleeve 651 to the base plate 70.

Specifically, the sleeve 651 has a free end 6511 and a connecting end 6512. The free end 6511 and the connecting end 6512 are respectively located at both ends, and the connecting portion 653 is located at the connecting end 6512 of the sleeve 651.

The connecting portion 653 may be configured to extend outward from the connecting end 6512 of the sleeve 651. When the limiting mechanism 65 and the base plate 70 are mounted, the connecting portion 653 of the limiting mechanism 65 can be connected to the base plate 70. Meanwhile, the connecting portion 653 increases the area size of the limiting mechanism 65 connectable to the base plate 70, so as to facilitate the stable connection of the limiting mechanism 65 and the base plate 70. Thus, it is advantageous to stably mount the camera module 30 to the display screen 20 by the limiting mechanism 65.

Figure 59:
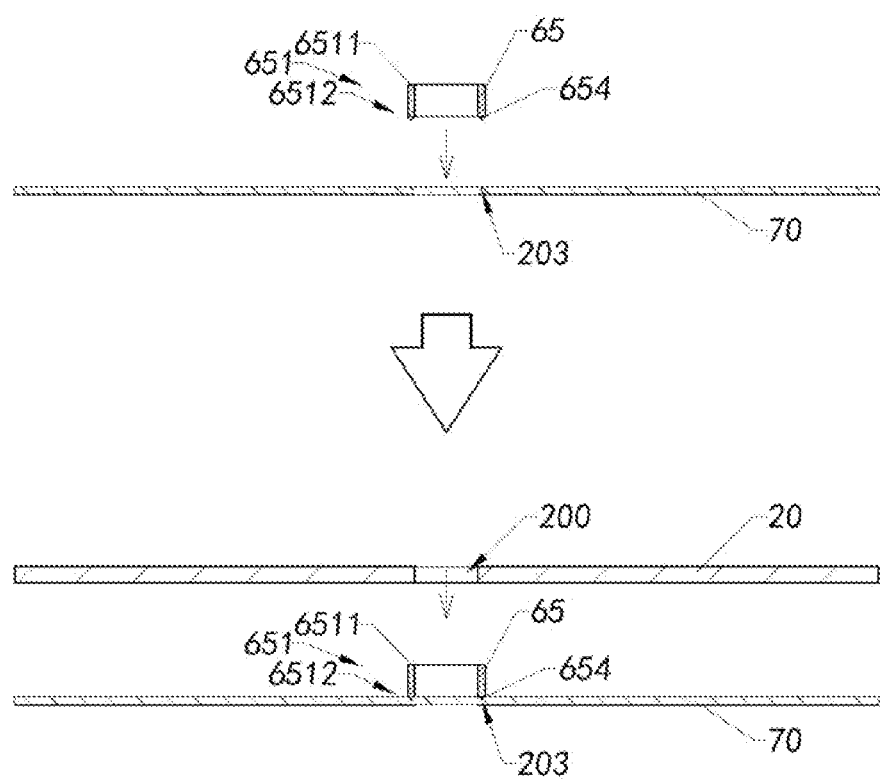
FIG. 59 is a schematic diagram of an assembly process according to a preferred embodiment of the present invention.

Referring to FIG. 59, a specific implementation mode of the limiting mechanism 65 according to the present invention is illustrated. In the present example, the relative positions of the limiting mechanism 65 and the base plate 70 are fixed in advance, and it is only necessary to adjust the relative positions of the camera module 30 and the limiting mechanism 65.

The limiting mechanism 65 is combined to the base plate 70 to facilitate enhancement of the combination strength of the limiting mechanism 65 to the base plate 70.

In the present example, the limiting mechanism 65 is embedded into the base plate 70.

The limiting mechanism 65 further includes at least one connecting pin 654. The connecting pin 654 extends from the connecting end 6512 of the sleeve 651 along the height direction of the sleeve 651. Preferably, there may be a plurality of connecting pins 654.

The base plate 70 has at least one embedded channel 203. The embedded channel 203 is located around the light through hole 200 of the display screen 20, and the embedded channel 203 is matched to the connecting pin 654 of the limiting mechanism 65.

Preferably, the embedded channel 203 is configured to avoid a circuit structure of the base plate 70 to reduce the influence on the working efficiency of the base plate 70.

When the limiting mechanism 65 is mounted to the base plate 70, the connecting pin 654 of the limiting mechanism 65 extends into the embedded channel 203 of the base plate 70. The connecting pin 654 may be embedded into the embedded channel 203. The embedded channel 203 may also be slightly larger than the connecting pin 654. When the connecting pin 654 extends into the embedded channel 203, a gap remains in the embedded channel 203. At this moment, a colloid may be filled inward, so that the connecting pin 654 of the limiting mechanism 65 can be fixed to the embedded channel 203 of the base plate 70, thereby facilitating the limiting mechanism 65 to be stably mounted to the base plate 70.

Further, the embedded channel 203 may be formed on the base plate 70 by means of perforating. For example, the embedded channel is formed by drilling inward from the surface of the base plate 70.

It will be understood by those skilled in the art that the manner in which the embedded channel 203 is formed or the position of the embedded channel 203 is not limited to the above examples.

Furthermore, according to other embodiments of the present invention, the embedded channel 203 may be formed on the sleeve 651, and the connecting pin 654 may be formed on the base plate 70.

When the limiting mechanism 65 is mounted to the base plate 70, the connecting pin 654 located on the base plate 70 extends into the embedded channel 203 of the sleeve 651, thereby facilitating fixation between the limiting mechanism 65 and the base plate 70.

The connecting pin 654 may be formed on the base plate 70 by means of deposition, evaporation, etc. The connecting pin 654 may be integrally formed on the base plate 70.

Furthermore, according to other embodiments of the present invention, the embedded channels 203 may be formed on the sleeve 651 and the base plate 70, respectively, and the connecting pins 654 can be embedded into the sleeve 651 and the base plate 70, respectively. For example, one end of the connecting pin 654 extends into the embedded channel 203 of the base plate 70, and the other end of the connecting pin 654 then extends into the embedded channel 203 of the sleeve 651. The connecting pin 654 and the base plate 70 and the connecting pin 654 and the sleeve 651 are respectively fixed, thereby fixing the sleeve 651 to the base plate 70.

Furthermore, in other embodiments of the present invention, the base plate 70 may have at least one mounting channel 201. The base plate 70 is recessed to form the mounting channel 201. At least a part of the limiting mechanism 65 may be accommodated in the mounting channel 201, and the base plate 70 and the limiting mechanism 65 may be then fixed by filling the gap between the base plate 70 and the limiting mechanism 65 with a colloid.

Figure 60A:
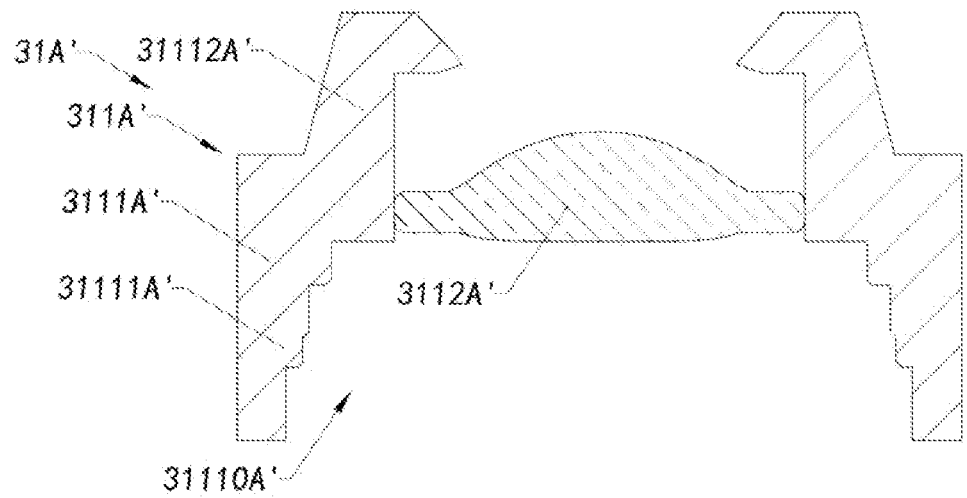
FIG. 60A is a schematic diagram of a lens barrel according to a preferred embodiment of the present invention.
Figure 60B:
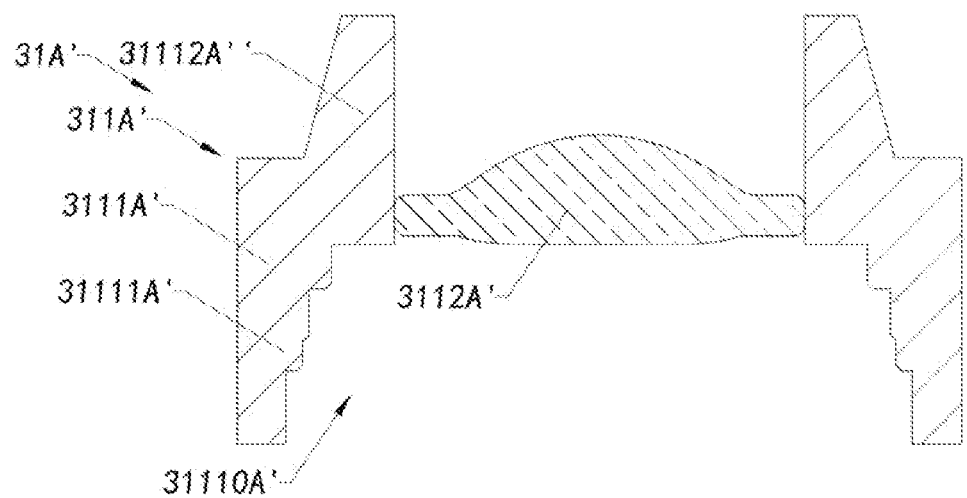
FIG. 60B is a schematic diagram of a lens barrel according to a preferred embodiment of the present invention.

In order to reduce the requirements for the assembly accuracy of the camera module 30 and the display screen 20, a lens barrel of the camera module 30 is preferably specially designed. Referring to FIGS. 60A, 60B, and 28, the camera module 30 includes an optical mechanism 31A' and a photosensitive unit 32A. The optical mechanism 31A' includes an optical lens 311A'. The optical lens 311A' is held in a photosensitive path of the photosensitive unit 32A.

The optical mechanism 31A' may also include components such as a motor, a base, and a filter element.

The optical lens 311A' includes the lens barrel 3111A' and a plurality of lenses. The plurality of lenses are held on the lens barrel 3111A'.

The lens barrel 3111A' has an end face. When the camera module 30 is mounted to the display screen 20, the end face of the lens barrel 3111A' is adapted to be close to the display screen 20 and then fixed to the display screen 20.

One of the lenses is a first lens 3112A'. The first lens 3112A' is generally closest to the end face of the lens barrel 3111A' relative to the other lenses.

In the present example, the first lens 3112A' and the end face of the lens barrel 3111A' are provided at a large distance.

Specifically, the lens barrel 3111A' includes a lens barrel wall 31111A' and a lens barrel cavity 31110A'. The lens 3112A' is accommodated in the lens barrel cavity 31110A'. The lens barrel wall 31111A' surrounds the lens barrel cavity 31110A'.

The lens barrel 3111A' further includes an extension wall 31112A'. The extension wall 31112A' extends vertically upward from one end of the lens barrel wall 31111A'. The lens barrel wall 31111A' has a high end and a low end. The extension wall 31112A' extends for a certain distance upward from the high end of the lens barrel wall 31111A' to increase the distance between the first lens 3112A' and the end face of the lens barrel 3111A'.

The camera module 30 can be assembled directly to the display screen 20 and avoids the influence on the first lens 3112A'.

In this way, the requirements for assembly accuracy between the camera module 30 and the display screen 20 can be reduced. The camera module 30 may be supported directly on the display screen 20 and the relative positions between the camera module 30 and the display screen 20 are then adjusted.

Further, in the example shown in FIG. 60A, the extension wall 31112A' is provided so as to extend horizontally inward after extending for a certain distance from the lens barrel wall 31111A'. In the example shown in FIG. 60B, the extension wall 31112A" may extend all the way upward from the lens barrel wall 31111A'.

Figure 60C:
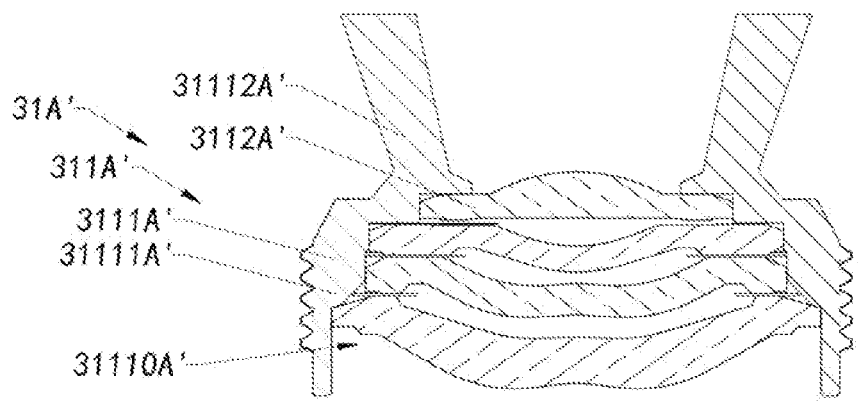
FIG. 60C is a schematic diagram of a lens barrel according to a preferred embodiment of the present invention.

Referring to FIG. 60C, another implementation mode of the optical mechanism 31A' according to the above embodiment of the present invention is shown. In the present embodiment, the extension wall 31112A' extends upward for a certain distance from the high end of the lens barrel wall 31111A', and the inner diameter of the extension wall 31112A' is set to be gradually reduced from top to bottom. As it is closer to the high end of the lens barrel wall 31111A', the inner diameter of the extension wall 31112A' is smaller. That is, as it is closer to the high end of the lens barrel wall 31111A', the lens barrel cavity 31110A' is smaller. Meanwhile, the outer diameter of the extension wall 31112A' is also set to be gradually reduced from top to bottom.

Figure 60D:
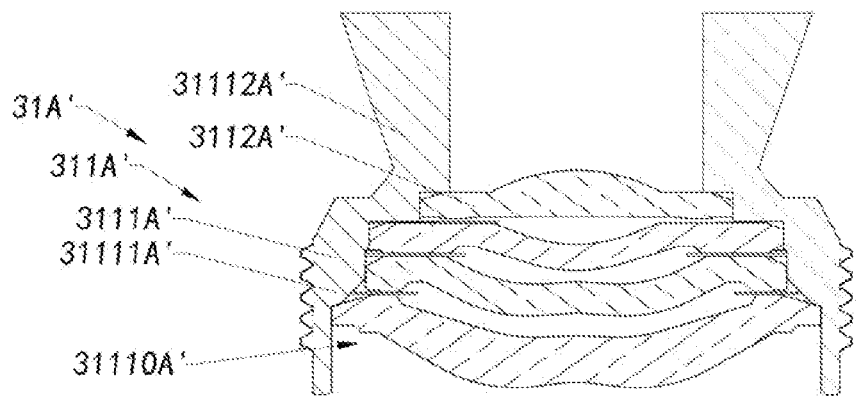
FIG. 60D is a schematic diagram of a lens barrel according to a preferred embodiment of the present invention.

Referring to FIG. 60D, another implementation mode of the optical mechanism 31A' according to the above embodiment of the present invention is shown. In the present embodiment, the extension wall 31112A' extends upward for a certain distance from the high end of the lens barrel wall 31111A', and the inner diameter of the extension wall 31112A' is set to remain constant from top to bottom. However, the outer diameter of the extension wall 31112A' is set to be gradually reduced from top to bottom. As it is closer to the high end of the lens barrel wall 31111A', the outer diameter of the extension wall 31112A' is smaller.

Figure 60E:
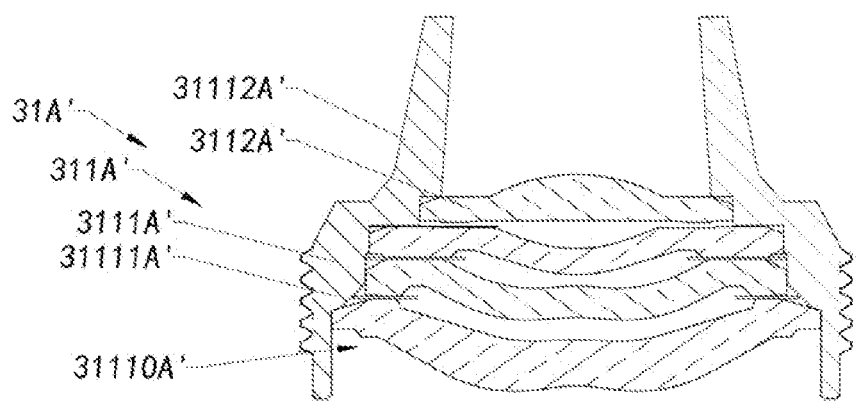
FIG. 60E is a schematic diagram of a lens barrel according to a preferred embodiment of the present invention.

Referring to FIG. 60E, another implementation mode of the optical mechanism 31A' according to the above embodiment of the present invention is shown. In the present embodiment, the extension wall 31112A' extends upward for a certain distance from the high end of the lens barrel wall 31111A', and the inner diameter of the extension wall 31112A' is set to be gradually increased from top to bottom. Also, the outer diameter of the extension wall 31112A' is set to be gradually increased from top to bottom. As it is closer to the high end of the lens barrel wall 31111A', both the inner and outer diameters of the extension wall 31112A' are increased.

Further, for the display screen 20 with the light through hole 200, an edge of the light through hole 200, i.e., a transition region between a display screen and a non-display region of the display screen 20, may have a black edge due to the presence of the light through hole 200, thereby influencing the normal display of the entire display screen 20. The light through hole 200 penetrates through at least a part of the display screen 20, e.g., a pixel layer of the display screen 20, in the height direction.

Figure 61A:
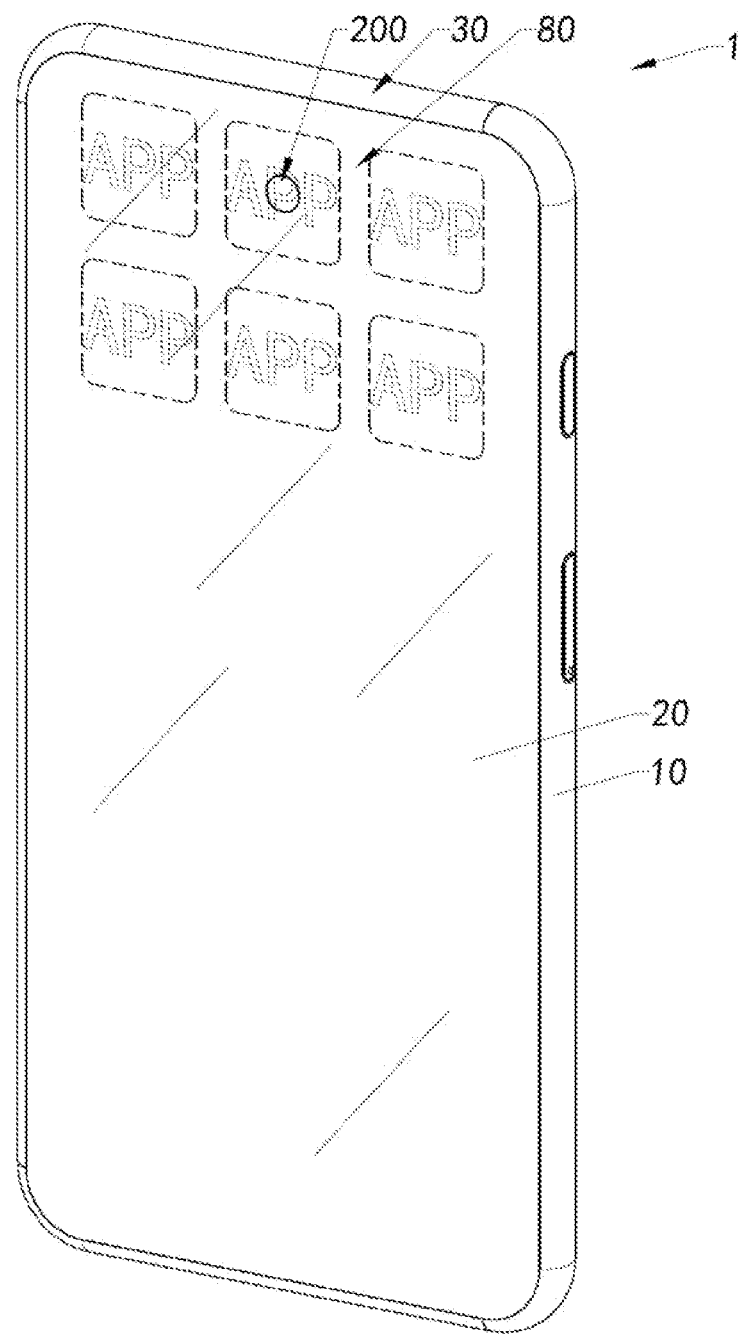
FIG. 61A is a schematic diagram of a terminal device according to a preferred embodiment of the present invention.
Figure 61B:
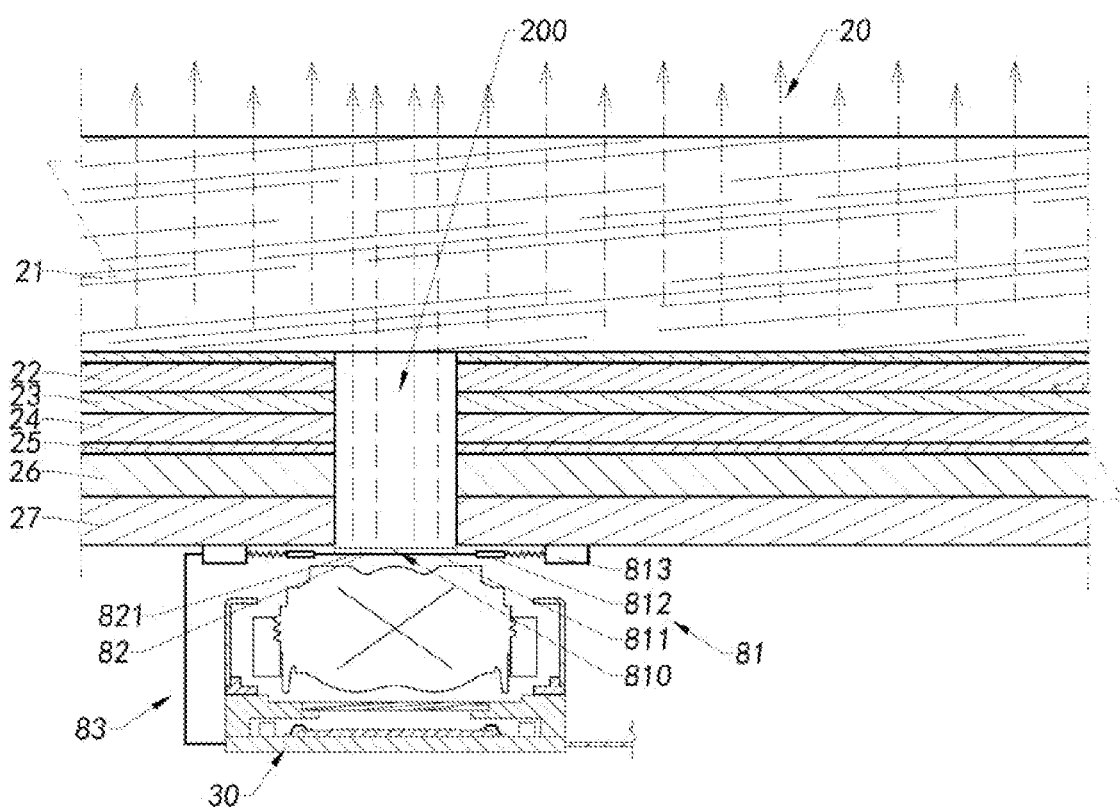
FIG. 61B is a schematic diagram of a display unit according to a preferred embodiment of the present invention.
Figure 61C:
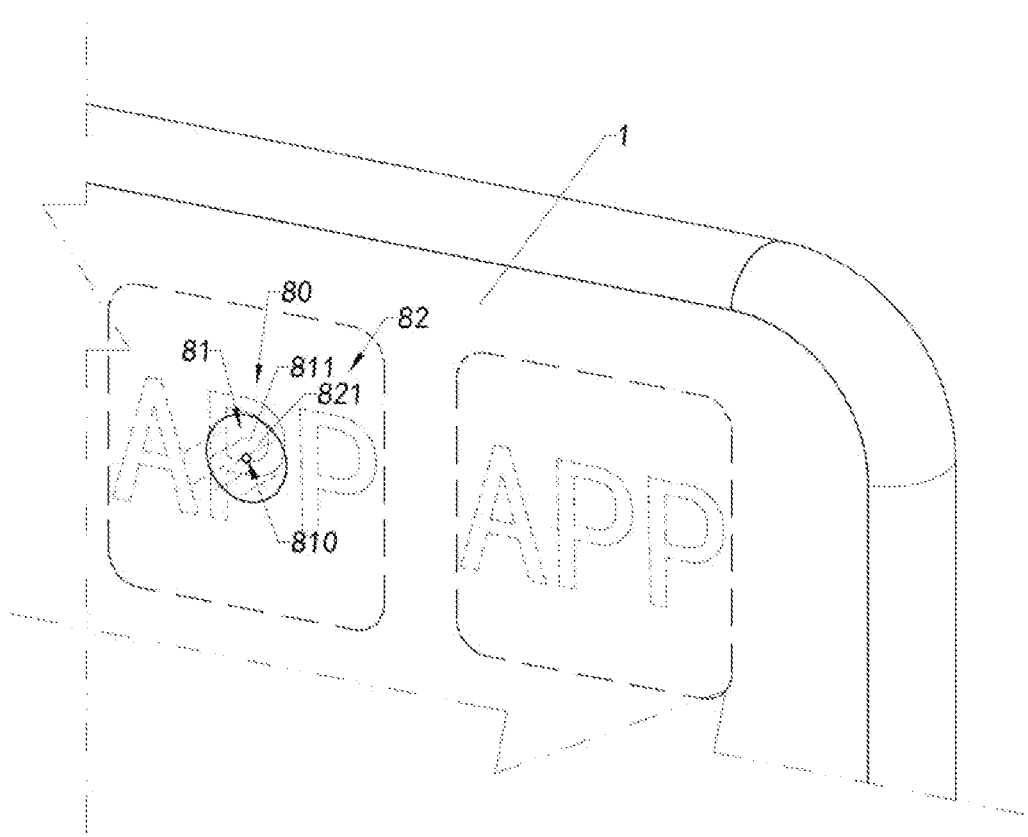
FIG. 61C is a partial schematic diagram of another operating state of the display unit according to the above preferred embodiment of the present invention.

According to another aspect of the present invention, referring to FIGS. 61A to 61C, a terminal device 1 is provided according to the present invention. The terminal device 1 includes a terminal device body 10, a display unit, and a camera module 30. The camera module 30 is located below the display unit. The camera module 30 has a front end. The front end of the camera module 30 is mounted to a display screen 20 of the display unit and the camera module 30 is aligned with a light through hole 200 of the display screen 20, so that light outside the display screen 20 is received by the camera module 30 via the light through hole 200.

The display unit includes the display screen 20 with the light through hole 200 and a light supplementing unit 80. The light supplementing unit 80 can supplement light to the position of the light through hole 200 of the display screen 20 to facilitate a display effect of the entire display screen 20.

In the present implementation, the light supplementing unit 80 is located between the display screen 20 and the camera module 30, and may be mounted to a bottom surface of the display screen 20. Light from the outside of the display screen 20 passes through the light through hole 200 of the display screen 20 and the light supplementing unit 80, and then reaches the camera module 30.

Further, in the present example, the display screen 20 is exemplified as an OLED display screen, and the light through hole 200 penetrates through the layers of the display screen other than the cover plate layer 21. It will be certainly understood by those skilled in the art that the type of display screen 20 is not limited to OLED display screens and that the position of the light through hole 200 inside the display screen 20 may not be limited to the above examples.

The light supplementing unit 80 can not only supplement light to the light through hole 200 of the display screen 20, but also control the light entering amount of the camera module 30.

Specifically, the light supplementing unit 80 includes a diaphragm structure 81 and a light emitting structure 82. The light emitting structure 82 is provided to the diaphragm structure 81.

The light emitting structure 82 can radiate light outward, and at least a part of the diaphragm structure 81 is located on the light through hole 200 or aligned with the light through hole 200. At least a part of the light emitting structure 82 provided to the diaphragm structure 81 is configured so as to be able to be located at the light through hole 200 or near the light through hole 200 or to be aligned with the light through hole 200. Therefore, when the light emitting structure 82 emits light, the problem of insufficient illumination of the display region and the non-display region of the display screen 20 corresponding to the position of the light through hole 200 can be compensated.

The diaphragm structure 81 includes a diaphragm moving portion 811, a diaphragm carrier 812, and a diaphragm driving portion 813. The diaphragm moving portion 811 is supported on the diaphragm carrier 812, and the diaphragm moving portion 811 is drivable connected to the diaphragm driving portion 813. The diaphragm moving portion 811 can move under the action of the diaphragm driving portion 813 to form a light hole 810 of a variable size.

Specifically, the diaphragm moving portion 811 moves under the drive of the diaphragm driving portion 813, and the size of an optical path corresponding to the camera module 30 can be changed as the relative positions of the diaphragm moving portion 811 and the light through hole are changed.

The light emitting structure 82 is provided to the diaphragm moving portion 811. Specifically, the diaphragm moving portion 811 has an upper surface facing the outside of the display screen 20 and a lower surface facing the camera module 30. The light emitting structure 82 is located on the upper surface of the diaphragm moving portion 811 so as to supplement light to a side of the display screen 20 facing the outside when the light emitting structure 82 emits light.

The entire diaphragm moving portion 811 may be opaque. When the light emitting structure 82 emits light, it is difficult for light emitted by the light emitting structure 82 to reach the camera module 30 located below the display screen 20. When the camera module 30 operates, the amount of light entering through the diaphragm moving portion 811 may be controlled based on the size of the light hole 810.

The entire diaphragm moving portion 811 may also be light-transmitting, but the lower surface of the diaphragm moving portion 811 may be provided with an opaque material. When the light emitting structure 82 emits light, it is difficult for light emitted by the light emitting structure 82 to reach the camera module 30 located below the display screen 20. When the camera module 30 operates, the amount of light entering through the diaphragm moving portion 811 may be controlled based on the size of the light hole 810.

After passing through the light through hole 200 of the display screen 20, the light passes through the light hole 810 of the diaphragm structure 81 and is received by the camera module 30. The light hole 810 of the diaphragm structure 81 is aligned with the through hole 200 of the display screen 20. Further, the light hole 810 of the diaphragm structure 81 and the light through hole 200 of the display screen 20 may be located on the same axis.

The light emitting structure 82 includes at least one light emitting element 821. The light emitting element 821 is arranged on the upper surface of the diaphragm moving portion 811 of the diaphragm structure 81. The light emitting element 821 may be one pixel or more pixels. When one of the light emitting elements 821 is energized, the light emitting element 821 emits light. When the plurality of light emitting elements 821 are energized, the illumination amplitude of the light emitting structure 82 is enhanced. The luminance of the light emitting structure 82 may be controlled by controlling the magnitude of an energizing current of the light emitting element 821.

When the camera module 30 needs to operate, the diaphragm moving portion 811 may move under the drive of the diaphragm driving portion 813 to form the light hole 810 or enlarge the light hole 810. At this moment, the diaphragm moving portion 811 may stop emitting light.

When the camera module 30 does not operate and the display screen 20 plays a display role, the diaphragm moving portion 811 is driven by the diaphragm driving portion 813 so that at least a part of the light emitting structure 82 corresponds to the light through hole 200. Thus, the light emitting structure 82 can radiate light outward via the light through hole 200. At this moment, the light hole 810 of the diaphragm structure 81 may be completely closed, or the light hole 810 of the diaphragm structure 81 may be opened, light may reach the camera module 30, and the camera module 30 may be started at any time to operate.

Further, the light supplementing unit 80 is detachably mounted to the display screen 20 to facilitate maintenance and replacement of the light supplementing unit 80.

The light supplementing unit 80 includes a control mechanism 83. The diaphragm structure 81 is controllably connected to the control mechanism 83. The control mechanism 83 may control the size of the light hole 810 of the diaphragm structure 81 by controlling the diaphragm driving portion 813 to control the movement of the diaphragm moving portion 811 of the diaphragm structure 81. The control mechanism 83 may also control an operating state of the light emitting structure 82, such as a light emitting intensity and an on/off state. The control mechanism 83 may be implemented as a control chip of the terminal device, such as a control chip of the camera module 30.

According to another aspect of the present invention, an operating method of a display unit is provided by the present invention. The operating method includes the following steps.

When the display screen 20 with the light through hole 200 operates, the light supplementing unit 80 is operated to emit light so as to supplement the light intensity of the position of the light through hole 200.

According to some embodiments of the present invention, when the camera module 30 located below the display screen 20 and aligned with the light through hole 200 operates, the diaphragm structure 81 of the light supplementing unit 80 located above the camera module 30 is operated to form the light hole 810. Light reaches the camera module 30 after being constrained by the light hole 810 and the light supplementing unit 80.

Referring to FIGS. 62A, 62C, and 61A-61C, another implementation mode of the terminal device 1 according to the above embodiment of the present invention is shown.

In the present example, the diaphragm moving portion 811 includes a plurality of blades 8111. Each blade 8111 is supported on the diaphragm carrier 812 and the distances between the plurality of blades 8111 can be changed with each other under the drive of the diaphragm driving portion 813, so that light can pass through the diaphragm structure 81, and the light through amount can also be controlled.

The light emitting structure 82 includes the plurality of light emitting elements 821, and each of the light emitting elements 821 corresponds to one of the blades 8111 of the diaphragm moving portion 811.

Each blade 8111 may be drivable connected to the diaphragm driving portion 813, respectively. All the blades 8111 may be drivable connected to the diaphragm driving portion 813, simultaneously.

The position of the light emitting element 821 can move as the blade 8111 moves. Referring to FIGS. 62A to 62C, as the blade 8111 moves, the aperture size of the light hole 810 of the diaphragm structure 81 of the light supplementing unit 80 can be adjusted, and the light hole 810 can be enlarged or reduced to control the light entering amount of the camera module 30.

According to other embodiments of the present invention, the diaphragm moving portion 811 includes a plurality of blades 8111, and the plurality of light emitting elements 821 are provided to one of the blades 8111. Each blade 8111 is provided with the plurality of light emitting elements 821.

The light emitting element 821 may be one of the pixels, and the entire diaphragm moving portion 811 may be used as a display portion of the display screen 20. Especially when the blades 8111 of the diaphragm moving portion 811 are folded to close the light hole 810, the position of the light through hole 200 of the display screen 20 appears to be integrated with the display region of the display screen 20.

Figure 63:
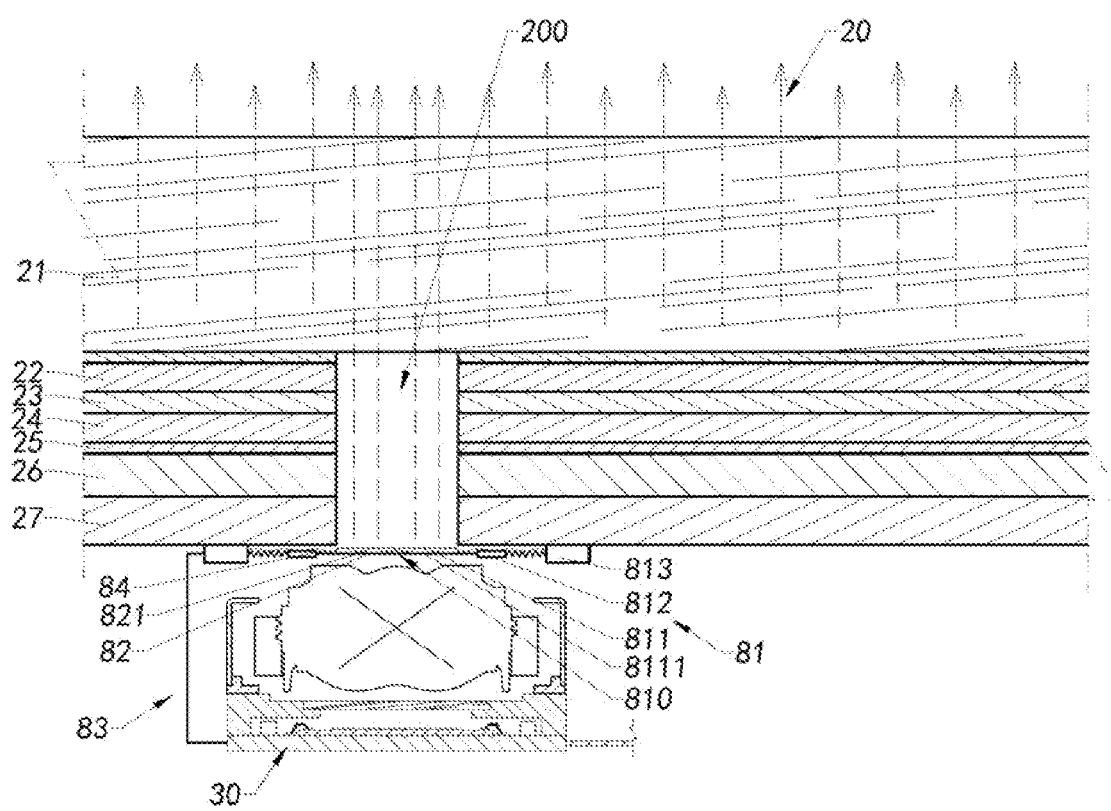
FIG. 63 is a schematic diagram of a display unit according to a preferred embodiment of the present invention.

Referring to FIG. 63, another implementation mode of the display unit according to the above preferred embodiment of the present invention is shown.

In the present example, the light supplementing unit 80 includes the diaphragm structure 81 and the light emitting structure 82, and further includes a reflecting structure 84. The reflecting structure 84 is provided to the diaphragm moving portion 811 of the diaphragm structure 81 and located between the light emitting structure 82 and the diaphragm moving portion 811.

When the light emitting structure 82 emits light, a part of the light emitted by the light emitting structure 82 is radiated outward to the outside of the display screen 20, a part of the light is radiated inward to the reflecting structure 84, and the reflecting structure 84 can radiate the light toward the outside of the display screen 20.

Further, the reflectivity of the reflecting structure 84 may change. For example, the reflecting structure 84 is implemented as a reflecting film, and is provided to the upper surface of the diaphragm moving portion 811.

The reflecting film may be a highly elastic film doped with a substance having a reflecting function or plated with a reflecting layer. When the reflecting film is stretched, the reflectivity of the reflecting film is reduced and the light transmittance of the reflecting film is increased. When the reflecting film is reduced in stretching deformation, the reflectivity of the reflecting film is increased and the light transmittance is reduced.

One end of the highly elastic reflecting film may be fixed to the diaphragm carrier 812 of the diaphragm structure 81, and the other end may be fixed to a side of the diaphragm moving portion 811 of the diaphragm structure 81 close to the light hole 810. When the light hole 810 of the diaphragm moving portion 811 is gradually reduced, the highly elastic reflecting film is stretched, so that the reflectivity is reduced. When the light hole 810 of the diaphragm moving portion 811 is gradually enlarged, the highly elastic reflecting film is stretched and reduced, so that the reflectivity is increased.

The control of the luminance and color of the light supplementing unit 80 is achieved by controlling the aperture size of the light hole 810 of the diaphragm structure 81.

Figure 64:
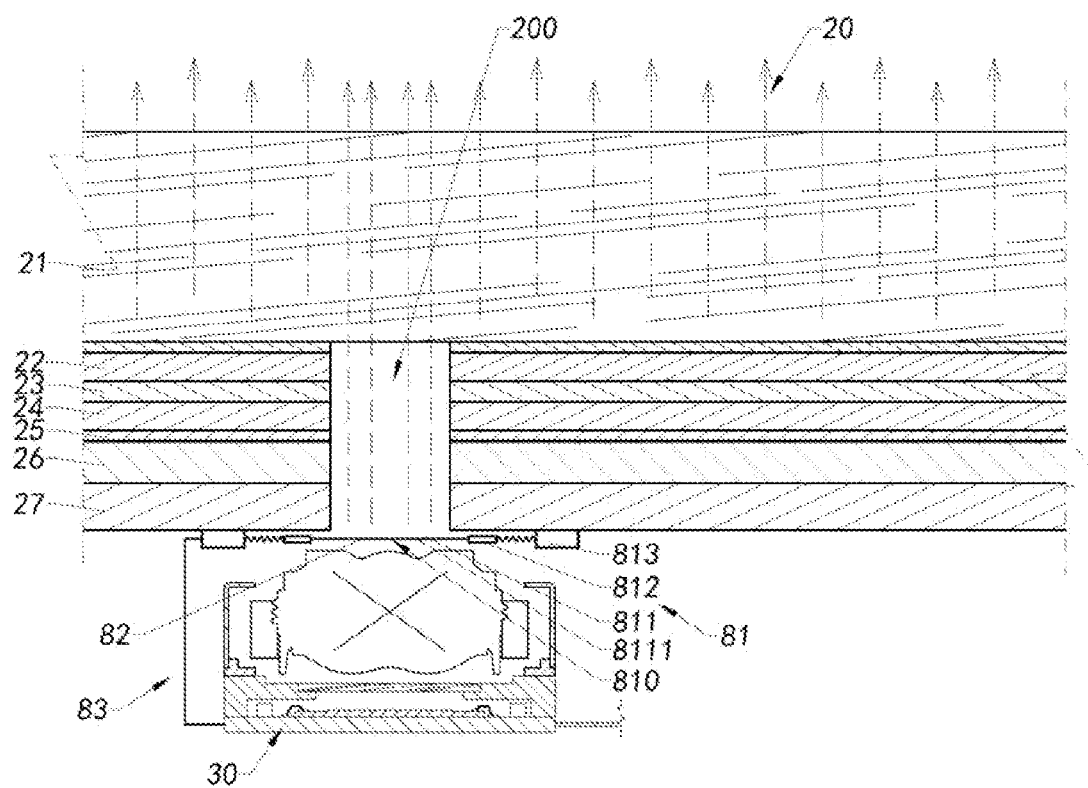
FIG. 64 is a schematic diagram of a display unit according to a preferred embodiment of the present invention.

Referring to FIG. 64, another implementation mode of the display unit according to the above preferred embodiment of the present invention is shown.

In the present example, the light supplementing unit 80 includes one of the diaphragm structures 81, and the diaphragm structure 81 is capable of emitting light. The diaphragm structure 81 may be made of a light emitting material, and may radiate light outward in the case of energization.

The diaphragm structure 81 may be an OLED structure capable of emitting light and displaying when energized. When the camera module 30 operates, the diaphragm structure 81 may be de-energized, and the aperture of the light hole 810 may be controlled by controlling the position of the diaphragm moving portion 811 of the diaphragm structure 81. When the camera module 30 does not operate, the diaphragm structure 81 may be energized and then emit light and play a display role to facilitate the display effect of the entire display screen 20.

Figure 65:
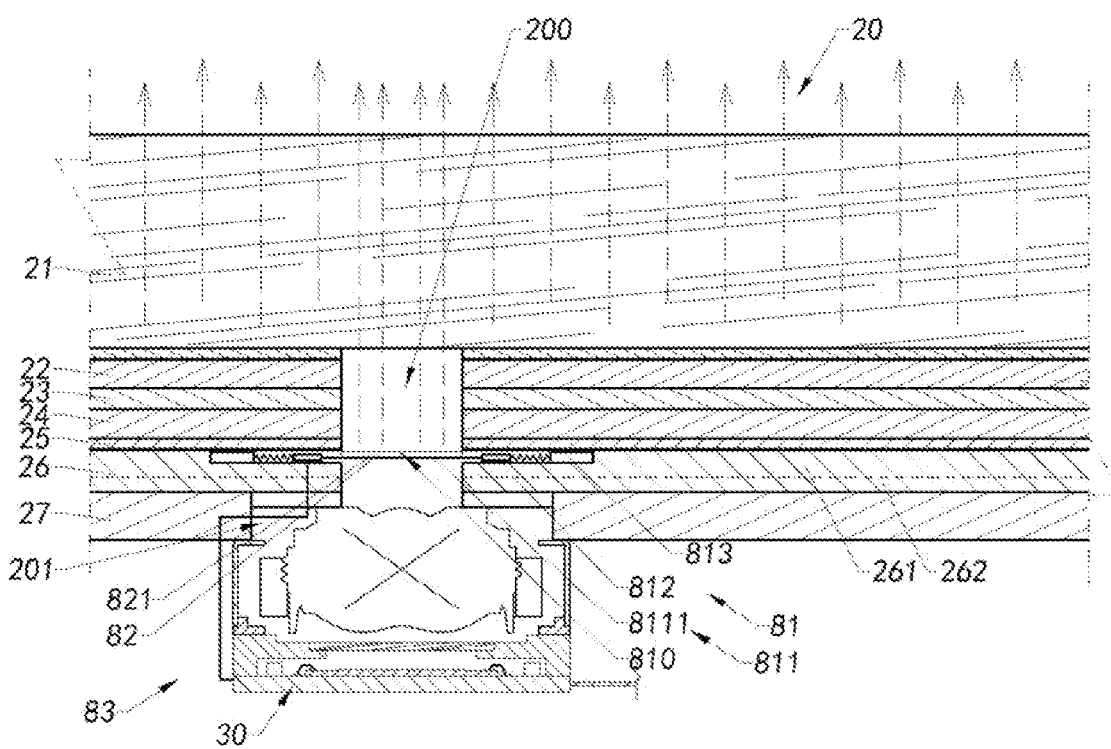
FIG. 65 is a schematic diagram of a display unit according to a preferred embodiment of the present invention.

Referring to FIG. 65, another implementation mode of the display unit according to the present invention is shown.

In the present example, the display unit includes a display screen 20 and a light supplementing unit 80. The display screen 20 includes, from top to bottom, a cover plate layer 21, an encapsulation layer 22, a touch layer 23, a polarization layer 24, a pixel layer 25, a drive circuit layer 26, and a back plate layer 27. The drive circuit layer 26 is formed on a bottom side of the pixel layer 25 and electrically connected to the pixel layer 25 so as to drive the pixel layer 25 to operate. The encapsulation layer 22 is formed on a top side of the pixel layer 25 for encapsulating the pixel layer 25. The light through hole 200 penetrates through the touch layer 23, the polarization layer 24, the encapsulation layer 22, the pixel layer 25, the drive circuit layer 26, and the back plate layer 27 in a height direction. The back plate layer 27 is located on the bottommost layer.

The display screen 20 is an OLED screen and the light supplementing unit 80 is located inside the display screen 20.

Specifically, the light supplementing unit 80 is located on the drive circuit layer 26 below the pixel layer 25. The light supplementing unit 80 is mounted to the drive circuit layer 26 and a diaphragm structure 81 of the light supplementing unit 80 is aligned with the light through hole 200 of the display screen 20. The drive circuit layer 26 includes a plurality of TFT structures 261 and a substrate base 262. The TFT structures 261 are provided to the substrate base 262. Preferably, the light supplementing unit 80 is provided between the adjacent TFT structures 261.

Light outside the display screen 20 needs to pass through the diaphragm structure 81 before reaching the position of the camera module 30 located below the display screen 20.

The light supplementing unit 80 includes the diaphragm structure 81 and a light emitting structure 82. The light emitting structure 82 is provided to at least a part of the diaphragm structure 81 so as to radiate light outward, in particular, radiate light toward the outside of the display screen 20, thereby facilitating the display effect of the position of the light through hole 200 of the display screen 20.

It is worth mentioning that the light emitting intensity of the light emitting structure 82 may be controlled based on requirements, and the light emitting structure 82 can be matched with the display requirements of different display regions of the display screen 20, so that the overall display effect of the entire display screen 20 can achieve a natural transition effect.

The diaphragm structure 81 includes a diaphragm moving portion 811, a diaphragm carrier 812, and a diaphragm driving portion 813. The diaphragm moving portion 811 is provided to the diaphragm carrier 812. The diaphragm moving portion 811 is drivable connected to the diaphragm driving portion 813.

The diaphragm structure 81 is capable of forming a light hole 810, and light can pass through the light hole 810. Further, the light hole 810 is formed in the diaphragm moving portion 811 and the aperture size of the light hole 810 may be adjusted as the diaphragm moving portion 811 is driven by the diaphragm driving portion 813.

The light emitting structure 82 is provided to the diaphragm moving portion 811. Preferably, the light emitting structure 82 is provided to the upper surface of the diaphragm moving portion 811. When the display screen 20 needs to display, the light emitting structure 82 may emit light so as to supplement light around the light through hole 200 of the display screen 20. When the camera module 30 operates, the light emitting structure 82 may stop emitting light, and the size of the light hole 810 of the diaphragm structure 81 may be adjusted to control the amount of light entering the camera module 30.

In the present embodiment, the diaphragm moving portion 811 includes a plurality of blades 8111, and the light emitting structure 82 is provided to the blades 8111 of the diaphragm moving portion 811. The blades 8111 may be drivable connected to the diaphragm driving portion 813.

According to other embodiments of the present invention, the diaphragm moving portion 811 of the diaphragm structure 81 is made of a light emitting material and capable of emitting light.

According to other embodiments of the present invention, the light emitting structure 82 may be covered, embedded, and at least partially embedded on the upper surface of the diaphragm moving portion 811 of the diaphragm structure 81.

According to other embodiments of the present invention, the diaphragm moving portion 811 of the diaphragm structure 81 may be fully transparent and the lower surface of the diaphragm moving portion 811 of the diaphragm structure 81 may be provided with a light-shielding material. The diaphragm structure 81 may also be at least partially light-transmitting. The light emitting structure 82 may be embedded in the diaphragm moving portion 811 of the diaphragm structure 81 and light is radiated outward by a light transmitting portion of the diaphragm moving portion 811.

Figure 66:
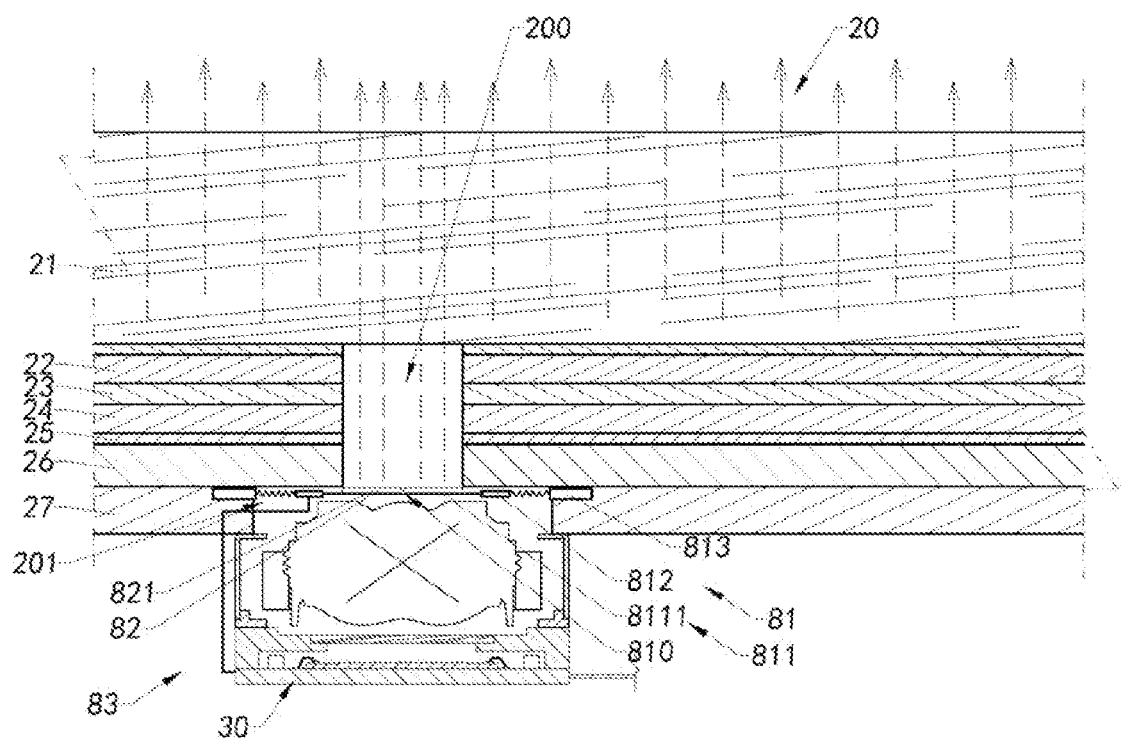
FIG. 66 is a schematic diagram of a display unit according to a preferred embodiment of the present invention.

Referring to FIG. 66, another implementation mode of the display unit according to the present invention is shown.

In the present example, the display unit includes a display screen 20 and a light supplementing unit 80. The display screen 20 includes, from top to bottom, a cover plate layer 21, an encapsulation layer 22, a touch layer 23, a polarization layer 24, a pixel layer 25, a drive circuit layer 26, and a back plate layer 27. The drive circuit layer 26 is formed on a bottom side of the pixel layer 25 and electrically connected to the pixel layer 25 so as to drive the pixel layer 25 to operate. The encapsulation layer 22 is formed on a top side of the pixel layer 25 for encapsulating the pixel layer 25. The light through hole 200 penetrates through the touch layer 23, the polarization layer 24, the encapsulation layer 22, the pixel layer 25, and the drive circuit layer 26 in a height direction. The back plate layer 27 is located on the bottommost layer.

The display screen 20 is an OLED screen and the light supplementing unit 80 is located inside the display screen 20.

Specifically, the light supplementing unit 80 is located on the back plate layer 27 below the pixel layer 25. The light supplementing unit 80 is mounted to the back plate layer 27 and a diaphragm structure 81 of the light supplementing unit 80 is aligned with the light through hole 200 of the display screen 20. The diaphragm structure 81 of the light supplementing unit 80 may be mounted to the back plate layer 27 by first perforating the back plate layer 27.

Light outside the display screen 20 needs to pass through the diaphragm structure 81 before reaching the position of the camera module 30 located below the display screen 20. The display screen 20 has a mounting channel 201. The mounting channel 201 is formed on the back plate layer 27 of the display screen 20 for accommodating at least a part of the camera module 30.

The light supplementing unit 80 includes the diaphragm structure 81 and a light emitting structure 82. The light emitting structure 82 is provided to at least a part of the diaphragm structure 81 so as to radiate light outward, in particular, radiate light toward the outside of the display screen 20, thereby facilitating the display effect of the position of the light through hole 200 of the display screen 20.

It is worth mentioning that the light emitting intensity of the light emitting structure 82 may be controlled based on requirements, and the light emitting structure 82 can be matched with the display requirements of different display regions of the display screen 20, so that the overall display effect of the entire display screen 20 can achieve a natural transition effect.

The diaphragm structure 81 includes a diaphragm moving portion 811, a diaphragm carrier 812, and a diaphragm driving portion 813. The diaphragm moving portion 811 is provided to the diaphragm carrier 812. The diaphragm moving portion 811 is drivable connected to the diaphragm driving portion 813.

The diaphragm structure 81 is capable of forming a light hole 810, and light can pass through the light hole 810. Further, the light hole 810 is formed in the diaphragm moving portion 811 and the aperture size of the light hole 810 may be adjusted as the diaphragm moving portion 811 is driven by the diaphragm driving portion 813.

The light emitting structure 82 is provided to the diaphragm moving portion 811. Preferably, the light emitting structure 82 is provided to the upper surface of the diaphragm moving portion 811. When the display screen 20 needs to display, the light emitting structure 82 may emit light so as to supplement light around the light through hole 200 of the display screen 20. When the camera module 30 operates, the light emitting structure 82 may stop emitting light, and the size of the light hole 810 of the diaphragm structure 81 may be adjusted to control the amount of light entering the camera module 30.

In the present embodiment, the diaphragm moving portion 811 includes a plurality of blades 8111, and the light emitting structure 82 is provided to the blades 8111 of the diaphragm moving portion 811. The blades 8111 may be drivable connected to the diaphragm driving portion 813.

Figure 67:
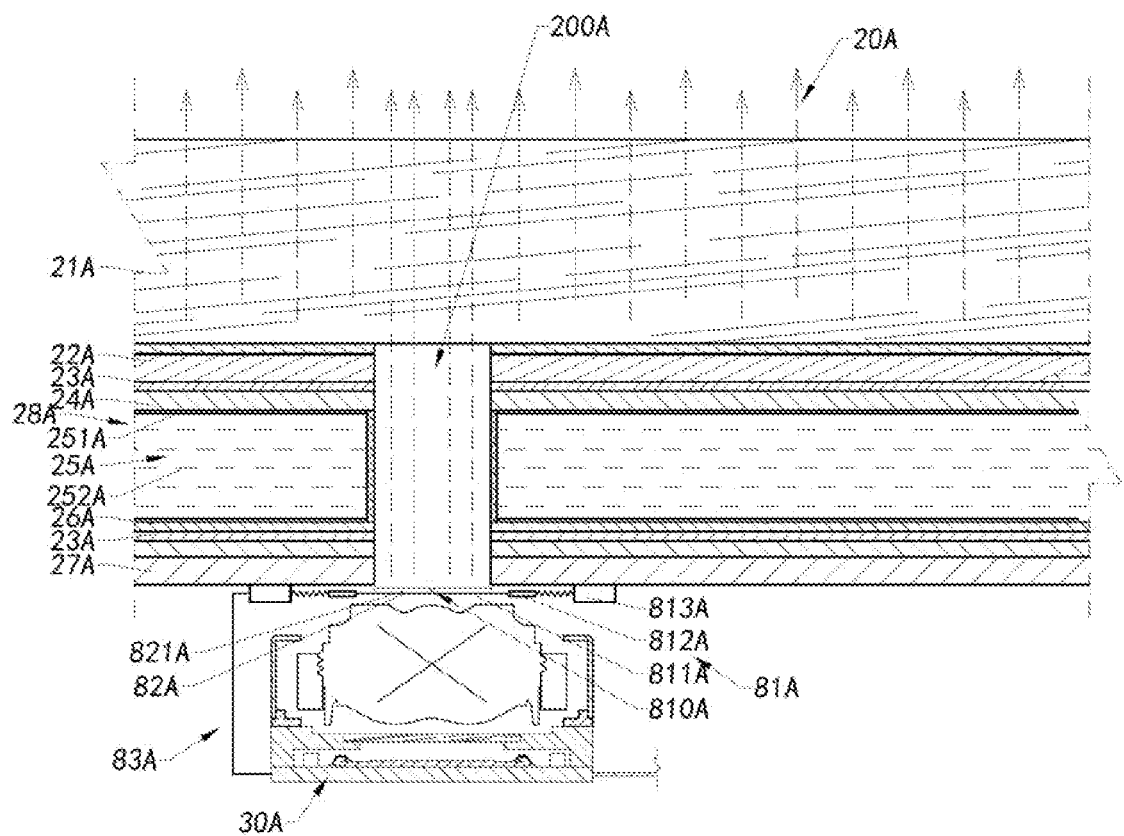
FIG. 67 is a schematic diagram of a display unit according to a preferred embodiment of the present invention.

Referring to FIG. 67, another implementation mode of the display unit according to the present invention is shown.

In the present embodiment, the display screen 20A is an LCD screen. The light supplementing unit 80A is located between the display screen 20A and the camera module 30A. For example, the light supplementing unit 80A is mounted to the bottom surface of the display screen 20A.

The light hole 810A of the diaphragm structure 81A of the light supplementing unit 80A can be aligned with the light through hole 200A and can be aligned with a photosensitive path of the camera module 30A.

The display unit includes the display screen 20A and the light supplementing unit 80A. The display screen 20A includes, from top to bottom, a cover plate layer 21, an encapsulation layer 22A, a touch layer 23A, a polarization layer 24A, a pixel layer 25A, a drive circuit layer 26A, and a back plate layer 27A. The drive circuit layer 26A is formed on a bottom side of the pixel layer 25A and electrically connected to the pixel layer 25A so as to drive the pixel layer 25A to operate. The encapsulation layer 22A is formed on a top side of the pixel layer 25A for encapsulating the pixel layer 25A. The light through hole 200A penetrates through the touch layer 23A, the polarization layer 24A, the encapsulation layer 22A, the pixel layer 25A, the drive circuit layer 26A, and the back plate layer 27A in a height direction. The back plate layer 27A is located on the bottommost layer. The pixel layer 25A includes a filter layer 251A and a liquid crystal 252A. The liquid crystal 252A is located between the filter layer 251A and the drive circuit layer 26A.

The light through hole 200A penetrates through the touch layer 23A, the polarization layer 24A, the pixel layer 25A, the drive circuit layer 26A, and the back plate layer 27A of the display screen 20A other than the cover plate layer 21A in the height direction.

The entire diaphragm moving portion 811A may be opaque. When the light emitting structure 82A emits light, it is difficult for light emitted by the light emitting structure 82A to reach the camera module 30A located below the display screen 20A. When the camera module 30A operates, the amount of light entering the position of the diaphragm moving portion 811A may be controlled based on the size of the light hole 810A.

The entire diaphragm moving portion 811A may also be light-transmitting, but the lower surface of the diaphragm moving portion 811A may be provided with an opaque material. When the light emitting structure 82A emits light, it is difficult for light emitted by the light emitting structure 82A to reach the camera module 30A located below the display screen 20A. When the camera module 30A operates, the amount of light entering the position of the diaphragm moving portion 811A may be controlled based on the size of the light hole 810A.

After passing through the light through hole 200A of the display screen 20A, the light passes through the light hole 810A of the diaphragm structure 81A and is received by the camera module 30A.

The light hole 810A of the diaphragm structure 81A is aligned with the light through hole 200A of the display screen 20A. Further, the light hole 810A of the diaphragm structure 81A and the light through hole 200A of the display screen 20A may be located on the same axis.

The light emitting structure 82A includes at least one light emitting element 821A. The light emitting element 821A is arranged on the upper surface of the diaphragm moving portion 811A of the diaphragm structure 81A. The light emitting element 821A may be one pixel or more pixels. When one of the light emitting elements 821A is energized, the light emitting element 821A emits light. When the plurality of light emitting elements 821A are energized, the illumination amplitude of the light emitting structure 82A is enhanced. The luminance of the light emitting structure 82A may be controlled by controlling the magnitude of an energizing current of the light emitting element 821A, so as to meet the requirements for the display luminance at different positions around the through hole.

The light emitting intensity of the light emitting structure 82 may be controlled based on requirements, and the light emitting structure 82 can be matched with the display requirements of different display regions of the display screen 20, so that the overall display effect of the entire display screen 20 can achieve a natural transition effect.

When the camera module 30A needs to operate, the diaphragm moving portion 811A may move under the drive of the diaphragm driving portion 813A to form the light hole 810A or enlarge the light hole 810A. At this moment, the diaphragm moving portion 811A may stop emitting light.

When the camera module 30A does not operate and the display screen 20A serves as a display screen 20A, the diaphragm moving portion 811A is driven by the diaphragm moving portion 811A so that at least a part of the light emitting structure 82A corresponds to the light through hole 200A. Thus, the light emitting structure 82A can radiate light outward via the light through hole 200A. At this moment, the light hole 810A of the diaphragm structure 81A may be completely closed, or the light hole 810A of the diaphragm structure 81 may be opened, light may reach the camera module 30A, and the camera module 30A may be started at any time to operate.

Further, the light supplementing unit 80A is detachably mounted to the display screen 20A to facilitate maintenance and replacement of the light supplementing unit 80A.

The light supplementing unit 80A includes a control mechanism 83A. The diaphragm structure 81A is controllably connected to the control mechanism 83A. The control structure may control the size of the light hole 810A of the diaphragm structure 81A by controlling the diaphragm driving portion 813A to control the movement of the diaphragm moving portion 811A of the diaphragm structure 81A. The control structure may also control a working state of the light emitting structure 82A, such as a light emitting intensity and an on/off state.

According to some embodiments of the present invention, for example, referring to FIG. 62, the diaphragm moving portion 811A includes a plurality of blades 8111A. Each blade 8111A is supported on the diaphragm carrier 812A and the distances between the plurality of blades 8111A can be changed with each other under the drive of the diaphragm driver 813A, so that light can pass through the diaphragm structure 81A, and the light through amount can also be controlled.

The light emitting structure 82A includes the plurality of light emitting elements 821A, and each of the light emitting elements 821A corresponds to one of the blades 8111A of the diaphragm moving portion 811A.

Each blade 8111A may be drivable connected to the diaphragm driver 813A, respectively. All the blades 8111A may be drivable connected to the diaphragm driver 813A, simultaneously.

The position of the light emitting element 821A can move as the blade 8111A moves.

According to some embodiments of the present invention, for example, referring to FIG. 62, the diaphragm moving portion 811A includes a plurality of blades 8111A, and the plurality of light emitting elements 821A are provided to one of the blades 8111A. Each blade 8111A is provided with the plurality of light emitting elements 821A.

The light emitting element 821A may be one of the pixels, and the entire diaphragm moving portion 811A may be used as a display portion of the display screen 20A. Especially when the blades 8111A of the diaphragm moving portion 811A are folded to close the light hole 810A, the position of the light through hole 200A of the display screen 20A appears to be integrated with the display region of the display screen 20A.

Figure 68:
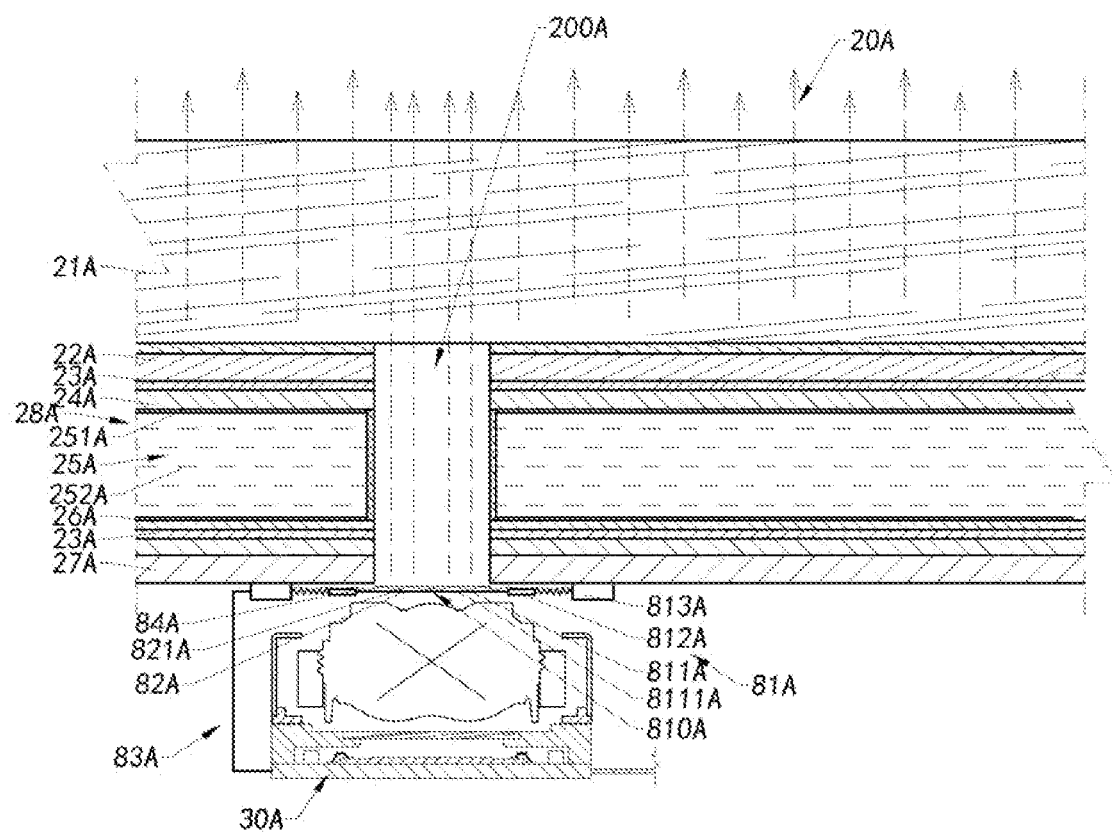
FIG. 68 is a schematic diagram of a display unit according to a preferred embodiment of the present invention.

Referring to FIG. 68, another implementation mode of the display unit according to the above preferred embodiment of the present invention is shown.

In the present example, the light supplementing unit 80A includes the diaphragm structure 81A and the light emitting structure 82A, and further includes a reflecting structure 84A. The reflecting structure 84A is provided to the diaphragm moving portion 811A of the diaphragm structure 81A and located between the light emitting structure 82A and the diaphragm moving portion 811A.

When the light emitting structure 82A emits light, a part of the light emitted by the light emitting structure 82A is radiated outward to the outside of the display screen 20A, a part of the light is radiated inward to the reflecting structure 84A, and the reflecting structure 84A can radiate the light toward the outside of the display screen 20A.

Further, the reflectivity of the reflecting structure 84A may change. For example, the reflecting structure 84A is implemented as a reflecting film, and is provided to the upper surface of the diaphragm moving portion 811A.

The reflecting film may be a highly elastic film doped with a substance having a reflecting function or plated with a reflecting layer. When the reflecting film is stretched, the reflectivity of the reflecting film is reduced and the light transmittance of the reflecting film is increased. When the reflecting film is reduced in stretching deformation, the reflectivity of the reflecting film is increased and the light transmittance is reduced.

One end of the highly elastic reflecting film may be fixed to the diaphragm carrier 812A of the diaphragm structure 81A, and the other end may be fixed to a side of the diaphragm moving portion 811A of the diaphragm structure 81A close to the light hole 810A. When the light hole 810A of the diaphragm moving portion 811A is gradually reduced, the highly elastic reflecting film is stretched, so that the reflectivity is reduced. When the light hole 810A of the diaphragm moving portion 811A is gradually enlarged, the highly elastic reflecting film is stretched and reduced, so that the reflectivity is increased.

The control of the luminance and color of the light supplementing unit 80A is achieved by controlling the aperture size of the light hole 810A of the diaphragm structure 81A.

Figure 69:
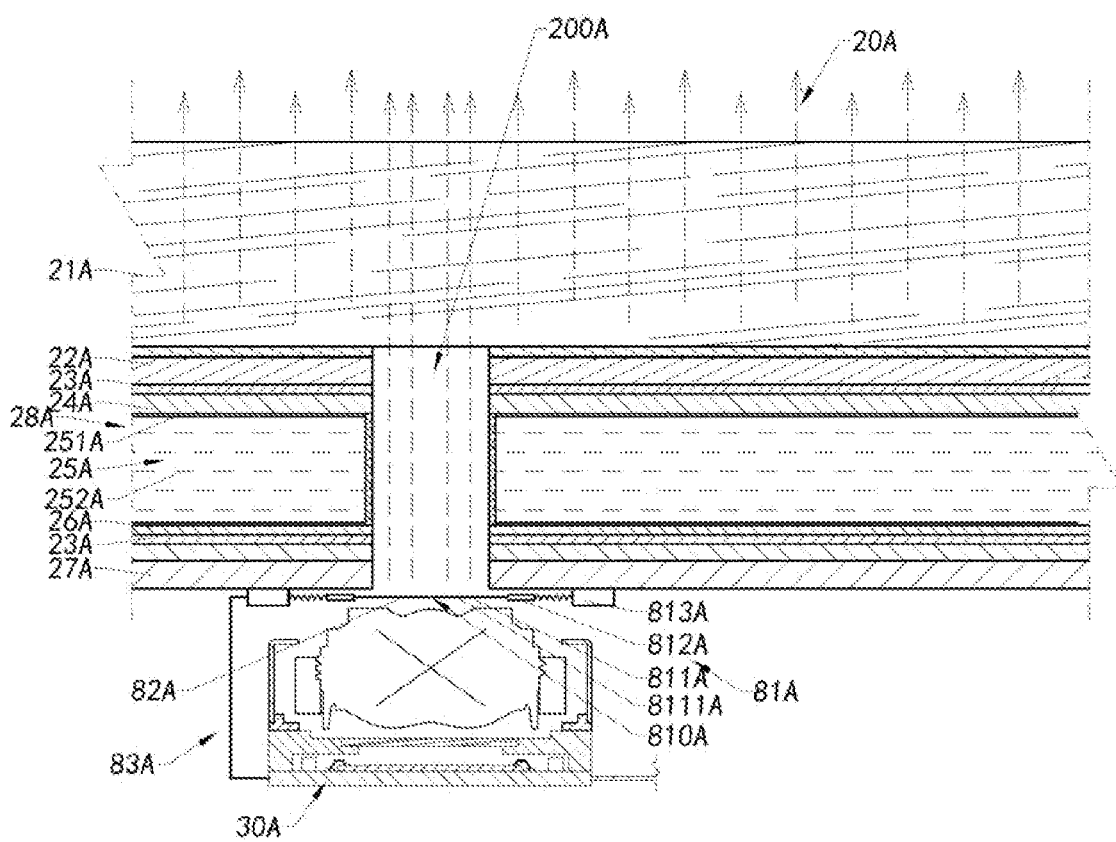
FIG. 69 is a schematic diagram of a display unit according to a preferred embodiment of the present invention.

Referring to FIG. 69, another implementation mode of the display unit according to the above preferred embodiment of the present invention is shown.

In the present example, the light supplementing unit 80A includes one of the diaphragm structures 81A, and the diaphragm structure 81A is capable of emitting light. The diaphragm structure 81A may be made of a light emitting material, and may radiate light outward in the case of energization.

The diaphragm structure 81A may be an OLED structure capable of emitting light and displaying when energized. When the camera module 30A operates, the diaphragm structure 81A may be de-energized, and the aperture of the light hole 810A may be controlled by controlling the position of the diaphragm moving portion 811A of the diaphragm structure 81A. When the camera module 30A does not operate, the diaphragm structure 81A may be energized and then emit light and play a display role to facilitate the display effect of the entire display screen 20A.

Figure 70:
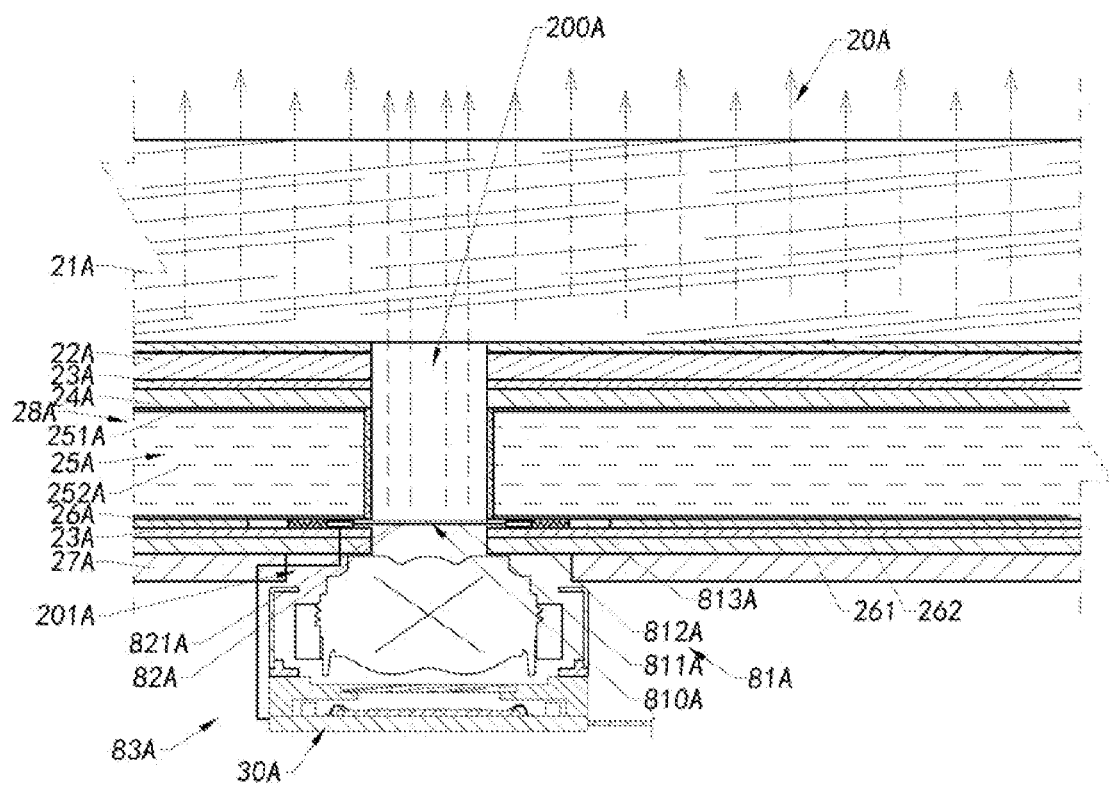
FIG. 70 is a schematic diagram of a display unit according to a preferred embodiment of the present invention.

Referring to FIG. 70, another implementation mode of the display unit according to the present invention is shown.

In the present example, the display unit includes a display screen 20A and a light supplementing unit 80A. The display screen 20A includes, from top to bottom, a cover plate layer 21, a touch layer 23A, a polarization layer 24A, a pixel layer 25A, a drive circuit layer 26A, and a back plate layer 27A. The drive circuit layer 26A is formed on a bottom side of the pixel layer 25A and electrically connected to the pixel layer 25A so as to drive the pixel layer 25A to operate. The encapsulation layer 22A is formed on a top side of the pixel layer 25A for encapsulating the pixel layer 25A. The light through hole 200A penetrates through the touch layer 23A, the polarization layer 24A, the encapsulation layer 22A, the pixel layer 25A, the drive circuit layer 26A, and the back plate layer 27A in a height direction. The back plate layer 27A is located on the bottommost layer.

The display screen 20A is an LCD screen and the light supplementing unit 80A is located inside the display screen 20A.

Specifically, the light supplementing unit 80A is located on the drive circuit layer 26A below the pixel layer 25A. The light supplementing unit 80A is mounted to the drive circuit layer 26A and a diaphragm structure 81A of the light supplementing unit 80A is aligned with the light through hole 200A of the display screen 20A. The drive circuit layer 26A includes a plurality of TFT structures 261A and a substrate base 262A. The TFT structures 261A are provided to the substrate base 262A. Preferably, the light supplementing unit 80A is provided between the adjacent TFT structures 261A.

Light outside the display screen 20A needs to pass through the diaphragm structure 81A before reaching the position of the camera module 30A located below the display screen 20A. The display screen 20A has a mounting channel 201A. The mounting channel 201A is formed on the back plate layer 27A of the display screen 20A for accommodating at least a part of the camera module 30A.

The light supplementing unit 80A includes the diaphragm structure 81A and a light emitting structure 82A. The light emitting structure 82A is provided to at least a part of the diaphragm structure 81A so as to radiate light outward, in particular, radiate light toward the outside of the display screen 20A, thereby facilitating the display effect of the position of the light through hole 200A of the display screen 20A.

The diaphragm structure 81A includes a diaphragm moving portion 811A, a diaphragm carrier 812A, and a diaphragm driving portion 813A. The diaphragm moving portion 811A is provided to the diaphragm carrier 812A. The diaphragm moving portion 811A is drivable connected to the diaphragm driving portion 813A.

The diaphragm structure 81A is capable of forming a light hole 810A, and light can pass through the light hole 810A. Further, the light hole 810A is formed in the diaphragm moving portion 811A and the aperture size of the light hole 810A may be adjusted as the diaphragm moving portion 811A is driven by the diaphragm driving portion 813A.

The light emitting structure 82A is provided to the diaphragm moving portion 811A. Preferably, the light emitting structure 82A is provided to the upper surface of the diaphragm moving portion 811A. When the display screen 20A needs to display, the light emitting structure 82A may emit light so as to supplement light around the light through hole 200A of the display screen 20A. When the camera module 30A operates, the light emitting structure 82A may stop emitting light, and the size of the light hole 810A of the diaphragm structure 81A may be adjusted to control the amount of light entering the camera module 30A.

In the present embodiment, the diaphragm moving portion 811A includes a plurality of blades 8111A, and the light emitting structure 82A is provided to the blades 8111A of the diaphragm moving portion 811A. The blades 8111A may be drivable connected to the diaphragm driving portion 813A.

According to other embodiments of the present invention, the diaphragm moving portion 811A of the diaphragm structure 81A is made of a light emitting material and capable of emitting light.

According to other embodiments of the present invention, the light emitting structure 82A may be covered, embedded, and at least partially embedded on the upper surface of the diaphragm moving portion 811A of the diaphragm structure 81A.

According to other embodiments of the present invention, the diaphragm moving portion 811A of the diaphragm structure 81A may be fully transparent and the lower surface of the diaphragm moving portion 811A of the diaphragm structure 81A may be provided with a light-shielding material. The diaphragm structure 81A may also be at least partially light-transmitting. The light emitting structure 82A may be embedded in the diaphragm moving portion 811A of the diaphragm structure 81A and light is radiated outward by a light transmitting portion of the diaphragm moving portion 811A.

Figure 71:
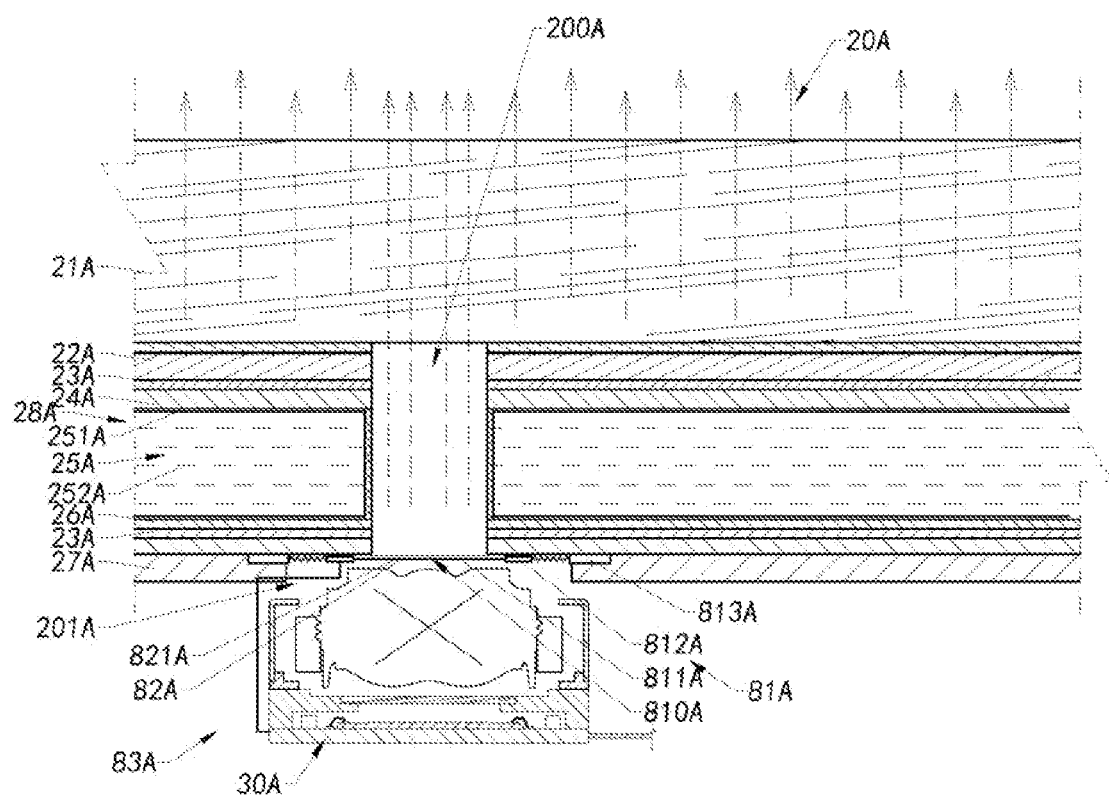
FIG. 71 is a schematic diagram of a display unit according to a preferred embodiment of the present invention.

Referring to FIG. 71, another implementation mode of the display unit according to the present invention is shown.

In the present example, the display unit includes a display screen 20A and a light supplementing unit 80A. The display screen 20A includes a cover plate layer 21, an encapsulation layer 22A, a touch layer 23A, a polarization layer 24A, a pixel layer 25A, a drive circuit layer 26A, and a back plate layer 27A. The drive circuit layer 26A is formed on a bottom side of the pixel layer 25A and electrically connected to the pixel layer 25A so as to drive the pixel layer 25A to operate. The encapsulation layer 22A is formed on a top side of the pixel layer 25A for encapsulating the pixel layer 25A. The light through hole 200A penetrates through the touch layer 23A, the polarization layer 24A, the encapsulation layer 22A, the pixel layer 25A, the drive circuit layer 26A, and the back plate layer 27A in a height direction. The back plate layer 27A is located on the bottommost layer.

The display screen 20A is an LCD screen and the light supplementing unit 80A is located inside the display screen 20A.

Specifically, the light supplementing unit 80A is located on the back plate layer 27A below the pixel layer 25A. The light supplementing unit 80A is mounted to the back plate layer 27A and a diaphragm structure 81A of the light supplementing unit 80A is aligned with the light through hole 200A of the display screen 20A. The diaphragm structure 81A of the light supplementing unit 80A may be mounted to the back plate layer 27A by first perforating the back plate layer 27A.

Light outside the display screen 20A needs to pass through the diaphragm structure 81A before reaching the position of the camera module 30A located below the display screen 20A. The display screen 20A has a mounting channel 201A. The mounting channel 201A is formed on the back plate layer 27A of the display screen 20A for accommodating at least a part of the camera module 30A.

The light supplementing unit 80A includes the diaphragm structure 81A and a light emitting structure 82A. The light emitting structure 82A is provided to at least a part of the diaphragm structure 81A so as to radiate light outward, in particular, radiate light toward the outside of the display screen 20A, thereby facilitating the display effect of the position of the light through hole 200A of the display screen 20A.

The diaphragm structure 81A includes a diaphragm moving portion 811A, a diaphragm carrier 812A, and a diaphragm driving portion 813A. The diaphragm moving portion 811A is provided to the diaphragm carrier 812A. The diaphragm moving portion 811A is drivable connected to the diaphragm driving portion 813A.

The diaphragm structure 81A is capable of forming a light hole 810A, and light can pass through the light hole 810A. Further, the light hole 810A is formed in the diaphragm moving portion 811A and the aperture size of the light hole 810A may be adjusted as the diaphragm moving portion 811A is driven by the diaphragm driving portion 813A.

The light emitting structure 82A is provided to the diaphragm moving portion 811A. Preferably, the light emitting structure 82A is provided to the upper surface of the diaphragm moving portion 811A. When the display screen 20A needs to display, the light emitting structure 82A may emit light so as to supplement light around the light through hole 200A of the display screen 20A. When the camera module 30A operates, the light emitting structure 82A may stop emitting light, and the size of the light hole 810A of the diaphragm structure 81A may be adjusted to control the amount of light entering the camera module 30A.

In the present embodiment, the diaphragm moving portion 811A includes a plurality of blades 8111A, and the light emitting structure 82A is provided to the blades 8111A of the diaphragm moving portion 811A. The blades 8111A may be drivable connected to the diaphragm driving portion 813A.

It will be understood by those skilled in the art that the embodiments of the present invention described above and shown in the accompanying drawings are illustrative only and do not limit the present invention. The objects of the present invention have been fully and effectively achieved. The functional and structural principles of the present invention have been shown and described in the embodiments, and any variations or modifications may be made to the implementation modes of the present invention without departing from the principles.

What is claimed is:

1. A terminal device, characterized by comprising:
a terminal device body;
a display screen provided with a light through hole; and
a camera module located below the display screen and having a front end, wherein the front end of the camera module is mounted to the display screen and the camera module is aligned with the light through hole of the display screen, so that light outside the display screen is received by the camera module via the light through hole.

2. The terminal device of claim 1, wherein the display screen includes a cover plate layer, a touch layer, a polarization layer, an encapsulation layer, a pixel layer, and a drive circuit layer, and the drive circuit layer is formed on a bottom side of the pixel layer and electrically connected to the pixel layer to drive the pixel layer to operate, and the encapsulation layer is formed on a top side of the pixel layer for encapsulating the pixel layer, and the light through hole penetrates through the touch layer, the polarization layer, the encapsulation layer, the pixel layer, and the drive circuit layer in a height direction.

3. The terminal device of claim 2, wherein the drive circuit layer includes a substrate base and a plurality of TFT structures provided to the substrate base, and the light through hole is located between the adjacent TFT structures.

4. The terminal device of claim 2, wherein the pixel layer includes a plurality of pixels, and the light through hole is located between the adjacent pixels.

5. The terminal device of claim 2, wherein the terminal device is provided with a protective material, which is located in the light through hole and coated on the pixel layer and/or the drive circuit layer.

6. The terminal device of claim 2, wherein the pixel layer includes an anode layer, a light emitting layer, a cathode layer, and a protective layer, and the anode layer is located above the drive circuit layer, and the light emitting layer is located between the anode layer and the cathode layer, and the cathode layer is located above the light emitting layer and below the protective layer; and the terminal device is provided with a protective material, which is located in the light through hole, and is extended downward from the protective layer to the cathode layer, or from the protective layer to the light emitting layer, or from the protective layer to the anode layer.

7. The terminal device of claim 2, including a back plate layer, which is located below the drive circuit layer and configured to emit light, wherein the pixel layer includes a filter layer and a liquid crystal located between the filter layer and the drive circuit layer, and the pixel layer is provided with a sealing material located between the filter layer and the drive circuit layer, and the liquid crystal is blocked by the sealing material so as not to leak to the light through hole.

8. The terminal device of claim 7, wherein the terminal device is provided with a protective material, which is located in the light through hole and coated on the pixel layer and/or the drive circuit layer.

9. The terminal device of claim 2, further including: a limiting mechanism, wherein the limiting mechanism is connected to the camera module and the display screen respectively, and the camera module is fixed to the display screen by the limiting mechanism.

10. The terminal device of claim 9, wherein the limiting mechanism is adhesively fixed to the display screen.

11. The terminal device of claim 9, wherein the limiting mechanism includes a sleeve having a free end and a connecting end, and a connecting portion formed by extending outward from the connecting end of the sleeve in a radial direction of the sleeve, and the connecting portion is attached to a back side of the display screen when the sleeve is mounted to the display screen.

12. A manufacturing method of a display screen with a light through hole, characterized by comprising the following steps:

forming a hole penetrating through a drive circuit layer in a height direction on the drive circuit layer;

providing a pixel layer, an encapsulation layer, a polarization layer, a touch layer and a cover plate layer above the drive circuit layer respectively; and forming a light through hole penetrating through the touch layer, the polarization layer, the encapsulation layer, and the pixel layer along the hole of the drive circuit layer.

13. The manufacturing method of claim 12, further including the following steps:

forming the pixel layer on the drive circuit layer with the hole;

forming a hole penetrating through the pixel layer and the drive circuit layer in the pixel layer and the drive circuit layer; and providing the encapsulation layer, the polarization layer, the touch layer and the cover plate layer above the drive circuit layer respectively.

14. The manufacturing method of claim 12, further comprising the following steps:

providing the pixel layer with a hole on the drive circuit layer with the hole, and aligning the drive circuit layer with the pixel layer; and providing the encapsulation layer, the polarization layer, the touch layer and the cover plate layer above the drive circuit layer respectively.

15. The manufacturing method of claim 14, wherein the pixel layer is formed on the drive circuit layer with the hole, and a hole penetrating through the pixel layer and the drive circuit layer in the height direction is then formed in the pixel layer and the drive circuit layer.

16. A manufacturing method of a display screen with a hole, characterized by comprising the following steps:

providing a liquid crystal layer, an encapsulation layer, a polarization layer, a touch layer and a cover plate layer, above a back plate layer, respectively; and perforating each layer of the display screen in alignment with a sealing region of the liquid crystal layer to obtain a light through hole penetrating through the touch layer, the polarization layer, the encapsulation layer, and the back plate layer of the display screen in a height direction.

17. The manufacturing method of claim 16, wherein the liquid crystal layer has a through hole.

18. The manufacturing method of claim 16, wherein a sealing region penetrating in a height direction is formed on the liquid crystal layer, and a perforated region is located between the sealing regions and smaller than the sealing regions when the liquid crystal layer is perforated.

19. The manufacturing method of claim 18, wherein the method for manufacturing the liquid crystal layer with a hole includes the following steps:

providing a sealing material between a filter layer and a drive circuit layer to form the sealing region; and filling a liquid crystal outside the sealing region.

20. The manufacturing method of claim 19, wherein the method for manufacturing the liquid crystal with a hole further includes the following steps:

providing a sealing material with a certain height on a surface of a drive circuit layer to form the sealing region;

filling a liquid crystal outside the sealing region; and covering a filter layer above the liquid crystal and attaching the filter layer to the drive circuit layer.

* * * * *